United States Patent
Iwato et al.

(10) Patent No.: US 8,822,129 B2
(45) Date of Patent: Sep. 2, 2014

(54) PATTERN FORMING METHOD, ELECTRON BEAM-SENSITIVE OR EXTREME ULTRAVIOLET-SENSITIVE COMPOSITION, RESIST FILM, MANUFACTURING METHOD OF ELECTRONIC DEVICE, AND ELECTRONIC DEVICE

(75) Inventors: Kaoru Iwato, Shizuoka (JP); Hideaki Tsubaki, Shizuoka (JP); Shuji Hirano, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 13/613,437

(22) Filed: Sep. 13, 2012

(65) Prior Publication Data

US 2013/0084438 A1     Apr. 4, 2013

(30) Foreign Application Priority Data

Sep. 30, 2011 (JP) ................. 2011-218548

(51) Int. Cl.
 *G03F 7/00* (2006.01)
 *G03F 7/004* (2006.01)
 *G03F 7/20* (2006.01)

(52) U.S. Cl.
 USPC ........ 430/270.1; 430/396; 430/913; 430/942; 430/945

(58) Field of Classification Search
 USPC ................ 430/270.1, 913, 396, 945, 942
 See application file for complete search history.

(56) References Cited

U.S. PATENT DOCUMENTS 8,071,272 B2 * 12/2011 Tsubaki ..................... 430/270.1
8,227,183 B2 * 7/2012 Tsubaki et al. ............... 430/434
2004/0260031 A1 12/2004 Takeda et al.
2008/0187860 A1 8/2008 Tsubaki et al.
2011/0177462 A1 7/2011 Hatakeyama et al.
2011/0200941 A1 8/2011 Masunaga et al.
2011/0236826 A1 * 9/2011 Hatakeyama et al. ..... 430/270.1
2012/0058436 A1 3/2012 Tsubaki et al.
2013/0029269 A1 1/2013 Hatakeyama et al.

FOREIGN PATENT DOCUMENTS

| JP | 2005-008766 A | 1/2005 |
| JP | 2005-084591 A | 3/2005 |
| JP | 2008-292975 A | 12/2008 |
| JP | 2010-217884 A | 9/2010 |
| JP | 2011-170316 A | 9/2011 |
| JP | 2011-191741 A | 9/2011 |
| JP | 2013-029564 A | 2/2013 |
| WO | 2010/095763 A1 | 8/2010 |

OTHER PUBLICATIONS

Machine translation of JP 2011-170316 (no date).*
Office Action dated Aug. 20, 2013, issued by the Japanese Patent Office in counterpart Japanese Application No. 2011-218548.
Office Action dated Mar. 25, 2014 issued by the Japanese Patent Office in corresponding Application No. 2011-218548.

* cited by examiner

*Primary Examiner* — Amanda C. Walke
(74) *Attorney, Agent, or Firm* — Sughrue Mion, PLLC

(57) ABSTRACT

There is provided a pattern forming method comprising (1) a step of forming a film by using an electron beam-sensitive or extreme ultraviolet-sensitive resin composition containing (A) a resin that contains a repeating unit having a partial structure represented by the specific formula and can decrease the solubility for a developer containing an organic solvent by the action of an acid, and (B) a compound capable of generating an acid upon irradiation with an electron beam or an extreme ultraviolet ray, (2) a step of exposing the film by using an electron beam or an extreme ultraviolet ray, and (4) a step of developing the exposed film by using an organic solvent-containing developer to form a negative pattern.

18 Claims, No Drawings

PATTERN FORMING METHOD, ELECTRON BEAM-SENSITIVE OR EXTREME ULTRAVIOLET-SENSITIVE COMPOSITION, RESIST FILM, MANUFACTURING METHOD OF ELECTRONIC DEVICE, AND ELECTRONIC DEVICE

BACKGROUND OF THE INVENTION

1. Field of the Invention

The present invention relates to a pattern forming method using a developer containing an organic solvent, an electron beam-sensitive or extreme ultraviolet-sensitive resin composition, and a resist film, which are suitably used for the ultramicrolithography process such as production of VLSI or high-capacity microchip or in other photofabrication processes, and also relates to a manufacturing method of an electronic device using the same, and an electronic device. More specifically, the present invention relates to a resist pattern forming method using a developer containing an organic solvent, an electron beam-sensitive or extreme ultraviolet-sensitive resin composition, and a resist film, which can be suitably used for semiconductor microfabrication employing an electron beam or EUV light (wavelength: near 13 nm), and also relates to a manufacturing method of an electronic device using the same, and an electronic device.

2. Description of the Related Art

In the process of producing a semiconductor device such as IC and LSI, microfabrication by lithography using a photoresist composition has been conventionally performed. Recently, with the increase in integration degree of an integrated circuit, formation of an ultrafine pattern in the submicron or quarter-micron region is required. To cope with this requirement, the exposure wavelength also tends to become shorter, for example, from g line to i line or further to KrF excimer laser light. At present, other than the excimer laser light, development of lithography using electron beam, X-ray or EUV light is also proceeding.

The lithography using electron beam, X-ray or EUV light is positioned as a next-generation or next-next-generation pattern formation technology and a high-sensitivity and high-resolution resist composition is being demanded.

Particularly, in order to shorten the wafer processing time, elevation of sensitivity is very important, but when higher sensitivity is sought for, the pattern profile or the resolution indicated by the limiting resolution line width is deteriorated, and development of a resist composition satisfying all of these properties at the same time is strongly demanded.

The high sensitivity is in a trade-off relationship with high resolution and good pattern profile, and it is very important how to satisfy all of these properties at the same time.

The actinic ray-sensitive or radiation-sensitive resin composition generally includes "a positive type" using a resin sparingly-soluble or insoluble in an alkali developer, where the exposed area is solubilized in an alkali developer upon exposure to radiation and a pattern is thereby formed, and "a negative type" using a resin soluble in an alkali developer, where the exposed area is sparingly solubilized or insolubilized in an alkali developer upon exposure to radiation and a pattern is thereby formed.

As the actinic ray-sensitive or radiation-sensitive resin composition suitable for such a lithography process using electron beam, X-ray or EUV light, a chemical amplification positive resist composition utilizing an acid catalytic reaction is studied from the standpoint of elevating the sensitivity, and a chemical amplification positive resist composition containing an acid generator and, as the main component, a phenolic resin having a property of being insoluble or sparingly soluble in an alkali developer but becoming soluble in an alkali developer by the action of an acid (hereinafter simply referred to as a "phenolic acid-decomposable resin") is being effectively used.

In the production of a semiconductor device or the like, patterns having various profiles such as line, trench and hole need to be formed. For meeting the requirement to form patterns having various profiles, not only a positive actinic ray-sensitive or radiation-sensitive resin composition but also a negative composition are currently under development.

In the formation of an ultrafine pattern, more improvements are demanded on the reduction of resolution and the pattern profile.

In order to solve this problem, there has been also proposed a method where an acid-decomposable resin is developed using a developer other than an alkali developer (see, for example, JP-A-2008-292975 (the term "JP-A" as used herein means an "unexamined published Japanese patent application" and JP-A-2010-217884).

However, in the microfabrication including negative pattern formation by organic solvent development, further improvements are demanded in terms of high sensitivity, prevention of pattern collapse after development, and enhancement of residual film ratio (prevention of film loss).

SUMMARY OF THE INVENTION

An object of the present invention is to solve the technical problem of enhancing the performance in the semiconductor microfabrication using an electron beam or an extreme ultraviolet ray (EUV light) and provide an actinic ray-sensitive or radiation-sensitive resin composition ensuring that in the negative pattern formation by organic solvent development, the sensitivity is high, generation of pattern collapse after development is suppressed, and the residual film ratio is large, as well as providing a resist film using the same, a pattern forming method, a manufacturing method of an electronic device, and an electronic device.

That is, the present invention is as follows.

[1] A pattern forming method comprising:

(1) a step of forming a film by using an electron beam-sensitive or extreme ultraviolet-sensitive resin composition containing (A) a resin that contains a repeating unit having a partial structure represented by the following formula (A0) and can decrease the solubility for a developer containing an organic solvent by the action of an acid, and (B) a compound capable of generating an acid upon irradiation with an electron beam or an extreme ultraviolet ray, (2) a step of exposing the film by using an electron beam or an extreme ultraviolet ray, and (4) a step of developing the exposed film by using an organic solvent-containing developer to form a negative pattern:

$$\text{Ar—(COO}R_a)_p \qquad (A0)$$

wherein Ar represents an aromatic ring group bonded directly or indirectly to the main chain of the resin (A); Ra represents a hydrogen atom or a group capable of leaving by the action of an acid, and when a plurality of Ra's are present, each Ra may be the same as or different from every other Ra; and p represents an integer of 1 to 4.

[2] The pattern forming method as described in [1], wherein the content of the repeating unit having a partial structure represented by formula (A0) is from 30 to 70 mol % based on all repeating units of the resin (A).

[3] The pattern forming method as described in [1] or [2], wherein the repeating unit having a partial structure represented by formula (A0) is a repeating unit represented by the following formula (A1):

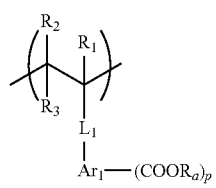

(A1)

wherein each of $R_1$, $R_2$ and $R_3$ independently represents a hydrogen atom, an alkyl group, a cycloalkyl group, a halogen atom, a cyano group or an alkoxycarbonyl group, $R_3$ may combine with $L_1$ or $Ar_1$ to form a ring, and in this case, $R_3$ represents an alkylene group;

$L_1$ represents a single bond or a divalent linking group, $Ar_1$ represents a (p+1)-valent aromatic ring group and in the case of combining with $R_3$ to form a ring, $Ar_1$ represents a (p+2)-valent aromatic ring group;

Ra represents a hydrogen atom or a group capable of leaving by the action of an acid; and p represents an integer of 1 to 4, and when a plurality of Ra's are present, each Ra may be the same as or different from every other Ra.

[4] The pattern forming method as described in [3], wherein the divalent linking group of $L_1$ is —COO—, —OCO—, —COO—La— or —OCO—La— (wherein La represents an alkylene group, a cycloalkylene group, or a divalent aromatic ring group).

[5] The pattern forming method as described in any one of [1] to [4], wherein Ra is a group capable of leaving by the action of an acid.

[6] The pattern forming method as described in any one of [1] to [5], wherein the resin (A) further contains a repeating unit having a lactone structure.

[7] The pattern forming method as described in any one of [1] to [6], which is used for fabrication of a semiconductor microcircuit.

[8] An electron beam-sensitive or extreme ultraviolet-sensitive resin composition used in the pattern forming method described in any one of [1] to [7].

[9] A resist film formed using the electron beam-sensitive or extreme ultraviolet-sensitive resin composition described in [8].

[10] A method for manufacturing an electronic device, comprising the pattern forming method described in any one of [1] to [7].

[11] An electronic device manufactured by the method for manufacturing an electronic device as described in [10].

The present invention preferably further includes the following configurations.

[12] The pattern forming method as described in any one of [1] to [7], wherein the developer is a developer containing at least one kind of an organic solvent selected from the group consisting of a ketone-based solvent, an ester-based solvent, an alcohol-based solvent, an amide-based solvent and an ether-based solvent.

[13] The pattern forming method as described in any one of [1] to [7] and [12], further comprising:

(5) a step of rinsing the film by using a rinsing solution containing an organic solvent.

[14] The actinic ray-sensitive or radiation-sensitive resin composition as described in [8], which is a chemical amplification resist composition for organic solvent development.

According to the present invention, an actinic ray-sensitive or radiation-sensitive resin composition ensuring that in the negative pattern formation by organic solvent development, using an electron beam or an extreme ultraviolet ray (EUV light), the sensitivity is high, generation of pattern collapse after development is suppressed, and the residual film ratio is large, as well as a resist film using the same, a pattern forming method, a manufacturing method of an electronic device, and an electronic device, can be provided

DETAILED DESCRIPTION OF THE INVENTION

The mode for carrying out the present invention is described below.

In the description of the present invention, when a group (atomic group) is denoted without specifying whether substituted or unsubstituted, the group encompasses both a group having no substituent and a group having a substituent. For example, "an alkyl group" encompasses not only an alkyl group having no substituent (unsubstituted alkyl group) but also an alkyl group having a substituent (substituted alkyl group).

In the description of the present invention, the "light" encompasses not only an extreme ultraviolet ray (EUV light) but also an electron beam.

Furthermore, in the description of the present invention, unless otherwise indicated, the "exposure" encompasses not only exposure to an extreme ultraviolet ray (EUV light) but also lithography with an electron beam.

[Pattern Forming Method]

The pattern forming method of the present invention comprises:

(1) a step of forming a film by using an electron beam-sensitive or extreme ultraviolet-sensitive resin composition containing (A) a resin that contains a repeating unit having a partial structure represented by the following formula (A0) and can decrease the solubility for a developer containing an organic solvent by the action of an acid, and (B) a compound capable of generating an acid upon irradiation with an electron beam or an extreme ultraviolet ray, (2) a step of exposing the film by using an electron beam or an extreme ultraviolet ray, and (4) a step of developing the exposed film by using an organic solvent-containing developer to form a negative pattern:

Ar—(COOR$_a$)$_p$ (A0)

wherein Ar represents an aromatic ring group bonded directly or indirectly to the main chain of the resin (A); Ra represents a hydrogen atom or a group capable of leaving by the action of an acid, and when a plurality of Ra's are present, each Ra may be the same as or different from every other Ra; and p represents an integer of 1 to 4.

The reason why according to the pattern forming method of the present invention using an electron beam-sensitive or extreme ultraviolet-sensitive resin composition containing (A) a resin that contains a repeating unit having a partial structure represented by formula (A0) and can decrease the solubility for a developer containing an organic solvent by the action of an acid, high sensitivity and reduction in the pattern collapse after development as well as a large residual film ratio are achieved in the negative pattern formation by organic solvent development is not clearly known but is presumed as follows.

The pattern forming method in which exposure is performed by an electron beam or an extreme ultraviolet ray is expected to enable successful formation of a very fine pattern (for example, a pattern having a line width of 50 nm or less).

However, for example, in the case of forming a line-and-space pattern having a line width of 50 nm or less, with the ratio between line width and space width being 1:1, a stronger capillary force is liable to be generated in the fine space void formed at the development and when the developer is discharged from the space void, the capillary force is imposed on the side wall of the pattern having a fine line width. In this connection, in the case of forming a positive pattern by using an alkali developer, the affinity of the pattern containing a resin as the main component for the alkali developer tends to be low and therefore, the capillary force imposed on the side wall of the pattern is large to readily cause pattern collapse.

On the other hand, in the case of forming a negative pattern by using an organic developer as in the present invention, the affinity of the pattern containing a resin as the main component for the organic developer tends to be high, and this is considered to reduce the capillary force imposed on the side wall of the pattern, hardly allow for generation of pattern collapse, and give excellent limiting resolution.

The residual film ratio of the resist film has a great effect on the later step (such as etching step and implanting step) and therefore, is preferably large. However, since the capillary force giving rise to pattern collapse is proportional to the area of the pattern side wall, there is a dilemma that as the residual film ratio of the finished pattern is larger (as the film loss amount is smaller), pattern collapse is more liable to occur.

In the system of obtaining a negative pattern by using an organic developer, the pattern obtained after development is the exposed area and therefore, physical properties of the exposed area are important.

According to the present invention, it is presumed that thanks to the presence of a repeating unit having a partial structure represented by formula (A0) in the exposed area (pattern area), the pattern strength after development is enhanced and in turn, both increase in the residual film ratio and inhibition of the pattern collapse can be satisfied.

Also, the present inventors have found that the partial structure represented by formula (A0) can enhance the sensitivity in exposure using an electron beam or an extreme ultraviolet ray (particularly, exposure using an extreme ultraviolet ray). The reason therefor is not clearly known but is presumed to be because the partial structure has a function of increasing the amount of acid generated upon exposure using an electron beam or an extreme ultraviolet ray.

(1) Film Formation

The resist film of the present invention is a film formed of the above-described electron beam-sensitive or extreme ultraviolet-sensitive resin composition.

More specifically, respective components described later of the electron beam-sensitive or extreme ultraviolet-sensitive resin composition are dissolved in a solvent, and the solution is filtered through a filter, if desired, and then coated on a support (substrate), whereby the resist film can be formed. The filter is preferably a polytetrafluoroethylene-, polyethylene- or nylon-made filter having a pore size of 0.1 μm or less, more preferably 0.05 μm or less, still more preferably 0.03 μm or less.

The composition is coated on such a substrate as used in the production of an integrated circuit device (for example, a silicon- or silicon dioxide-coated substrate) by an appropriate coating method such as spin coater and then dried to form a photosensitive film. In the drying stage, heating (prebaking) is preferably performed.

The film thickness is not particularly limited but is preferably adjusted to a range of 10 to 500 nm, more preferably from 10 to 200 nm, still more preferably from 10 to 80 nm. In the case of coating the electron beam-sensitive or extreme ultraviolet-sensitive resin composition by a spinner, the rotation speed of the spinner is usually from 500 to 3,000 rpm, preferably from 800 to 2,000 rpm, more preferably from 1,000 to 1,500 rpm.

The heating (prebaking) is preferably performed at a temperature of 60 to 200° C., more preferably at 80 to 150° C., still more preferably at 90 to 140° C.

The heating (prebaking) time is not particularly limited but is preferably from 30 to 300 seconds, more preferably from 30 to 180 seconds, still more preferably from 30 to 90 seconds.

The heating may be performed by means of a device usually attached to an exposure/developing machine or may be also performed using a hot plate or the like.

If desired, a commercially available inorganic or organic antireflection film may be used. Also, an antireflection film may be used by coating it as an underlying layer of the electron beam-sensitive or extreme ultraviolet-sensitive resin composition. The antireflection film which can be used may be either an inorganic film type such as titanium, titanium dioxide, titanium nitride, chromium oxide, carbon and amorphous silicon, or an organic film type composed of a light absorber and a polymer material. Furthermore, a commercially available organic antireflection film such as DUV30 Series and DUV-40 Series produced by Brewer Science, Inc., or AR-2, AR-3 and AR-5 produced by Shipley Co., Ltd., can be used as the organic antireflection film.

(2) Exposure

Exposure is performed using an extreme ultraviolet light (EUV light) or an electron beam (EB). In the case of using an exposure light source that emits an extreme ultraviolet ray (EUV light), the film formed is preferably irradiated with EUV light (near 13 nm) through a predetermined mask. In the case of irradiation with an electron beam (EB), lithography without the intervention of a mask (direct lithography) is the common practice. The exposure preferably uses an extreme ultraviolet ray.

(3) Baking

After the exposure, baking (heating) is preferably performed before performing development.

The heating is preferably performed at a temperature of 60 to 150° C., more preferably at 80 to 150° C., still more preferably at 90 to 140° C.

The heating time is not particularly limited but is preferably from 30 to 300 seconds, more preferably from 30 to 180 seconds, still more preferably from 30 to 90 seconds.

The heating may be performed by means of a device usually attached to an exposure/developing machine or may be also performed using a hot plate or the like.

The reaction of the exposed area is accelerated by the baking and in turn, the sensitivity or pattern profile is improved. It is also preferred to contain a heating step (postbaking) after the rinsing step. The heating temperature and the heating time are as described above. By the baking, the developer and rinsing solution remaining between patterns and in the inside of the pattern are removed.

(4) Development

In the present invention, development is performed using a developer containing an organic solvent.

Developer:

The vapor pressure of the developer (in the case of a mixed solvent, the entire vapor pressure) is, at 20° C., preferably 5 kPa or less, more preferably 3 kPa or less, still more preferably 2 kPa or less. By setting the vapor pressure of the organic solvent to 5 kPa or less, evaporation of the developer on a substrate or in a development cup is suppressed and the temperature uniformity in the wafer plane is enhanced, as a result, the dimensional uniformity in the wafer plane is improved.

As the organic solvent used for the developer, various organic solvents may be widely used but, for example, a solvent such as ester-based solvent, ketone-based solvent, alcohol-based solvent, amide-based solvent, ether-based solvent and hydrocarbon-based solvent may be used.

In the present invention, the ester-based solvent is a solvent having an ester group in the molecule; the ketone-based solvent is a solvent having a ketone group in the molecule; the alcohol-based solvent is a solvent having an alcoholic hydroxyl group in the molecule; the amide-based solvent is a solvent having an amide group in the molecule; and the ether-based solvent is a solvent having an ether bond in the molecule. Some of these solvents have a plurality of kinds of the above-described functional groups per molecule, and in such a case, the solvent comes under all of solvent species containing the functional group that is contained in the solvent. For example, diethylene glycol monomethyl ether comes under both of the alcohol-based solvent and the ether-based solvent in the categories above. Also, the hydrocarbon-based solvent means a hydrocarbon solvent not having a substituent.

Above all, a developer containing at least one kind of a solvent selected from a ketone-based solvent, an ester-based solvent, an alcohol-based solvent and an ether-based solvent is preferred.

Examples of the ester-based solvent include methyl acetate, ethyl acetate, butyl acetate, pentyl acetate, isopropyl acetate, amyl acetate, isoamyl acetate, ethyl methoxyacetate, ethyl ethoxyacetate, propylene glycol monomethyl ether acetate (PGMEA; another name: 1-methoxy-2-acetoxypropane), ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monoethyl ether acetate, diethylene glycol monophenyl ether acetate, diethylene glycol monobutyl ether acetate, diethylene glycol monoethyl ether acetate, 2-methoxybutyl acetate, 3-methoxybutyl acetate, 4-methoxybutyl acetate, 3-methyl-3-methoxybutyl acetate, 3-ethyl-3-methoxybutyl acetate, propylene glycol monoethyl ether acetate, propylene glycol monopropyl ether acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, propylene glycol diacetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, methyl 2-hydroxypropionate, ethyl 2-hydroxypropionate, methyl-3-methoxypropionate, ethyl-3-methoxypropionate, ethyl-3-ethoxypropionate and propyl-3-methoxypropionate.

Examples of the ketone-based solvent include 1-octanone, 2-octanone, 1-nonanone, 2-nonanone, acetone, 2-heptanone, 4-heptanone, 1-hexanone, 2-hexanone, diisobutyl ketone, cyclohexanone, methylcyclohexanone, phenylacetone, methyl ethyl ketone, methyl isobutyl ketone, acetylacetone, acetonylacetone, ionone, diacetonyl alcohol, acetylcarbinol, acetophenone, methyl naphthyl ketone, isophorone, propylene carbonate and γ-butyrolactone.

Examples of the alcohol-based solvent include an alcohol such as methyl alcohol, ethyl alcohol, n-propyl alcohol, isopropyl alcohol, n-butyl alcohol, sec-butyl alcohol, tert-butyl alcohol, isobutyl alcohol, n-hexyl alcohol, n-heptyl alcohol, n-octyl alcohol, n-decanol and 3-methoxy-1-butanol; a glycol-based solvent such as ethylene glycol, diethylene glycol and triethylene glycol; and a hydroxyl group-containing glycol ether-based solvent such as ethylene glycol monomethyl ether, propylene glycol monomethyl ether (PGME; another name: 1-methoxy-2-propanol), diethylene glycol monomethyl ether, triethylene glycol monoethyl ether, methoxymethyl butanol, ethylene glycol monoethyl ether, ethylene glycol monopropyl ether, ethylene glycol monobutyl ether, propylene glycol monoethyl ether, propylene glycol monopropyl ether, propylene glycol monobutyl ether and propylene glycol monophenyl ether. Among these, a glycol ether-based solvent is preferably used.

Examples of the ether-based solvent include, in addition to the hydroxyl group-containing glycol ether-based solvents above, a hydroxyl group-free glycol ether-based solvent such as propylene glycol dimethyl ether, propylene glycol diethyl ether, diethylene glycol dimethyl ether and diethylene glycol diethyl ether; an aromatic ether solvent such as anisole and phenetole; dioxane; tetrahydrofuran; tetrahydropyrane; perfluoro-2-butyltetrahydrofuran; perfluorotetrahydrofuran; and 1,4-dioxane. A glycol ether-based solvent or an aromatic ether solvent such as anisole is preferably used.

Examples of the amide-based solvent which can be used include N-methyl-2-pyrrolidone, N,N-dimethylacetamide, N,N-dimethylformamide, hexamethylphosphoric triamide and 1,3-dimethyl-2-imidazolidinone.

Examples of the hydrocarbon-based solvent include an aliphatic hydrocarbon-based solvent such as pentane, hexane, octane, decane, 2,2,4-trimethylpentane, 2,2,3-trimethylhexane, perfluorohexane and perfluoroheptane, and an aromatic hydrocarbon-based solvent such as toluene, xylene, ethylbenzene, propylbenzene, 1-methylpropylbenzene, 2-methylpropylbenzene, dimethylbenzene, diethylbenzene, ethylmethylbenzene, trimethylbenzene, ethyldimethylbenzene and dipropylbenzene. Among these, an aromatic hydrocarbon-based solvent is preferred.

A plurality of these solvents may be mixed, or the solvent may be mixed with a solvent other than those described above or water and used. However, in order to sufficiently bring out the effects of the present invention, the percentage of water content in the entire developer is preferably less than 10 mass %, and it is more preferred to contain substantially no water.

The concentration of the organic solvent (in the case of mixing a plurality of kinds of organic solvents, the total concentration) in the developer is preferably 50 mass % or more, more preferably 70 mass % or more, still more preferably 90 mass % or more. Above all, the developer is preferably composed of substantially only an organic solvent. The expression "composed of substantially only an organic solvent" encompasses a case containing a slight amount of a surfactant, an antioxidant, a stabilizer, a defoaming agent or the like.

Among the solvents above, it is more preferred to contain one or more selected from the group consisting of butyl acetate, pentyl acetate, isopentyl acetate, propylene glycol monomethyl ether acetate and anisole.

The organic solvent used as the developer may be suitably an ester-based solvent.

The ester-based solvent used here is preferably the later-described solvent represented by formula (S1) or the later-described solvent represented by formula (S2), more preferably the solvent represented by formula (S1), still more preferably an alkyl acetate, and most preferably butyl acetate, pentyl acetate or isopentyl acetate.

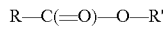   Formula (S1)

In formula (S1), each of R and R' independently represents a hydrogen atom, an alkyl group, a cycloalkyl group, an alkoxyl group, an alkoxycarbonyl group, a carboxyl group, a hydroxyl group, a cyano group or a halogen atom. R and R' may combine with each other to form a ring.

The carbon number of the alkyl group, alkoxy group and alkoxycarbonyl group of R and R' is preferably from 1 to 15, and the carbon number of the cycloalkyl group is preferably from 3 to 15.

Each of R and R' is preferably a hydrogen atom or an alkyl group, and the alkyl group, cycloalkyl group, alkoxyl group and alkoxycarbonyl group of R and R' and the ring formed by combining R and R' with each other may be substituted with a hydroxyl group, a carbonyl group-containing group (such as acyl group, aldehyde group and alkoxycarbonyl group), a cyano group or the like.

Examples of the solvent represented by formula (S1) include methyl acetate, butyl acetate, ethyl acetate, isopropyl acetate, amyl acetate, isoamyl acetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, methyl 2-hydroxypropionate and ethyl 2-hydroxypropionate.

Among these, a solvent where R and R' are an unsubstituted alkyl group is preferred.

The solvent represented by formula (S1) is preferably an alkyl acetate, more preferably butyl acetate, pentyl acetate or isopentyl acetate.

The solvent represented by formula (S1) may be used in combination with one or more other solvents. In this case, the solvent used in combination is not particularly limited as long as it can be mixed with the solvent represented by formula (S1) without causing separation, and the solvents represented by formula (S1) may be used in combination with each other or the solvent represented by formula (S1) may be used by mixing it with a solvent selected from other ester-based, ketone-based, alcohol-based, amide-based, ether-based and hydrocarbon-based solvents. As for the solvent used in combination, one or more species may be used but from the standpoint of obtaining a stable performance, one species is preferably used. In the case where one species of the solvent used in combination is mixed and used, the mixing ratio between the solvent represented by formula (S1) and the solvent used in combination is, in mass ratio, usually from 20:80 to 99:1, preferably from 50:50 to 97:3, more preferably from 60:40 to 95:5, and most preferably from 60:40 to 90:10.

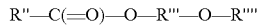   Formula (S2)

In formula (S2), each of R" and R"" independently represents a hydrogen atom, an alkyl group, a cycloalkyl group, an alkoxyl group, an alkoxycarbonyl group, a carboxyl group, a hydroxyl group, a cyano group or a halogen atom, and R" and R"" may combine with each other to form a ring.

Each of R" and R"" is preferably a hydrogen atom or an alkyl group. The carbon number of the alkyl group, alkoxyl group and alkoxycarbonyl group of R" and R"" is preferably from 1 to 15, and the carbon number of the cycloalkyl group is preferably from 3 to 15.

R'" represents an alkylene group or a cycloalkylene group. R'" is preferably an alkylene group. The carbon number of the alkylene group of R'" is preferably from 1 to 10, and the carbon number of the cycloalkylene group of R'" is preferably from 3 to 10.

The alkyl group, cycloalkyl group, alkoxyl group and alkoxycarbonyl group of R" and R"", the alkylene group and cycloalkylene group of R'", and the ring formed by combining R" and R"" with each other may be substituted with a hydroxyl group, a carbonyl group-containing group (such as acyl group, aldehyde group and alkoxycarbonyl group), a cyano group or the like.

In formula (S2), the alkylene group of R'" may have an ether bond in the alkylene chain.

Examples of the solvent represented by formula (S2) include propylene glycol monomethyl ether acetate, ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monophenyl ether acetate, diethylene glycol monobutyl ether acetate, diethylene glycol monoethyl ether acetate, propylene glycol monoethyl ether acetate, propylene glycol monopropyl ether acetate, methyl-3-methoxypropionate, ethyl-3-methoxypropionate, ethyl-3-ethoxypropionate, propyl-3-methoxypropionate, ethyl methoxyacetate, ethyl ethoxyacetate, 2-methoxybutyl acetate, 3-methoxybutyl acetate, 4-methoxybutyl acetate, 3-methyl-3-methoxybutyl acetate, 3-ethyl-3-methoxybutyl acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate and 4-methyl-4-methoxypentyl acetate, with propylene glycol monomethyl ether acetate being preferred.

Above all, a solvent where R" and R"" are an unsubstituted alkyl group and R'" is an unsubstituted alkylene group is preferred, a solvent where R" and R"" are either a methyl group or an ethyl group is more preferred, and a solvent where R" and R"" are a methyl group is still more preferred.

The solvent represented by formula (S2) may be used in combination with one or more other solvents. In this case, the solvent used in combination is not particularly limited as long as it can be mixed with the solvent represented by formula (S2) without causing separation, and the solvents represented by formula (S2) may be used in combination with each other or the solvent represented by formula (S2) may be used by mixing it with a solvent selected from other ester-based, ketone-based, alcohol-based, amide-based, ether-based and hydrocarbon-based solvents. As for the solvent used in combination, one or more species may be used but from the standpoint of obtaining a stable performance, one species is preferably used. In the case where one species of the solvent used in combination is mixed and used, the mixing ratio between the solvent represented by formula (S2) and the solvent used in combination is, in mass ratio, usually from 20:80 to 99:1, preferably from 50:50 to 97:3, more preferably from 60:40 to 95:5, and most preferably from 60:40 to 90:10.

The organic solvent used as the developer may be suitably an ether-based solvent.

The ether-based solvent which can be used includes the ether-based solvents described above. Among these, an ether-based solvent containing one or more aromatic rings is preferred, a solvent represented by the following formula (S3) is more preferred, and anisole is most preferred.

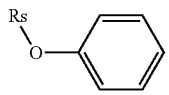

(S3)

In formula (S3), Rs represents an alkyl group. The alkyl group is preferably an alkyl group having a carbon number of 1 to 4, more preferably a methyl group or an ethyl group, and most preferably a methyl group.

In the present invention, the percentage of water content in the developer is usually 10 mass % or less, preferably 5 mass % or less, more preferably 1 mass % or less, and it is most preferred to contain substantially no water.

Surfactant:

In the developer containing an organic solvent, an appropriate amount of a surfactant can be added, if desired.

As the surfactant, the same as the later-described surfactant used in the electron beam-sensitive or extreme ultraviolet-sensitive resin composition may be used.

The amount of the surfactant used is usually from 0.001 to 5 mass %, preferably from 0.005 to 2 mass %, more preferably from 0.01 to 0.5 mass %, based on the entire amount of the developer (In this specification, mass ratio is equal to weight ratio).

Developing Method:

As the developing method, for example, a method of dipping the substrate in a bath filled with the developer for a fixed time (dipping method), a method of raising the developer on the substrate surface by the effect of a surface tension and keeping it still for a fixed time, thereby performing the development (puddle method), a method of spraying the developer on the substrate surface (spraying method), and a method of continuously ejecting the developer on the substrate spinning at a constant speed while scanning the developer ejecting nozzle at a constant rate (dynamic dispense method) may be applied.

Also, after the step of performing development, a step of stopping the development while replacing the developer with another solvent may be practiced.

The development time is not particularly limited as long as it is long enough to sufficiently dissolve the resin of the unexposed area, and the development time is usually from 10 to 300 seconds, preferably from 20 to 120 seconds.

The temperature of the developer is preferably from 0 to 50° C., more preferably from 15 to 35° C.

(5) Rinsing

The pattern forming method of the present invention may contain (5) a step of rinsing the film by using a rinsing solution containing an organic solvent, after the development step (4).

Rinsing Solution:

The vapor pressure of the rinsing solution (in the case of a mixed solvent, the entire vapor pressure) used after development is, at 20° C., preferably from 0.05 to 5 kPa, more preferably from 0.1 to 5 kPa, and most preferably from 0.12 to 3 kPa. By setting the vapor pressure of the rinsing solution to from 0.05 to 5 kPa, the temperature uniformity in the wafer plane is enhanced and swelling ascribable to permeation of the rinsing solution is suppressed, as a result, the dimensional uniformity in the wafer plane is improved.

As the rinsing solution, various organic solvents may be used, but it is preferred to use a rinsing solution containing at least one kind of an organic solvent selected from a hydrocarbon-based solvent, a ketone-based solvent, an ester-based solvent, an alcohol-based solvent, an amide-based solvent and an ether-based solvent, or water.

More preferably, a step of washing the film by using a rinsing solution containing at least one kind of an organic solvent selected from a ketone-based solvent, an ester-based solvent, an alcohol-based solvent, an amide-based solvent and a hydrocarbon-based solvent is preformed after development. Still more preferably, a step of washing the film by using a rinsing solution containing an alcohol-based solvent or a hydrocarbon-based solvent is preformed after development.

In particular, a rinsing solution containing at least one or more organic solvents selected from the group consisting of a monohydric alcohol-based solvent and a hydrocarbon-based solvent is preferably used.

The monohydric alcohol used in the rinsing step after development includes a linear, branched or cyclic monohydric alcohol, and specific examples of the monohydric alcohol which can be used include 1-butanol, 2-butanol, 3-methyl-1-butanol, tert-butyl alcohol, 1-pentanol, 2-pentanol, 1-hexanol, 1-heptanol, 1-octanol, 2-hexanol, 2-heptanol, 2-octanol, 3-hexanol, 3-heptanol, 3-octanol, 4-octanol, 3-methyl-3-pentanol, cyclopentanol, 2,3-dimethyl-2-butanol, 3,3-dimethyl-2-butanol, 2-methyl-2-pentanol, 2-methyl-3-pentanol, 3-methyl-2-pentanol, 3-methyl-3-pentanol, 4-methyl-2-pentanol, 4-methyl-3-pentanol, cyclohexanol, 5-methyl-2-hexanol, 4-methyl-2-hexanol, 4,5-dimethyl-2-hexanol, 6-methyl-2-heptanol, 7-methyl-2-octanol, 8-methyl-2-nonanol, and 9-methyl-2-decanol. Of these, 1-hexanol, 2-hexanol, 1-pentanol, 3-methyl-1-butanol, 3-methyl-2-pentanol, 3-methyl-3-pentanol, 4-methyl-2-pentanol and 4-methyl-3-pentanol are preferred, and 1-hexanol and 4-methyl-2-pentanol are most preferred.

The hydrocarbon-based solvent includes an aromatic hydrocarbon-based solvent such as toluene and xylene, and an aliphatic hydrocarbon-based solvent such as octane and decane.

The rinsing solution preferably contains one or more solvents selected from 1-hexanol, 4-methyl-2-pentanol and decane.

As for these components, a plurality of components may be mixed, or the component may be used by mixing it with an organic solvent other than those described above. The above-described solvent may be mixed with water, but the percentage of water content in the rinsing solution is usually 60 mass % or less, preferably 30 mass % or less, more preferably 10 mass % or less, and most preferably 5 mass % or less. By setting the percentage of water content to 60 mass % or less, good rinsing characteristics can be obtained.

The rinsing solution may be also used after adding thereto an appropriate amount of a surfactant.

As the surfactant, the same as the later-described surfactant used in the electron beam-sensitive or extreme ultraviolet-sensitive resin composition may be used, and the amount used thereof is usually from 0.001 to 5 mass %, preferably from 0.005 to 2 mass %, more preferably from 0.01 to 0.5 mass %, based on the entire amount of the rinsing solution.

Rinsing Method:

In the rinsing step, the developed wafer is washed using the above-described rinsing solution containing an organic solvent.

The method for washing treatment is not particularly limited but, for example, a method of continuously ejecting the rinsing solution on the substrate spinning at a constant speed (spin ejection method), a method of dipping the substrate in a bath filled with the rinsing solution for a fixed time (dipping method), and a method of spraying the rinsing solution on the substrate surface (spraying method) may be applied. Above all, a method where the washing treatment is performed by the spin ejection method and after the washing, the rinsing solution is removed from the substrate surface by spinning the substrate at a rotation speed of 2,000 to 4,000 rpm, is preferred.

The rinsing time is not particularly limited but is usually from 10 to 300 seconds, preferably from 10 to 180 seconds, and most preferably from 20 to 120 seconds.

The temperature of the rinsing solution is preferably from 0 to 50° C., more preferably from 15 to 35° C.

After the development or rinsing, a treatment of removing the developer or rinsing solution adhering on the pattern with a supercritical fluid may be performed.

Furthermore, after the development, rinsing or treatment with a supercritical fluid, a heating treatment for removing the solvent remaining in the pattern may be performed. The heating temperature is not particularly limited as long as a good resist pattern can be obtained, but the heating temperature is usually from 40 to 160° C., preferably from 50 to 150° C., and most preferably from 50 to 110° C. The heating time is not particularly limited as long as a good resist pattern can be obtained, but the heating time is usually from 15 to 300 seconds, preferably from 15 to 180 seconds.

Alkali Development:

The pattern forming method of the present invention may further include a step of performing development by using an aqueous alkali solution to form a resist pattern (alkali development step), and by this development, a finer pattern can be formed.

In the present invention, the portion of low exposure intensity is removed by the organic solvent development step (4), and by further performing the alkali development step, the portion of high exposure intensity is also removed. By the multiple development process of performing development a plurality of times in this way, a pattern can be formed by keeping only the region of intermediate exposure intensity from being dissolved, so that a finer pattern than usual can be formed (the same mechanism as disclosed in [0077] of JP-A-2008-292975).

The alkali development may be performed either before or after the step (4) of performing the development by using a developer containing an inorganic solvent but is preferably performed before the organic solvent development step (4).

Examples of the aqueous alkali solution which can be used for alkali development include an alkaline aqueous solution of inorganic alkalis such as sodium hydroxide, potassium hydroxide, sodium carbonate, sodium silicate, sodium metasilicate and aqueous ammonia, primary amines such as ethylamine and n-propylamine, secondary amines such as diethylamine and di-n-butylamine, tertiary amines such as triethylamine and methyldiethylamine, alcohol amines such as dimethylethanolamine and triethanolamine, quaternary ammonium salts such as tetramethylammonium hydroxide and tetraethylammonium hydroxide, or cyclic amines such as pyrrole and piperidine.

The alkaline aqueous solution above may be also used after adding thereto alcohols and a surfactant each in an appropriate amount.

The alkali concentration of the alkali developer is usually from 0.1 to 20 mass %.

The pH of the alkali developer is usually from 10.0 to 15.0.

In particular, an aqueous solution of 2.38 mass % tetramethylammonium hydroxide is preferred.

The alkali development time is not particularly limited and is usually from 10 to 300 seconds, preferably from 20 to 120 seconds.

The temperature of the alkali developer is preferably from 0 to 50° C., more preferably from 15 to 35° C.

As the development using an aqueous alkali solution, a rinsing treatment may be performed. The rinsing solution in the rinsing treatment is preferably pure water, and the rinsing solution may be also used after adding thereto an appropriate amount of a surfactant.

Also, after the development or rinsing, a heating treatment to remove the water remaining in the pattern may be performed.

Furthermore, a treatment of removing the remaining developer or rinsing solution by heating may be performed. The heating temperature is not particularly limited as long as a good resist pattern can be obtained, but the heating temperature is usually from 40 to 160° C., preferably from 50 to 150° C., and most preferably from 50 to 110° C. The heating time is not particularly limited as long as a good resist pattern can be obtained, but the heating time is usually from 15 to 300 seconds, preferably from 15 to 180 seconds.

With respect to the film formed from the resist composition of the present invention, the exposure may be also performed by filling a liquid (immersion medium) having a refractive index higher than that of air between the film and a lens at the irradiation with an actinic ray or radiation (immersion exposure). By this exposure, the resolution can be enhanced. The immersion medium used may be any liquid as long as it has a refractive index higher than that of air, but pure water is preferred.

The immersion liquid used in the immersion exposure is described below.

The immersion liquid is preferably a liquid being transparent to light at the exposure wavelength and having as small a temperature coefficient of refractive index as possible so as to minimize the distortion of an optical image projected on the resist film, and water is preferably used in view of easy availability and easy handleability in addition to the above-described aspects.

Furthermore, a medium having a refractive index of 1.5 or more can be also used from the standpoint that the refractive index can be more enhanced. This medium may be either an aqueous solution or an organic solvent.

In the case of using water as the immersion liquid, for the purpose of decreasing the surface tension of water and increasing the surface activity, an additive (liquid) which does not dissolve the resist film on a wafer and at the same time, gives only a negligible effect on the optical coat at the undersurface of the lens element, may be added in a small ratio. The additive is preferably an aliphatic alcohol having a refractive index nearly equal to that of water, and specific examples thereof include methyl alcohol, ethyl alcohol and isopropyl alcohol. By virtue of adding an alcohol having a refractive index nearly equal to that of water, even when the alcohol component in water is evaporated and its content concentration is changed, the change in the refractive index of the entire liquid can be advantageously made very small. On the other hand, if an impurity greatly differing in the refractive index from water is mixed, this incurs distortion of the optical image projected on the resist film. Therefore, the water used is preferably distilled water. Pure water obtained by further filtering the distilled water through an ion exchange filter or the like may be also used.

The electrical resistance of water is preferably 18.3 MΩcm or more, and TOC (total organic carbon) is preferably 20 ppb or less. Also, the water is preferably subjected to a deaeration treatment.

The lithography performance can be enhanced by elevating the refractive index of the immersion liquid. From such a standpoint, an additive for elevating the refractive index may be added to water, or heavy water ($D_2O$) may be used in place of water.

In order to prevent the film from directly contacting with the immersion liquid, a film (hereinafter, sometimes referred to as a "topcoat") sparingly soluble in the immersion liquid may be provided between the film formed of the composition of the present invention and the immersion liquid. The functions required of the topcoat are suitability for coating as an overlayer of the composition film and sparing solubility in the immersion liquid. The topcoat is preferably unmixable with the composition film and capable of being uniformly coated as an overlayer of the composition film.

Specific examples of the topcoat include a hydrocarbon polymer, an acrylic acid ester polymer, a polymethacrylic acid, a polyacrylic acid, a polyvinyl ether, a silicon-containing polymer and a fluorine-containing polymer. If an impurity is dissolved out into the immersion liquid from the topcoat, the optical lens is contaminated. In this viewpoint, the amount of residual monomer components of the polymer contained in the topcoat is preferably smaller.

On peeling off the topcoat, a developer may be used or a releasing agent may be separately used. The releasing agent is preferably a solvent hardly permeating the film. From the standpoint that the peeling step can be performed simultaneously with the development step of the film, the topcoat is preferably peelable with an organic solvent-containing developer.

With no difference in the refractive index between the topcoat and the immersion liquid, the resolution is enhanced. In the case of using water as the immersion liquid, the topcoat preferably has a refractive index close to that of the immersion liquid. From the standpoint of having a refractive index close to that of the immersion liquid, the topcoat preferably contains a fluorine atom. Also, in view of transparency and refractive index, the topcoat is preferably a thin film.

The topcoat is preferably unmixable with the film and further unmixable with the immersion liquid. From this standpoint, when the immersion liquid is water, the solvent used for the topcoat is preferably a medium that is sparingly soluble in the solvent used for the composition of the present invention and at the same time, is insoluble in water. In the case where the immersion liquid is an organic solvent, the topcoat may be either water-soluble or water-insoluble.

[1] Electron Beam-Sensitive or Extreme Ultraviolet-Sensitive Resin Composition

The electron beam-sensitive or extreme ultraviolet-sensitive resin composition which can be used in the present invention is described below.

The electron beam-sensitive or extreme ultraviolet-sensitive resin composition according to the present invention is used for negative development (development where the solubility for developer is decreased when exposed, as a result, the exposed area remains as a pattern and the unexposed area is removed). That is, the electron beam-sensitive or extreme ultraviolet-sensitive resin composition according to the present invention can be an electron beam-sensitive or extreme ultraviolet-sensitive resin composition for organic solvent development, which is used for development using an organic solvent-containing developer. The "for organic solvent development" as used herein means usage where the composition is subjected to at least a step of performing development by using an organic solvent-containing developer.

In this way, the present invention also relates to the electron beam-sensitive or extreme ultraviolet-sensitive resin composition for used for the pattern forming method described above.

The electron beam-sensitive or extreme ultraviolet-sensitive resin composition of the present invention is typically a resist composition and is preferably a negative resist composition (that is, a resist composition for organic solvent development), because particularly high effects can be obtained. The composition according to the present invention is typically a chemical amplification resist composition.

The composition for use in the present invention contains (A) a resin that contains a repeating unit having a partial structure represented by formula (A0) and can decrease the solubility for a developer containing an organic solvent by the action of an acid (hereinafter, sometimes simply referred to as "resin (A)"), and (B) a compound capable of generating an acid upon irradiation with an electron beam or an extreme ultraviolet ray. The resin (A) is described below.

[1] Resin (A)

The resin (A) for use in the present invention contains a repeating unit having a partial structure represented by formula (A0).

In formula (A0), the aromatic ring group Ar bonded directly or indirectly to the main chain of the resin (A) may have a substituent, and preferred examples thereof include an aromatic ring group having a carbon number of 6 to 18, such as benzene ring group, methylbenzene ring group, naphthalene ring group and anthracene ring group, and an aromatic ring group containing a heterocyclic ring such as pyridine, thiophene, furan, pyrrole, benzothiophene, benzofuran, benzopyrrole, triazine, imidazole, benzimidazole, triazole, thiadiazole and thiazole.

p is preferably 1 or 2.

Ra is preferably a group capable of leaving by the action of an acid.

Examples of the group capable of leaving by the action of an acid include —C($R_{36}$)($R_{37}$)($R_{38}$), —C(=O)—O—C($R_{36}$)($R_{37}$)($R_{38}$), —C($R_{01}$)($R_{02}$)(O$R_{39}$), —C($R_{01}$)($R_{02}$)—C(=O)—O—C($R_{36}$)($R_{37}$)($R_{38}$) and —CH($R_{36}$)(Ar$_a$).

In the formulae, each of $R_{36}$ to $R_{39}$ independently represents an alkyl group, a cycloalkyl group, a monovalent aromatic ring group, a group formed by combining an alkylene group and a monovalent aromatic ring group, or an alkenyl group. $R_{36}$ and $R_{37}$ may combine with each other to form a ring.

Each of $R_{01}$ and $R_{02}$ independently represents a hydrogen atom, an alkyl group, a cycloalkyl group, a monovalent aromatic ring group, a group formed by combining an alkylene group and a monovalent aromatic ring group, or an alkenyl group.

Ar$_a$ represents a monovalent aromatic ring group.

The alkyl group of $R_{36}$ to $R_{39}$, $R_{01}$ and $R_{02}$ is preferably an alkyl group having a carbon number of 1 to 8, and examples thereof include a methyl group, an ethyl group, a propyl group, an n-butyl group, a sec-butyl group, a hexyl group and an octyl group.

The cycloalkyl group of $R_{36}$ to $R_{39}$, $R_{01}$ and $R_{02}$ may be monocyclic or polycyclic. The monocyclic cycloalkyl group is preferably a cycloalkyl group having a carbon number of 3 to 8, and examples thereof include a cyclopropyl group, a cyclobutyl group, a cyclopentyl group, a cyclohexyl group and a cyclooctyl group. The polycyclic cycloalkyl group is preferably a cycloalkyl group having a carbon number of 6 to 20, and examples thereof include an adamantyl group, a norbornyl group, an isoboronyl group, a camphanyl group, a dicyclopentyl group, an α-pinel group, a tricyclodecanyl group, a tetracyclododecyl group and an androstanyl group. Incidentally, a part of carbon atoms in the cycloalkyl group may be substituted with a heteroatom such as oxygen atom.

The monovalent aromatic ring group of $R_{36}$ to $R_{39}$, $R_{01}$, $R_{02}$ and $Ar_a$ is preferably a monovalent aromatic ring group having a carbon number of 6 to 10, and examples thereof include an aryl group such as phenyl group, naphthyl group and anthryl group, and a divalent aromatic ring group containing a heterocyclic ring such as thiophene, furan, pyrrole, benzothiophene, benzofuran, benzopyrrole, triazine, imidazole, benzimidazole, triazole, thiadiazole and thiazole.

The group formed by combining an alkylene group and a monovalent aromatic ring group of $R_{36}$ to $R_{39}$, $R_{01}$ and $R_{02}$ is preferably an aralkyl group having a carbon number of 7 to 12, and examples thereof include a benzyl group, a phenethyl group and a naphthylmethyl group.

The alkenyl group of $R_{36}$ to $R_{39}$, $R_{01}$ and $R_{02}$ is preferably an alkenyl group having a carbon number of 2 to 8, and examples thereof include a vinyl group, an allyl group, a butenyl group and a cyclohexenyl group.

The ring formed by combining $R_{36}$ and $R_{37}$ with each other may be monocyclic or polycyclic. The monocyclic ring structure is preferably a cycloalkyl structure having a carbon number of 3 to 8, and examples thereof include a cyclopropane structure, a cyclobutane structure, a cyclopentane structure, a cyclohexane structure, a cycloheptane structure and a cyclooctane structure. The polycyclic ring structure is preferably a cycloalkyl structure having a carbon number of 6 to 20, and examples thereof include an adamantane structure, a norbornane structure, a dicyclopentane structure, a tricyclodecane structure and a tetracyclododecane structure. Incidentally, a part of carbon atoms in the cycloalkyl structure may be substituted with a heteroatom such as oxygen atom.

Each of the groups above as $R_{36}$ to $R_{39}$, $R_{01}$, $R_{02}$ and $Ar_a$ may have a substituent, and examples of the substituent include an alkyl group, a cycloalkyl group, an aryl group, an amino group, an amido group, a ureido group, a urethane group, a hydroxyl group, a carboxyl group, a halogen atom, an alkoxy group, a thioether group, an acyl group, an acyloxy group, an alkoxycarbonyl group, a cyano group and a nitro group. The carbon number of the substituent is preferably 8 or less.

The group capable of leaving by the action of an acid is more preferably a structure represented by the following formula (VI-A):

(VI-A)

In the formula, each of $L_1$ and $L_2$ independently represents a hydrogen atom, an alkyl group, a cycloalkyl group, a monovalent aromatic ring group, or a group formed by combining an alkylene group and a monovalent aromatic ring group.

M represents a single bond or a divalent linking group.

Q represents an alkyl group, a cycloalkyl group which may contain a heteroatom, a monovalent aromatic ring group which may contain a heteroatom, an amino group, an ammonium group, a mercapto group, a cyano group or an aldehyde group.

At least two members of Q, M and $L_1$ may combine with each other to form a ring (preferably a 5- or 6-membered ring).

The alkyl group as $L_1$ and $L_2$ is, for example, an alkyl group having a carbon number of 1 to 8, and specific preferred examples thereof include a methyl group, an ethyl group, a propyl group, an n-butyl group, a sec-butyl group, a hexyl group and an octyl group.

The cycloalkyl group as $L_1$ and $L_2$ is, for example, a cycloalkyl group having a carbon number of 3 to 15, and specific preferred examples thereof include a cyclopentyl group, a cyclohexyl group, a norbornyl group and an adamantyl group.

The monovalent aromatic ring group as $L_1$ and $L_2$ is, for example, an aryl group having a carbon number of 6 to 15, and specific preferred examples thereof include a phenyl group, a tolyl group, a naphthyl group and an anthryl group.

The group formed by combining an alkylene group and a monovalent aromatic ring group as $L_1$ and $L_2$ is, for example, an aralkyl group having a carbon number of 6 to 20, such as benzyl group and phenethyl group.

Examples of the divalent linking group as M include an alkylene group (such as methylene group, ethylene group, propylene group, butylene group, hexylene group and octylene group), a cycloalkylene group (such as cyclopentylene group, cyclohexylene group and adamantylene group), an alkenylene group (such as ethenylene group, propenylene group and butenylene group), a divalent aromatic ring group (such as phenylene group, tolylene group and naphthylene group), —S—, —O—, —CO—, —SO₂—, —N(R₀)—, and a divalent linking group formed by combining a plurality thereof. Here, $R_0$ is a hydrogen atom or an alkyl group (for example, an alkyl group having a carbon number of 1 to 8, and specific examples thereof include a methyl group, an ethyl group, a propyl group, an n-butyl group, a sec-butyl group, a hexyl group and an octyl group).

Examples of the alkyl group as Q are the same as those of the alkyl group described above for $L_1$ and $L_2$.

Examples of the heteroatom-free aliphatic hydrocarbon ring group and the heteroatom-free monovalent aromatic ring group in the cycloalkyl group which may contain a heteroatom and the monovalent aromatic ring group which may contain a heteroatom as Q include the cycloalkyl group and monovalent aromatic ring group described above for $L_1$ and $L_2$, and the carbon number is preferably from 3 to 15.

Examples of the heteroatom-containing alicyclic group and the heteroatom-containing monovalent aromatic ring group include a group having a heterocyclic structure such as thiirane, cyclothiolane, thiophene, furan, pyrrole, benzothiophene, benzofuran, benzopyrrole, triazine, imidazole, benzimidazole, triazole, thiadiazole, thiazole and pyrrolidone, but the heterocyclic structure is not limited thereto as long as it is a structure generally called a heterocyclic ring (a ring composed of carbon and a heteroatom, or a ring composed of a heteroatom).

Examples of the ring which may be formed by combining at least two members of Q, M and $L_1$ include an oxygen atom-containing 5- or 6-membered ring formed by combining at least two members of Q, M and $L_1$ and thereby forming, for example, a propylene group or a butylene group.

In formula (VI-A), each of the groups represented by $L_1$, $L_2$, M and Q may have a substituent, and examples of the substituent include those described above as the substituent which $R_{36}$ to $R_{39}$, $R_{01}$, $R_{02}$ and $Ar_a$ may have. The carbon number of the substituent is preferably 8 or less.

The group represented by -M-Q is preferably a group having a carbon number of 1 to 30, more preferably a group having a carbon number of 5 to 20.

In the present invention, the repeating unit having a partial structure represented by formula (A0) is preferably a repeating unit represented by the following formula (A1):

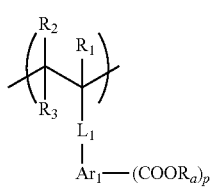

(A1)

In the formula, each of $R_1$, $R_2$ and $R_3$ independently represents a hydrogen atom, an alkyl group, a cycloalkyl group, a halogen atom, a cyano group or an alkoxycarbonyl group, $R_3$ may combine with $L_1$ or $Ar_1$ to form a ring, and in this case, $R_3$ represents an alkylene group.

$L_1$ represents a single bond or a divalent linking group.

$Ar_1$ represents a (p+1)-valent aromatic ring group and in the case of combining with $R_3$ to form a ring, $Ar_1$ represents a (p+2)-valent aromatic ring group.

Ra represents a hydrogen atom or a group capable of leaving by the action of an acid.

p represents an integer of 1 to 4, and when a plurality of Ra's are present, each Ra may be the same as or different from every other Ra.

The alkyl group of $R_1$ to $R_3$ in formula (A1) is preferably an alkyl group having a carbon number of 20 or less, such as methyl group, ethyl group, propyl group, isopropyl group, n-butyl group, sec-butyl group, hexyl group, 2-ethylhexyl group, octyl group and dodecyl group, which may have a substituent. The alkyl group is more preferably an alkyl group having a carbon number of 8 or less, still more preferably an alkyl group having a carbon number of 3 or less.

As the alkyl group contained in the alkoxycarbonyl group, the same as the alkyl group in $R_1$ to $R_3$ is preferred.

The cycloalkyl group may be either monocyclic or polycyclic. The cycloalkyl group is preferably a monocyclic cycloalkyl group having a carbon number of 3 to 8, such as cyclopropyl group, cyclopentyl group and cyclohexyl group, which may have a substituent.

The halogen atom includes a fluorine atom, a chlorine atom, a bromine atom and an iodine atom, with a fluorine atom being preferred.

In formula (A1), each of $R_1$ and $R_2$ is preferably a hydrogen atom, an alkyl group or a halogen atom, more preferably a hydrogen atom, a methyl group, an ethyl group, a trifluoromethyl group (—$CF_3$), a hydroxymethyl group (—$CH_2$—OH), a chloromethyl group (—$CH_2$—Cl) or a fluorine atom (—F). $R_3$ is preferably a hydrogen atom, an alkyl group, a halogen atom or an alkylene group (forms a ring with $L_1$), more preferably a hydrogen atom, a methyl group, an ethyl group, a trifluoromethyl group (—$CF_3$), a hydroxymethyl group (—$CH_2$—OH), a chloromethyl group (—$CH_2$—Cl), a fluorine atom (—F), a methylene group (forms a ring with $L_1$) or an ethylene group (forms a ring with $L_1$).

In the case where $R_3$ is an alkylene group and forms a ring with $L_1$, the alkylene group is preferably an alkylene group having a carbon number of 1 to 8, such as methylene group, ethylene group, propylene group, butylene group, hexylene group and octylene group, more preferably an alkylene group having a carbon number of 1 to 4, still more preferably an alkylene group having a carbon number of 1 or 2. The ring formed by combining $R_3$ and $L_1$ may be monocyclic or polycyclic and is preferably a 5- or 6-membered ring.

Examples of the divalent linking group represented by $L_1$ include —COO—, —OCO—, an alkylene group, a divalent aromatic ring group, —COO—La—, —O—La—, and a group formed by combining two or more thereof. Here, La represents an alkylene group, a cycloalkylene group, a divalent aromatic ring group, and a group formed by combining an alkylene group and a divalent aromatic ring group.

$L_1$ is preferably a single bond, —COO—, —OCO—, —COO—La— or —OCO—La— (wherein La represents an alkylene group, a cycloalkylene group or a divalent aromatic ring group).

La is preferably an alkylene group having a carbon number of 1 to 5, more preferably a methylene group or a propylene group. The divalent aromatic ring group is preferably a 1,4-phenylene group, a 1,3-phenylene group, a 1,2-phenylene group or a 1,4-naphthylene group, more preferably a 1,4-phenylene group.

With respect to the (p+1)-valent aromatic ring group $Ar_1$, the divalent aromatic ring group when p is 1 may have a substituent, and preferred examples of the aromatic ring group include an arylene group having a carbon number of 6 to 18, such as phenylene group, tolylene group, naphthylene group and anthracenylene group, and an aromatic ring group containing a heterocyclic ring such as pyridine, thiophene, furan, pyrrole, benzothiophene, benzofuran, benzopyrrole, triazine, imidazole, benzimidazole, triazole, thiadiazole and thiazole.

Specific examples of the (p+1)-valent aromatic ring group when p is an integer of 2 or more suitably include groups formed by removing arbitrary (p−1) hydrogen atoms from the above-described specific examples of the divalent aromatic ring group.

The (p+1)-valent aromatic ring group may further have a substituent.

The (p+1)-valent aromatic ring group $Ar_1$ is preferably an aromatic ring group having a carbon number of 6 to 18, which may have a substituent, and preferred examples thereof include a phenylene group and a naphthylene group.

Examples of the substituent which the alkyl group, cycloalkyl group, alkoxycarbonyl group, alkylene group and (p+1)-valent aromatic ring group above may have include an alkyl group, a cycloalkyl group, an aryl group, an amino group, an amido group, a ureido group, a urethane group, a hydroxyl group, a carboxyl group, a halogen atom, an alkoxy group, a thioether group, an acyl group, an acyloxy group, an alkoxycarbonyl group, a cyano group and a nitro group. The carbon number of the substituent is preferably 8 or less.

Ra is preferably a group capable of leaving by the action of an acid.

Specific examples and preferred examples of the group capable of leaving by the action of an acid of Ra are the same as those described for Ra in formula (A0).

p is preferably 1 or 2.

As for the repeating unit having a partial structure represented by formula (A0) or the repeating unit represented by formula (A1), one kind may be used or two or more kinds may be used in combination.

The content of the repeating unit having a partial structure represented by formula (A0) or the repeating unit represented by formula (A1) (in the case of containing a plurality of kinds of compounds, the total content) is preferably from 10 to 80 mol %, more preferably from 20 to 75 mol %, still more preferably from 30 to 70 mol %, based on all repeating units in the resin (A).

Specific examples of the repeating unit having a partial structure represented by formula (A0) and the repeating unit represented by formula (A1), where Ra is a group capable of leaving by the action of an acid, are illustrated below, but the present invention is not limited thereto.

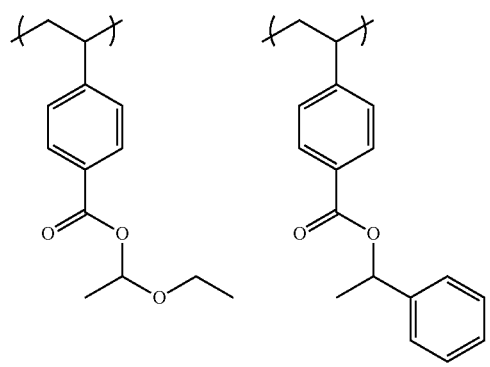

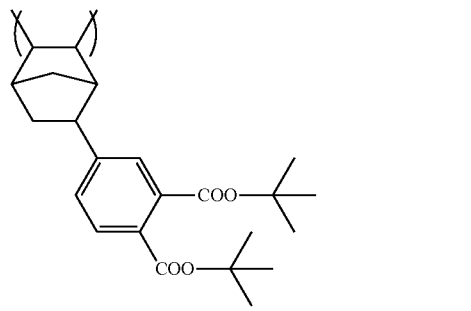

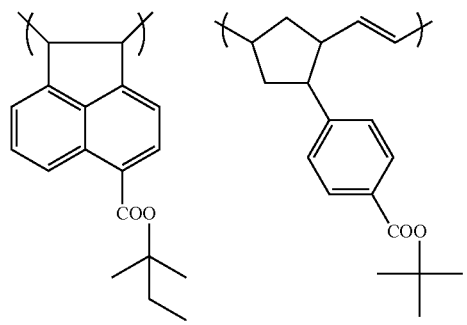

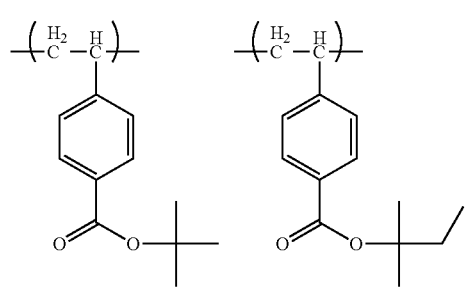

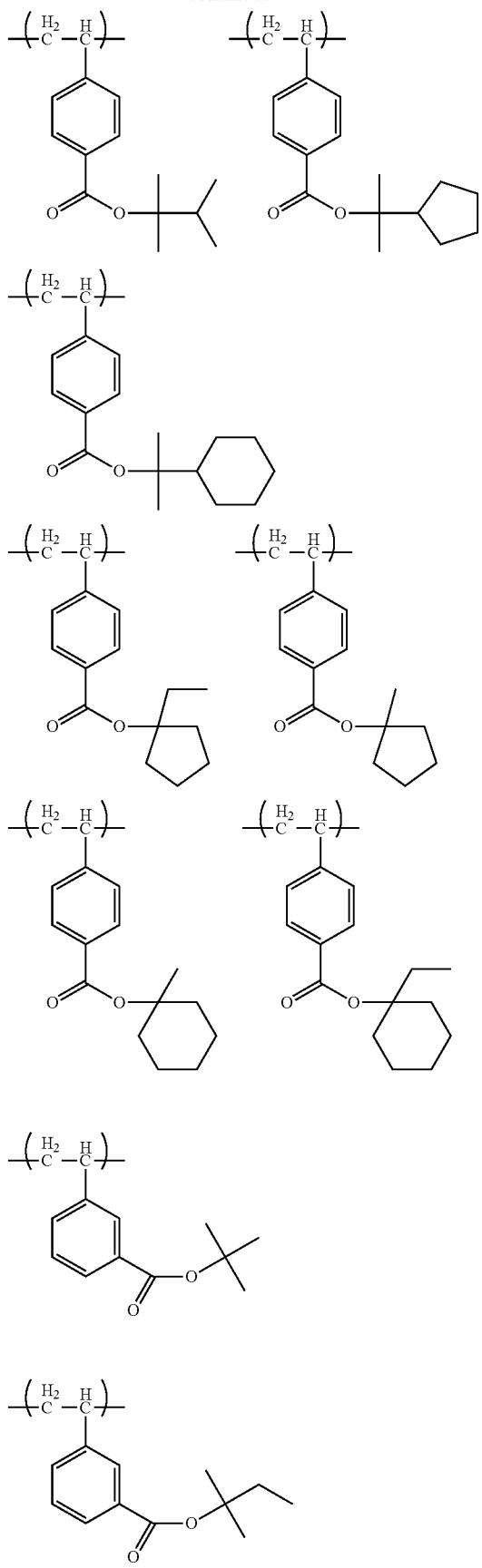

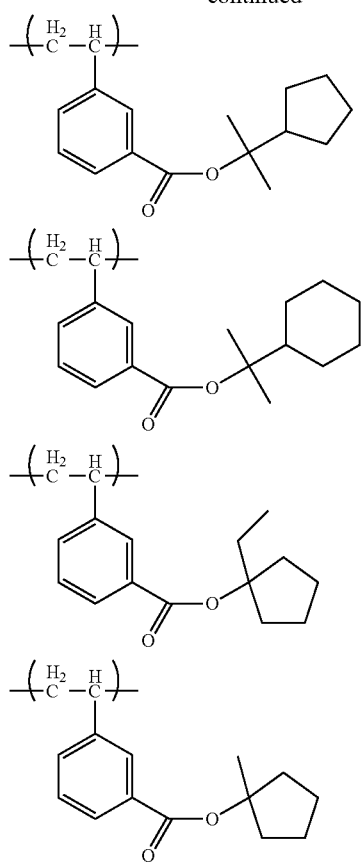
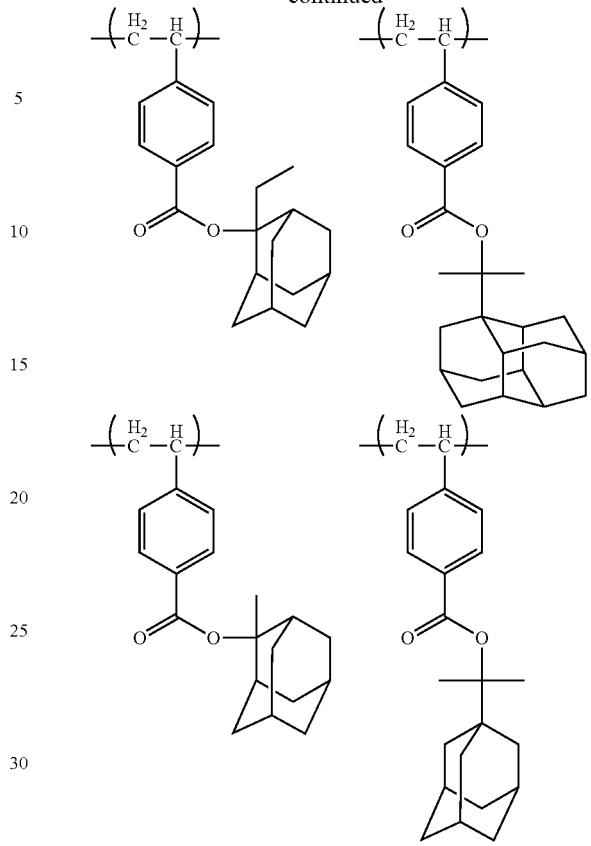
Specific examples of the repeating unit having a partial structure represented by formula (A0) and the repeating unit represented by formula (A1), where Ra is a hydrogen atom, are illustrated below, but the present invention is not limited thereto.
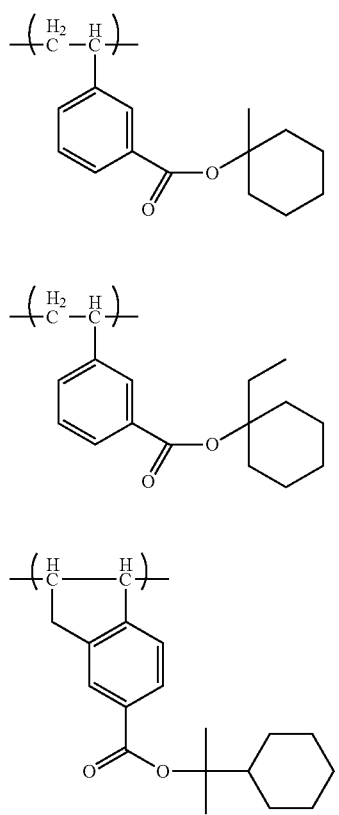
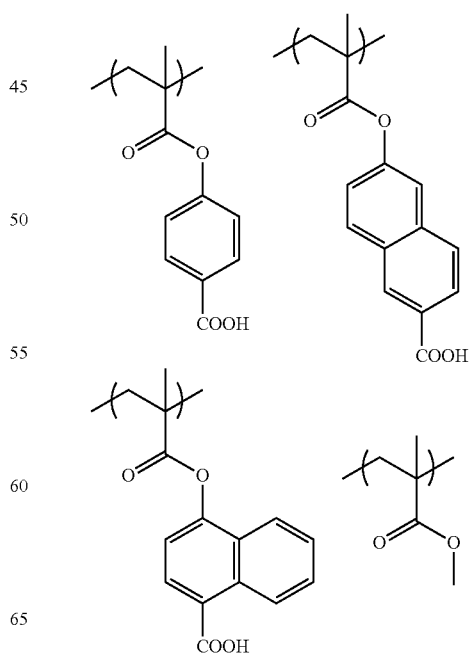

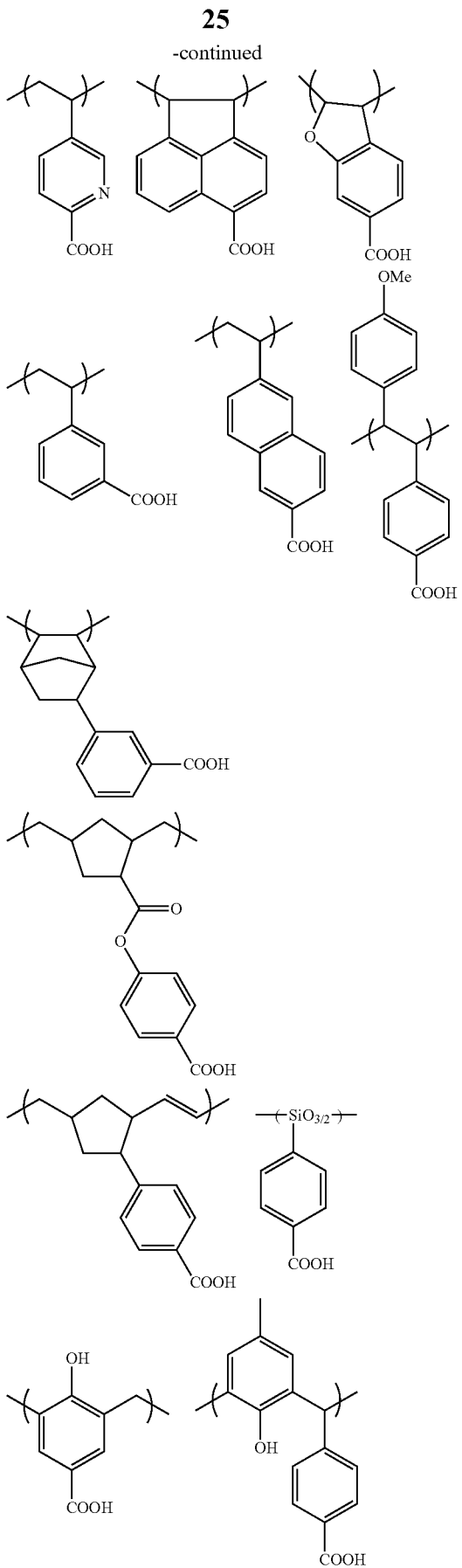
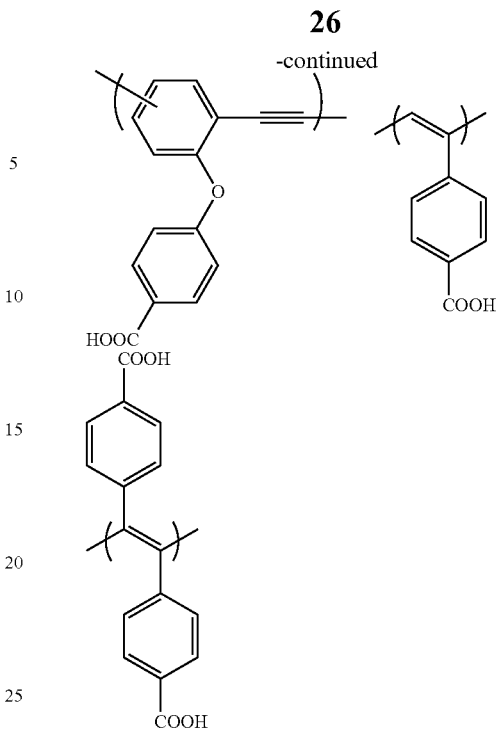

(a) Repeating Unit Having Acid-Decomposable Group

From the standpoint of imparting a function capable of decreasing the solubility for an organic solvent-containing developer by the action of an acid to the resin (A), when Ra in formula (A0) or formula (A1) is a hydrogen atom, the resin (A) contains (a) an acid-decomposable repeating unit.

Also, when Ra in formula (A0) or formula (A1) is a group capable of leaving by the action of an acid, the repeating unit represented by formula (A0) or formula (A1) functions by itself as an acid-decomposable repeating unit and therefore, the resin may or may not contain the acid-decomposable repeating unit (a).

Here, the acid-decomposable repeating unit is, for example, a repeating unit having a group capable of decomposing by the action of an acid (hereinafter sometimes referred to as "acid-decomposable group"), on either one or both of the main chain and the side chain of the resin. The group produced by the decomposition is preferably a polar group, because the affinity for an organic solvent-containing developer is reduced and insolubilization or difficult solubilization (negative conversion) proceeds. The polar group is more preferably an acidic group. Definition of the polar group is the same as the definition described later in the paragraph of Repeating Unit (b), and examples of the polar group produced resulting from decomposition of the acid-decomposable group include an alcoholic hydroxyl group, an amino group and an acidic group.

The polar group produced resulting from decomposition of the acid-decomposable group is preferably an acidic group.

The acidic group is not particularly limited as long as it is a group insolubilized in an organic solvent-containing developer, and the acidic group is preferably a phenolic hydroxyl group, a carboxylic acid group, a sulfonic acid group, a fluorinated alcohol group, a sulfonamide group, a sulfonylimide group, an (alkylsulfonyl)(alkylcarbonyl)methylene group, an (alkylsulfonyl)(alkylcarbonyl)imide group, a bis(alkylcarbonyl)methylene group, a bis(alkylcarbonyl)imide group, a bis(alkylsulfonyl)methylene group, a bis(alkylsulfonyl)imide group, a tris(alkylcarbonyl)methylene group and a tris(alkylsulfonyl)methylene group, more preferably a carboxylic acid group, a fluorinated alcohol group (preferably hexafluoroisopropanol), a phenolic hydroxyl group, and an acidic group (a group capable of dissociating in an aqueous 2.38 mass % tetramethylammonium hydroxide solution that is conventionally used as the developer for resist) such as sulfonic acid group.

The group preferred as the acid-decomposable group is a group where a group capable of leaving by the action of an acid is substituted for a hydrogen atom of the group above.

Examples of the group capable of leaving by the action of an acid include —$C(R_{36})(R_{37})(R_{38})$, —$C(R_{36})(R_{37})(OR_{39})$, and —$C(R_{01})(R_{02})(OR_{39})$.

In the formulae, each of $R_{36}$ to $R_{39}$ independently represents an alkyl group, a cycloalkyl group, a monovalent aromatic ring group, a group formed by combining an alkylene group and a monovalent aromatic ring group, or an alkenyl group, and $R_{36}$ and $R_{37}$ may combine with each other to form a ring.

Each of $R_{01}$ and $R_{02}$ independently represents a hydrogen atom, an alkyl group, a cycloalkyl group, a monovalent aromatic ring group, a group formed by combining an alkylene group and a monovalent aromatic ring group, or an alkenyl group.

The acid-decomposable group is preferably a cumyl ester group, an enol ester group, an acetal ester group, a tertiary alkyl ester group or the like, more preferably a tertiary alkyl ester group.

The repeating unit (a) is preferably a repeating unit represented by the following formula (V):

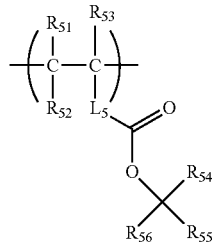

(V)

In formula (V), each of $R_{51}$, $R_{52}$ and $R_{53}$ independently represents a hydrogen atom, an alkyl group, a cycloalkyl group, a halogen atom, a cyano group or an alkoxycarbonyl group. $R_{52}$ may combine with $L_5$ to form a ring, and in this case, $R_{52}$ is preferably an alkylene group.

$L_5$ represents a single bond or a divalent linking group, and in the case of forming a ring with $R_{52}$, $L_5$ represents a trivalent linking group.

$R_{54}$ represents an alkyl group, and each of $R_{55}$ and $R_{56}$ independently represents a hydrogen atom, an alkyl group, a cycloalkyl group, a monovalent aromatic ring group, or an aralkyl group. $R_{55}$ and $R_{56}$ may combine with each other to form a ring. However, $R_{55}$ and $R_{56}$ are not a hydrogen atom at the same time.

Formula (V) is described in more detail.

Specific examples and preferred examples of the alkyl group, alkoxycarbonyl group, cycloalkyl group and halogen atom of $R_{51}$ to $R_{53}$ in formula (V) are the same as specific examples and preferred examples of the alkyl group, alkoxycarbonyl group, cycloalkyl group and halogen atom of $R_1$ to $R_3$ in formula (A1).

Examples of the substituent which each of the groups above may have are also the same as those described above for the substituent which the alkyl group, cycloalkyl group, alkoxycarbonyl group, alkylene group and (p+1)-valent aromatic ring group in formula (A1) may have.

In the case where $R_{52}$ is an alkylene group and forms a ring with $L_5$, the alkylene group is preferably an alkylene group having a carbon number of 1 to 8, such as methylene group, ethylene group, propylene group, butylene group, hexylene group and octylene group, more preferably an alkylene group having a carbon number of 1 to 4, still more preferably an alkylene group having a carbon number of 1 or 2. The ring formed by combining $R_{52}$ and $L_5$ is preferably a 5- or 6-membered ring.

Specific examples and preferred examples of $R_{51}$ to $R_{53}$ in formula (V) are the same as specific examples and preferred examples of $R_1$ to $R_3$ in formula (A1).

Examples of the divalent linking group represented by $L_5$ include an alkylene group, a divalent aromatic ring group, —COO-$L_1$-, —O-$L_1$-, and a group formed by combining two or more of these groups. Here, $L_1$ represents an alkylene group, a cycloalkylene group, a divalent aromatic ring group, and a group formed by combining an alkylene group and a divalent aromatic ring group.

$L_5$ is preferably a single bond, a group represented by —COO-$L_1$-, or a divalent aromatic ring group. $L_1$ is preferably an alkylene group having a carbon number of 1 to 5, more preferably a methylene group or a propylene group. The divalent aromatic ring group is preferably a 1,4-phenylene group, a 1,3-phenylene group, a 1,2-phenylene group or a 1,4-naphthylene group, more preferably a 1,4-phenylene group.

In the case where $L_5$ combines with $R_{52}$ to form a ring, preferred examples of the trivalent linking group represented by $L_5$ include groups formed by removing one arbitrary hydrogen atom from specific examples above of the divalent linking group represented by $L_5$.

The alkyl group of $R_{54}$ to $R_{56}$ is preferably an alkyl group having a carbon number of 1 to 20, more preferably an alkyl group having a carbon number of 1 to 10, still more preferably an alkyl group having a carbon number of 1 to 4, such as methyl group, ethyl group, n-propyl group, isopropyl group, n-butyl group, isobutyl group and tert-butyl group.

The cycloalkyl group represented by $R_{55}$ and $R_{56}$ is preferably a cycloalkyl group having a carbon number of 3 to 20 and may be a monocyclic cycloalkyl group such as cyclopentyl group and cyclohexyl group, or a polycyclic cycloalkyl group such as norbornyl group, adamantyl group, tetracyclodecanyl group and tetracyclododecanyl group.

The ring formed by combining $R_{55}$ and $R_{56}$ with each other is preferably a ring having a carbon number of 3 to 20 and may be a monocyclic ring such as cyclopentyl group and cyclohexyl group, or a polycyclic ring such as norbornyl group, adamantyl group, tetracyclodecanyl group and tetracyclododecanyl group. In the case where $R_{55}$ and $R_{56}$ combine with each other to form a ring, $R_{54}$ is preferably an alkyl group having a carbon number of 1 to 3, more preferably a methyl group or an ethyl group.

The monovalent aromatic ring group represented by $R_{55}$ and $R_{56}$ is preferably a monovalent aromatic ring group having a carbon number of 6 to 20 and may be monocyclic or polycyclic, and may have a substituent. Examples thereof include a phenyl group, a 1-naphthyl group, a 2-naphthyl group, a 4-methylphenyl group, and a 4-methoxyphenyl group. In the case where either one of $R_{55}$ and $R_{56}$ is a hydrogen atom, the other is preferably a monovalent aromatic ring group.

The aralkyl group represented by $R_{55}$ and $R_{56}$ may be monocyclic or polycyclic or may have a substituent and is preferably an aralkyl group having a carbon number of 7 to 21, and examples thereof include a benzyl group and a 1-naphthylmethyl group.

The synthesis method of the monomer corresponding to the repeating unit represented by formula (V) is not particularly limited, and synthesis methods for general polymerizable group-containing esters can be applied.

Specific examples of the repeating unit (a) represented by formula (V) are illustrated below, but the present invention is not limited thereto.

In specific examples, each of Rx and $Xa_1$ represents a hydrogen atom, $CH_3$, $CF_3$ or $CH_2OH$, and each of Rxa and Rxb independently represents an alkyl group having a carbon number of 1 to 4, an aryl group having a carbon number of 6 to 18, or an aralkyl group having a carbon number of 7 to 19. Z represents a substituent. p represents 0 or a positive integer and is preferably 0 to 2, more preferably 0 or 1. In the case where a plurality of Z's are present, each may be the same as or different from every others. From the standpoint of increasing the dissolution contrast for the organic solvent-containing developer between before and after acid decomposition, Z is suitably a group composed of only hydrogen atom and carbon atom and is preferably, for example, a linear or branched alkyl group or a cycloalkyl group.

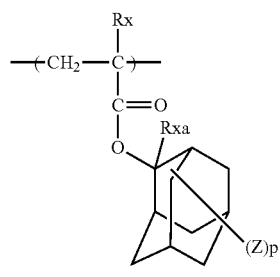

1

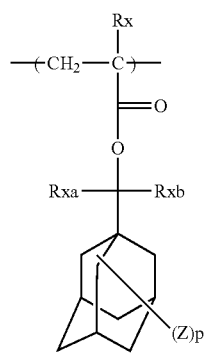

2

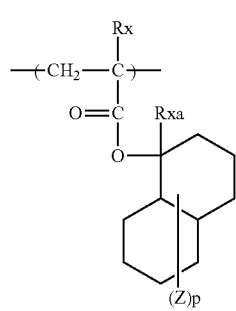

3

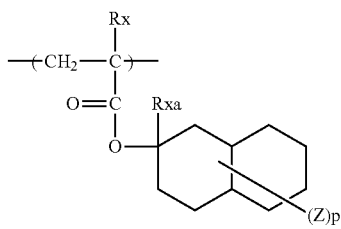

4

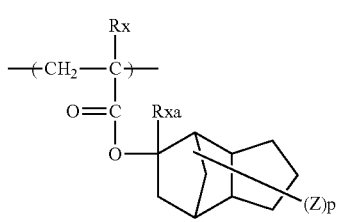

5

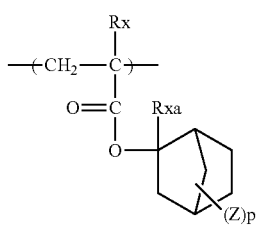

6

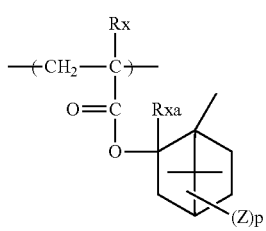

7

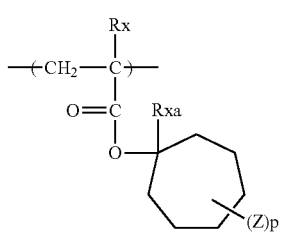

8

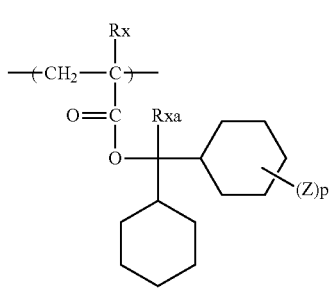

9

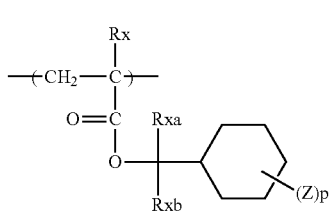

10

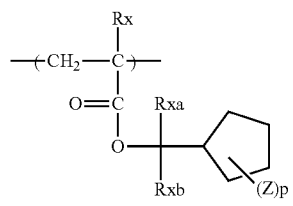
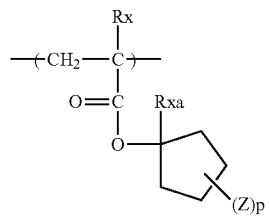
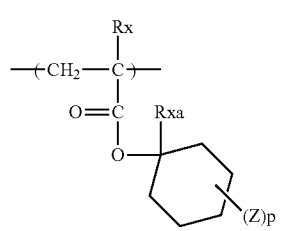
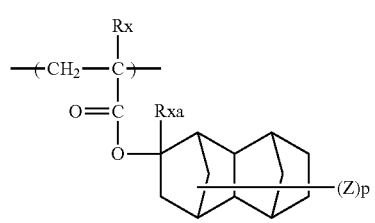
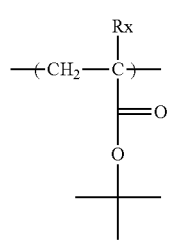
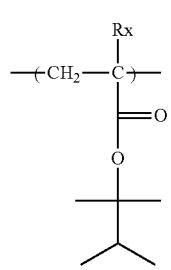
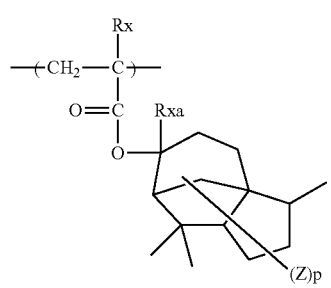
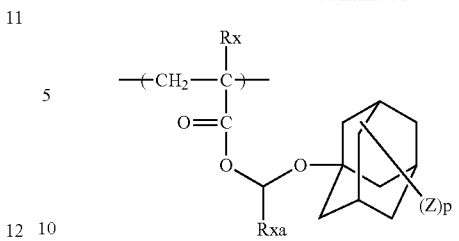
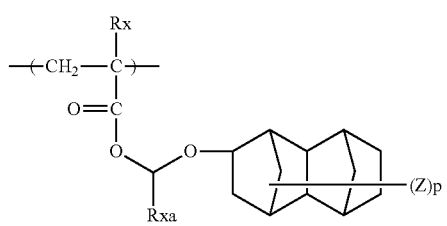
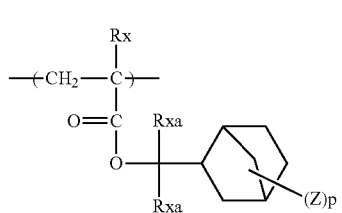
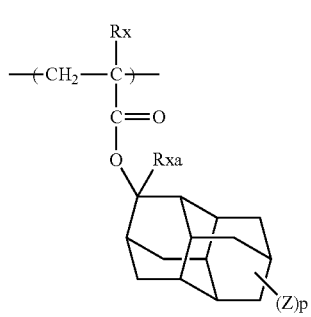
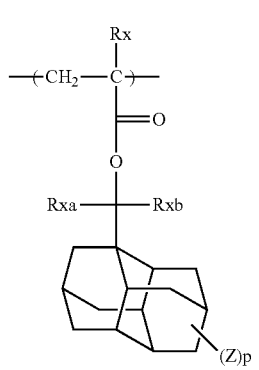
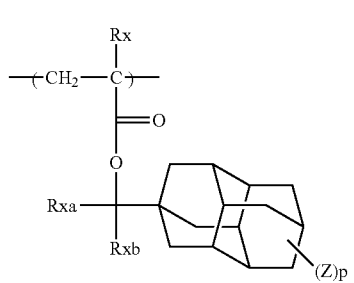

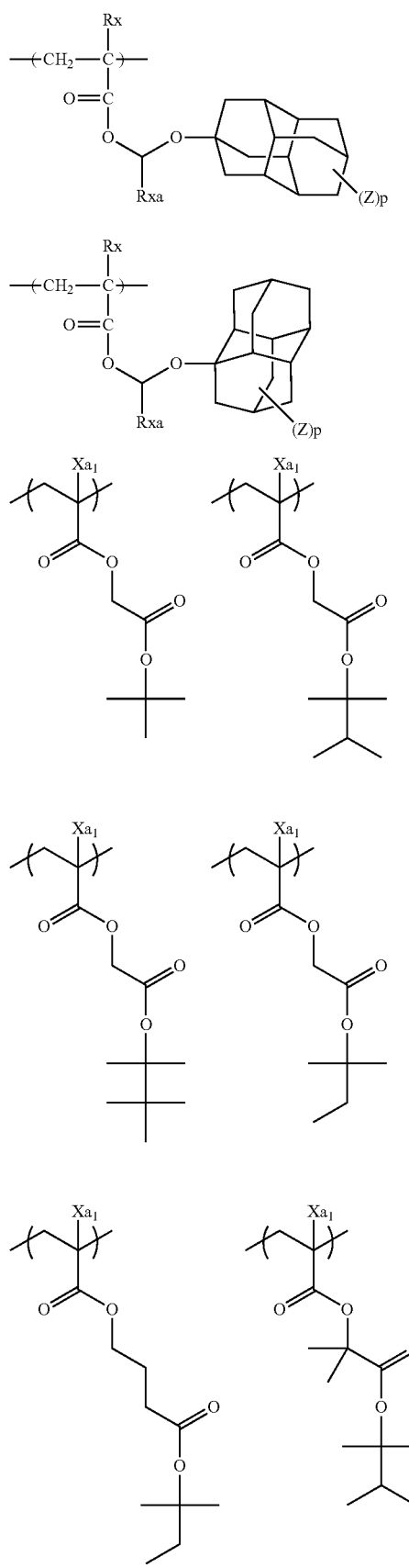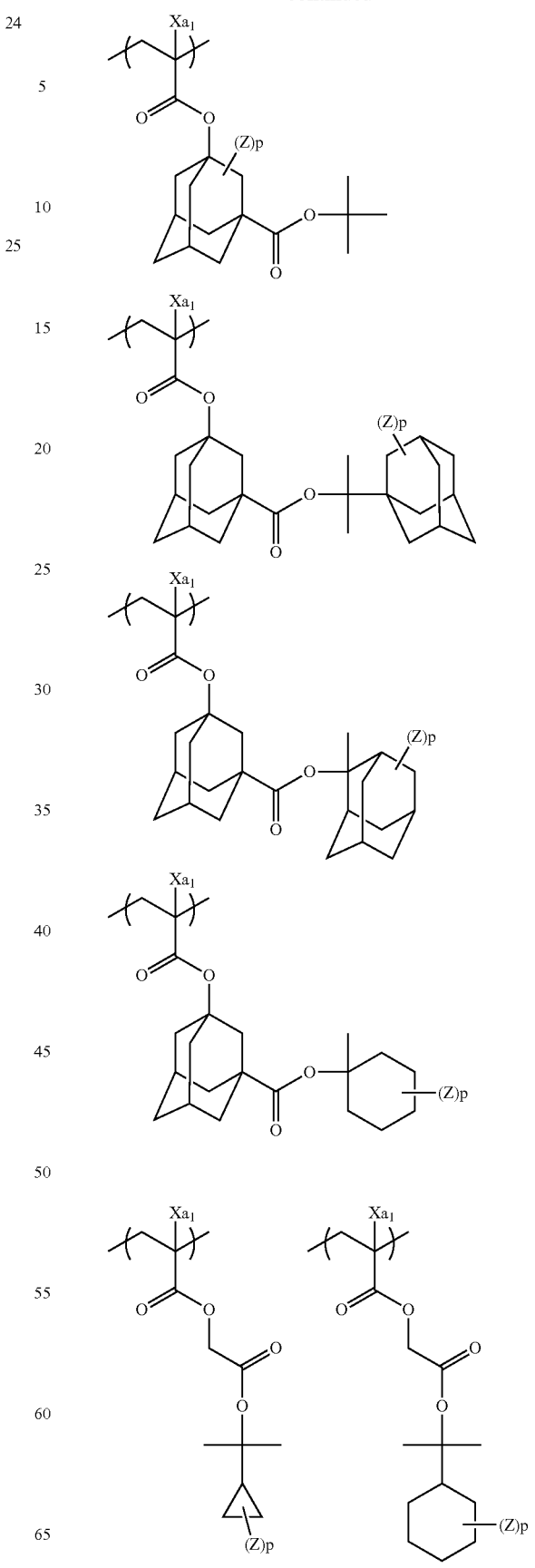

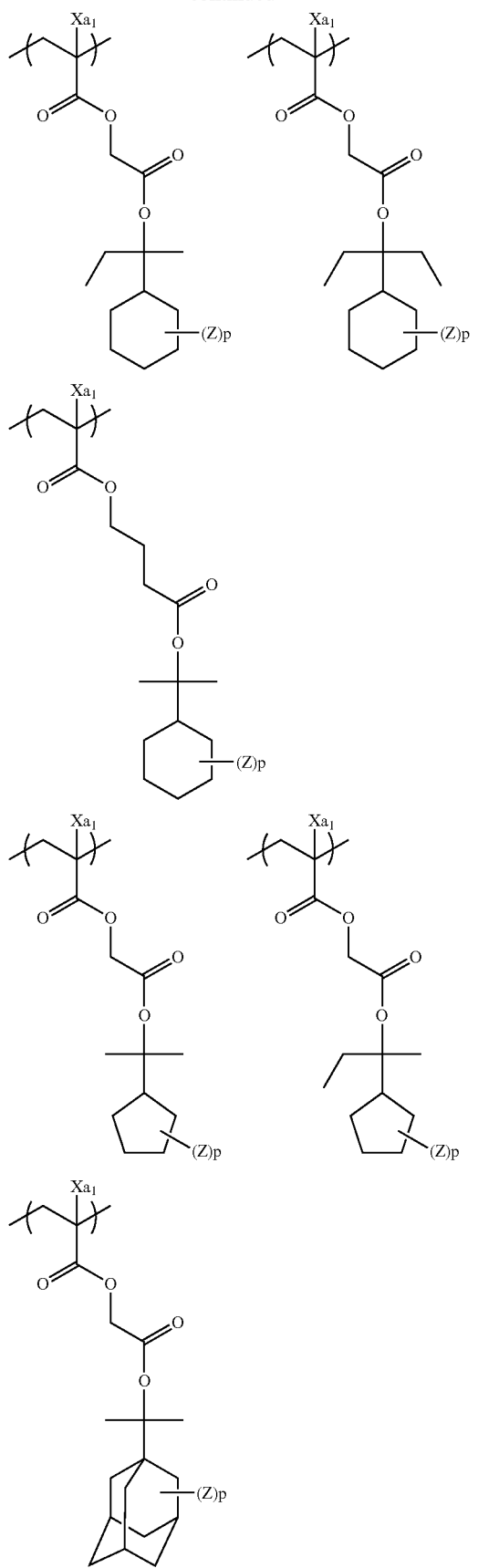
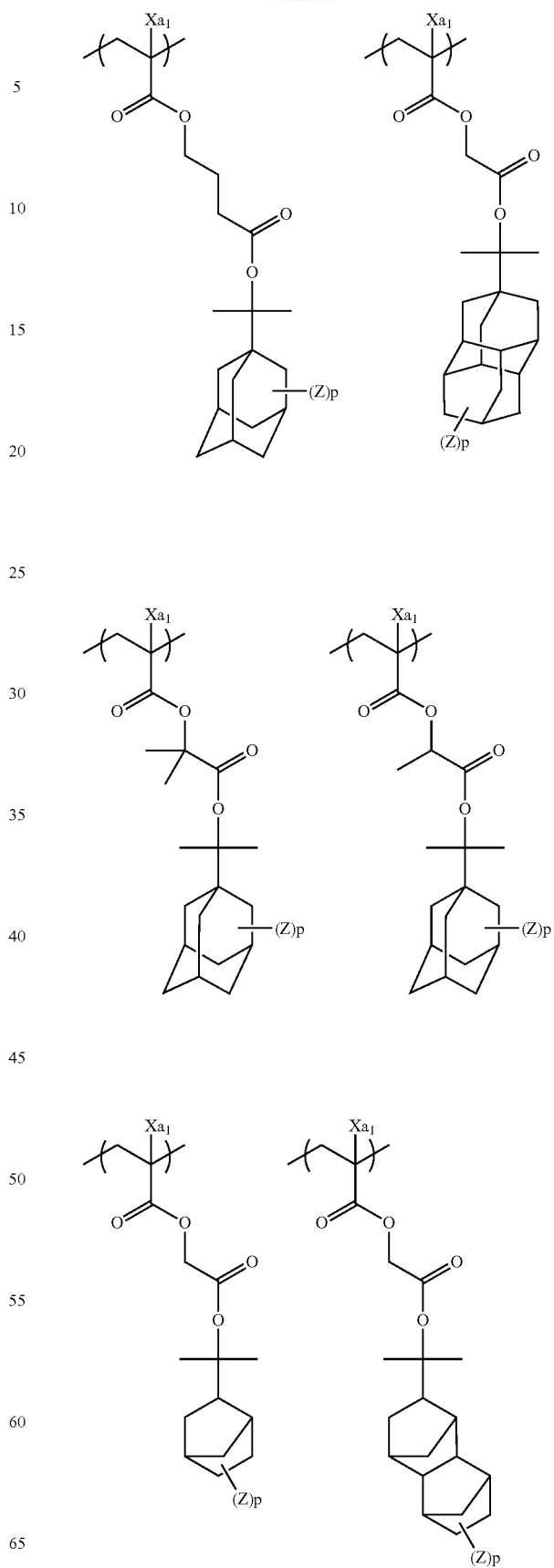

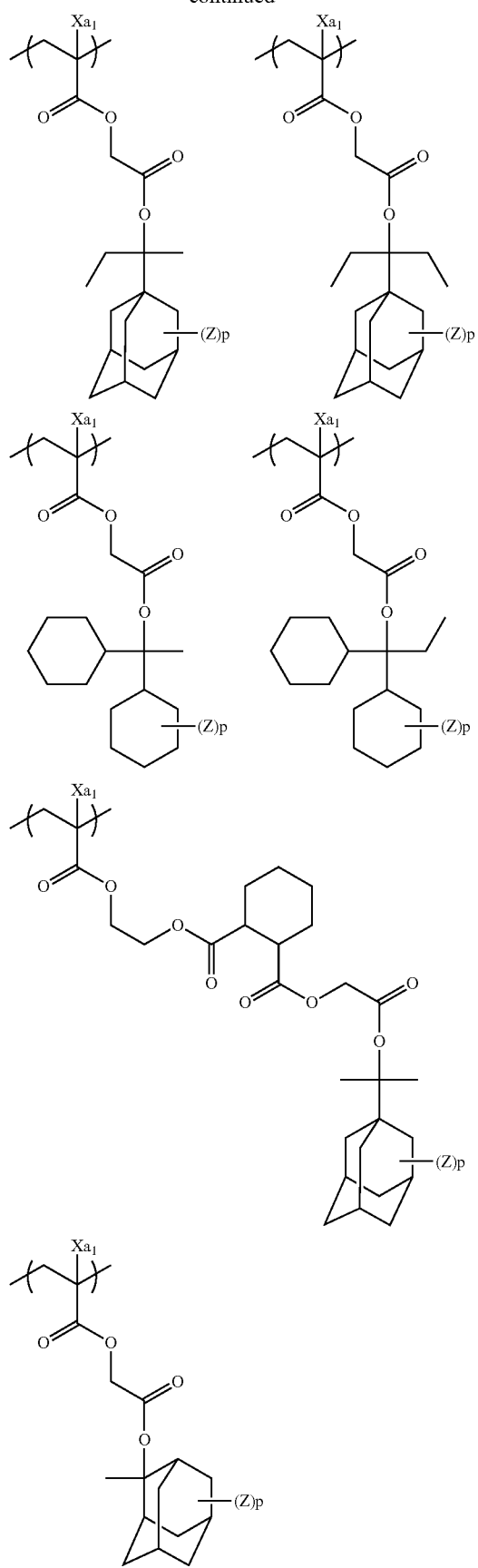
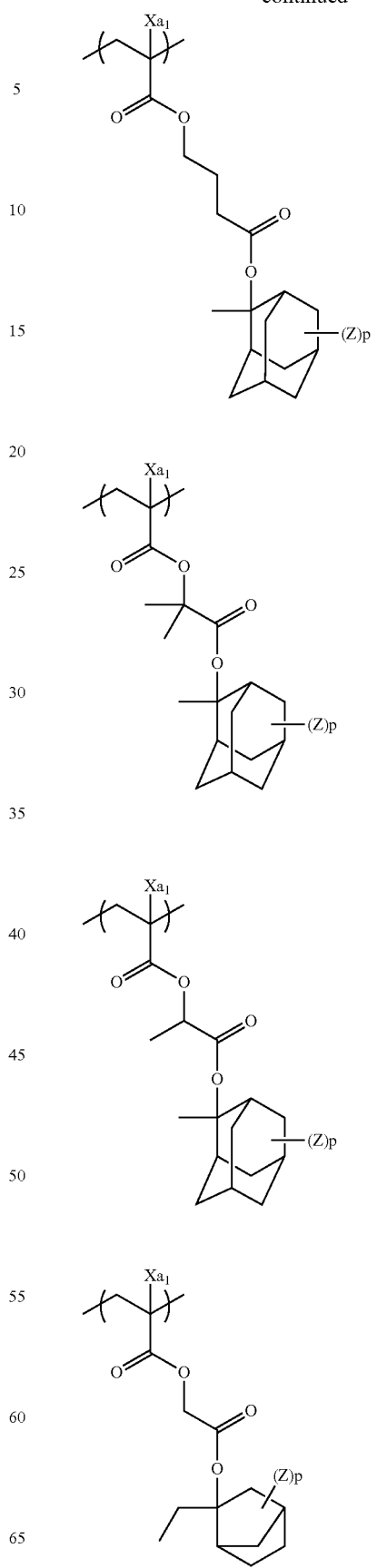

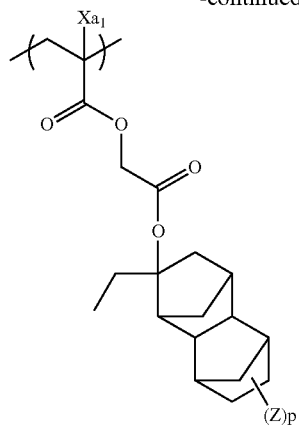
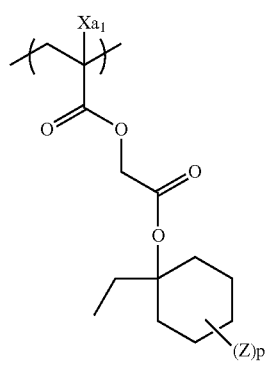
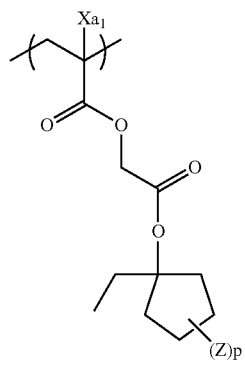
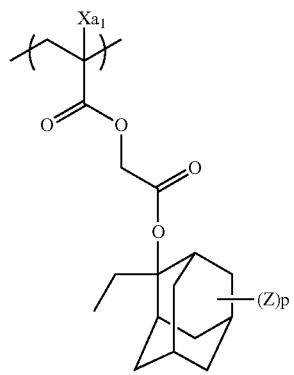
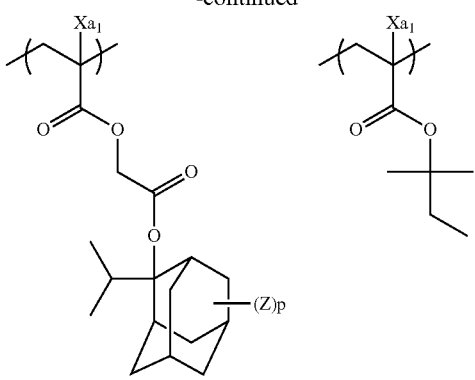
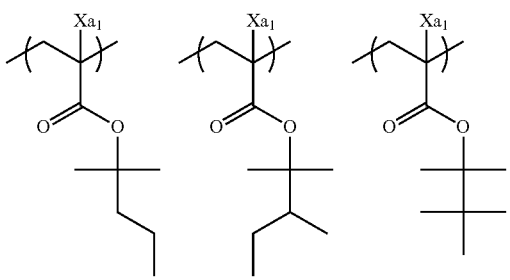
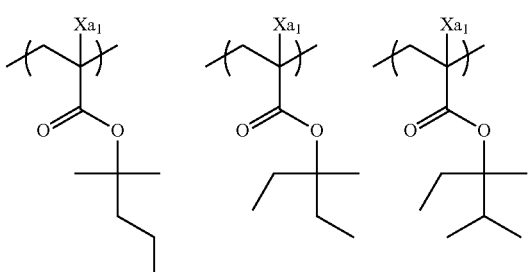
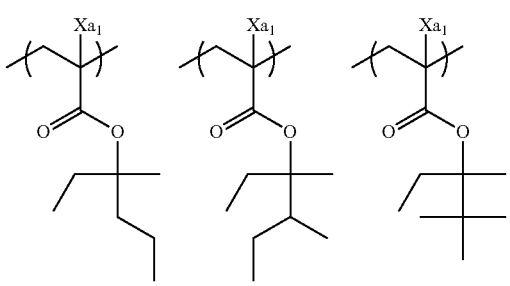
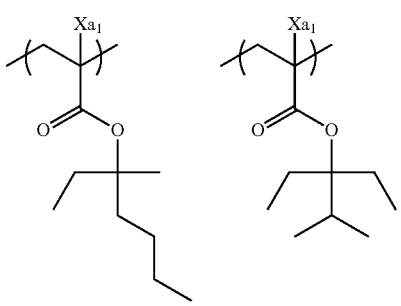

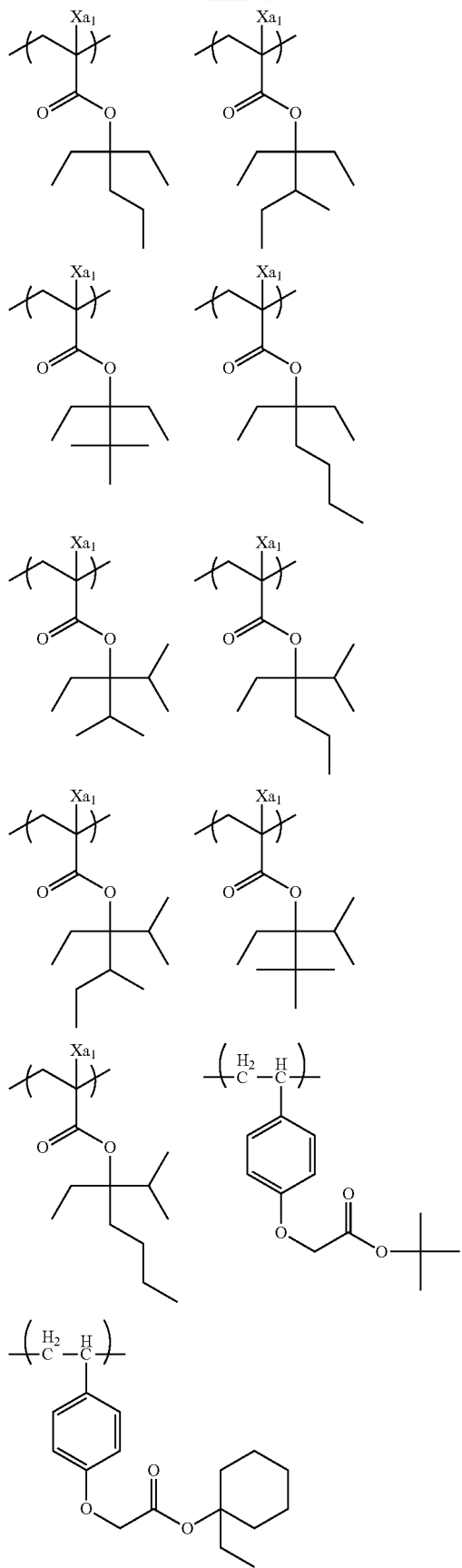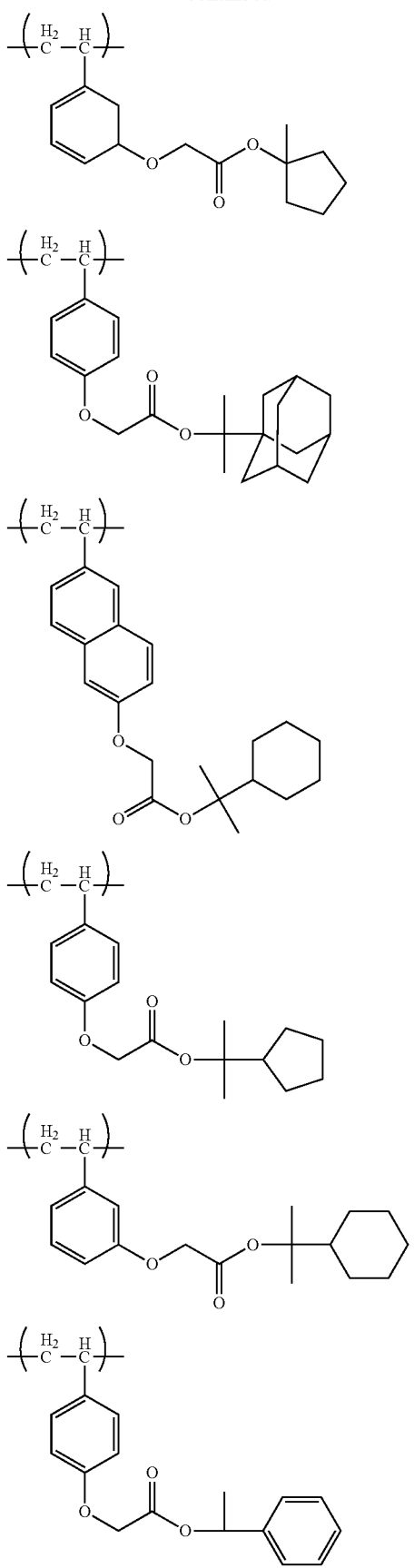

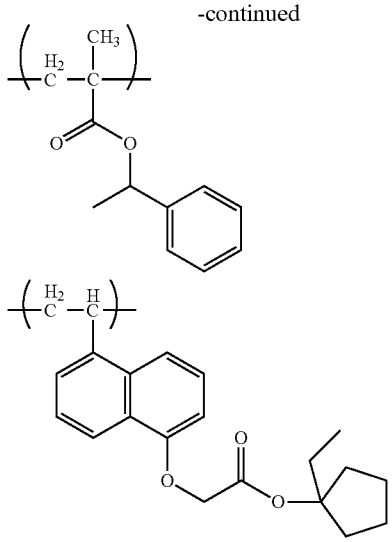

The resin (A) may contain, as the repeating unit (a), a repeating unit represented by the following formula (VI):

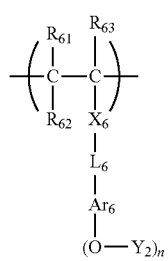

In formula (VI), each of $R_{61}$, $R_{62}$ and $R_{63}$ independently represents a hydrogen atom, an alkyl group, a cycloalkyl group, a halogen atom, a cyano group or an alkoxycarbonyl group. $R_{62}$ may combine with $Ar_6$ to form a ring, and in this case, $R_{62}$ represents a single bond or an alkylene group.

$X_6$ represents a single bond, —COO— or —CONR$_{64}$—, and $R_{64}$ represents a hydrogen atom or an alkyl group.

$L_6$ represents a single bond or an alkylene group.

$Ar_6$ represents a (n+1)-valent aromatic ring group and in the case of combining with $R_{62}$ to form a ring, $Ar_6$ represents a (n+2)-valent aromatic ring group.

$Y_2$ represents, when n≥2, each independently represents, a hydrogen atom or a group capable of leaving by the action of an acid, provided that at least one $Y_2$ represents a group capable of leaving by the action of an acid.

n represents an integer of 1 to 4.

Formula (VI) is described in more detail below.

Specific examples and preferred examples of the alkyl group, alkoxycarbonyl group, cycloalkyl group and halogen atom of $R_{61}$ to $R_{63}$ in formula (VI) are the same as specific examples and preferred examples of the alkyl group, alkoxycarbonyl group, cycloalkyl group and halogen atom in $R_1$ to $R_3$ of formula (A1).

Examples of the substituent which each of the groups above may have are also the same as those of the substituent which the alkyl group, cycloalkyl group, alkoxycarbonyl group, alkylene group and (p+1)-valent aromatic ring group in formula (A1) may have.

In the case where $R_{62}$ represents an alkylene group, the alkylene group is preferably an alkylene group having a carbon atom of 1 to 8, such as methylene group, ethylene group, propylene group, butylene group, hexylene group and octylene group, which may have a substituent.

Examples of the alkyl group of $R_{64}$ in —CONR$_{64}$— ($R_{64}$ represents a hydrogen atom or an alkyl group) represented by $X_6$ are the same as those of the alkyl group of $R_{61}$ to $R_{63}$.

$X_6$ is preferably a single bond, —COO— or —CONH—, more preferably a single bond or —COO—.

The alkylene group in $L_6$ is preferably an alkylene group having a carbon number of 1 to 8, such as methylene group, ethylene group, propylene group, butylene group, hexylene group and octylene group, which may have a substituent. The ring formed by combining $R_{62}$ and $L_6$ is preferably a 5- or 6-membered ring.

Specific examples and preferred examples of the (n+1)-valent aromatic ring group $Ar_6$ are the same as specific examples and preferred examples of the (p+1)-valent aromatic ring group $Ar_1$ in formula (A1).

Specific examples of the (n+1)-valent aromatic ring group when n is an integer of 2 or more include groups formed by removing arbitrary (n−1) hydrogen atoms from the above-described specific examples of the divalent aromatic ring group.

The (n+1)-valent aromatic ring group may further have a substituent.

Examples of the substituent which the above-described alkyl group, cycloalkyl group, alkoxycarbonyl group, alkylene group and (n+1)-valent aromatic ring group may have are the same as specific examples of the substituent which the alkyl group, cycloalkyl group, alkoxycarbonyl group, alkylene group and (p+1)-valent aromatic ring group in formula (A1) may have.

n is preferably 1 or 2, more preferably 1.

Each of n$Y_2$s independently represents a hydrogen atom or a group capable of leaving by the action of an acid, provided that at least one of n$Y_2$s represents a group capable of leaving by the action of an acid.

Specific examples and preferred examples of the group $Y_2$ capable of leaving by the action of an acid are the same as specific examples and preferred examples of the group capable of leaving by the action of an acid for Ra.

As specific preferred examples of the repeating unit (a), specific examples of the repeating unit represented by formula (VI) are illustrated below, but the present invention is not limited thereto.

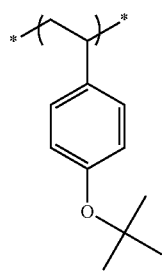

(VI-1)

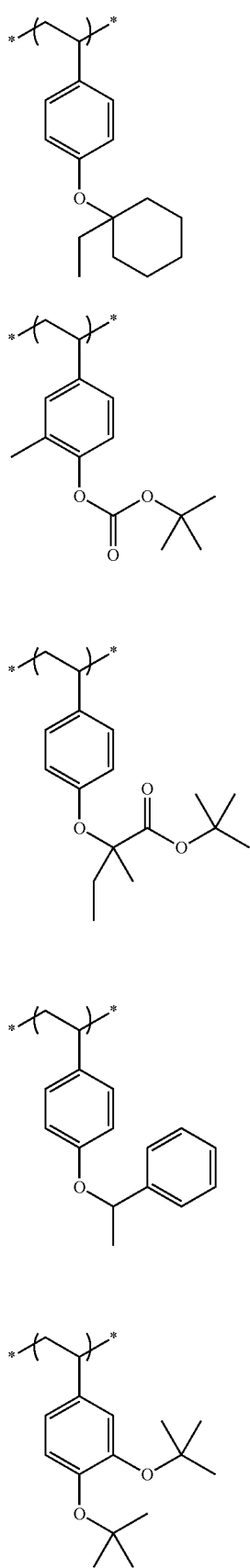
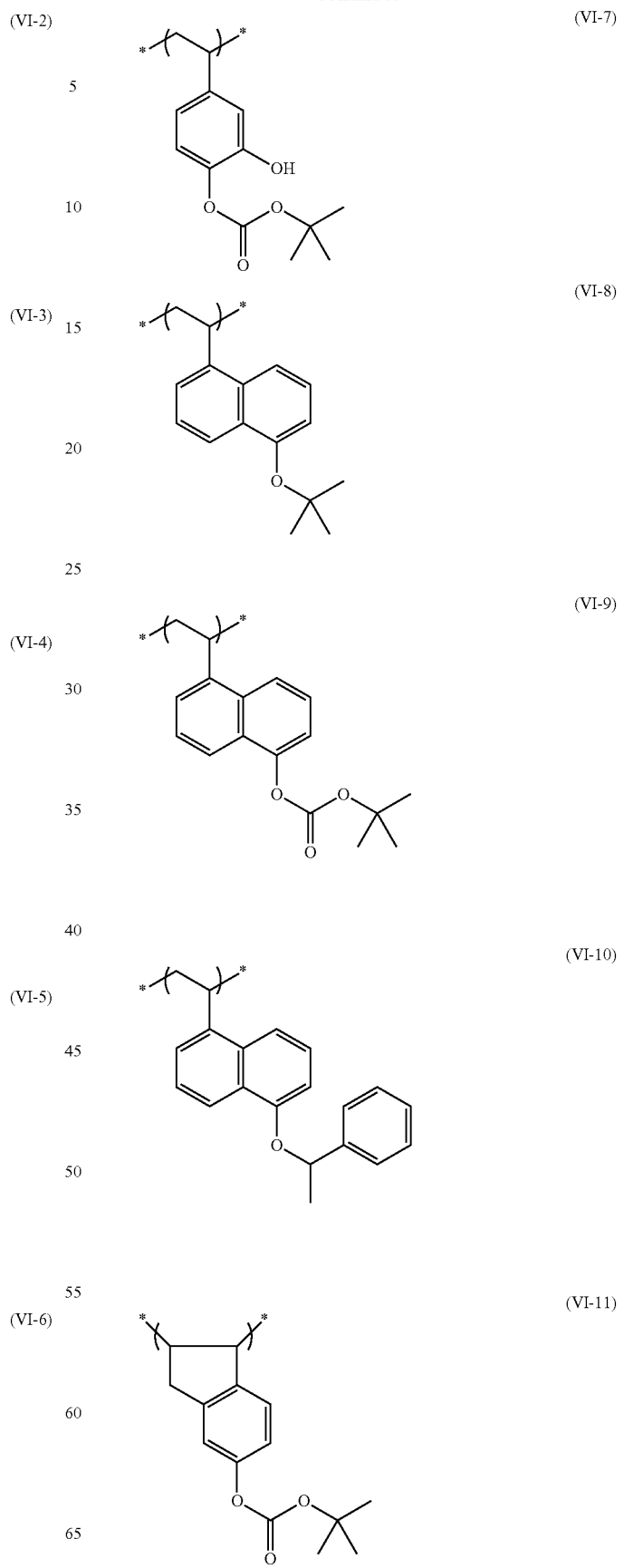

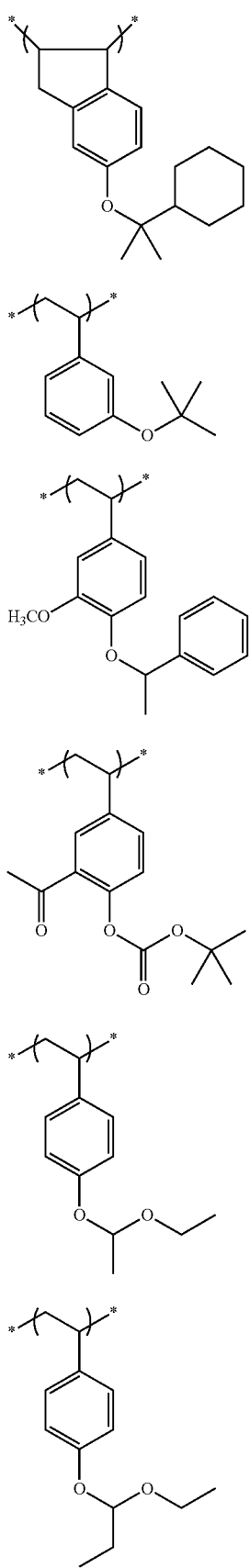
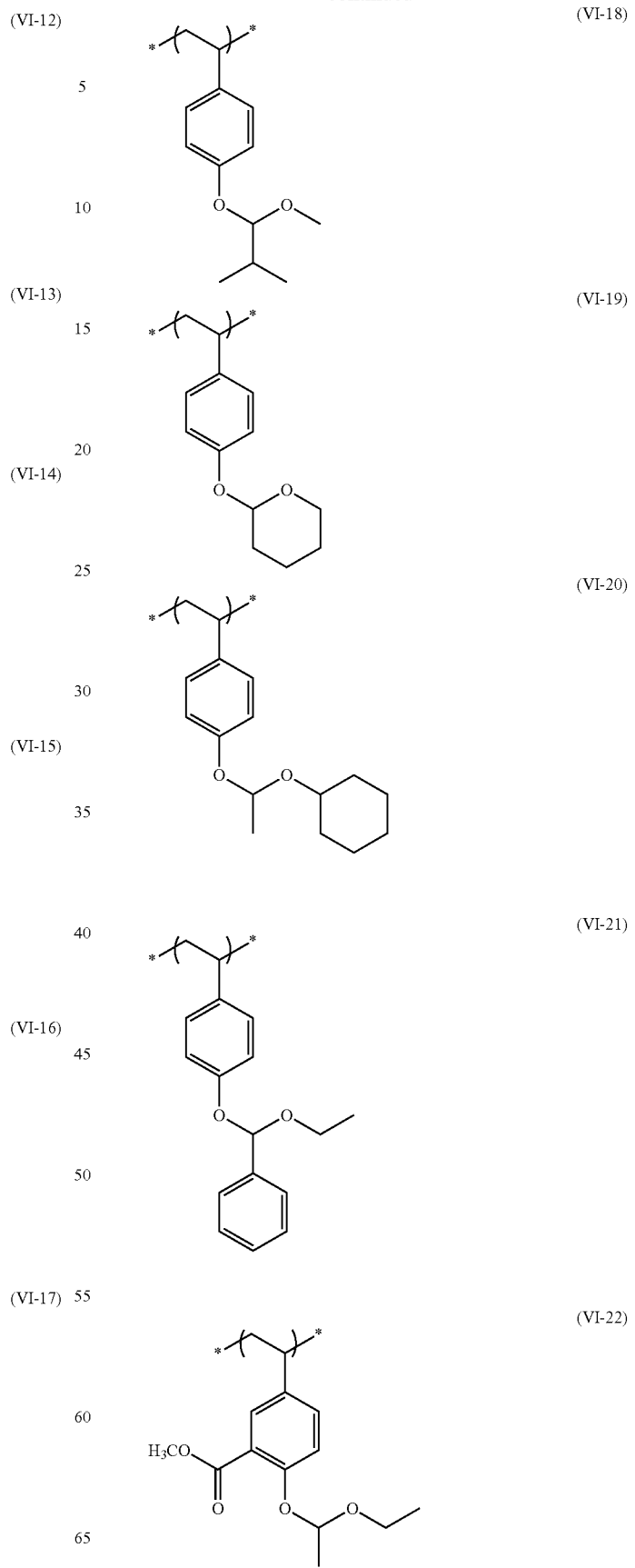

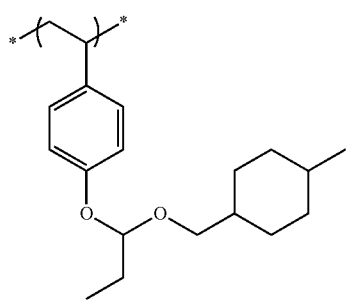 (VI-23)
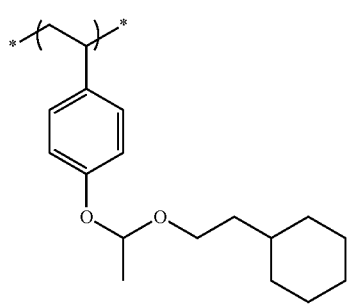 (VI-24)
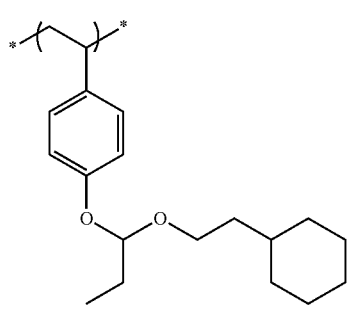 (VI-25)
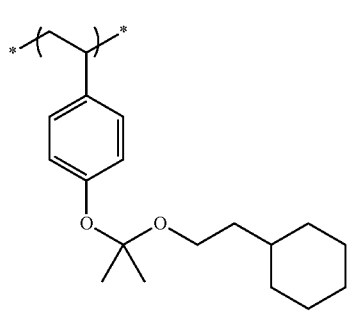 (VI-26)
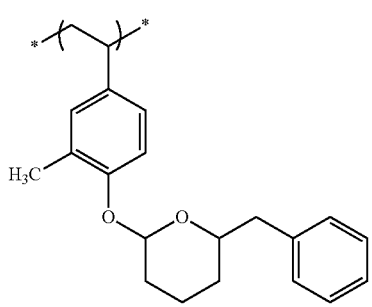 (VI-27)
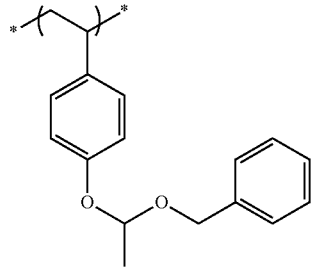 (VI-28)
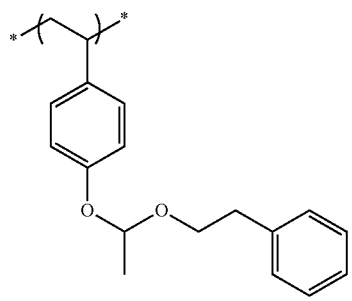 (VI-29)
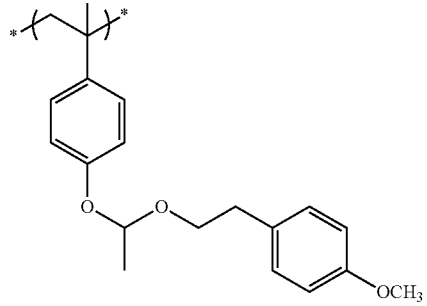 (VI-30)
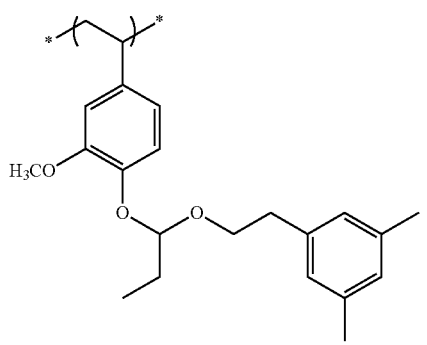 (VI-31)
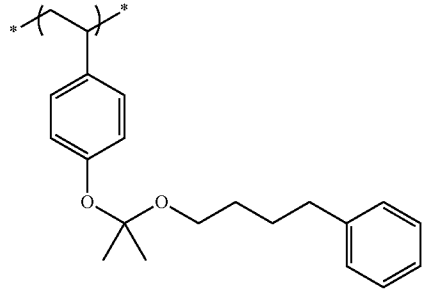 (VI-32)

(VI-33)
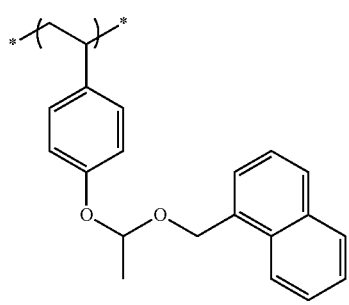
(VI-34)
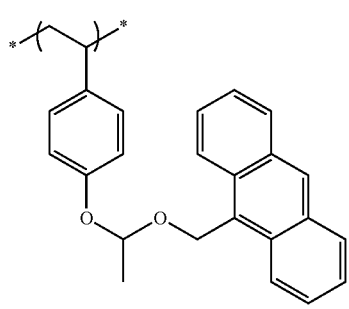
(VI-35)
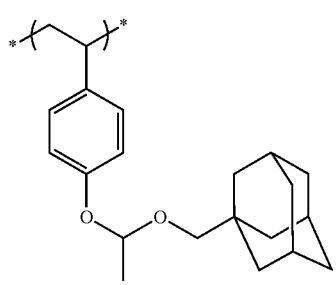
(VI-36)
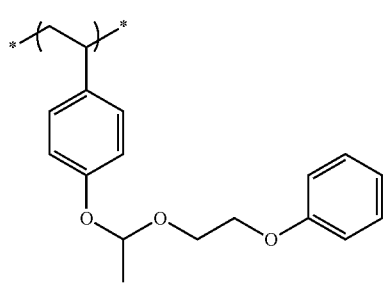
(VI-37)
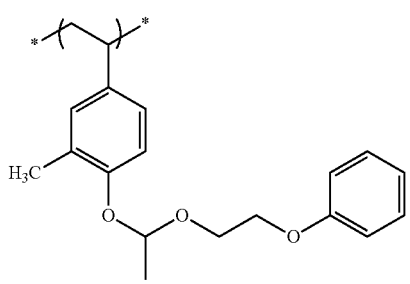
(VI-38)
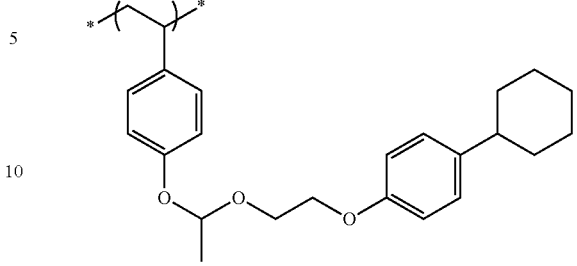
(VI-39)
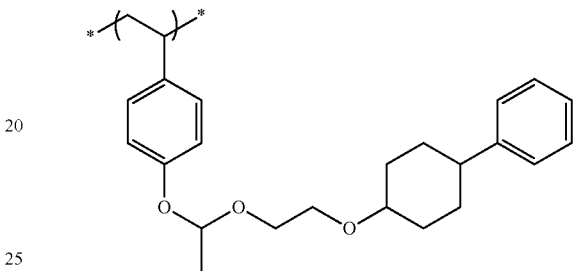
(VI-40)
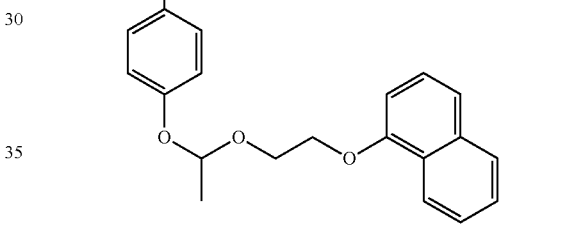
(VI-41)
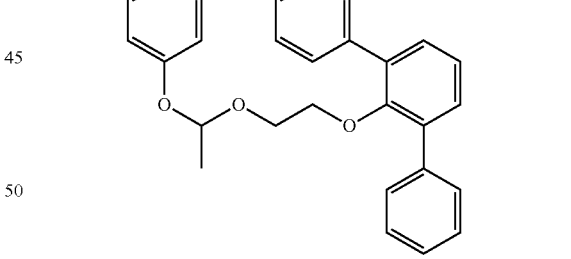
(VI-42)
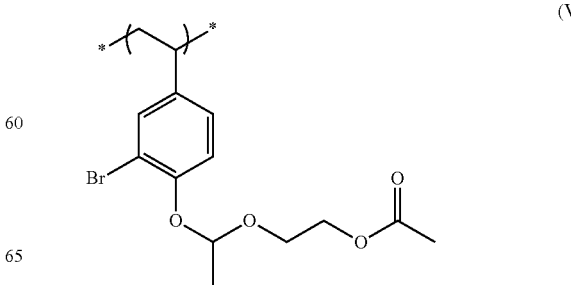

(VI-43) 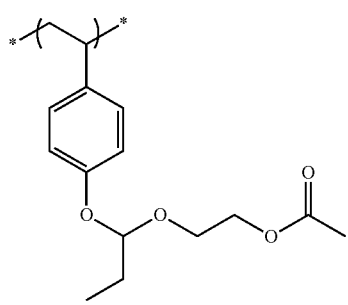
(VI-44) 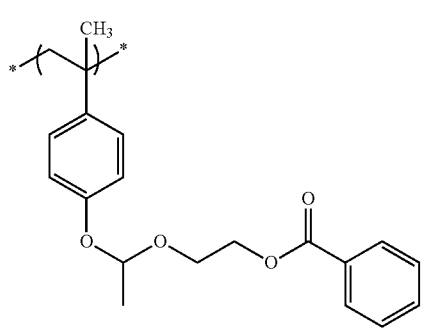
(VI-45) 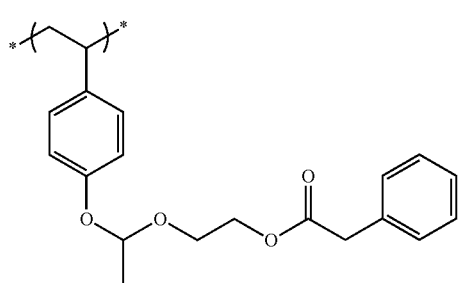
(VI-46) 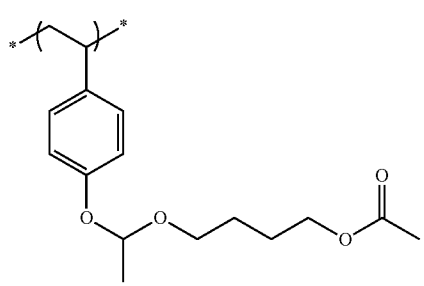
(VI-47) 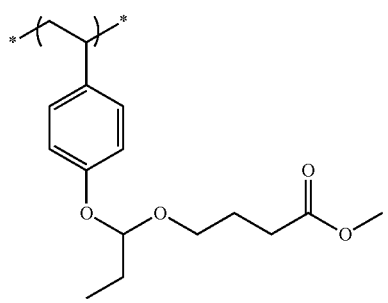
(VI-48) 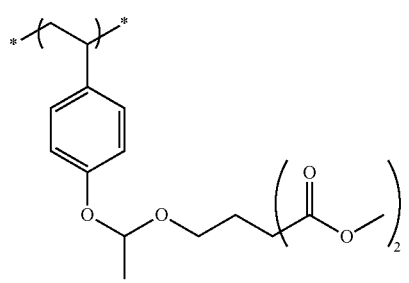
(VI-49) 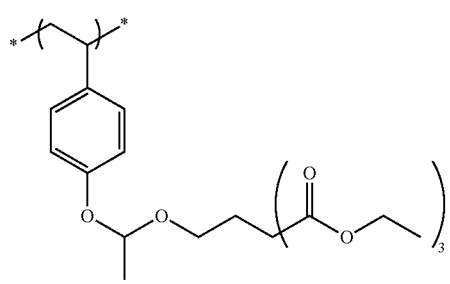
(VI-50) 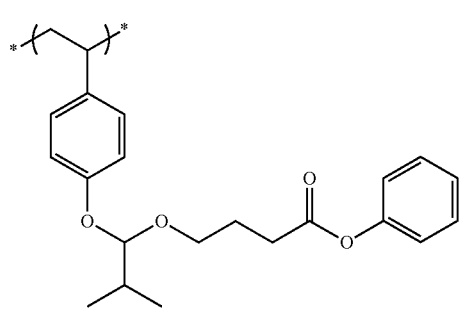
(VI-51) 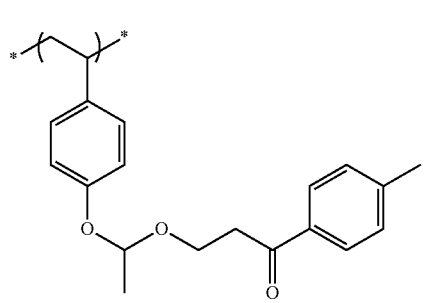
(VI-52) 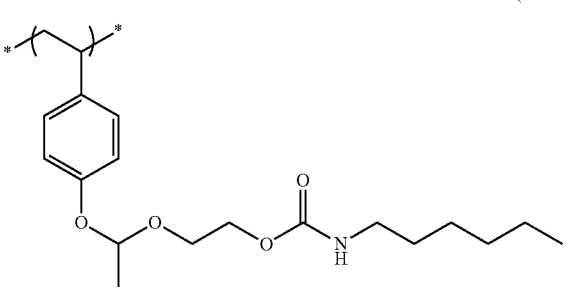

(VI-53)
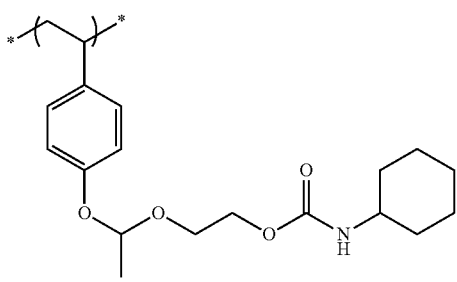
(VI-54)
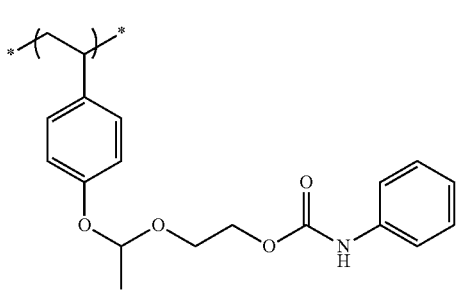
(VI-55)
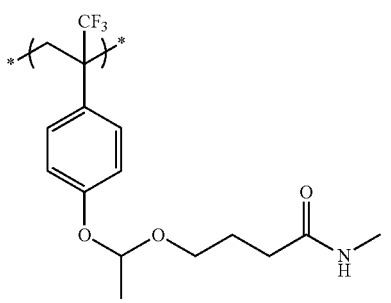
(VI-56)
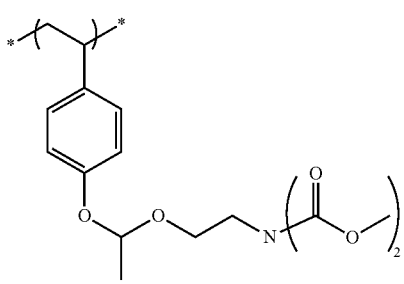
(VI-57)
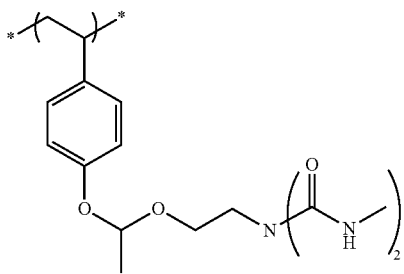
(VI-58)
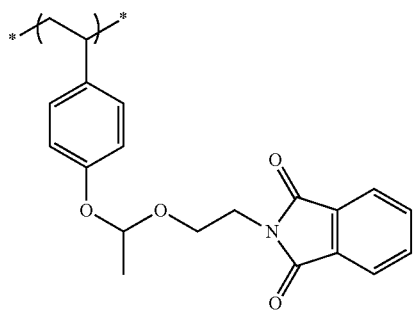
(VI-59)
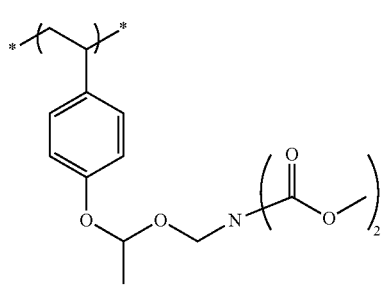
(VI-60)
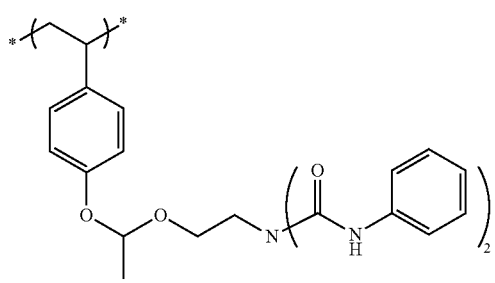
(VI-61)
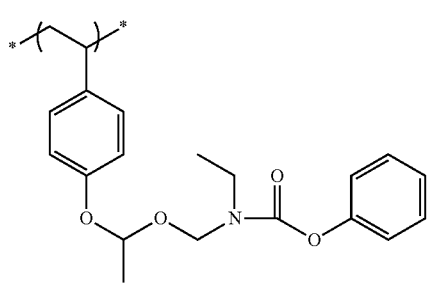
(VI-62)
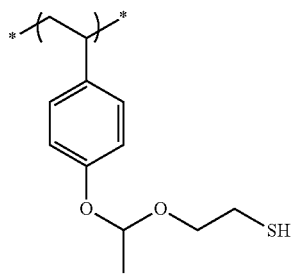

(VI-63)
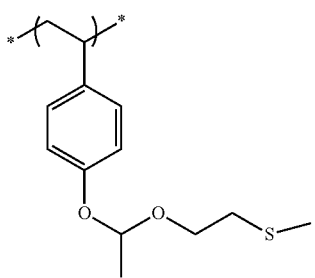
(VI-64)
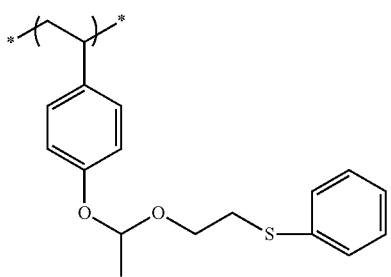
(VI-65)
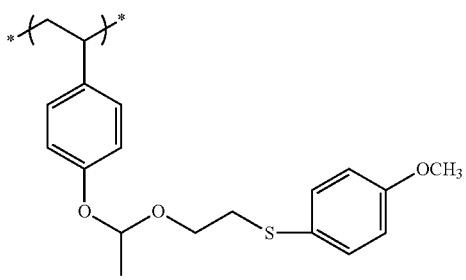
(VI-66)
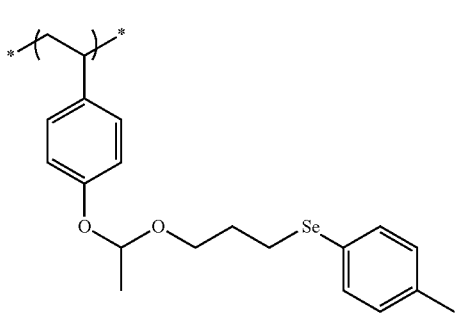
(VI-67)
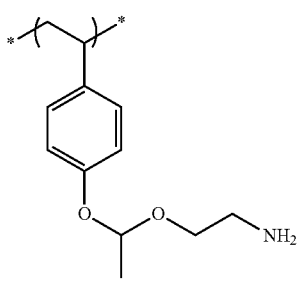
(VI-68)
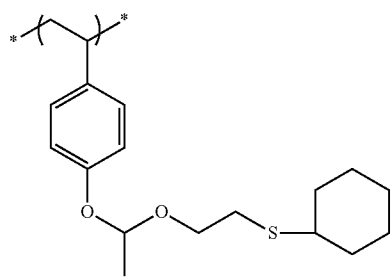
(VI-69)
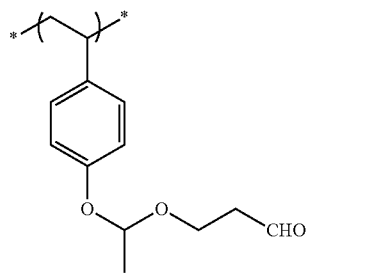
(VI-70)
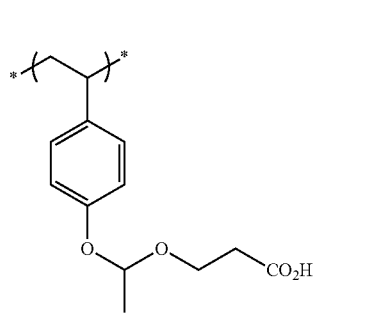
(VI-71)
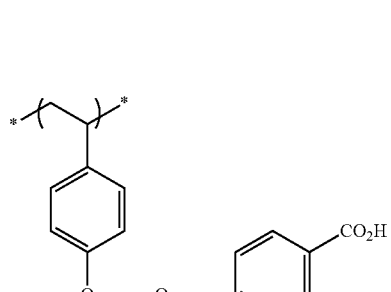
(VI-72)
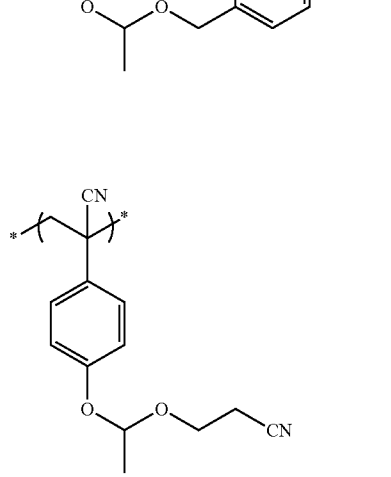

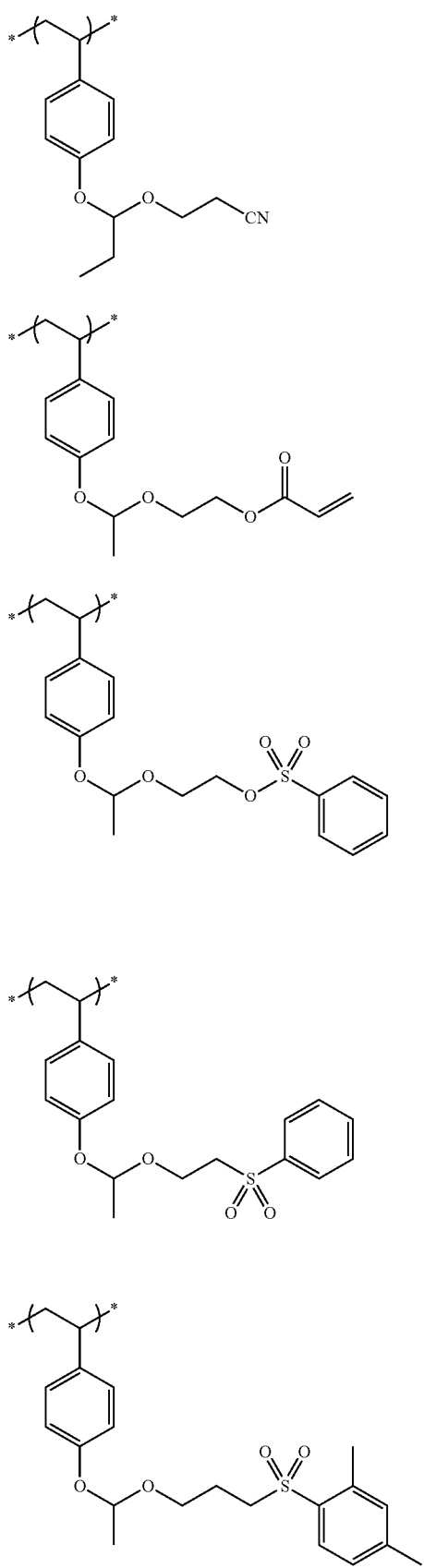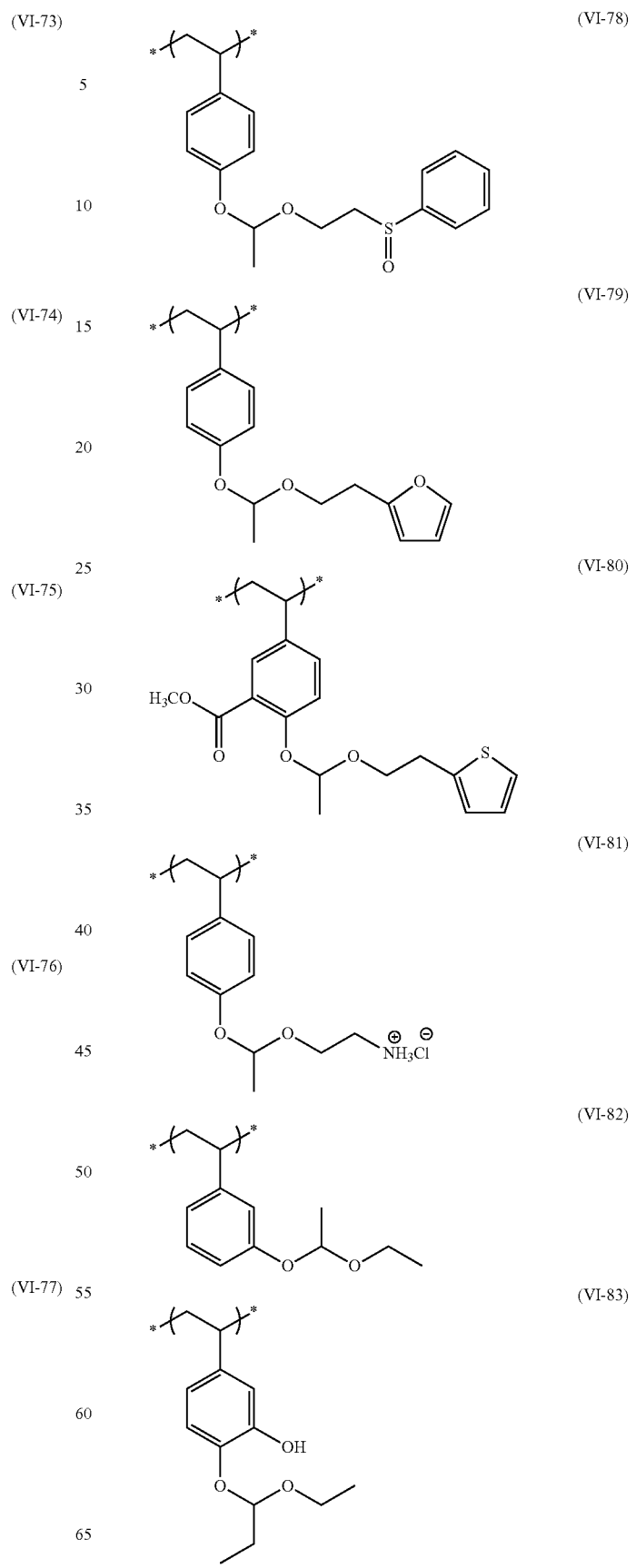

(VI-84)
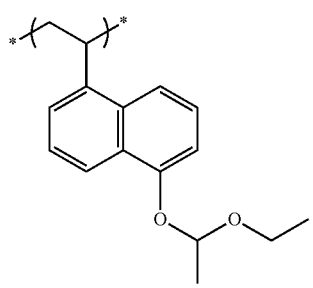
(VI-85)
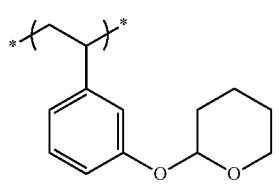
(VI-86)
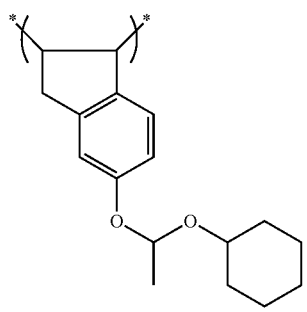
(VI-87)
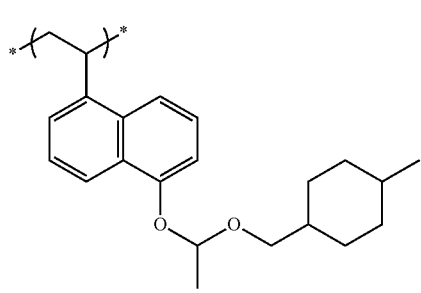
(VI-88)
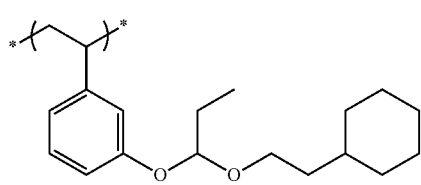
(VI-89)
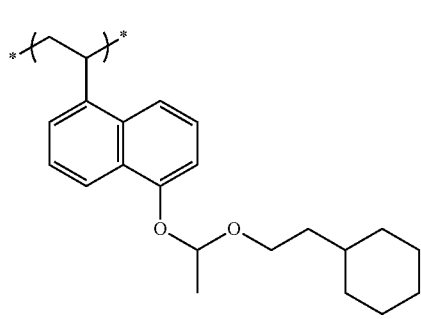
(VI-90)
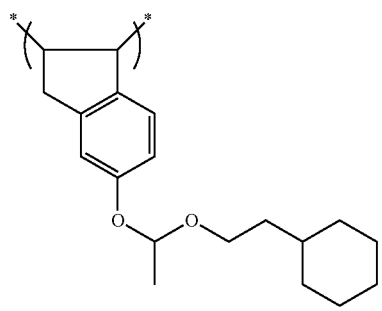
(VI-91)
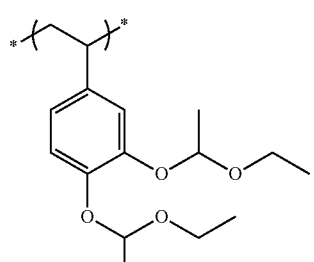
(VI-92)
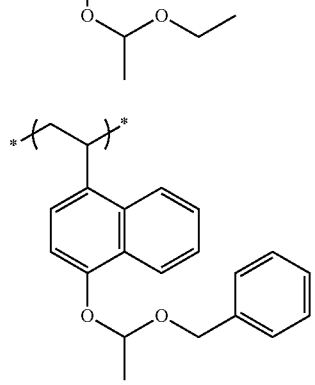
(VI-93)
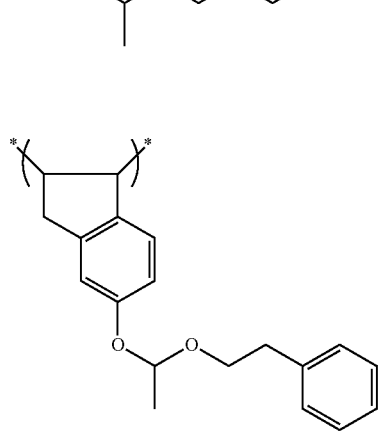
(VI-94)
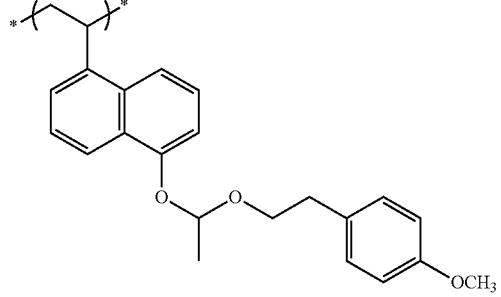

(VI-95)
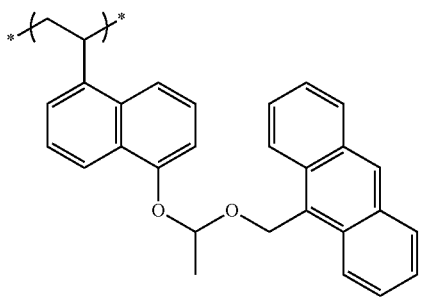
(VI-96)
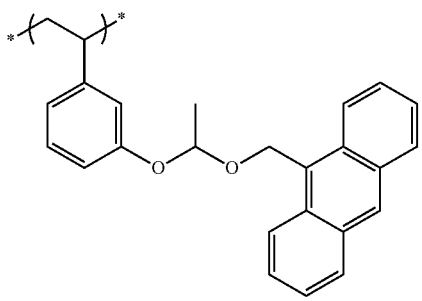
(VI-97)
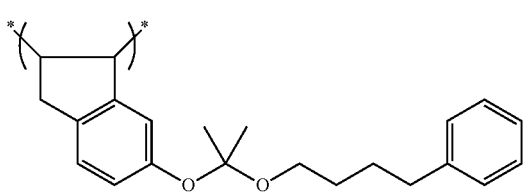
(VI-98)
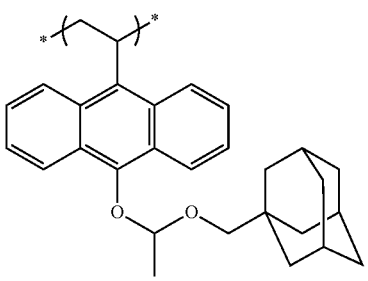
(VI-99)
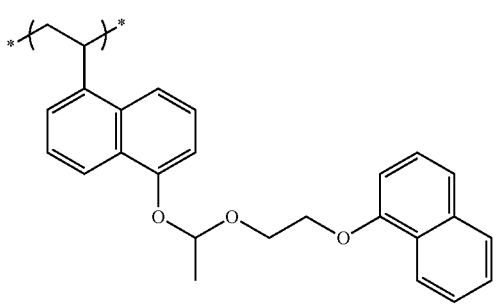
(VI-100)
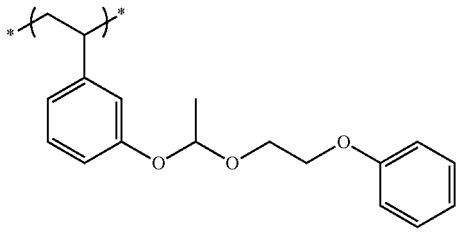
(VI-101)
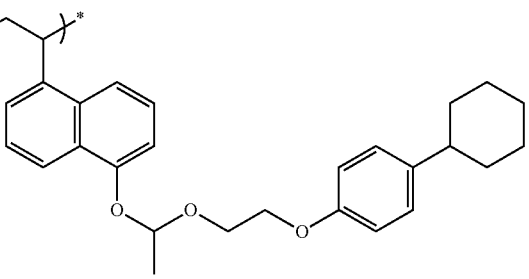
(VI-102)
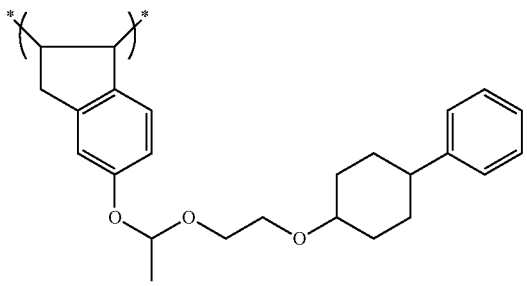
(VI-103)
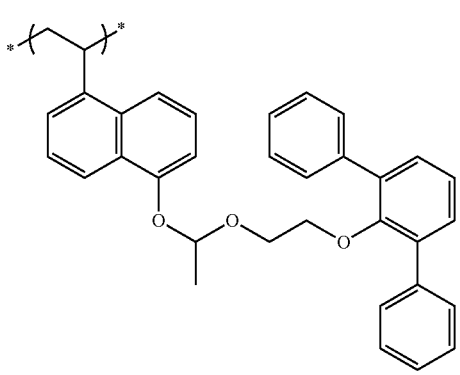
(VI-104)
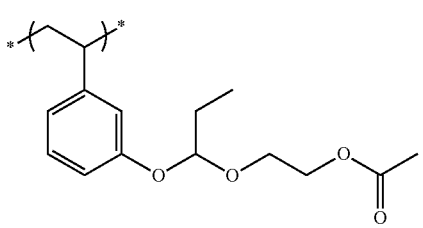

(VI-105)
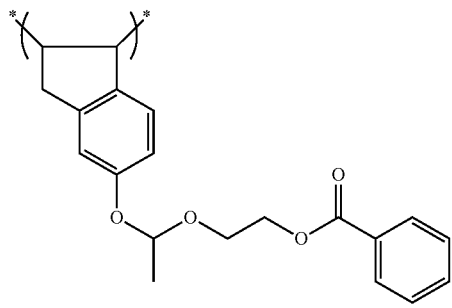
(VI-106)
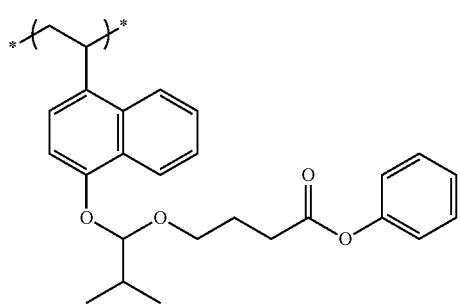
(VI-107)
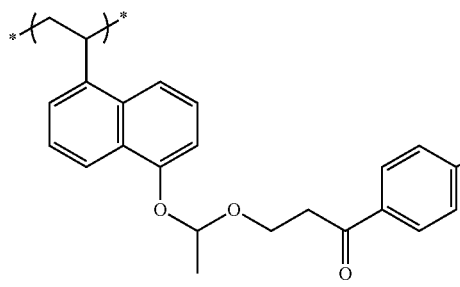
(VI-108)
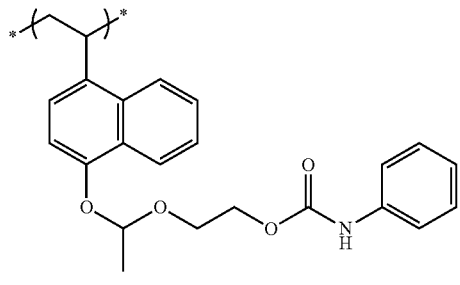
(VI-109)
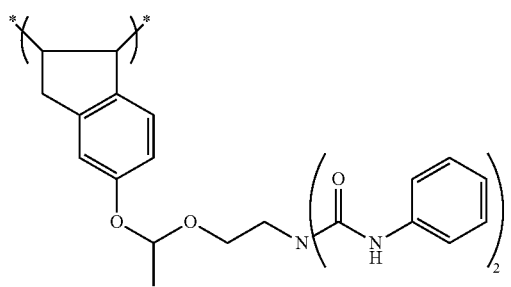
(VI-110)
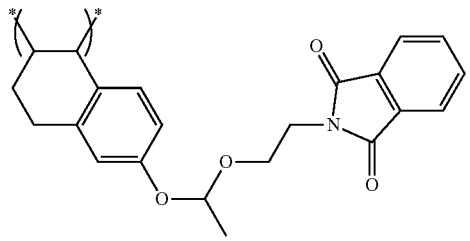
(VI-111)
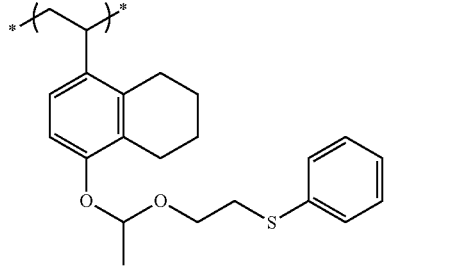
(VI-112)
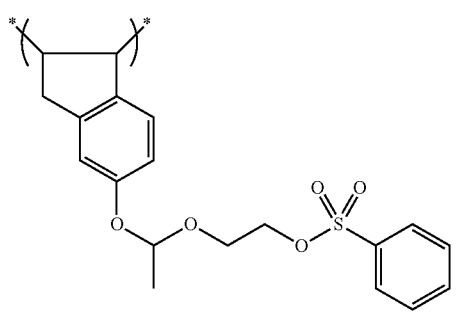
(VI-113)
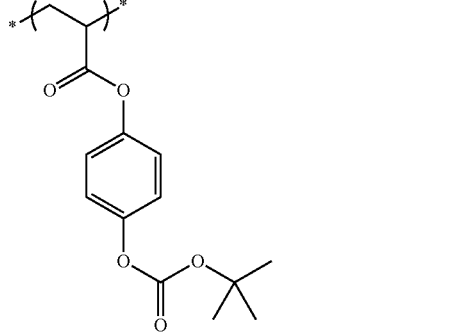
(VI-114)
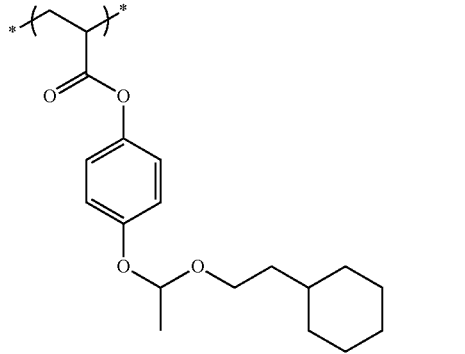

(VI-115)
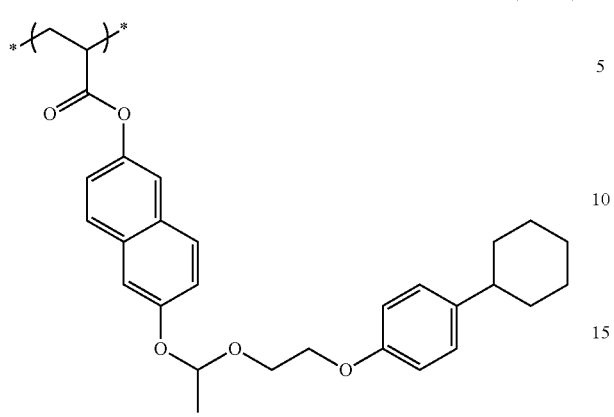
(VI-116)
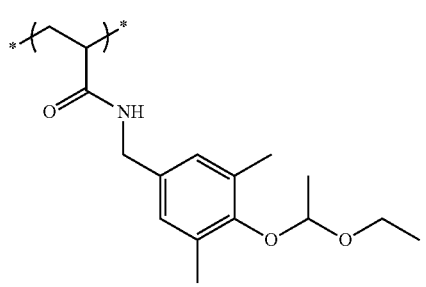
(VI-117)
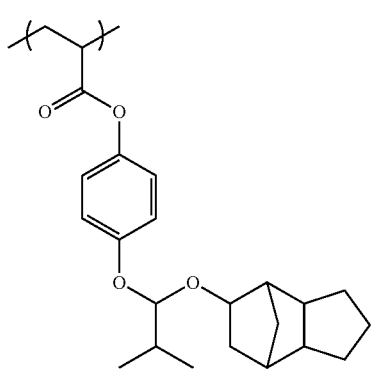
(VI-118)
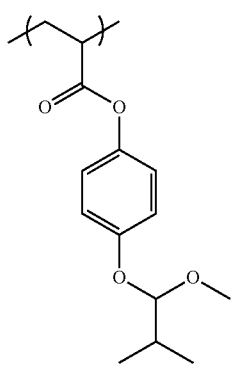
(VI-119)
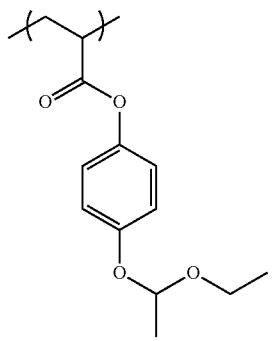
(VI-120)
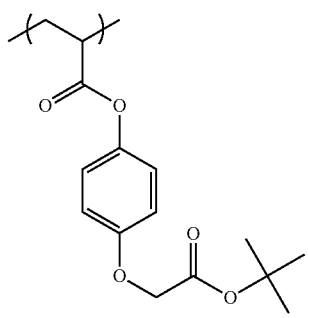
(VI-121)
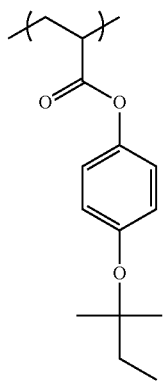
(VI-122)
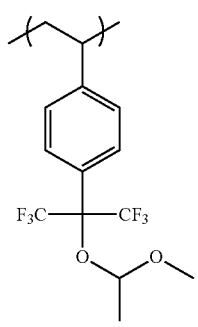

(VI-123) 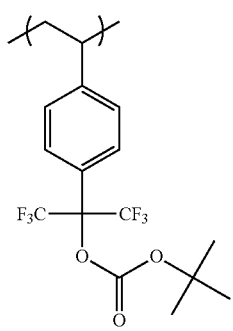
(VI-124) 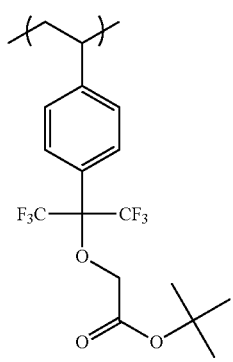
(VI-125) 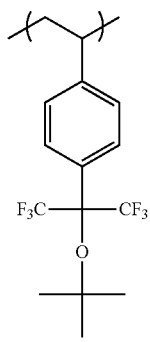
(VI-126) 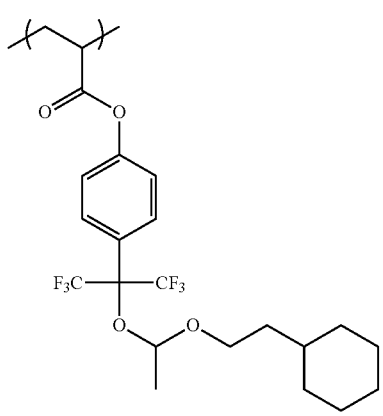
(VI-127) 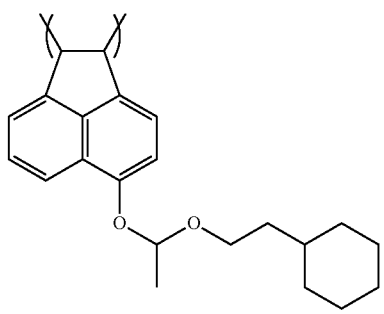
(VI-128) 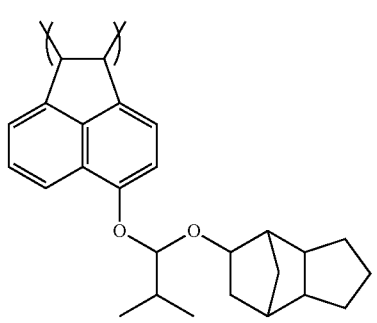
(VI-129) 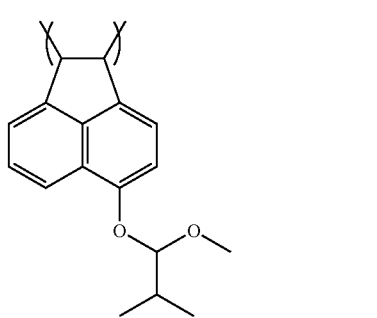
(VI-130) 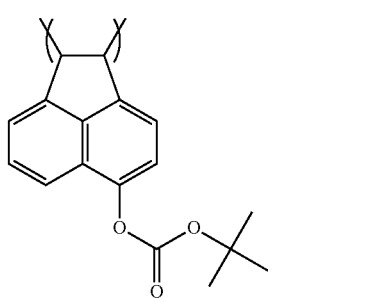
(VI-131)

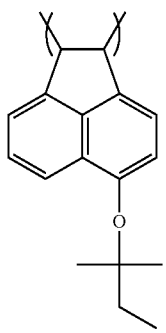 (VI-132)
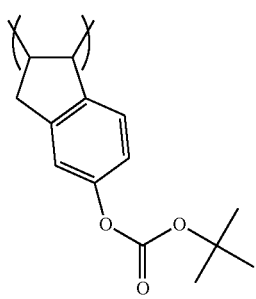 (VI-133)
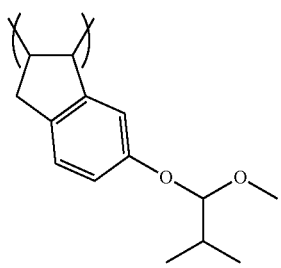 (VI-134)
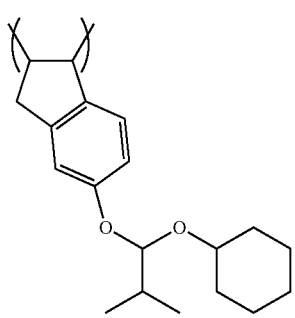 (VI-135)
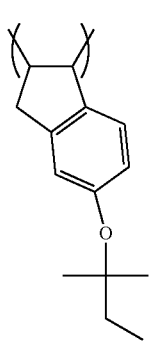 (VI-136)
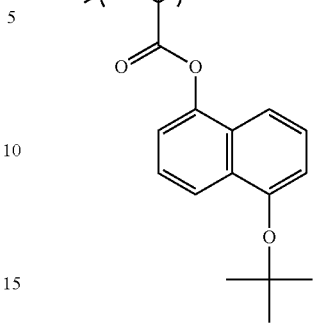 (VI-137)
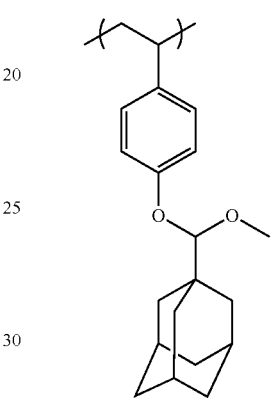 (VI-138)
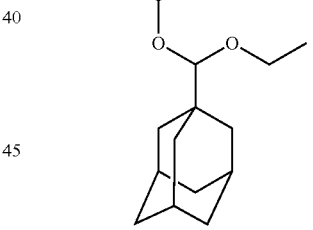 (VI-139)
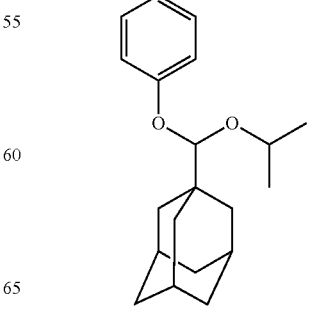 (VI-140)

-continued (VI-141)

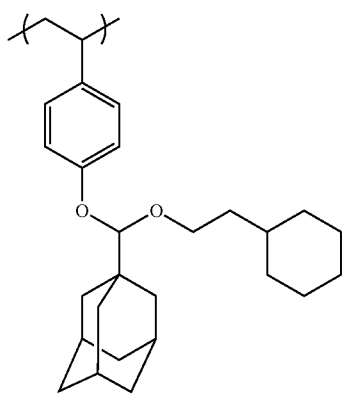

The repeating unit represented by formula (VI) is a repeating unit in which a phenolic hydroxyl group is produced resulting from decomposition of an acid-decomposable group, but in this case, there is a tendency that the solubility of the resin in the exposed area for an organic solvent is less likely to become sufficiently low, and in view of resolution, addition of the repeating unit is not preferred in some cases. This tendency emerges more prominently in a repeating unit derived from hydroxystyrenes (that is, in formula (VI), when both $X_6$ and $L_6$ are a single bond). The reason therefor is not clearly known but is presumed to be because, for example, a phenolic hydroxyl group is present in the vicinity of the main chain. On this account, in the present invention, the content of the repeating unit in which a phenolic hydroxyl group is produced resulting from decomposition of an acid-decomposable group (for example, the repeating unit represented by formula (VI), preferably the repeating unit represented by formula (VI) where both $X_6$ and $L_6$ are a single bond) is preferably 4 mol % or less, more preferably 2 mol % or less, and most preferably 0 mol % (namely, the repeating unit is not contained), based on all repeating units in the resin (A).

Also, the resin (A) may contain, as the repeating unit (a), a repeating unit represented by the following formula (BZ):

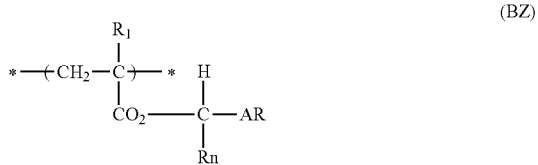

(BZ)

In formula (BZ), AR represents an aryl group, Rn represents an alkyl group, a cycloalkyl group or an aryl group, and Rn and AR may combine with each other to form a non-aromatic ring.

$R_1$ represents a hydrogen atom, an alkyl group, a cycloalkyl group, a halogen atom, a cyano group or an alkyloxycarbonyl group.

The aryl group of AR is preferably an aryl group having a carbon number 6 to 20, such as phenyl group, naphthyl group, anthryl group and fluorene group, more preferably an aryl group having a carbon number of 6 to 15.

When AR is a naphthyl group, an anthryl group or a fluorene group, the bonding position of AR to the carbon atom to which Rn is bonded is not particularly limited. For example, when AR is a naphthyl group, the carbon atom may be bonded to the α-position or β-position of the naphthyl group. When AR is an anthryl group, the carbon atom may be bonded to the 1-position, 2-position or 9-position of the anthryl group.

The aryl group as AR may have one or more substituents. Specific examples of the substituent include a linear or branched alkyl group having a carbon number of 1 to 20, such as methyl group, ethyl group, propyl group, isopropyl group, n-butyl group, isobutyl group, tert-butyl group, pentyl group, hexyl group, octyl group and dodecyl group, an alkoxy group containing such an alkyl group moiety, a cycloalkyl group such as cyclopentyl group and cyclohexyl group, a cycloalkoxy group containing such a cycloalkyl group moiety, a hydroxyl group, a halogen atom, an aryl group, a cyano group, a nitro group, an acyl group, an acyloxy group, an acylamino group, a sulfonylamino group, an alkylthio group, an arylthio group, an aralkylthio group, a thiophenecarbonyloxy group, a thiophenemethylcarbonyloxy group, and a heterocyclic residue such as pyrrolidone residue. The substituent is preferably a linear or branched alkyl group having a carbon number of 1 to 5 or an alkoxy group containing such an alkyl group moiety, more preferably a para-methyl group or a para-methoxy group.

In the case where the aryl group as AR has a plurality of substituents, at least two members of the plurality of substituents may combine with each other to form a ring. The ring is preferably a 5- to 8-membered ring, more preferably a 5- or 6-membered ring. The ring may be a heterocyclic ring containing a heteroatom such as oxygen atom, nitrogen atom and sulfur atom, in the ring members.

Furthermore, this ring may have a substituent. Examples of the substituent are the same as those described later for the further substituent which may be substituted on Rn.

In view of the roughness performance, the repeating unit (a) represented by formula (BZ) preferably contains two or more aromatic rings. Usually, the number of aromatic rings contained in the repeating unit is preferably 5 or less, more preferably 3 or less.

Also, in the repeating unit (a) represented by formula (BZ), in view of the roughness performance, AR preferably contains two or more aromatic rings, and it is more preferred that AR is a naphthyl group or a biphenyl group. Usually, the number of aromatic rings contained in AR is preferably 5 or less, more preferably 3 or less.

As described above, Rn represents an alkyl group, a cycloalkyl group or an aryl group.

The alkyl group of Rn may be a linear alkyl group or a branched alkyl group. The alkyl group is preferably an alkyl group having a carbon number of 1 to 20, such as methyl group, ethyl group, propyl group, isopropyl group, n-butyl group, isobutyl group, tert-butyl group, pentyl group, hexyl group, cyclohexyl group, octyl group and dodecyl group. The alkyl group of Rn is preferably an alkyl group having a carbon number of 1 to 5, more preferably an alkyl group having a carbon number of 1 to 3.

The cycloalkyl group of Rn includes, for example, a cycloalkyl group having a carbon number of 3 to 15, such as cyclopentyl group and cyclohexyl group.

The aryl group of Rn is preferably, for example, an aryl group having a carbon number of 6 to 14, such as phenyl group, xylyl group, toluoyl group, cumenyl group, naphthyl group and anthryl group.

Each of the alkyl group, cycloalkyl group and aryl group as Rn may further have a substituent. Examples of the substituent include an alkoxy group, a hydroxyl group, a halogen atom, a nitro group, an acyl group, an acyloxy group, an acylamino group, a sulfonylamino group, a dialkylamino group, an alkylthio group, an arylthio group, an aralkylthio group, a thiophenecarbonyloxy group, a thiophenemethylcarbonyloxy group, and a heterocyclic residue such as pyrrolidone residue. Among these, an alkoxy group, a hydroxyl group, a halogen atom, a nitro group, an acyl group, an acyloxy group, an acylamino group and a sulfonylamino group are preferred.

As described above, $R_1$ represents a hydrogen atom, an alkyl group, a cycloalkyl group, a halogen atom, a cyano group or an alkyloxycarbonyl group.

Examples of the alkyl group and cycloalkyl group of $R_1$ are the same as those described above for Rn. Each of these alkyl group and cycloalkyl group may have a substituent. Examples of this substituent are the same as those described above for Rn.

In the case where $R_1$ is an alkyl or cycloalkyl group having a substituent, particularly preferred examples of $R_1$ include a trifluoromethyl group, an alkyloxycarbonylmethyl group, an alkylcarbonyloxymethyl group, a hydroxymethyl group and an alkoxymethyl group.

The halogen atom of $R_1$ includes fluorine atom, chlorine atom, bromine atom and iodine atom, with fluorine atom being preferred.

As the alkyl group moiety contained in the alkyloxycarbonyl group or $R_1$, for example, the configuration described above as the alkyl group of $R_1$ may be employed.

Rn and AR preferably combine with each other to form a non-aromatic ring and in this case, particularly the roughness performance can be more improved.

The non-aromatic ring which may be formed by combining Rn and AR with each other is preferably a 5- to 8-membered ring, more preferably a 5- or 6-membered ring.

The non-aromatic ring may be an aliphatic ring or a heterocyclic ring containing a heteroatom such as oxygen atom, nitrogen atom and sulfur atom, as a ring member.

The non-aromatic ring may have a substituent. Examples of the substituent are the same as those described above for the further substituent which Rn may have.

Specific examples of the repeating unit (a) represented by formula (BZ) are illustrated below, but the present invention is not limited thereto.

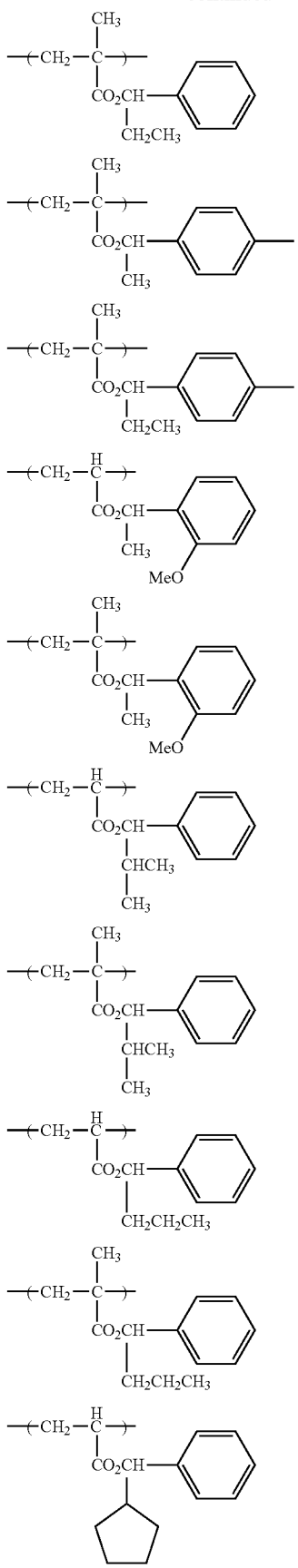

77
-continued
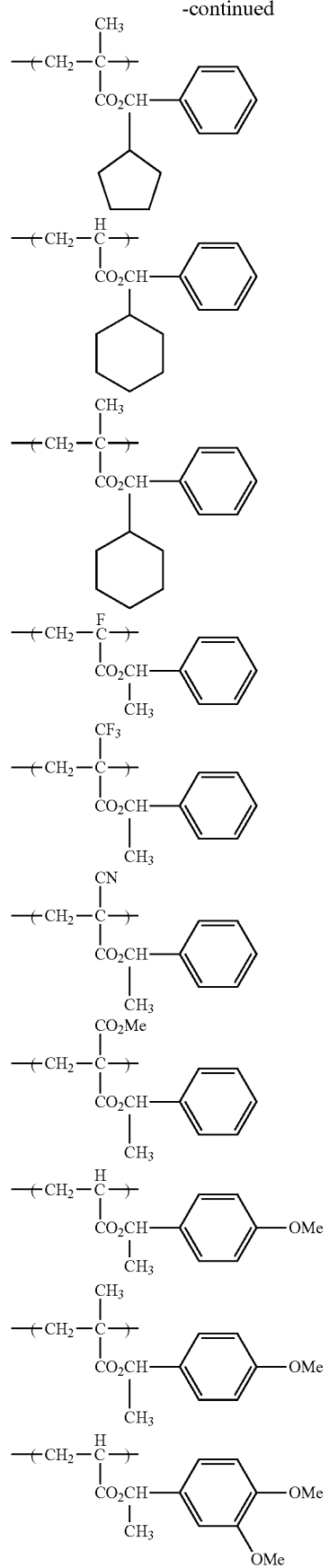
78
-continued
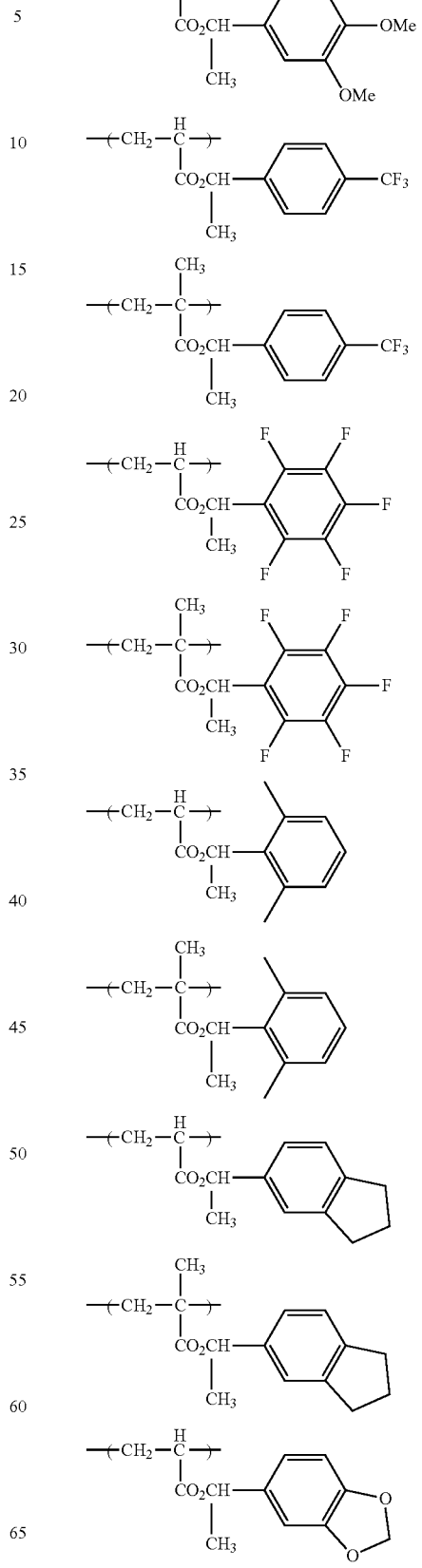

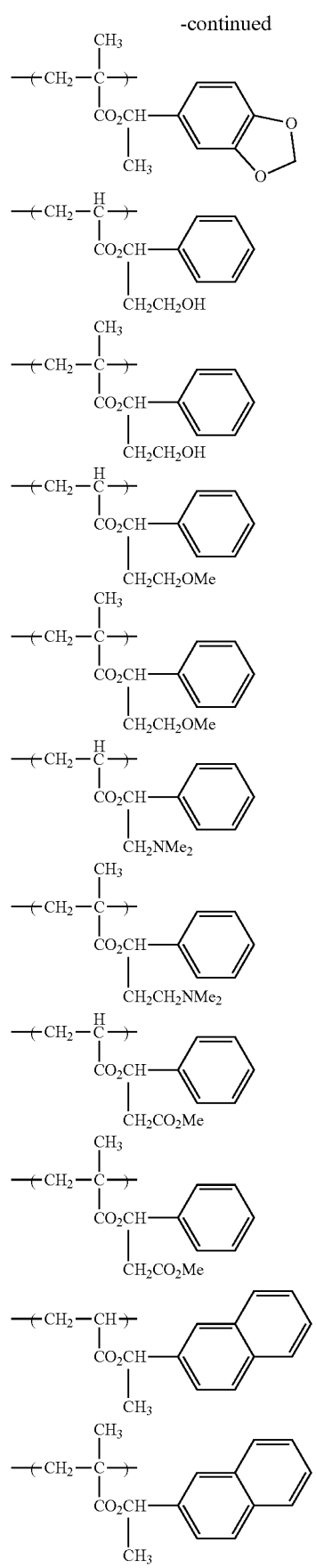
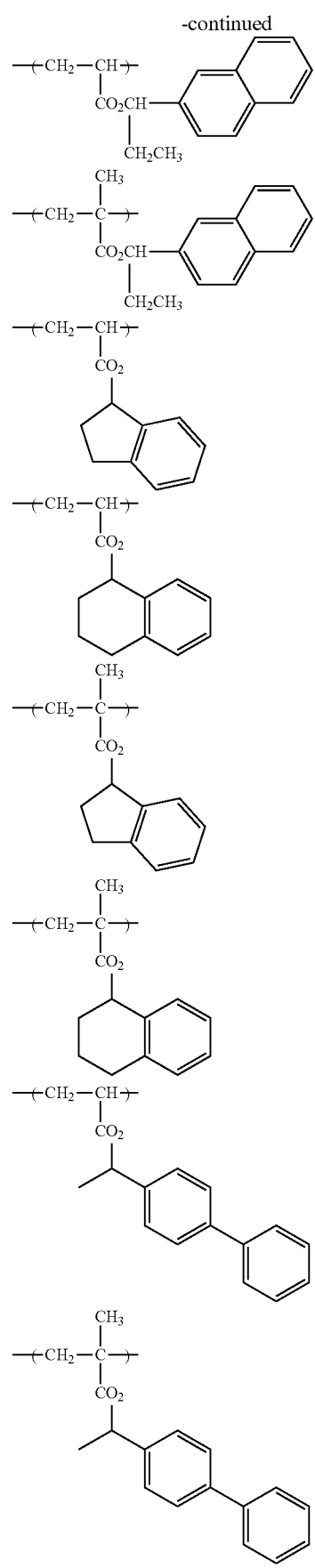

81
-continued
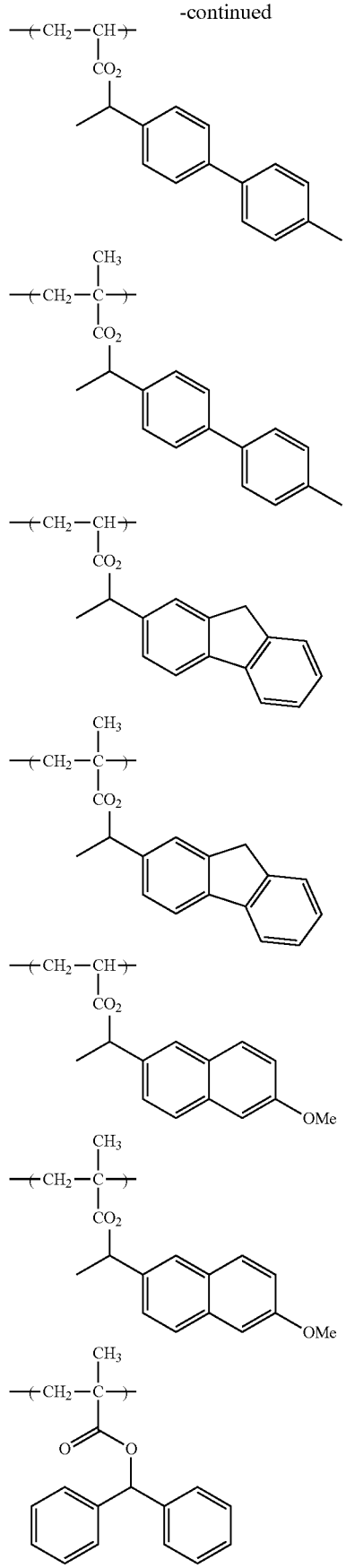
82
-continued
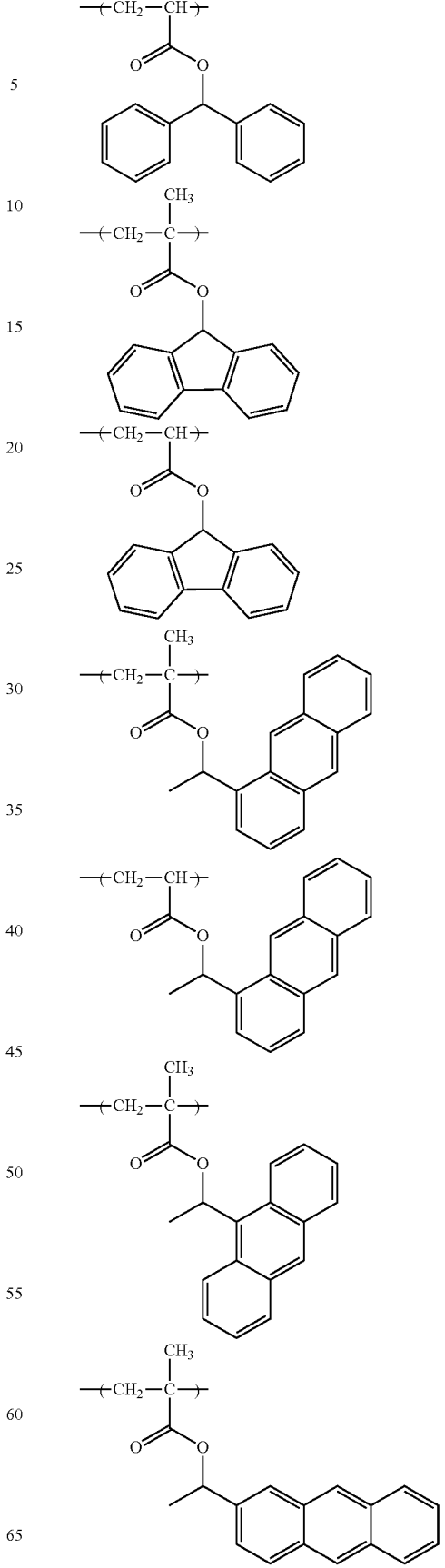

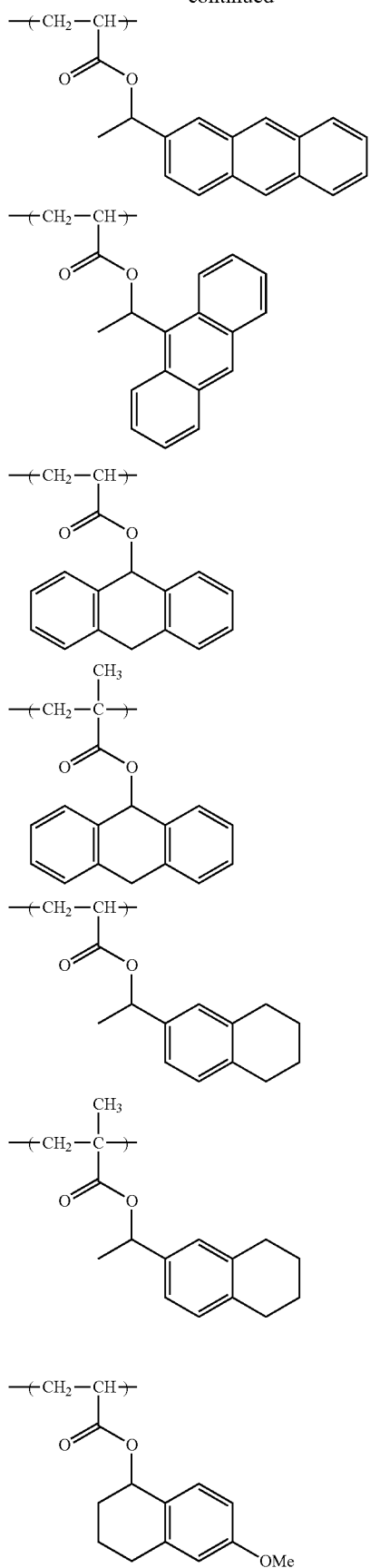

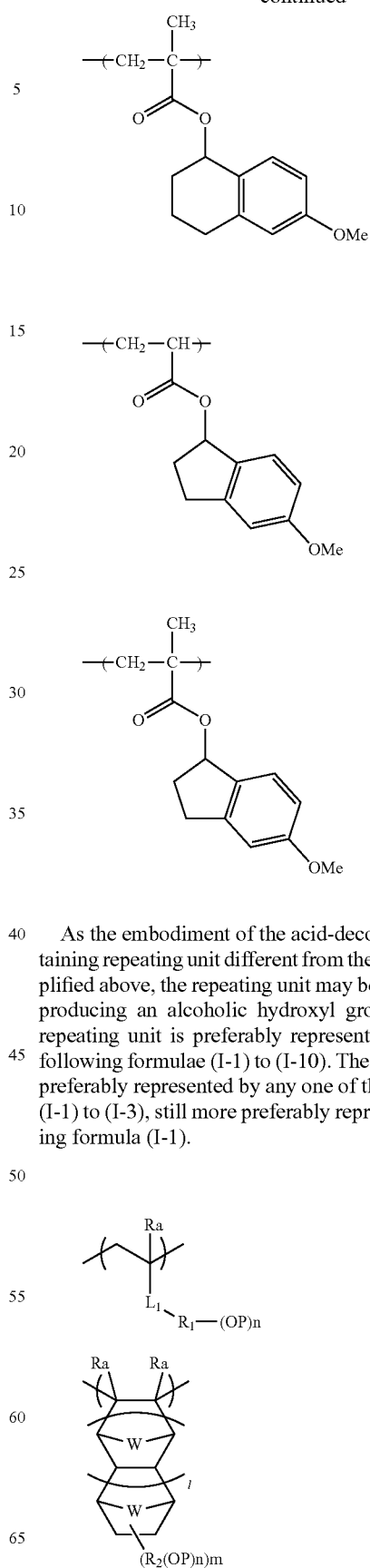

As the embodiment of the acid-decomposable group-containing repeating unit different from the repeating units exemplified above, the repeating unit may be in an embodiment of producing an alcoholic hydroxyl group. In this case, the repeating unit is preferably represented by any one of the following formulae (I-1) to (I-10). The repeating unit is more preferably represented by any one of the following formulae (I-1) to (I-3), still more preferably represented by the following formula (I-1).

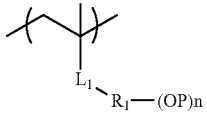
(I-1)

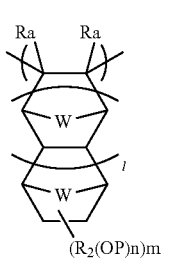
(I-2)

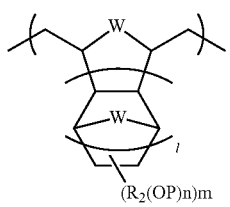
(I-3)

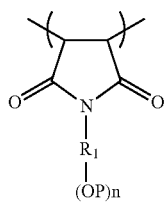
(I-4)

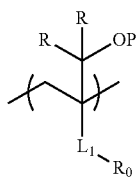
(I-5)

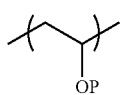
(I-6)

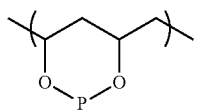
(I-7)

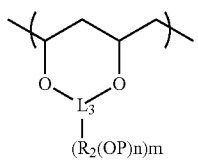
(I-8)

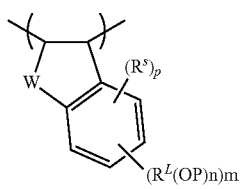
(I-9)

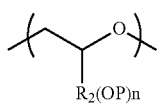
(I-10)

In formulae, each Ra independently represents a hydrogen atom, an alkyl group or a group represented by —$CH_2$—O—$Ra_2$, wherein $Ra_2$ represents a hydrogen atom, an alkyl group or an acyl group.

$R_1$ represents a (n+1)-valent organic group.

$R_2$ represents, when m≥2, each independently represents, a single bond or a (n+1)-valent organic group.

Each OP independently represents a group capable of decomposing by the action of an acid to produce an alcoholic hydroxy group, and when n≥2 and/or m≥2, two or more OP's may combine with each other to form a ring.

W represents a methylene group, an oxygen atom or a sulfur atom, n and m represent an integer of 1 or more. Incidentally, in the case where $R_2$ in formula (I-2), (I-3) or (I-8) represents a single bond, n is 1.

l represents an integer of 0 or more.

$L_1$ represents a linking group represented by —COO—, —OCO—, —CONH—, —O—, —Ar—, —$SO_3$— or —$SO_2$NH—, wherein Ar represents a divalent aromatic ring group.

Each R independently represents a hydrogen atom or an alkyl group.

$R_0$ represents a hydrogen atom or an organic group.

$L_3$ represents a (m+2)-valent linking group.

$R^L$ represents, when m≥2, each independently represents, a (n+1)-valent linking group.

$R^S$ represents, when p≥2, each independently represents, a substituent, and when p≥2, the plurality of $R^S$s may combine with each other to form a ring.

p represents an integer of 0 to 3.

Ra represents a hydrogen atom, an alkyl group or a group represented by —$CH_2$—O—$Ra_2$. Ra is preferably a hydrogen atom or an alkyl group having a carbon number of 1 to 10, more preferably a hydrogen or a methyl group.

W represents a methylene group, an oxygen atom or a sulfur atom. W is preferably a methylene group or an oxygen atom.

$R_1$ represents a (n+1)-valent organic group. $R_1$ is preferably a non-aromatic hydrocarbon group. In this case, $R_1$ may be a chain hydrocarbon group or an alicyclic hydrocarbon group. $R_1$ is more preferably an alicyclic hydrocarbon group.

$R_2$ represents a single bond or a (n+1)-valent organic group. $R_2$ is preferably a single bond or a non-aromatic hydrocarbon group. In this case, $R_2$ may be a chain hydrocarbon group or an alicyclic hydrocarbon group.

In the case where $R_1$ and/or $R_2$ are a chain hydrocarbon group, this chain hydrocarbon group may be linear or branched. The carbon number of the chain hydrocarbon group is preferably from 1 to 8. For example, when $R_1$ and/or $R_2$ are an alkylene group, $R_1$ and/or $R_2$ are preferably a methylene group, an ethylene group, an n-propylene group, an isopropylene group, an n-butylene group, an isobutylene group or a sec-butylene group.

In the case where $R_1$ and/or $R_2$ are an alicyclic hydrocarbon group, this alicyclic hydrocarbon group may be monocyclic or polycyclic. The alicylcic hydrocarbon group has, for example, a monocyclo, bicyclo, tricyclo or tetracyclo structure. The carbon number of the alicyclic hydrocarbon group is usually 5 or more, preferably from 6 to 30, more preferably from 7 to 25.

The alicyclic hydrocarbon group includes, for example, those having a partial structure illustrated below. Each of these partial structures may have a substituent. Also, in each of these partial structures, the methylene group (—$CH_2$—) may be substituted with an oxygen atom (—O—), a sulfur atom (—S—), a carbonyl group [—C(=O)—], a sulfonyl group [—S(=O)$_2$—], a sulfinyl group [—S(=O)—] or an imino group [—N(R)—] (wherein R is a hydrogen atom or an alkyl group).

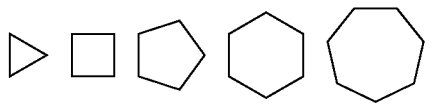

-continued

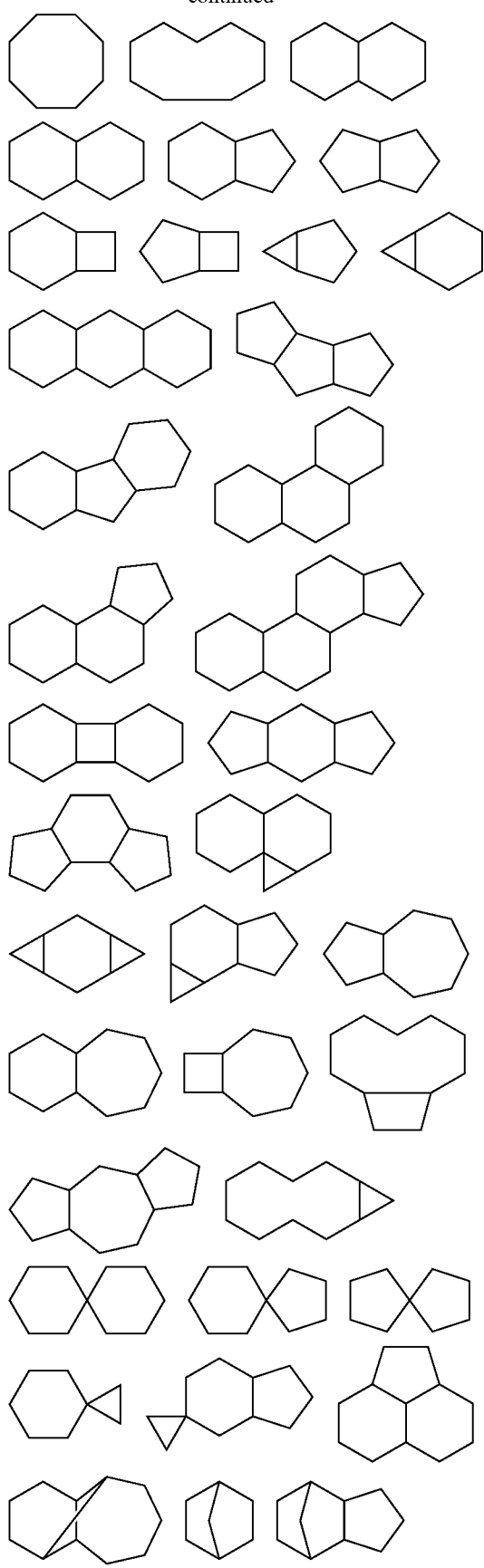

-continued

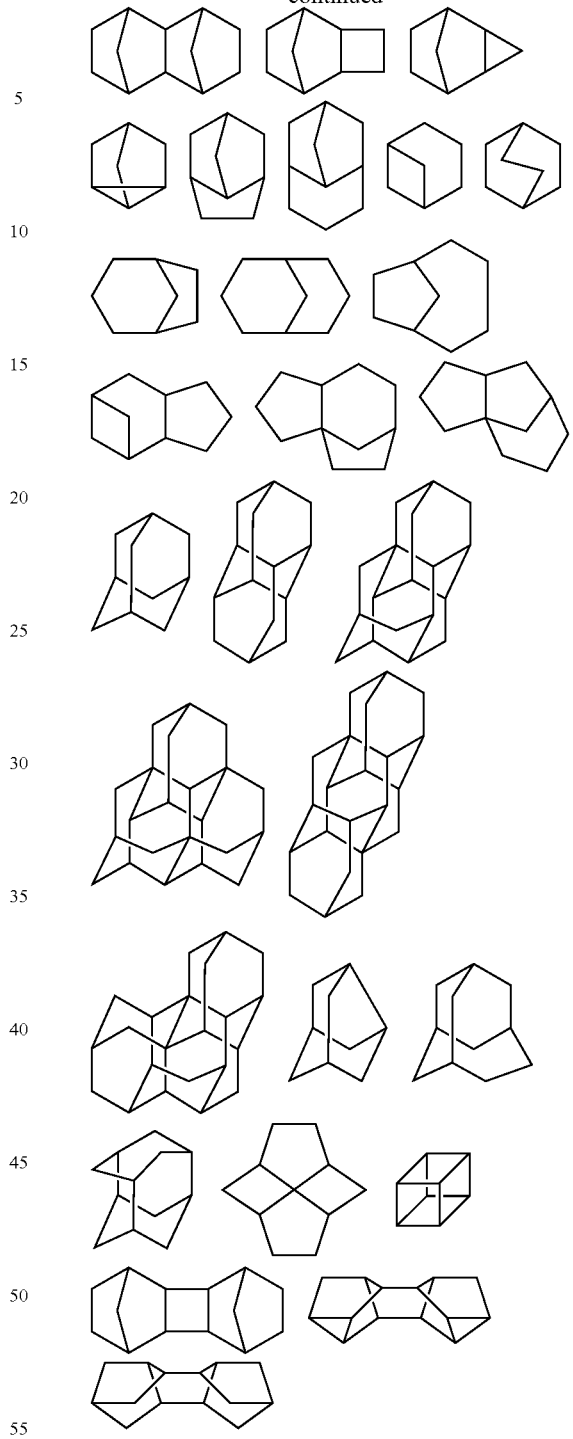

For example, when $R_1$ and/or $R_2$ are a cycloalkylene group, $R_1$ and/or $R_2$ are preferably an adamantylene group, a noradamantylene group, a decahydronaphthylene group, a tricyclodecanylene group, a tetracyclododecanylene group, a norbornylene group, a cyclopentylene group, a cyclohexylene group, a cycloheptylene group, a cyclooctylene group, a cyclodecanylene group or a cyclododecanylene group, more preferably an adamantylene group, a norbornylene group, a cyclohexylene group, a cyclopentylene group, a tetracyclododecanylene group or a tricyclodecanylene group.

The non-aromatic hydrocarbon group of $R_1$ and/or $R_2$ may have a substituent. Examples of this substituent include an alkyl group having a carbon number of 1 to 4, a halogen atom, a hydroxy group, an alkoxy group having a carbon number of 1 to 4, a carboxy group, and an alkoxycarbonyl group having a carbon number of 2 to 6. These alkyl group, alkoxy group and alkoxycarbonyl group may further have a substituent, and examples of the substituent include a hydroxy group, a halogen atom and an alkoxy group.

$L_1$ represents a linking group represented by —COO—, —OCO—, —CONH—, —O—, —Ar—, —$SO_3$— or —$SO_2$NH—, wherein Ar represents a divalent aromatic ring group. $L_1$ is preferably a linking group represented by —COO—, —CONH— or —Ar—, more preferably a linking group represented by —COO— or —CONH—.

R represents a hydrogen atom or an alkyl group. The alkyl group may be linear or branched. The carbon number of this alkyl group is preferably from 1 to 6, more preferably from 1 to 3. R is preferably a hydrogen atom or a methyl group, more preferably a hydrogen atom.

$R_0$ represents a hydrogen atom or an organic group. Examples of the organic group include an alkyl group, a cycloalkyl group, an aryl group, an alkynyl group and an alkenyl group. $R_0$ is preferably a hydrogen atom or an alkyl group, more preferably a hydrogen atom or a methyl group.

$L_3$ represents a (m+2)-valent linking group. That is, $L_3$ represents a trivalent or higher valent linking group. Examples of such a linking group include corresponding groups in specific examples illustrated later.

$R^L$ represents a (n+1)-valent linking group. That is, $R^L$ represents a divalent or higher valent linking group. Examples of such a linking group include an alkylene group, a cycloalkylene group, and corresponding groups in specific examples illustrated later. $R^L$ may combine with another $R^L$ or $R^S$ to form a ring structure.

$R^S$ represents a substituent. The substituent includes, for example, an alkyl group, an alkenyl group, an alkynyl group, an aryl group, an alkoxy group, an acyloxy group, an alkoxycarbonyl group and a halogen atom.

n is an integer of 1 or more. n is preferably an integer of 1 to 3, more preferably 1 or 2. Also, when n is an integer of 2 or more, the dissolution contrast for an organic solvent-containing developer can be more enhanced and in turn, the limiting resolution and roughness characteristics can be more improved.

m is an integer of 1 or more. m is preferably an integer of 1 to 3, more preferably 1 or 2.

l an integer of 0 or more. l is preferably 0 or 1.

p is an integer of 0 to 3.

Specific examples of the repeating unit having a group capable of decomposing by the action of an acid to produce an alcoholic hydroxy group are illustrated below. In specific examples, Ra and OP have the same meanings as in formulae (I-1) to (I-3). In the case where a plurality of OP's are combined to form a ring, the corresponding ring structure is conveniently denoted by "O—P—O".

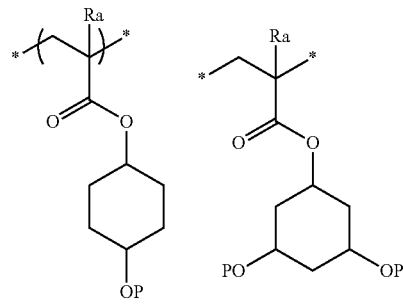

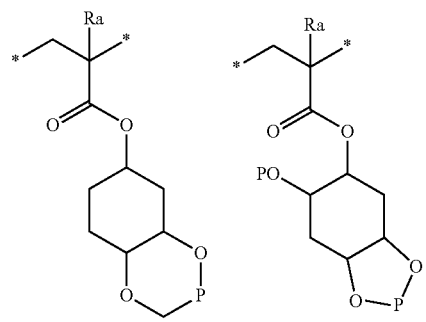

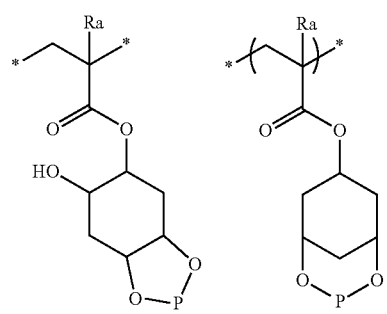

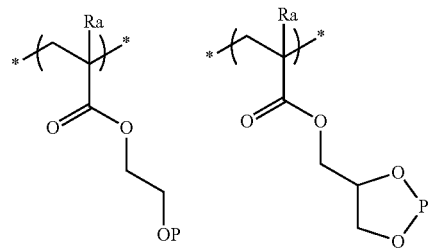

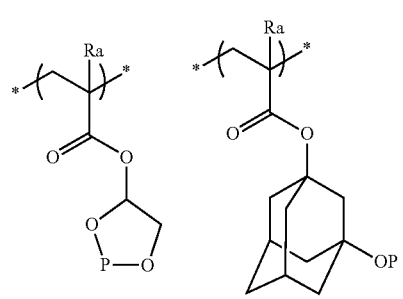

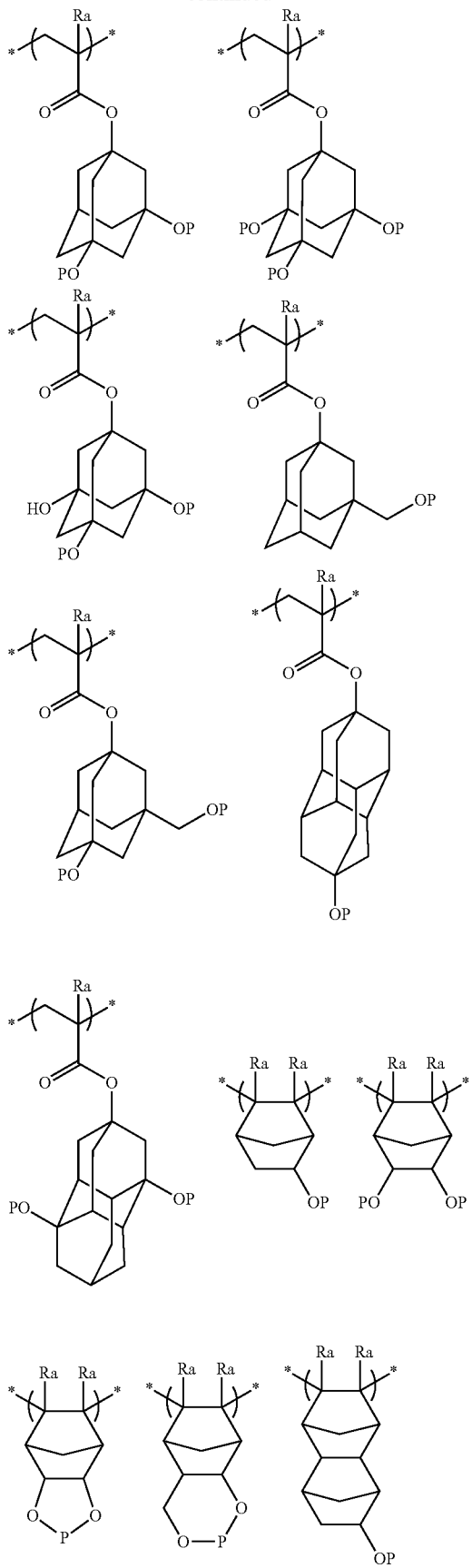
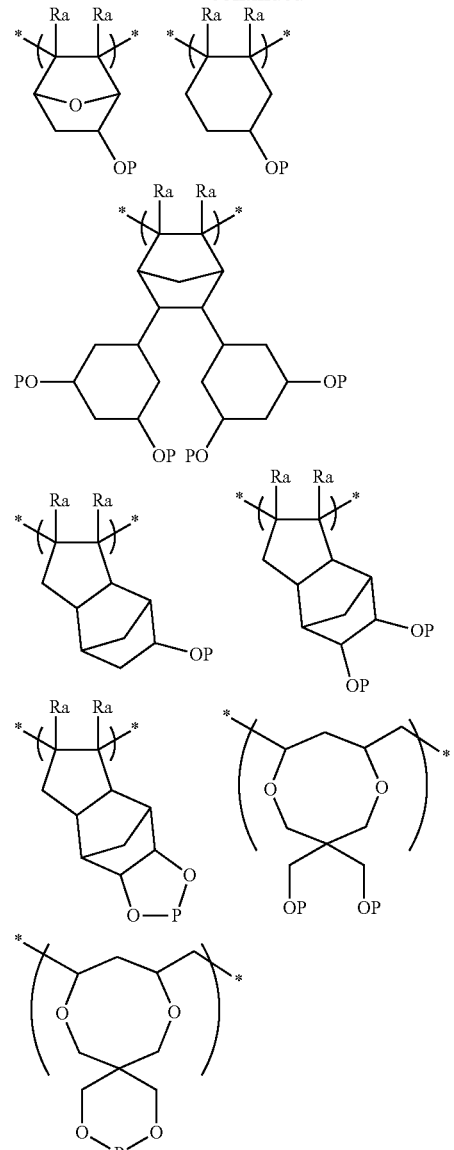
The group capable of decomposing by the action of an acid to produce an alcoholic hydroxy group is preferably represented by at least one formula selected from the group consisting of the following formulae (II-1) to (II-4):
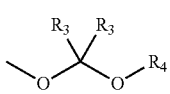 (II-1)
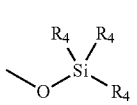 (II-2)
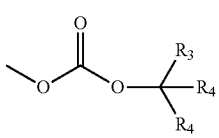 (II-3)

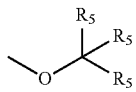
(II-4)

In the formulae, each $R_3$ independently represents a hydrogen atom or a monovalent organic group. $R_3$s may combine with each other to form a ring.

Each $R_4$ independently represents a monovalent organic group. $R_4$s may combine with each other to form a ring. $R_3$ and $R_4$ may combine with each other to form a ring.

Each $R_5$ independently represents a hydrogen atom, an alkyl group, a cycloalkyl group, an aryl group, an alkenyl group or an alkynyl group. At least two $R_5$s may combine with each other to form a ring, provided that when one or two of three $R_5$s are a hydrogen atom, at least one of the remaining $R_5$s represents an aryl group, an alkenyl group or an alkynyl group.

The group capable of decomposing by the action of an acid to produce an alcoholic hydroxy group is also preferably represented by at least one formula selected from the group consisting of the following formulae (II-5) to (II-9):

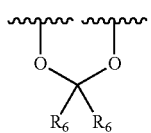
(II-5)

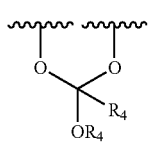
(II-6)

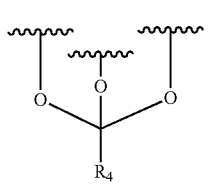
(II-7)

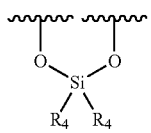
(II-8)

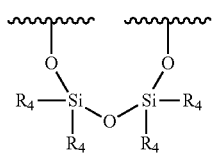
(II-9)

In the formulae, $R_4$ has the same meaning as in formulae (II-1) to (II-3).

Each $R_6$ independently represents a hydrogen atom or a monovalent organic group. $R_6$s may combine with each other to form a ring.

The group capable of decomposing by the action of an acid to produce an alcoholic hydroxy group is more preferably represented by at least one formula selected from formulae (II-1) to (II-3), still more preferably represented by formula (II-1) or (II-3), yet still more preferably represented by formula (II-1).

$R_3$ represents a hydrogen atom or a monovalent organic group as described above. $R_3$ is preferably a hydrogen atom, an alkyl group or a cycloalkyl group, more preferably a hydrogen atom or an alkyl group.

The alkyl group of $R_3$ may be linear or branched. The carbon number of the alkyl group of $R_3$ is preferably from 1 to 10, more preferably from 1 to 3. Examples of the alkyl group of $R_3$ include a methyl group, an ethyl group, an n-propyl group, an isopropyl group and an n-butyl group.

The cycloalkyl group of $R_3$ may be monocyclic or polycyclic. The carbon number of the cycloalkyl group of $R_3$ is preferably 3 to 10, more preferably 4 to 8. Examples of the cycloalkyl group of $R_3$ include a cyclopropyl group, a cyclobutyl group, a cyclopentyl group, a cyclohexyl group, a norbornyl group and an adamantyl group.

In formula (II-1), at least either one $R_3$ is preferably a monovalent organic group. When such a configuration is employed, particularly high sensitivity can be achieved.

$R_4$ represents a monovalent organic group. $R_4$ is preferably an alkyl group or a cycloalkyl group, more preferably an alkyl group. These alkyl group and cycloalkyl group may have a substituent.

The alkyl group of $R_4$ preferably has no substituent or has one or more aryl groups and/or one or more silyl groups as the substituent. The carbon number of the unsubstituted alkyl group is preferably from 1 to 20. The carbon number of the alkyl group moiety in the alkyl group substituted with one or more aryl groups is preferably from 1 to 25. The carbon number of the alkyl group moiety in the alkyl group substituted with one or more silyl groups is preferably from 1 to 30. Also, in the case where the cycloalkyl group of $R_4$ does not have a substituent, the carbon number thereof is preferably from 3 to 20.

$R_5$ represents a hydrogen atom, an alkyl group, a cycloalkyl group, an aryl group, an alkenyl group or an alkynyl group. However, when one or two of three $R_5$s are a hydrogen atom, at least one of the remaining $R_5$s represents an aryl group, an alkenyl group or an alkynyl group. $R_5$ is preferably a hydrogen atom or an alkyl group. The alkyl group may or may not have a substituent. When the alkyl group does not have a substituent, the carbon number thereof is preferably from 1 to 6, more preferably from 1 to 3.

$R_6$ represents a hydrogen atom or a monovalent organic group as described above. $R_6$ is preferably a hydrogen atom, an alkyl group or a cycloalkyl group, more preferably a hydrogen atom or an alkyl group, still more preferably a hydrogen atom or an alkyl group having no substituent. $R_6$ is preferably a hydrogen atom or an alkyl group having a carbon number of 1 to 10, more preferably a hydrogen atom or an alkyl group having a carbon number of 1 to 10 and having no substituent.

Examples of the alkyl group and cycloalkyl group of $R_4$, $R_5$ and $R_6$ are the same as those described for $R_3$ above.

Specific examples of the group capable of decomposing by the action of an acid to produce an alcoholic hydroxyl group are illustrated below.

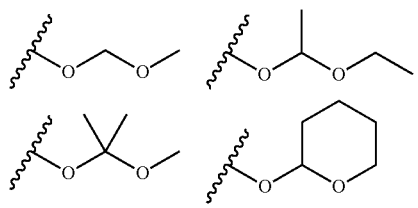

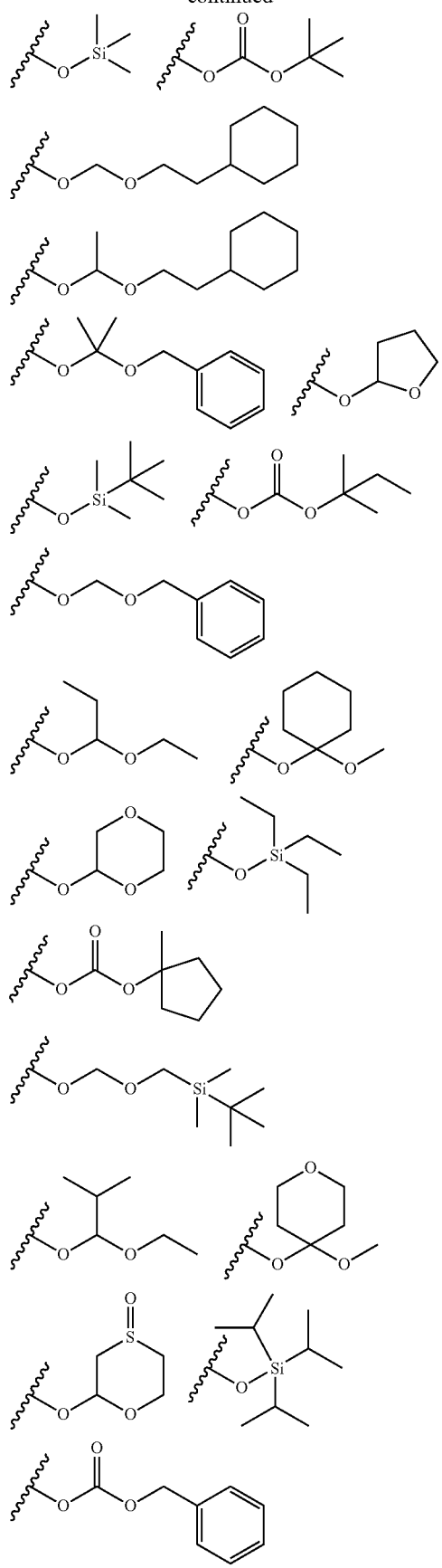
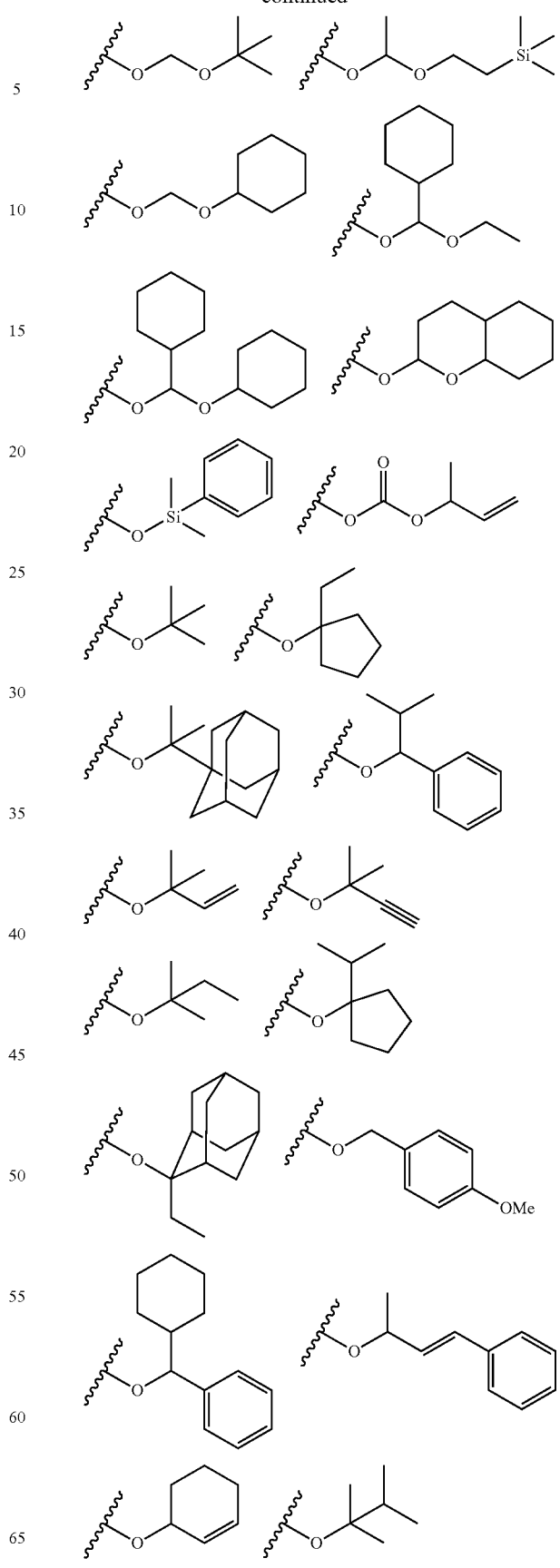

-continued
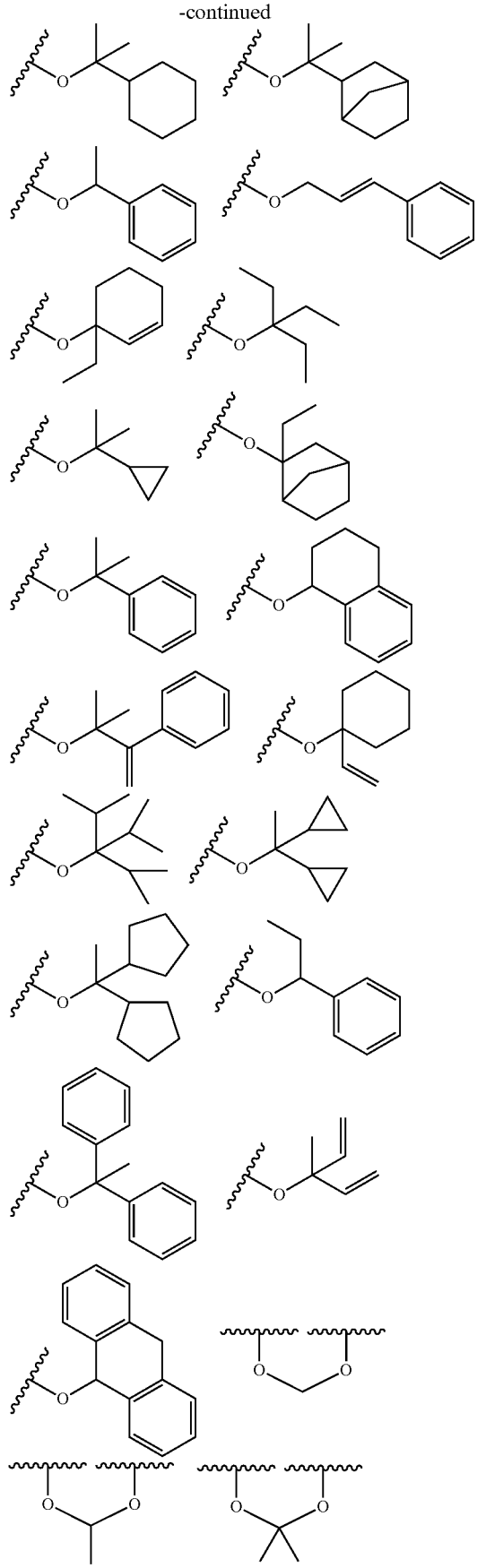
-continued
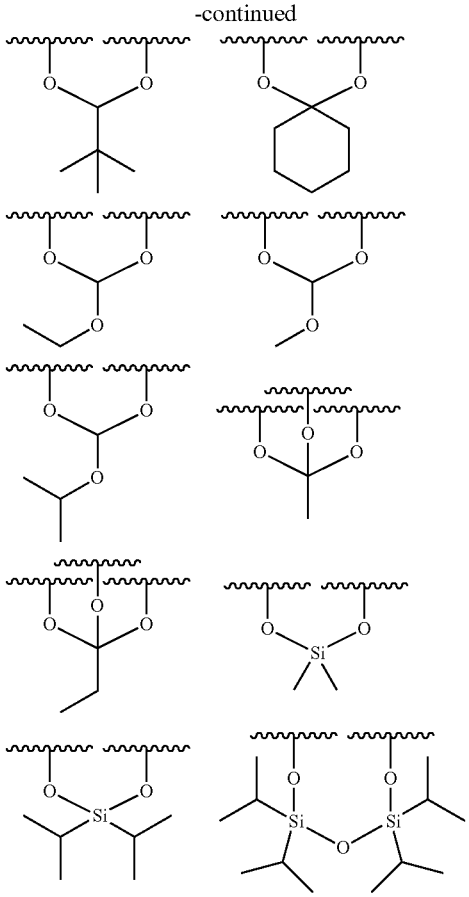
Specific examples of the repeating unit containing a group capable of decomposing by the action of an acid to produce an alcoholic hydroxy group are illustrated below. In specific examples, $Xa_1$ represents a hydrogen atom, $CH_3$, $CF_3$ or $CH_2OH$.
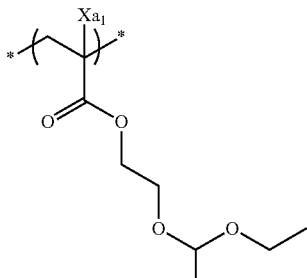
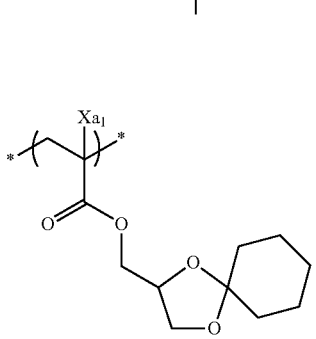

99
-continued
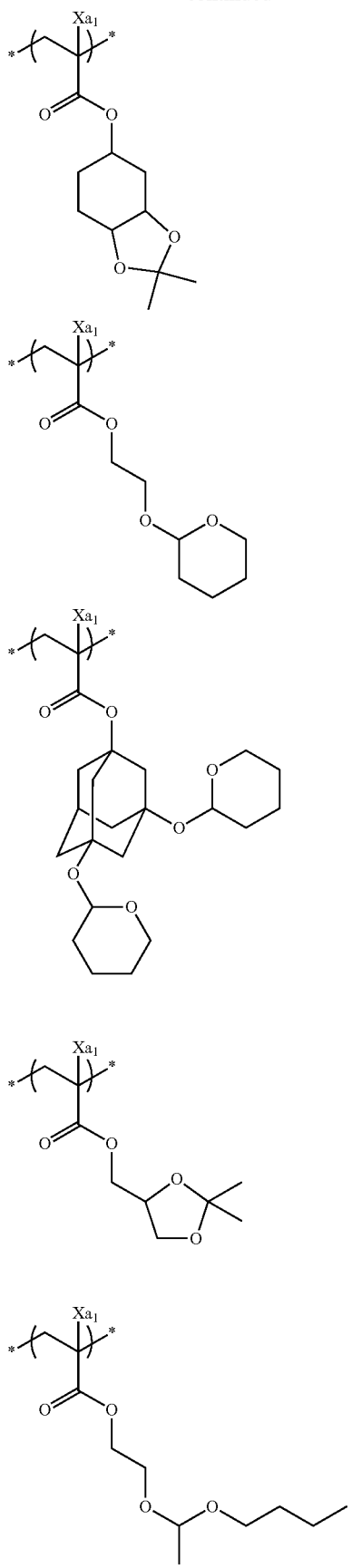
100
-continued
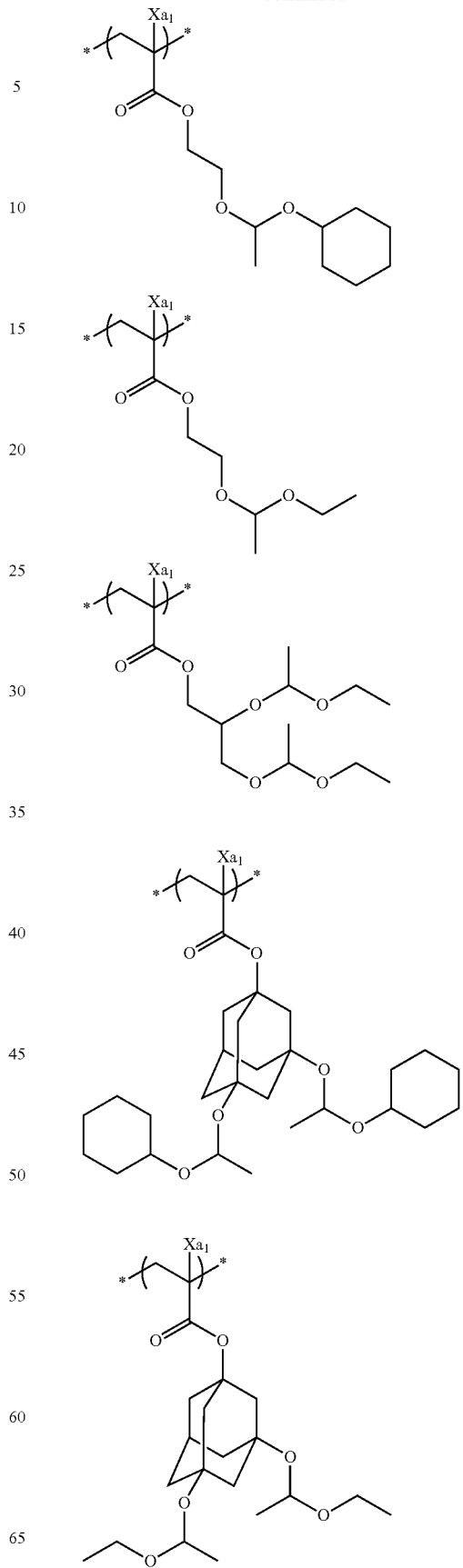

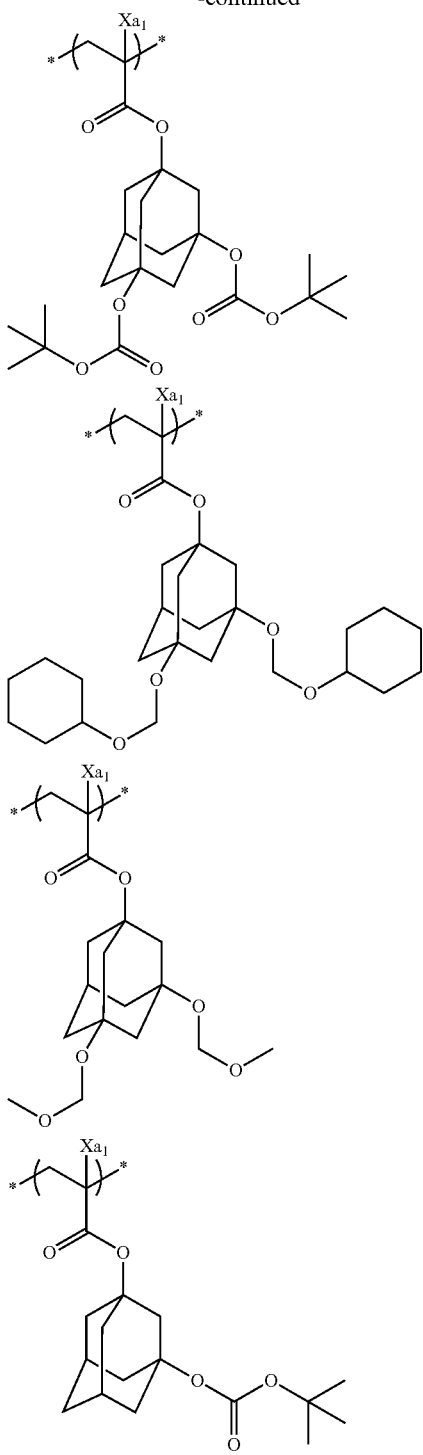

As for the repeating unit having an acid-decomposable group, one kind may be used alone, or two or more kinds may be used in combination.

The content of the repeating unit having an acid-decomposable group (in the case of containing a plurality of kinds of repeating units, the total thereof) in the resin (A) is preferably from 5 to 80 mol %, more preferably from 5 to 75 mol %, still more preferably from 10 to 65 mol %, based on all repeating units in the resin (A).

(b) Repeating Unit Having Polar Group

The resin (A) preferably contains (b) a repeating unit having a polar group. By containing the repeating unit (b), for example, the sensitivity of the composition containing the resin can be enhanced. The repeating unit (b) is preferably a non-acid-decomposable repeating unit (that is, does not have an acid-decomposable group).

The "polar group" which can be contained in the repeating unit (b) include, for example, the following (1) to (4). In the following, the "electronegativity" means a Pauling's value.

(1) A functional group containing a structure where an oxygen atom and an atom with the electronegativity difference from oxygen atom being 1.1 or more are bonded through a single bond Examples of this polar group include a group containing a structure represented by O—H, such as hydroxy group.

(2) A functional group containing a structure where a nitrogen atom and an atom with the electronegativity difference from nitrogen atom being 0.6 or more are bonded through a single bond Examples of this polar group include a group containing a structure represented by N—H, such as amino group.

(3) A functional group containing a structure where two atoms differing in the electronegativity by 0.5 or more are bonded through a double bond or a triple bond Examples of this polar group include a group containing a structure represented by C≡N, C═O, N═O, S═O or C═N.

(4) A functional group having an ionic moiety

Examples of this polar group include a group having a moiety represented by $N^+$ or $S^+$.

Specific examples of the structure which can be contained in the "polar group" are illustrated below. In the following specific examples, $X^-$ indicates a counter anion.

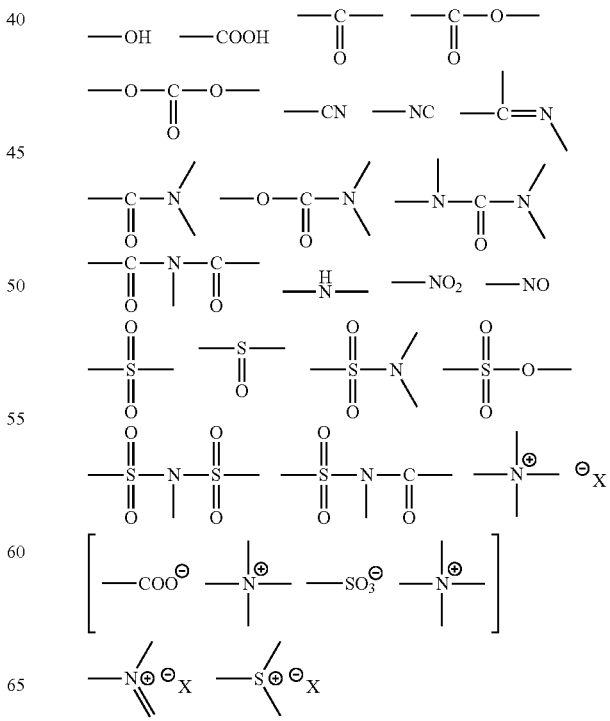

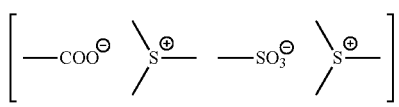

The "polar group" which can be contained in the repeating unit (b) is preferably, for example, at least one selected from the group consisting of (I) a hydroxy group, (II) a cyano group, (III) a lactone group, (IV) a carboxylic acid group or a sulfonic acid group, (V) an amide group, a sulfonamide group or a group corresponding to a derivative thereof, (VI) an ammonium salt or a sulfonium salt, and a group formed by combining two or more thereof.

The polar group is preferably selected from a hydroxyl group, a cyano group, a lactone group, a carboxylic acid group, a sulfonic acid group, an amide group, a sulfonamide group, an ammonium group, a sulfonium group, and a group formed by combining two or more thereof, more preferably an alcoholic hydroxy group, a cyano group, a lactone group, or a cyanolactone structure-containing group.

When a repeating unit having an alcoholic hydroxy group is further incorporated into the resin, the exposure latitude (EL) of a composition containing the resin can be more enhanced.

When a repeating unit having a cyano group is further incorporated into the resin, the sensitivity of a composition containing the resin can be more enhanced.

When a repeating unit having a lactone group is further incorporated into the resin, the dissolution contrast for an organic solvent-containing developer can be more enhanced. Also, a composition containing the resin can be more improved in the dry etching resistance, coatability and adherence to substrate.

When a repeating unit having a group containing a cyano group-containing lactone structure is further incorporated into the resin, the dissolution contrast for an organic solvent-containing developer can be more enhanced. Also, a composition containing the resin can be more improved in the sensitivity, dry etching resistance, coatability and adherence to substrate. In addition, a single repeating unit can play functions attributable to a cyano group and a lactone group, respectively, and the latitude in designing the resin can be more broadened.

In the case where the polar group contained in the repeating unit (b) is an alcoholic hydroxyl group, the repeating unit is preferably represented by any one of the following formulae (I-1H) to (I-10H), more preferably represented by any one of the following formulae (I-1H) to (I-3H), still more preferably represented by the following formula (I-1H).

(I-1H)

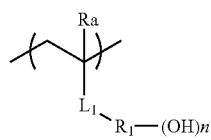

(I-2H)

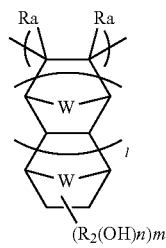

(I-3H)

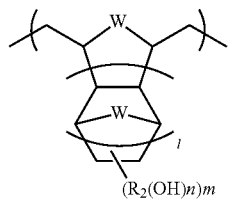

(I-4H)

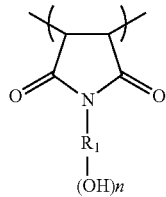

(I-5H)

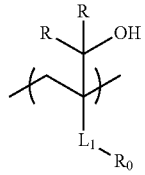

(I-6H)

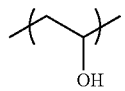

(I-7H)

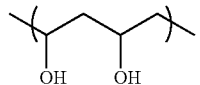

(I-8H)

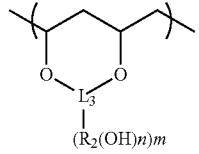

(I-9H)

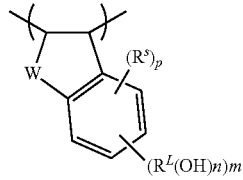

(I-10H)

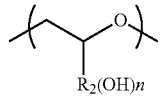

In the formulae, Ra, $R_1$, $R_2$, W, n, m, l, $L_1$, R, $R_0$, $L_3$, $R^L$, $R^S$ and p have the same meanings as in formulae (I-1) to (I-10).

When a repeating unit having a group capable of decomposing by the action of an acid to produce an alcoholic hydroxy group and a repeating unit represented by any one of formulae (I-1H) to (I-10H) are used in combination, for example, thanks to suppression of acid diffusion by the alcoholic hydroxy group and increase in the sensitivity brought about by the group capable of decomposing by the action of an acid to produce an alcoholic hydroxy group, the exposure latitude (EL) can be improved without deteriorating other performances.

The content of the repeating unit having an alcoholic hydroxyl group is preferably from 1 to 60 mol %, more preferably from 3 to 50 mol %, still more preferably from 5 to 40 mol %, based on all repeating units in the resin (A).

Specific examples of the repeating unit represented by any one of formulae (I-1H) to (I-10H) are illustrated below. In specific examples, Ra has the same meaning as in formulae (I-1H) to (I-10H).

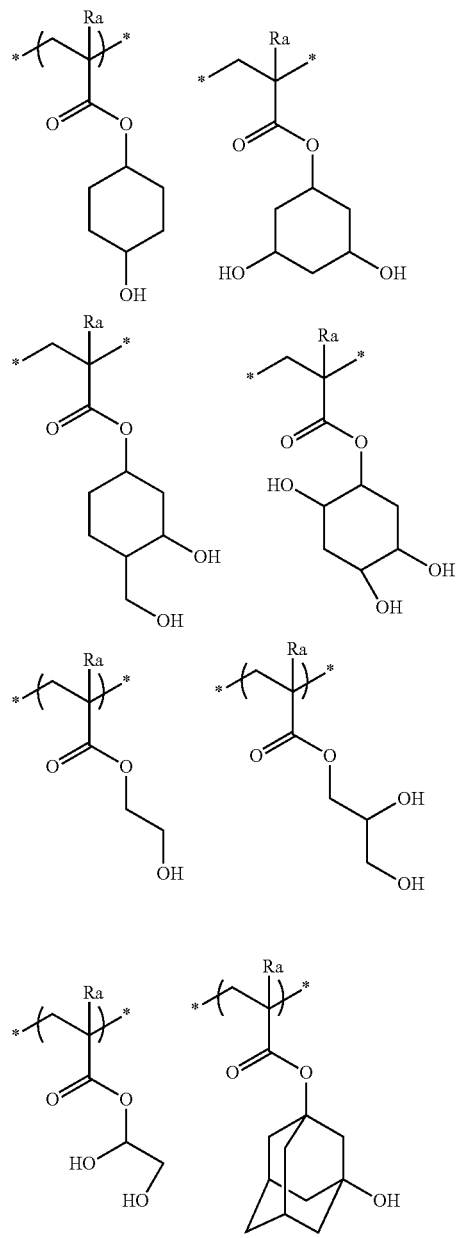

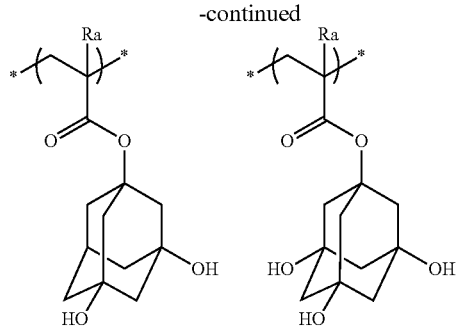

-continued

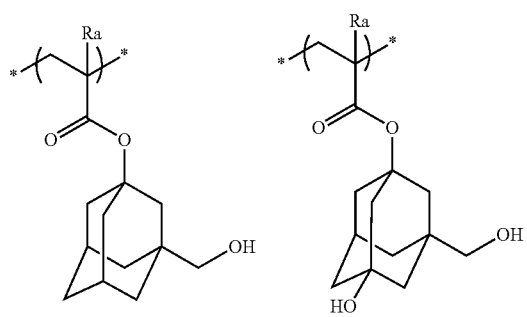

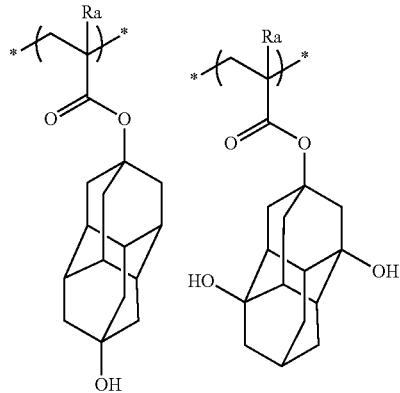

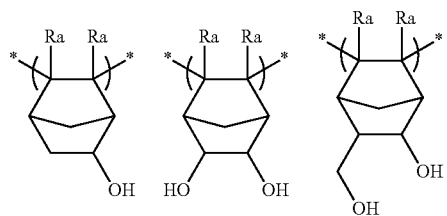

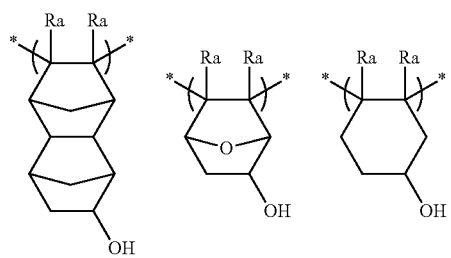

-continued

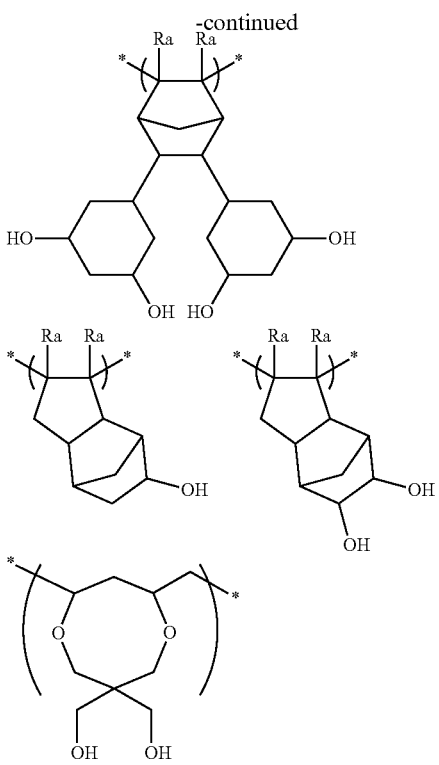

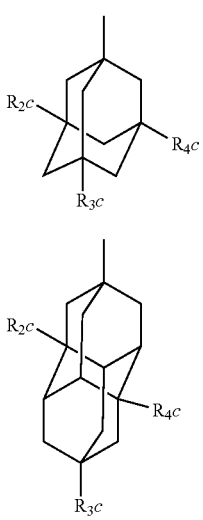

In the case where the polar group contained in the repeating unit (b) is an alcoholic hydroxy group or a cyano group, one preferred embodiment of the repeating unit is a repeating unit having an alicyclic hydrocarbon structure substituted with a hydroxyl group or a cyano group. At this time, it is preferred to have no acid-decomposable group. The alicyclic hydrocarbon structure in the alicyclic hydrocarbon structure substituted with a hydroxyl group or a cyano group is preferably an adamantyl group, a diamantyl group or a norbornane group. The alicyclic hydrocarbon structure substituted with a hydroxyl group or a cyano group is preferably a partial structure represented by the following formulae (VIIa) to (VIIc). Thanks to this repeating unit, adherence to substrate and affinity for developer are enhanced.

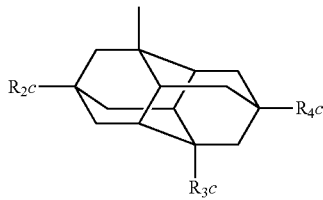

(VIIa)

(VIIb)

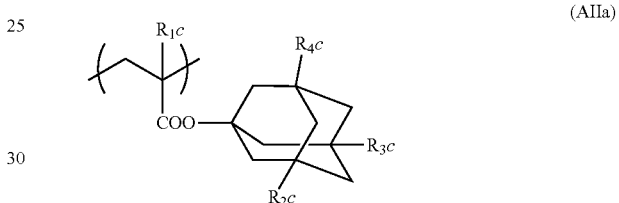

(VIIc)

In formulae (VIIa) to (VIIc), each of $R_2c$ to $R_4c$ independently represents a hydrogen atom, a hydroxyl group or a cyano group, provided that at least one of $R_2c$ to $R_4c$ represents a hydroxyl group. A structure where one or two members of $R_2c$ to $R_4c$ are a hydroxyl group with the remaining being a hydrogen atom is preferred. In formula (VIIa), it is more preferred that two members of $R_2c$ to $R_4c$ are a hydroxyl group and the remaining is a hydrogen atom.

The repeating unit having a partial structure represented by formulae (VIIa) to (VIIc) includes repeating units represented by the following formulae (AIIa) to (AIIc):

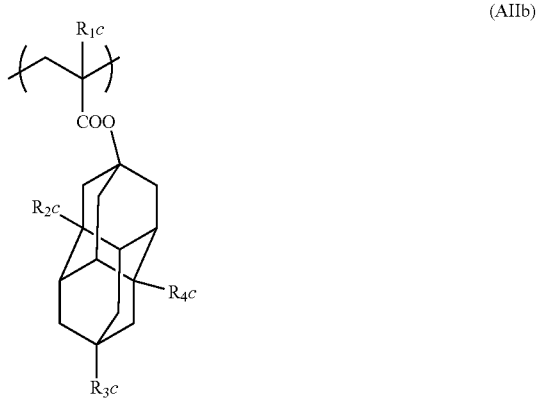

(AIIa)

(AIIb)

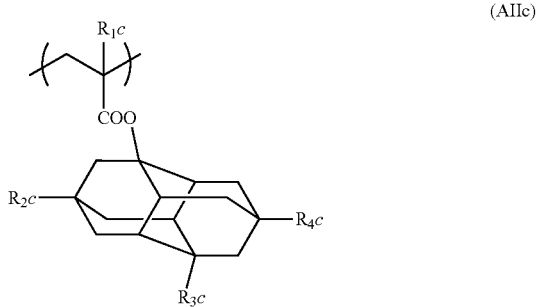

(AIIc)

In formulae (AIIa) to (AIIc), $R_1c$ represents a hydrogen atom, a methyl group, a trifluoromethyl group or a hydroxymethyl group.

$R_2c$ to $R_4c$ have the same meanings as $R_2c$ to $R_4c$ in formulae (VIIa) to (VIIc).

The resin (A) may or may not contain a repeating unit having a hydroxyl group or a cyano group, but in the case of containing a repeating unit having a hydroxyl group or a cyano group, the content thereof is preferably from 1 to 60 mol %, more preferably from 3 to 50 mol %, still more preferably from 5 to 40 mol %, based on all repeating units in the resin (A).

Specific examples of the repeating unit having a hydroxyl group or a cyano group are illustrated below, but the present invention is not limited thereto.

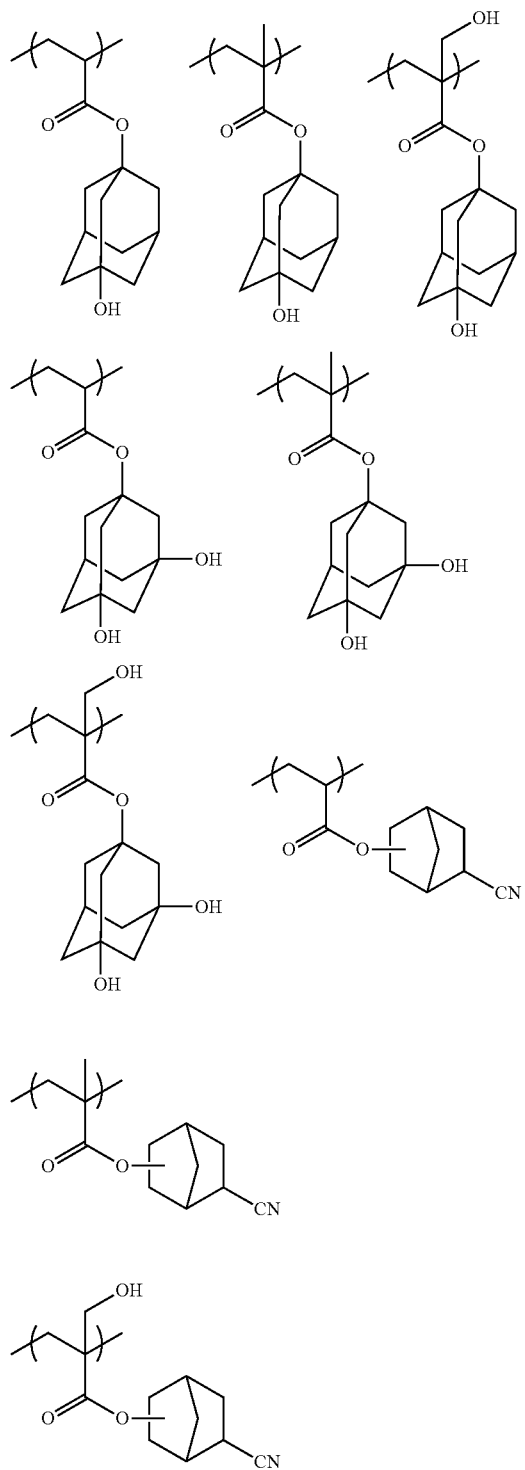

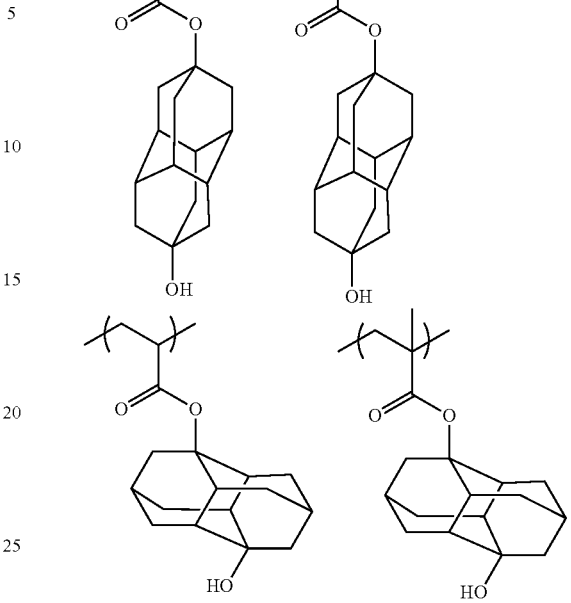

The repeating unit (b) may be a repeating unit having a lactone structure as the polar group.

The repeating unit having a lactone structure is preferably a repeating unit represented by the following formula (AII):

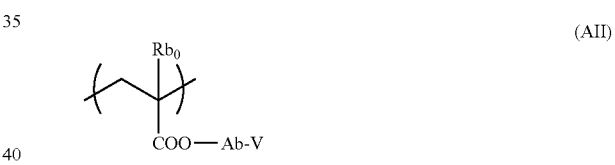

(AII)

In formula (AII), $Rb_0$ represents a hydrogen atom, a halogen atom or an alkyl group (preferably having a carbon number of 1 to 4) which may have a substituent.

Preferred substituents which the alkyl group of $Rb_0$ may have include a hydroxyl group and a halogen atom. The halogen atom of $Rb_0$ includes a fluorine atom, a chlorine atom, a bromine atom and an iodine atom. $Rb_0$ is preferably a hydrogen atom, a methyl group, a hydroxymethyl group or a trifluoromethyl group, more preferably a hydrogen atom or a methyl group.

Ab represents a single bond, an alkylene group, a divalent linking group having a monocyclic or polycyclic cycloalkyl structure, an ether bond, an ester bond, a carbonyl group, or a divalent linking group formed by combining these. Ab is preferably a single bond or a divalent linking group represented by -$Ab_1$-$CO_2$—.

$Ab_1$ is a linear or branched alkylene group or a monocyclic or polycyclic cycloalkylene group and is preferably a methylene group, an ethylene group, a cyclohexylene group, an adamantylene group or a norbornylene group.

V represents a group having a lactone structure.

As the group having a lactone structure, any group may be used as long as it has a lactone structure, but a 5- to 7-membered ring lactone structure is preferred, and a 5- to 7-membered ring lactone structure to which another ring structure is fused to form a bicyclo or spiro structure is preferred. It is more preferred to contain a repeating unit having a lactone structure represented by any one of the following formulae (LC1-1) to (LC1-17). The lactone structure may be bonded directly to the main chain Preferred lactone structures are (LC1-1), (LC1-4), (LC1-5), (LC1-6), (LC1-8), (LC1-13) and (LC1-14) are preferred.
LC1-1
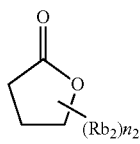
LC1-2
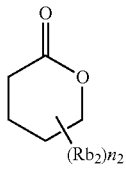
LC1-3
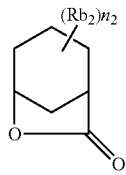
LC1-4
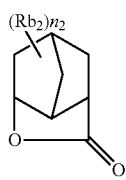
LC1-5
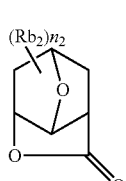
LC1-6
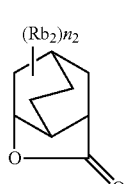
LC1-7
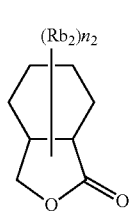
LC1-8
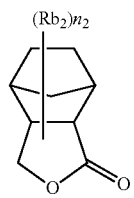
LC1-9
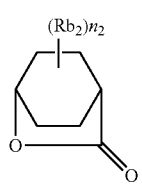
LC1-10
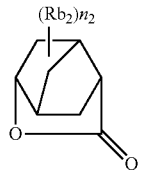
LC1-11
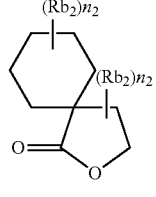
LC1-12
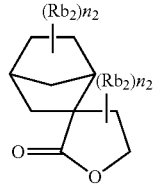
LC1-13
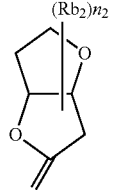
LC1-14
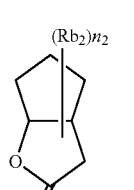
LC1-15
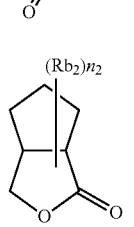

-continued

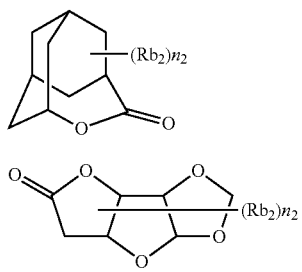
LC1-16

LC1-17

The lactone structure moiety may or may not have a substituent (Rb$_2$). Preferred examples of the substituent (Rb$_2$) include an alkyl group having a carbon number of 1 to 8, a monovalent cycloalkyl group having a carbon number of 4 to 7, an alkoxy group having a carbon number of 1 to 8, an alkoxycarbonyl group having a carbon number of 2 to 8, a carboxyl group, a halogen atom, a hydroxyl group, a cyano group and an acid-decomposable group. Among these, an alkyl group having a carbon number of 1 to 4, a cyano group and an acid-decomposable group are more preferred. n$_2$ represents an integer of 0 to 4. When n$_2$ is 2 or more, each substituent (Rb$_2$) may be the same as or different from every other substituents (Rb$_2$) and also, the plurality of substituents (Rb$_2$) may combine with each other to form a ring.

The repeating unit having a lactone group usually has an optical isomer, and any optical isomer may be used. One optical isomer may be used alone, or a mixture of a plurality of optical isomers may be used. In the case of mainly using one optical isomer, the optical purity (ee) thereof is preferably 90% or more, more preferably 95% or more.

The resin (A) may or may not contain the repeating unit having a lactone structure, but in the case of containing the repeating unit having a lactone structure, the content of the repeating unit above in the resin (A) is preferably from 1 to 70 mol %, more preferably from 3 to 65 mol %, still more preferably from 5 to 60 mol %, based on all repeating units.

Specific examples of the lactone structure-containing repeating unit in the resin (A) are illustrated below, but the present invention is not limited thereto. In the formulae, Rx represents H, CH$_3$, CH$_2$OH or CF$_3$.

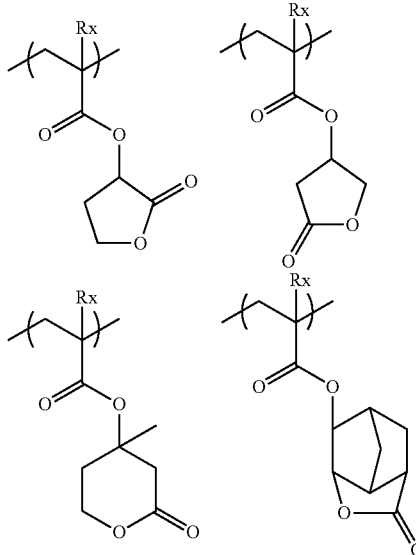

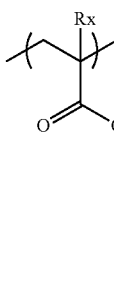

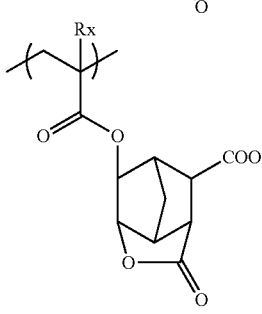

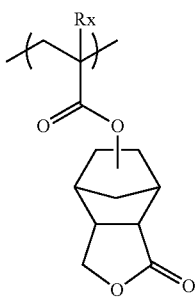

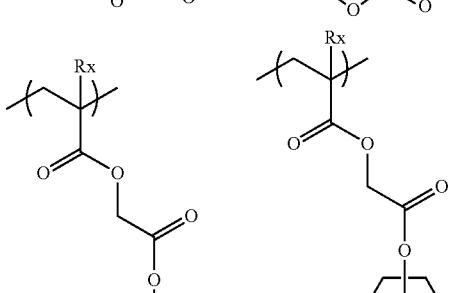

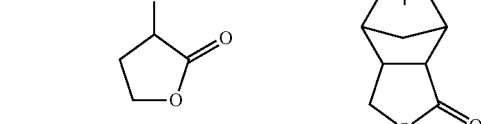

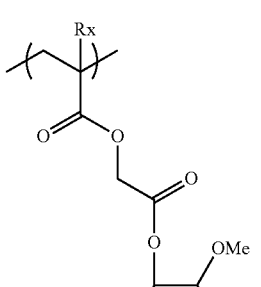

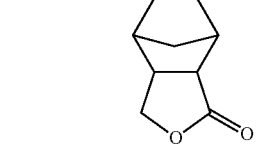

-continued

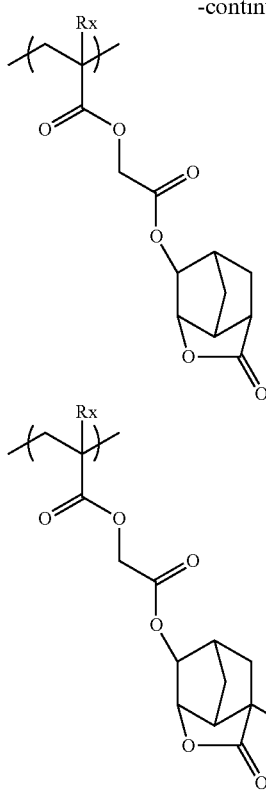

It is also a particularly preferred embodiment that the polar group which can be contained in the repeating unit (b) is an acidic group. Preferred acidic groups include a phenolic hydroxyl group, a carboxylic acid group, a sulfonic acid group, a fluorinated alcohol group (such as hexafluoroisopropanol group), a sulfonamide group, a sulfonylimide group, an (alkylsulfonyl)(alkylcarbonyl)methylene group, an (alkylsulfonyl)(alkylcarbonyl)imide group, a bis(alkylcarbonyl)methylene group, a bis(alkylcarbonyl)imide group, a bis(alkylsulfonyl)methylene group, a bis(alkylsulfonyl)imide group, tris (alkylcarbonyl)methylene group and tris(alkylsulfonyl) methylene group. Among others, the repeating unit (b) is preferably a repeating unit having a carboxyl group. By virtue of containing a repeating unit having an acidic group, the resolution increases in usage of forming contact holes. As the repeating unit having an acidic group, all of a repeating unit where an acidic group is directly bonded to the main chain of the resin, such as repeating unit by an acrylic acid or a methacrylic acid, a repeating unit where an acidic group is bonded to the main chain of the resin through a linking group, and a repeating unit where an acidic group is introduced into the polymer chain terminal by using an acidic group-containing polymerization initiator or chain transfer agent at the polymerization, are preferred. In particular, a repeating unit by an acrylic acid or a methacrylic acid is preferred.

The acidic group which can be contained in the repeating unit (b) may or may not contain an aromatic ring, but in the case of containing an aromatic ring, the acidic group is preferably selected from acidic groups except for a phenolic hydroxyl group. In the case where the repeating unit (b) has an acidic group, the content of the repeating unit having an acidic group is preferably 30 mol % or less, more preferably 20 mol % or less, based on all repeating units in the resin (A). In the case where the resin (A) contains a repeating unit having an acidic group, the content of the repeating unit having an acidic group in the resin (A) is usually 1 mol % or more.

Specific examples of the repeating unit having an acidic group are illustrated below, but the present invention is not limited thereto.

In specific examples, Rx represents H, $CH_3$, $CH_2OH$ or $CF_3$.

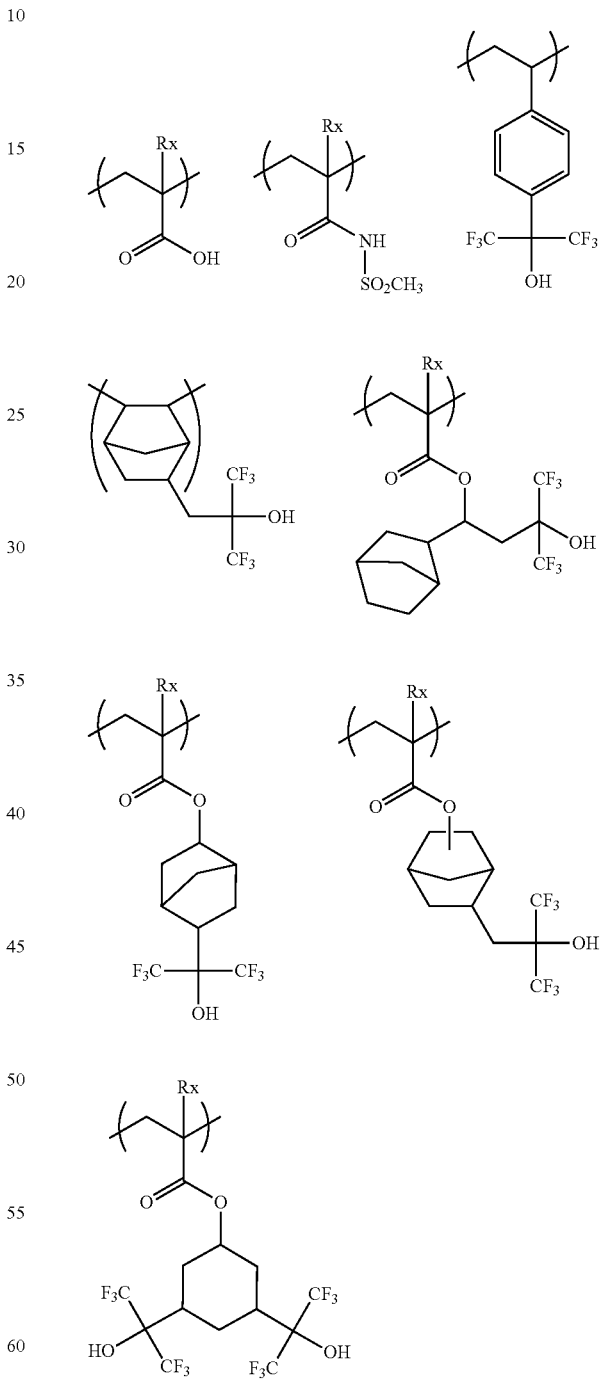

The resin (A) for use in the present invention may contain (b) a non-acid-decomposable repeating unit having a phenolic hydroxyl group. The repeating unit (b) here is preferably a structure represented by the following formula (I):

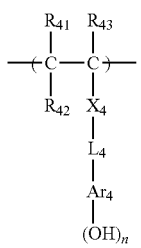

(I)

In the formula, each of $R_{41}$, $R_{42}$ and $R_{43}$ independently represents a hydrogen atom, an alkyl group, a halogen atom, a cyano group or an alkoxycarbonyl group. $R_{42}$ may combine with $Ar_4$ to form a ring, and in this case, $R_{42}$ represents a single bond or an alkylene group.

$X_4$ represents a single bond, —COO— or —CONR$_{64}$—, and $R_{64}$ represents a hydrogen atom or an alkyl group.

$L_4$ represents a single bond or an alkylene group.

$Ar_4$ represents a (n+1)-valent aromatic ring group, and in the case of combining with $R_{42}$ to form a ring, $Ar_4$ represents a (n+2)-valent aromatic ring group.

n represents an integer of 1 to 4.

Specific examples of the alkyl group, cycloalkyl group, halogen atom and alkoxycarbonyl group of $R_{41}$, $R_{42}$ and $R_{43}$ in formula (I) and the substituent which these groups may have are the same as specific examples described above for respective groups represented by $R_{51}$, $R_{52}$ and $R_{53}$ in formula (V).

$Ar_4$ represents a (n+1)-valent aromatic ring group. The divalent aromatic ring group when n is 1 may have a substituent, and preferred examples of the divalent aromatic ring group include an arylene group having a carbon number of 6 to 18, such as phenylene group, tolylene group, naphthylene group and anthracenylene group, and an aromatic ring group containing a heterocyclic ring such as thiophene, furan, pyrrole, benzothiophene, benzofuran, benzopyrrole, triazine, imidazole, benzimidazole, triazole, thiadiazole and thiazole.

Specific preferred examples of the (n+1)-valent aromatic ring group when n is an integer of 2 or more include groups formed by removing arbitrary (n−1) hydrogen atoms from the above-described specific examples of the divalent aromatic ring group.

The (n+1)-valent aromatic ring group may further have a substituent.

Examples of the substituent which the above-described alkyl group, cycloalkyl group, alkoxycarbonyl group, alkylene group and (n+1)-valent aromatic ring group may have include the alkyl group described for $R_{51}$ to $R_{53}$ in formula (V), an alkoxy group such as methoxy group, ethoxy group, hydroxyethoxy group, propoxy group, hydroxypropoxy group and butoxy group, and an aryl group such as phenyl group.

Examples of the alkyl group of $R_{64}$ in —CONR$_{64}$— ($R_{64}$ represents a hydrogen atom or an alkyl group) represented by $X_4$ are the same as those of the alkyl group of $R_{61}$ to $R_{63}$.

$X_4$ is preferably a single bond, —COO— or —CONH—, more preferably a single bond or —COO—.

The alkylene group in $L_4$ is preferably an alkylene group having a carbon number of 1 to 8, such as methylene group, ethylene group, propylene group, butylene group, hexylene group and octylene group, which may have a substituent.

$Ar_4$ is preferably an aromatic ring group having a carbon number of 6 to 18, which may have a substituent, more preferably a benzene ring group, a naphthalene ring group or a biphenylene ring group.

The repeating unit (b) preferably has a hydroxystyrene structure, that is, $Ar_4$ is preferably a benzene ring group.

Specific examples of the repeating unit (b) represented by formula (I) are illustrated below, but the present invention is not limited thereto. In the formulae, a represents an integer of 1 or 2.

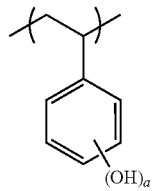
(B-1)

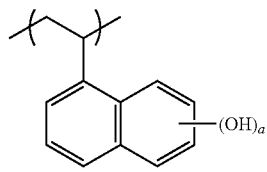
(B-2)

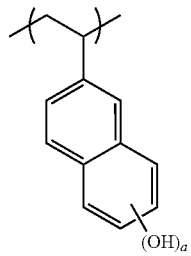
(B-3)

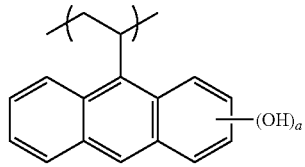
(B-4)

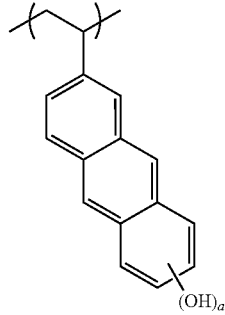
(B-5)

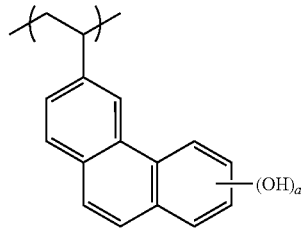
(B-6)

(B-7)
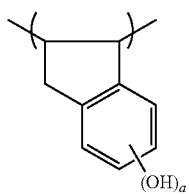
(B-8)
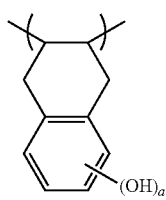
(B-9)
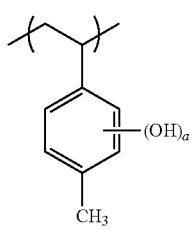
(B-10)
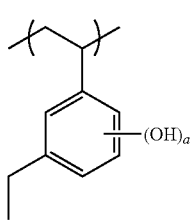
(B-11)
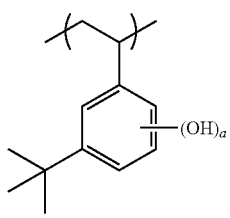
(B-12)
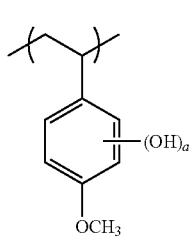
(B-13)
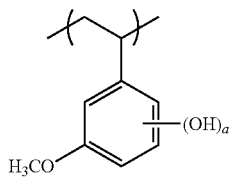
(B-14)
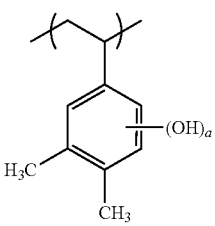
(B-15)
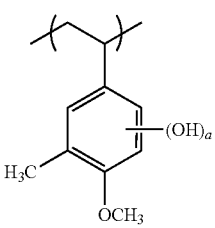
(B-16)
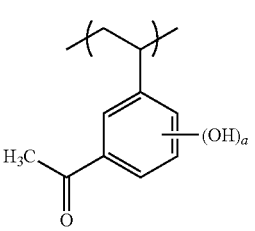
(B-17)
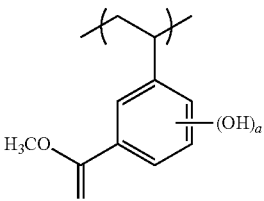
(B-18)
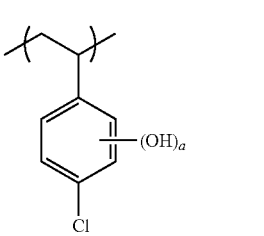
(B-19)
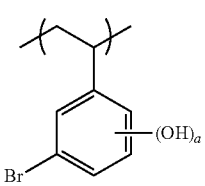
(B-20)
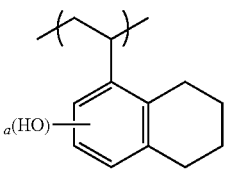

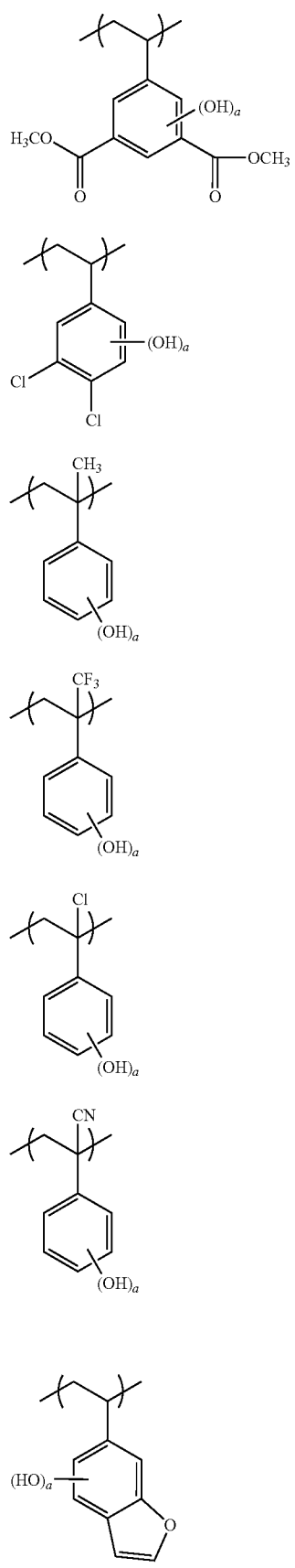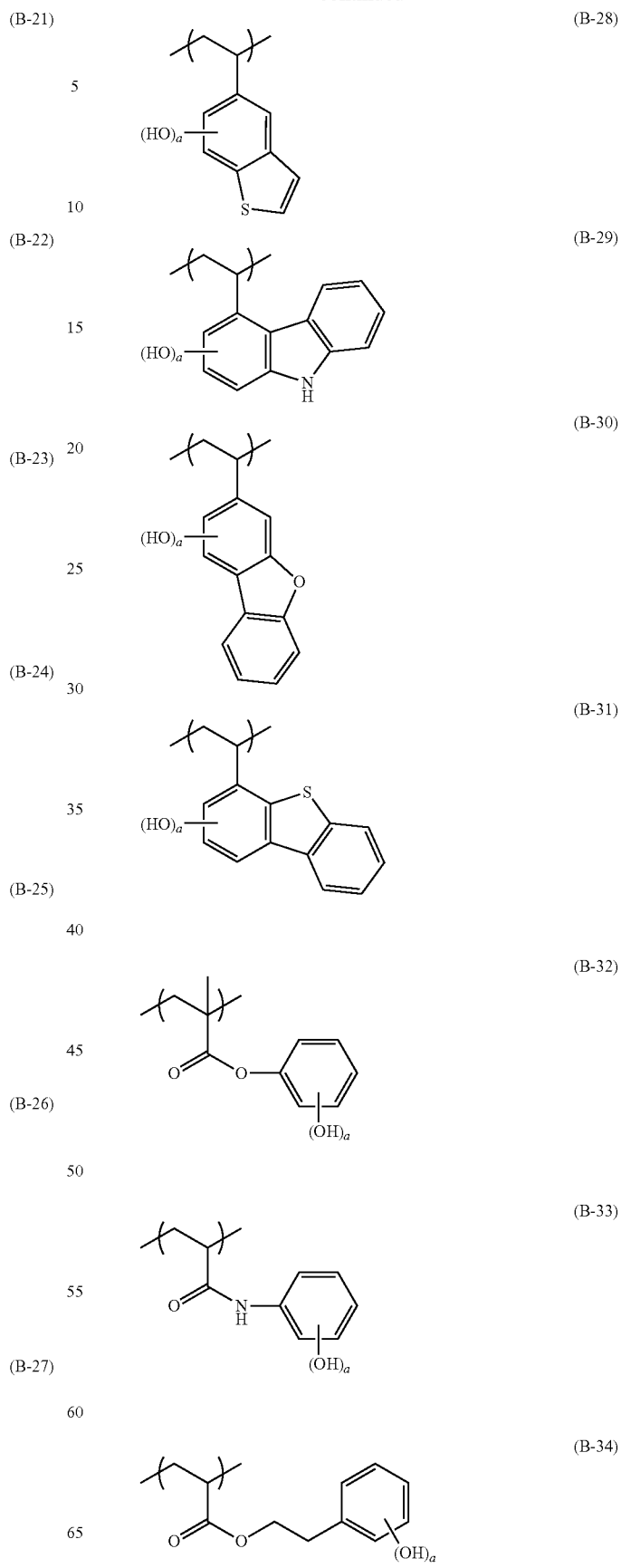

-continued

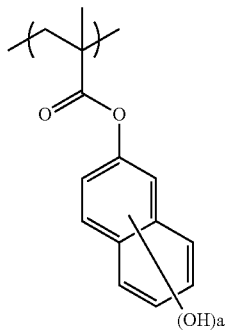
(B-35)

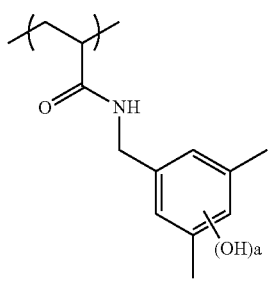
(B-36)

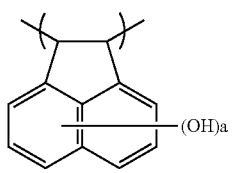
(B-37)

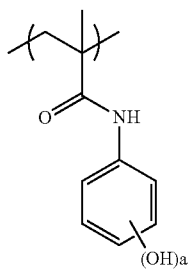
(B-38)

The resin (A) may contain two or more kinds of repeating units represented by formula (I).

The phenolic hydroxyl group-containing repeating unit like the repeating unit (b) represented by formula (I) tends to increase the solubility of the resin (A) for an organic solvent and in view of resolution, addition of the repeating unit is not preferred in some cases. This tendency emerges more prominently in a repeating unit derived from hydroxystyrenes (that is, in formula (I), when both $X_4$ and $L_4$ are a single bond). The reason therefor is not clearly known but is presumed to be because, for example, a phenolic hydroxyl group is present in the vicinity of the main chain. On this account, in the present invention, the content of the repeating unit represented by formula (I) (preferably the repeating unit represented by formula (I) where both $X_4$ and $L_4$ are a single bond) is preferably 4 mol % or less, more preferably 2 mol % or less, and most preferably 0 mol % (namely, the repeating unit is not contained), based on all repeating units in the resin (A).

(c) Repeating Unit Having a Plurality of Aromatic Rings

The resin (A) may contain (c) a repeating unit having a plurality of aromatic rings represented by the following formula (c1):

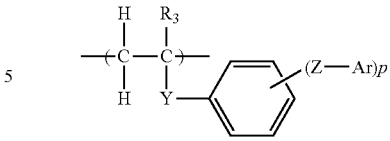
(c1)

In formula (c1), $R_3$ represents a hydrogen atom, an alkyl group, a halogen atom, a cyano group or a nitro group;
Y represents a single bond or a divalent linking group;
Z represents a single bond or a divalent linking group;
Ar represents an aromatic ring group; and
p represents an integer of 1 or more.

The alkyl group as $R_3$ may be either linear or branched, and examples thereof include a methyl group, an ethyl group, an n-propyl group, an i-propyl group, an n-butyl group, a sec-butyl group, a tert-butyl group, an n-pentyl group, an n-hexyl group, an n-heptyl group, an n-octyl group, an n-nonyl group, an n-decanyl group, and an i-butyl group. The alkyl group may have a substituent, and preferred examples of the substituent include an alkoxy group, a hydroxyl group, a halogen atom, and a nitro group. As the alkyl group having a substituent, for example, a $CF_3$ group, an alkyloxycarbonylmethyl group, an alkylcarbonyloxymethyl group, a hydroxymethyl group, and an alkoxymethyl group are preferred.

The halogen atom as $R_3$ includes fluorine atom, chlorine atom, bromine atom and iodine atom, with fluorine atom being preferred.

Y represents a single bond or a divalent linking group, and examples of the divalent linking group include an ether group (oxygen atom), a thioether group (sulfur atom), an alkylene group, an arylene group, a carbonyl group, a sulfide group, a sulfone group, —COO—, —CONH—, —SO$_2$NH—, —CF$_2$—, —CF$_2$CF$_2$—, —OCF$_2$O—, —CF$_2$OCF$_2$—, —SS—, —CH$_2$SO$_2$CH$_2$—, —CH$_2$COCH$_2$—, —COCF$_2$CO—, —COCO—, —OCOO—, —OSO$_2$O—, an amino group (nitrogen atom), an acyl group, an alkylsulfonyl group, —CH=CH—, —C≡C—, an aminocarbonylamino group, an aminosulfonylamino group, and a group formed by combining these. Y preferably has a carbon number of 15 or less, more preferably a carbon number of 10 or less.

Y is preferably a single bond, a —COO— group, a —COS— group or a —CONH— group, more preferably a —COO— group or a —CONH— group, still more preferably a —COO— group.

Z represents a single bond or a divalent linking group, and examples of the divalent linking group include an ether group (oxygen atom), a thioether group (sulfur atom), an alkylene group, an arylene group, a carbonyl group, a sulfide group, a sulfone group, —COO—, —CONH—, —SO$_2$NH—, an amino group (nitrogen atom), an acyl group, an alkylsulfonyl group, —CH=CH—, an aminocarbonylamino group, an aminosulfonylamino group, and a group formed by combining these.

Z is preferably a single bond, an ether group, a carbonyl group or —COO—, more preferably a single bond or an ether group, still more preferably a single bond.

Ar represents an aromatic ring group, and specific examples thereof include a phenyl group, a naphthyl group, an anthracenyl group, a phenanthrenyl group, a quinolinyl group, a furanyl group, a thiophenyl group, a fluorenyl-9-on-yl group, an anthraquinolinyl group, a phenanthraquinolinyl group, and a pyrrole group, with a phenyl group being preferred. Such an aromatic ring group may further have a substituent, and preferred examples of the substituent include an alkyl group, an alkoxy group, a hydroxy group, a halogen atom, a nitro group, an acyl group, an acyloxy group, an acylamino group, a sulfonylamino group, an aryl group such as phenyl group, an aryloxy group, an arylcarbonyl group, and a heterocyclic residue. Among these, from the standpoint of preventing exposure latitude or pattern profile from deterioration due to out-of-band light, a phenyl group is preferred.

p is an integer of 1 or more and is preferably an integer of 1 to 3.

The repeating unit (c) is, more preferably a repeating unit represented by the following formula (c2):

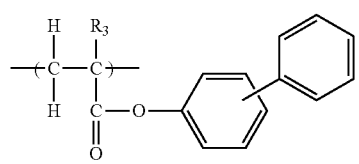

(c2)

In formula (c2), $R_3$ represents a hydrogen atom or an alkyl group. Preferred examples of the alkyl group as $R_3$ are the same as in formula (c1).

Here, as for the extreme ultraviolet (EUV) exposure, leaked light (out-of-band light) generated in the ultraviolet region at a wavelength of 100 to 400 nm worsens the surface roughness, as a result, due to bridge between patterns or disconnection of pattern, the resolution and LWR performance tend to be impaired.

However, the aromatic ring in the repeating unit (c) functions as an internal filter capable of absorbing the above-described out-of-band light. Accordingly, in view of high resolution and low LWR, the resin (A) preferably contains the repeating unit (c).

In this connection, from the standpoint of obtaining high resolution, the repeating unit (c) is preferably free from a phenolic hydroxyl group (a hydroxyl group bonded directly on an aromatic ring).

Specific examples of the repeating unit (c) are illustrated below, but the present invention is not limited thereto.

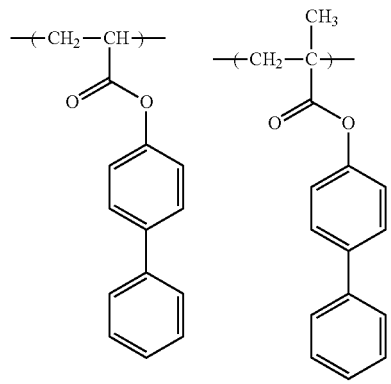

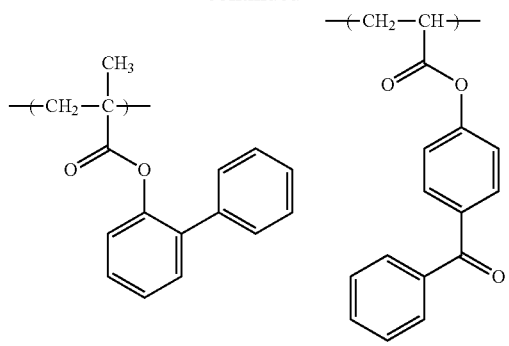

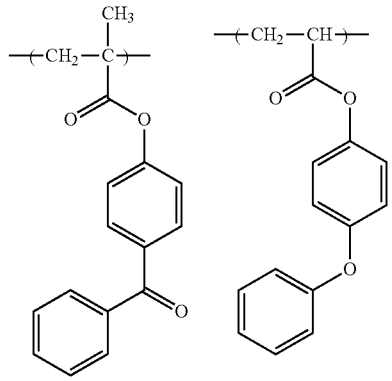

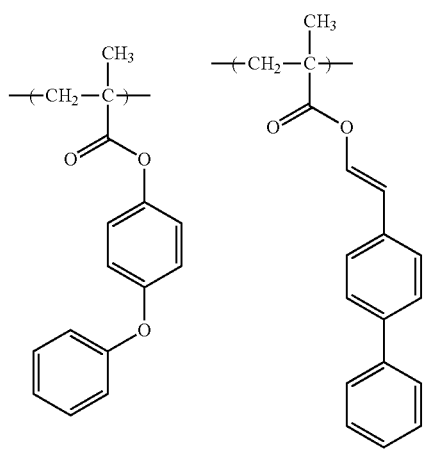

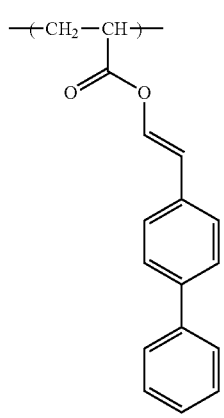

127
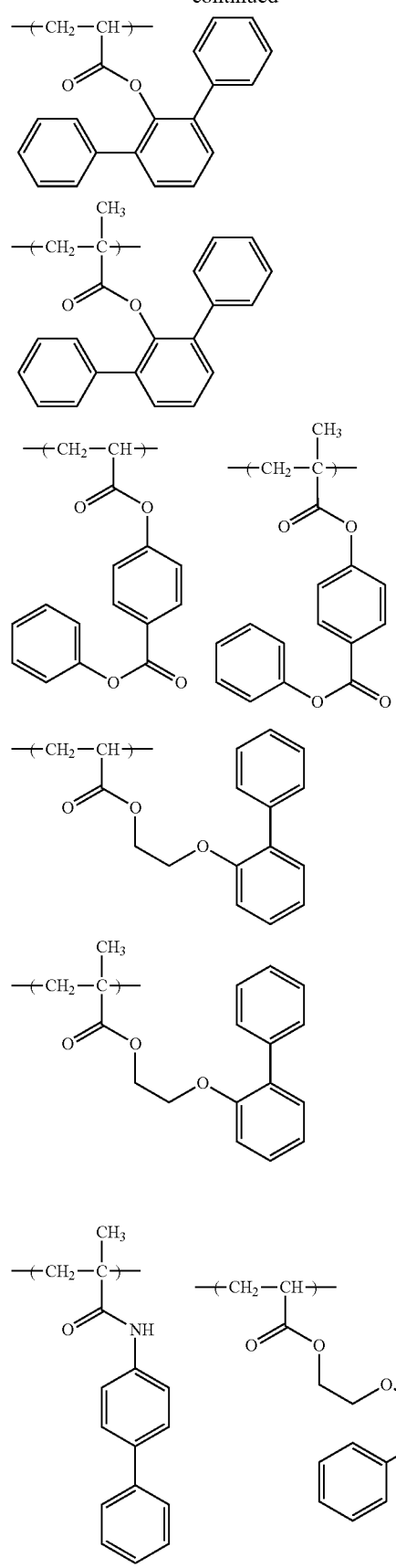
128
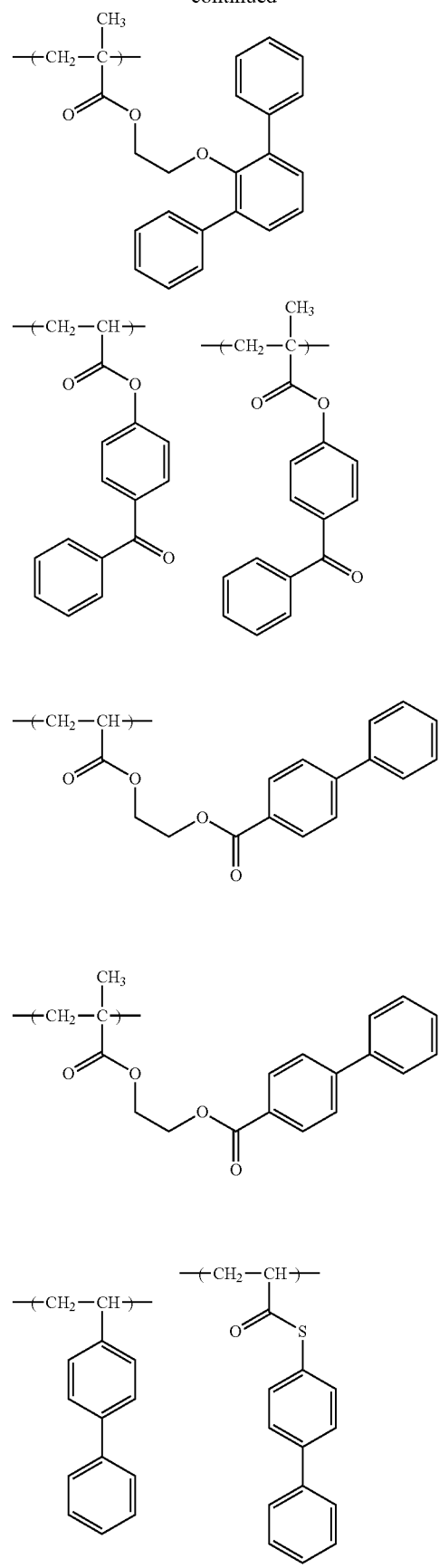

129
-continued
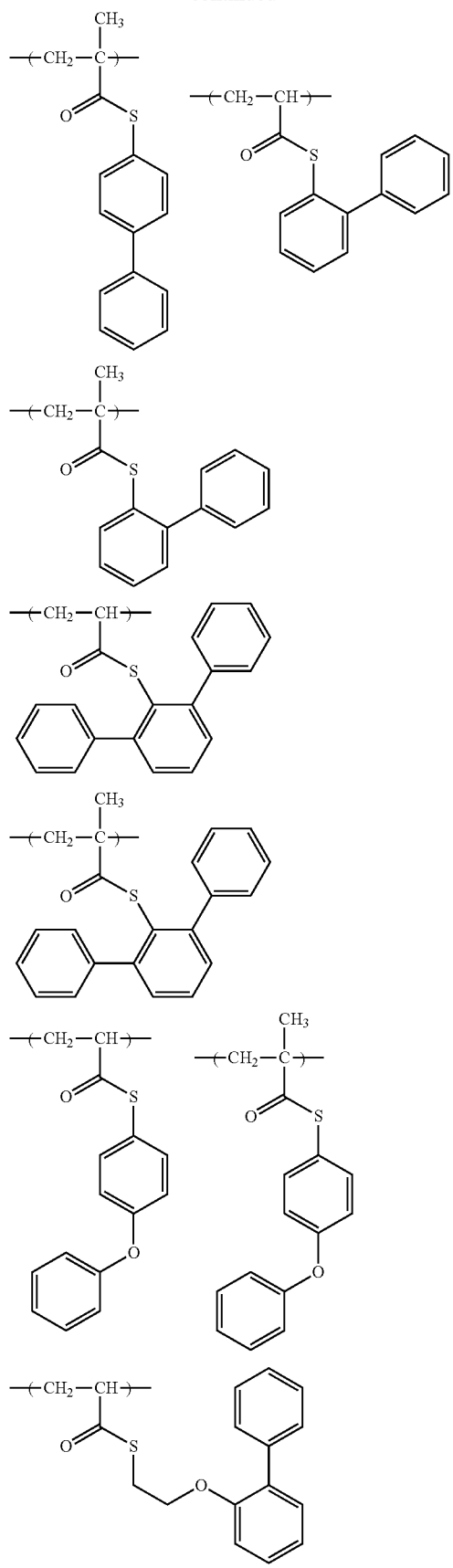
130
-continued
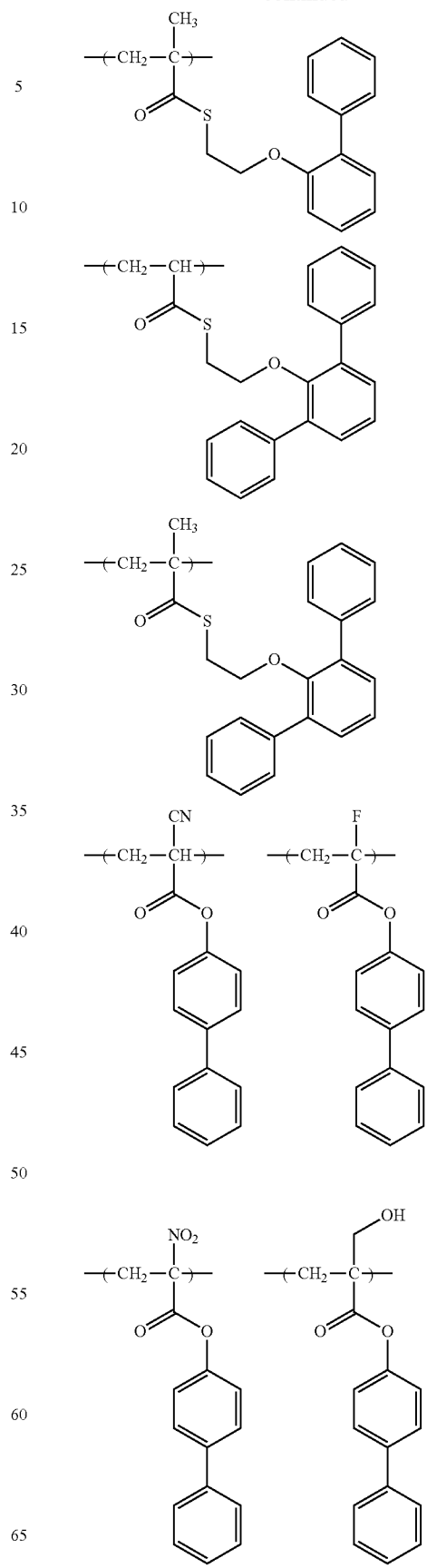

-continued

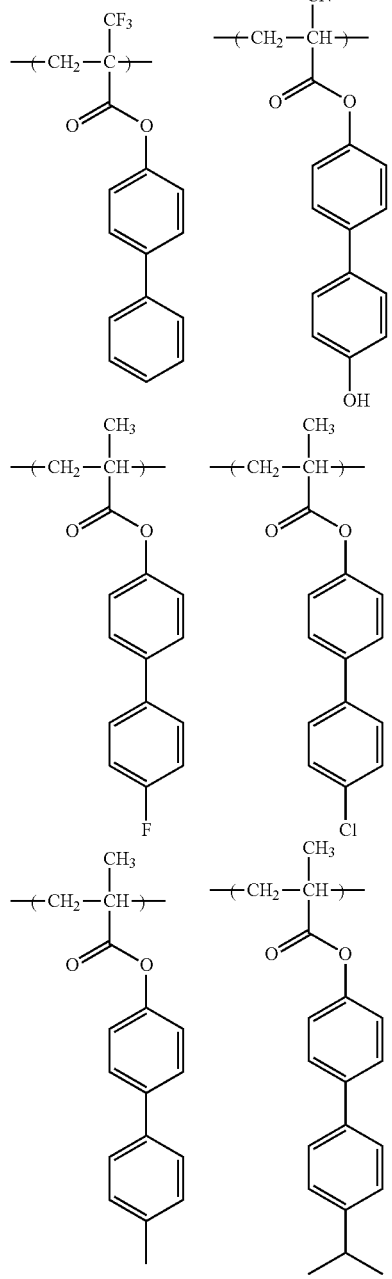

The resin (A) may or may not contain the repeating unit (c), but in the case containing the repeating unit (c), the content thereof is preferably from 1 to 30 mol %, more preferably from 1 to 20 mol %, still more preferably from 1 to 15 mol %, based on all repeating units in the resin (A). As for the repeating unit (c) contained in the resin (A), two or more kinds of repeating units may be contained in combination.

The resin (A) for use in the present invention may appropriately contain a repeating unit other than the above-described repeating units (a) to (c). As an example of such a repeating unit, the resin may contain a repeating unit having an alicyclic hydrocarbon structure free from a polar group (for example, the above-described acid group, a hydroxyl group or a cyano group) and not exhibiting acid decomposability. Thanks to this configuration, the solubility of the resin at the development using an organic solvent-containing developer can be appropriately adjusted. Such a repeating unit includes a repeating unit represented by formula (IV):

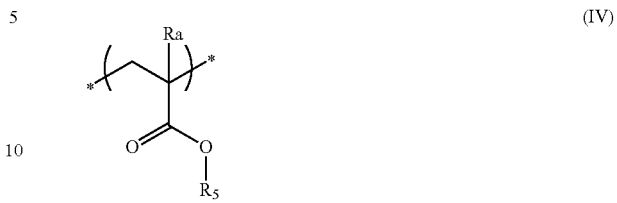

In formula (IV), $R_5$ represents a hydrocarbon group having at least one cyclic structure and having no polar group.

Ra represents a hydrogen atom, an alkyl group or a —$CH_2$—O—$Ra_2$ group, wherein $Ra_2$ represents a hydrogen atom, an alkyl group or an acyl group. Ra is preferably a hydrogen atom, a methyl group, a hydroxymethyl group or a trifluoromethyl group, more preferably a hydrogen atom or a methyl group.

The cyclic structure contained in $R_5$ includes a monocyclic hydrocarbon group and a polycyclic hydrocarbon group. Examples of the monocyclic hydrocarbon group include a cycloalkyl group having a carbon number of 3 to 12, such as cyclopentyl group, cyclohexyl group, cycloheptyl group and cyclooctyl group, and a cycloalkenyl group having a carbon number of 3 to 12, such as cyclohexenyl group. The monocyclic hydrocarbon group is preferably a monocyclic hydrocarbon group having a carbon number of 3 to 7, more preferably a cyclopentyl group or a cyclohexyl group.

The polycyclic hydrocarbon group includes a ring assembly hydrocarbon group and a crosslinked cyclic hydrocarbon group. Examples of the ring assembly hydrocarbon group include a bicyclohexyl group and a perhydronaphthalenyl group. Examples of the crosslinked cyclic hydrocarbon ring include a bicyclic hydrocarbon ring such as pinane ring, bornane ring, norpinane ring, norbornane ring and bicyclooctane ring (e.g., bicyclo[2.2.2]octane ring, bicyclo[3.2.1]octane ring), a tricyclic hydrocarbon ring such as homobledane ring, adamantane ring, tricyclo[5.2.1.0$^{2,6}$]decane ring and tricyclo [4.3.1.1$^{2,5}$]undecane ring, and a tetracyclic hydrocarbon ring such as tetracyclo[4.4.0.1$^{2,5}$.1$^{7,10}$]dodecane ring and perhydro-1,4-methano-5,8-methanonaphthalene ring. The crosslinked cyclic hydrocarbon ring also includes a condensed cyclic hydrocarbon ring, for example, a condensed ring formed by fusing a plurality of 5- to 8-membered cycloalkane rings, such as perhydronaphthalene (decalin) ring, perhydroanthracene ring, perhydrophenathrene ring, perhydroacenaphthene ring, perhydrofluorene ring, perhydroindene ring and perhydrophenalene ring.

Preferred examples of the crosslinked cyclic hydrocarbon ring include a norbornyl group, an adamantyl group, a bicyclooctanyl group and a tricyclo[5,2,1,0$^{2,6}$]decanyl group. Among these crosslinked cyclic hydrocarbon rings, a norbornyl group and an adamantyl group are more preferred.

Such an alicyclic hydrocarbon group may have a substituent, and preferred examples of the substituent include a halogen atom, an alkyl group, a hydroxyl group with a hydrogen atom being substituted for, and an amino group with a hydrogen atom being substituted for. The halogen atom is preferably bromine atom, chlorine atom or fluorine atom, and the alkyl group is preferably a methyl group, an ethyl group, a butyl group or a tert-butyl group. This alkyl group may further have a substituent, and the substituent which the alkyl group may further have includes a halogen atom, an alkyl group, a hydroxyl group with a hydrogen atom being substituted for, and an amino group with a hydrogen atom being substituted for.

Examples of the substituent for the hydrogen atom include an alkyl group, a cycloalkyl group, an aralkyl group, a substituted methyl group, a substituted ethyl group, an alkoxycarbonyl group and an aralkyloxycarbonyl group. The alkyl group is preferably an alkyl group having a carbon number of 1 to 4; the substituted methyl group is preferably a methoxymethyl group, a methoxythiomethyl group, a benzyloxymethyl group, a tert-butoxymethyl group or a 2-methoxyethoxymethyl group; the substituted ethyl group is preferably a 1-ethoxyethyl group or a 1-methyl-1-methoxyethyl group; the acyl group is preferably an aliphatic acyl group having a carbon number of 1 to 6, such as formyl group, acetyl group, propionyl group, butyryl group, isobutyryl group, valeryl group and pivaloyl group; and the alkoxycarbonyl group includes, for example, an alkoxycarbonyl group having a carbon number of 1 to 4.

The resin (A) may or may not contain a repeating unit having an alicyclic hydrocarbon structure free from a polar group and not exhibiting acid decomposability, but in the case of containing this repeating unit, the content thereof is preferably from 1 to 20 mol %, more preferably from 5 to 15 mol %, based on all repeating units in the resin (A).

Specific examples of the repeating unit having an alicyclic hydrocarbon structure free from a polar group and not exhibiting acid decomposability are illustrated below, but the present invention is not limited thereto. In the formulae, Ra represents H, $CH_3$, $CH_2OH$ or $CF_3$.

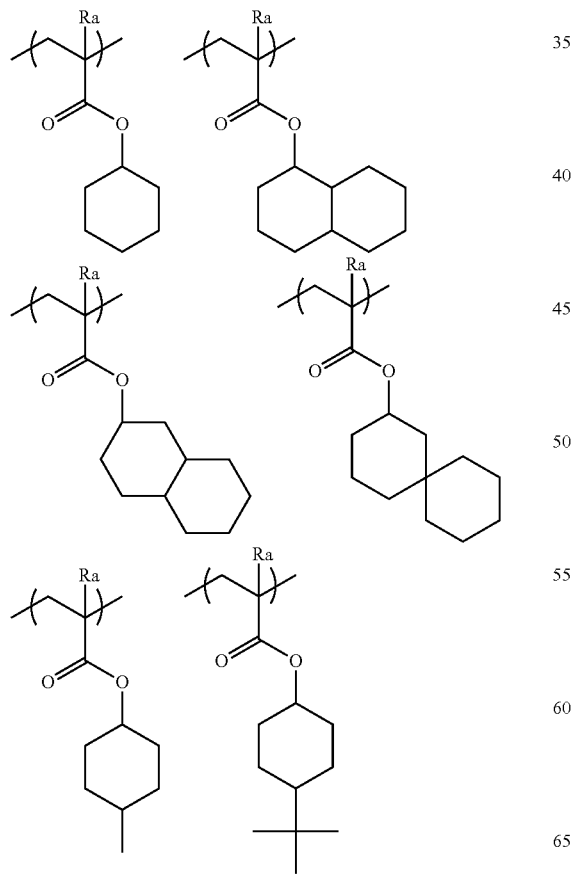

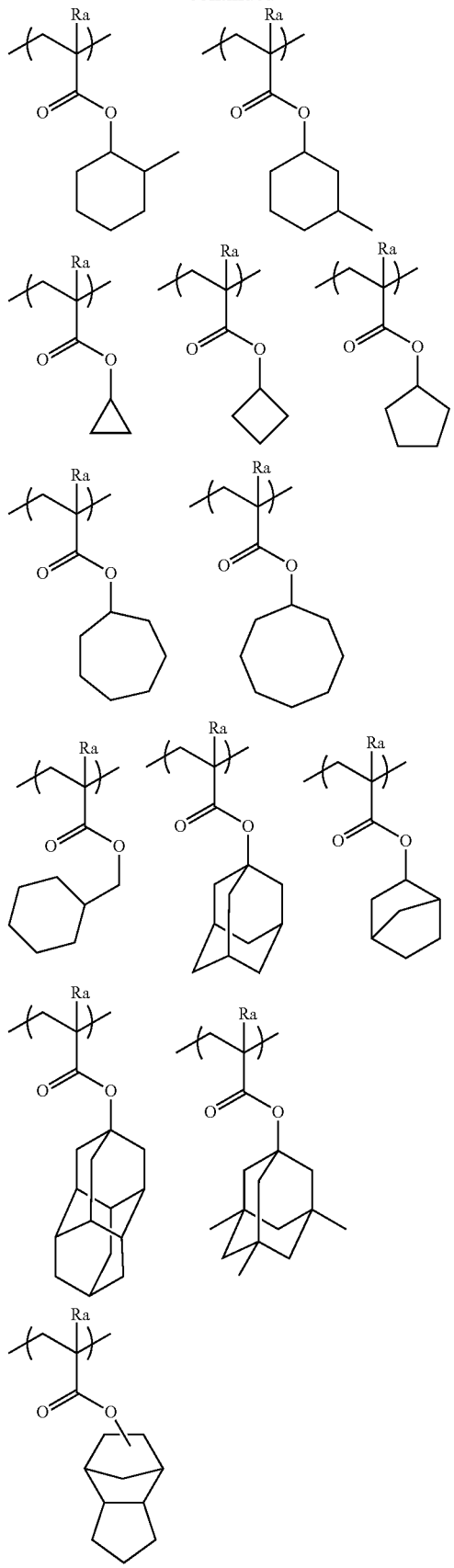

From the standpoint of elevating Tg, improving dry etching resistance and producing an effect such as internal filter for out-of-band-light, the resin (A) may containing the following monomer component.

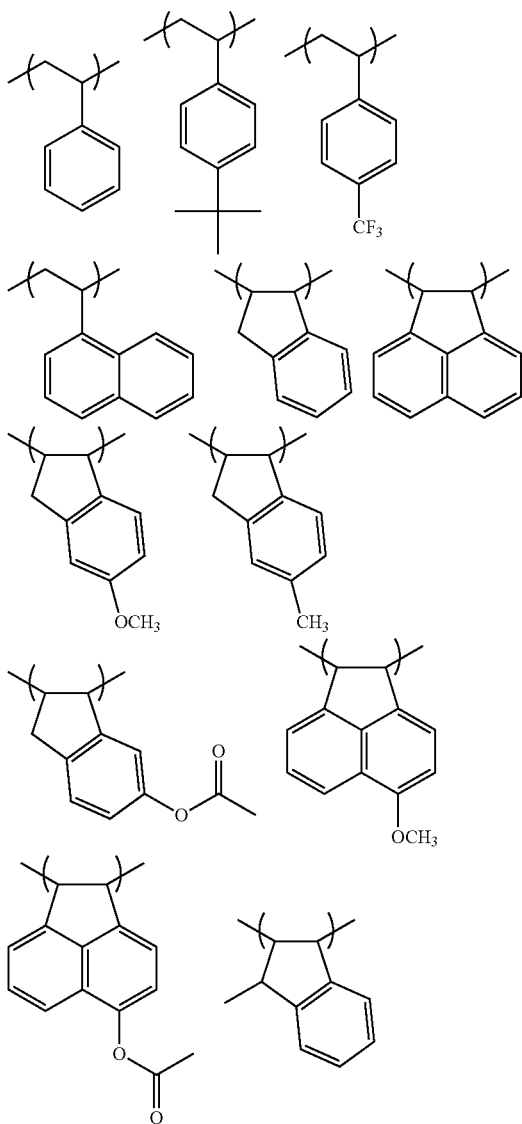

In the resin (A) for use in the composition of the present invention, the molar ratio of respective repeating structural units contained is appropriately set to control the dry etching resistance of resist, suitability for standard developer, adherence to substrate, resist profile and performances generally required of a resist, such as resolution, heat resistance and sensitivity.

The form of the resin (A) for use in the present invention may be any of random type, block type, comb type and star type.

The resin (A) can be synthesized, for example, by radical, cationic or anionic polymerization of unsaturated monomers corresponding to respective structures. It is also possible to obtain the target resin by polymerizing unsaturated monomers corresponding to precursors of respective structures and then performing a polymer reaction.

Examples of the general synthesis method include a batch polymerization method of dissolving unsaturated monomers and a polymerization initiator in a solvent and heating the solution, thereby effecting the polymerization, and a dropping polymerization method of adding dropwise a solution containing unsaturated monomers and a polymerization initiator to a heated solvent over 1 to 10 hours. A dropping polymerization method is preferred.

Examples of the solvent used for the polymerization include a solvent which can be used when preparing the later-described electron beam-sensitive or extreme ultraviolet-sensitive resin composition, and it is more preferred to perform the polymerization by using the same solvent as the solvent used in the composition of the present invention. By the use of this solvent, production of particles during storage can be suppressed.

The polymerization reaction is preferably performed in an inert gas atmosphere such as nitrogen or argon. As for the polymerization initiator, the polymerization is started using a commercially available radical initiator (e.g., azo-based initiator, peroxide). The radical initiator is preferably an azo-based initiator, and an azo-based initiator having an ester group, a cyano group or a carboxyl group is preferred. Preferred examples of the initiator include azobisisobutyronitrile, azobisdimethylvaleronitrile and dimethyl 2,2'-azobis(2-methylpropionate). If desired, the polymerization may be performed in the presence of a chain transfer agent (e.g., alkylmercaptan).

The concentration during the reaction is from 5 to 70 mass %, preferably from 10 to 50 mass %, and the reaction temperature is usually from 10 to 150° C., preferably from 30 to 120° C., more preferably from 40 to 100° C.

The reaction time is usually from 1 to 48 hours, preferably from 1 to 24 hours, more preferably from 1 to 12 hours.

After the completion of reaction, the reaction solution is allowed to cool to room temperature and purified. In the purification, a conventional method, for example, a liquid-liquid extraction method of applying water washing or combining an appropriate solvent to remove residual monomers or oligomer components, a purification method in a solution sate, such as ultrafiltration of removing by extraction only polymers having a molecular weight lower than a specific molecular weight, a reprecipitation method of adding dropwise the resin solution to a poor solvent to solidify the resin in the poor solvent and thereby remove residual monomers or the like, or a purification method in a solid state, such as washing of the resin slurry with a poor solvent after separation by filtration, may be applied. For example, the resin is precipitated as a solid by contacting the reaction solution with a solvent in which the resin is sparingly soluble or insoluble (poor solvent) and which is in a volumetric amount of 10 times or less, preferably from 10 to 5 times, the reaction solution.

The solvent used at the operation of precipitation or reprecipitation from the polymer solution (precipitation or reprecipitation solvent) may be sufficient if it is a poor solvent to the polymer, and the solvent which can be used may be appropriately selected from a hydrocarbon, a halogenated hydrocarbon, a nitro compound, an ether, a ketone, an ester, a carbonate, an alcohol, a carboxylic acid, water, a mixed solvent containing such a solvent, and the like, according to the kind of the polymer. Among these solvents, a solvent containing at least an alcohol (particularly, methanol or the like) or water is preferred as the precipitation or reprecipitation solvent.

The amount of the precipitation or reprecipitation solvent used may be appropriately selected by taking into consideration the efficiency, yield and the like, but in general, the amount used is from 100 to 10,000 parts by mass, preferably from 200 to 2,000 parts by mass, more preferably from 300 to 1,000 parts by mass, per 100 parts by mass of the polymer solution.

The temperature at the precipitation or reprecipitation may be appropriately selected by taking into consideration the efficiency or operability but is usually on the order of 0 to 50° C., preferably in the vicinity of room temperature (for example, approximately from 20 to 35° C.). The precipitation or reprecipitation operation may be performed using a commonly employed mixing vessel such as stirring tank, by a known method such as batch system and continuous system.

The precipitated or reprecipitated polymer is usually subjected to commonly employed solid-liquid separation such as filtration and centrifugation, then dried and used. The filtration is performed using a solvent-resistant filter element preferably under pressure. The drying is performed under atmospheric pressure or reduced pressure (preferably under reduced pressure) at a temperature of approximately from 30 to 100° C., preferably on the order of 30 to 50° C.

Incidentally, after the resin is once precipitated and separated, the resin may be again dissolved in a solvent and then put into contact with a solvent in which the resin is sparingly soluble or insoluble. That is, there may be used a method comprising, after the completion of radical polymerization reaction, bringing the polymer into contact with a solvent in which the polymer is sparingly soluble or insoluble, to precipitate a resin (step a), separating the resin from the solution (step b), anew dissolving the resin in a solvent to prepare a resin solution A (step c), bringing the resin solution A into contact with a solvent in which the resin is sparingly soluble or insoluble and which is in a volumetric amount of less than 10 times (preferably 5 times or less) the resin solution A, to precipitate a resin solid (step d), and separating the precipitated resin (step e).

The polymerization reaction is preferably performed in an inert gas atmosphere such as nitrogen or argon. As for the polymerization initiator, the polymerization is started using a commercially available radical initiator (e.g., azo-based initiator, peroxide). The radical initiator is preferably an azo-based initiator, and an azo-based initiator having an ester group, a cyano group or a carboxyl group is preferred. Preferred examples of the initiator include azobisisobutyronitrile, azobisdimethylvaleronitrile and dimethyl 2,2'-azobis(2-methylpropionate). The initiator is added additionally or in parts, if desired. After the completion of reaction, the reaction product is pored in a solvent, and the desired polymer is collected by a method for powder or solid recovery or the like. The concentration during the reaction is from 5 to 50 mass %, preferably from 10 to 30 mass %, and the reaction temperature is usually from 10 to 150° C., preferably from 30 to 120° C., more preferably from 60 to 100° C.

The molecular weight of the resin (A) according to the present invention is not particularly limited, but the weight average molecular weight is preferably from 1,000 to 100,000, more preferably from 1,500 to 60,000, still more preferably from 2,000 to 30,000. When the weight average molecular weight is from 1,000 to 100,000, the heat resistance and dry etching resistance can be kept from deterioration and at the same time, the film-forming property can be prevented from deteriorating due to impairment of developability or increase in the viscosity. Here, the weight average molecular weight of the resin indicates a molecular weight in terms of polystyrene measured by GPC (carrier: THF or N-methyl-2-pyrrolidone (NMP)).

The polydispersity (Mw/Mn) is preferably from 1.00 to 5.00, more preferably from 1.03 to 3.50, still more preferably from 1.05 to 2.50. As the molecular weight distribution is narrower, the resolution and resist profile are more excellent, the side wall of the resist pattern is smoother, and the roughness is more improved.

As for the resin (A) used in the present invention, one kind of a resin may be used alone, or two or more kinds of resins may be used in combination. The content of the resin (A) is preferably from 20 to 99 mass %, more preferably from 30 to 89 mass %, still more preferably from 40 to 79 mass %, based on the entire solid content in the electron beam-sensitive or extreme ultraviolet-sensitive resin composition of the present invention.

[2] (B) Compound Capable of Generating Acid Upon Irradiation with Electronic Beam or Extreme Ultraviolet Ray The composition of the present invention contains a compound capable of generating an acid upon irradiation with an electron beam or an extreme ultraviolet ray (hereinafter, sometimes referred to as an "acid generator").

The acid generator is not particularly limited as long as it is a known acid generator, but a compound capable of generating an organic acid, for example, at least one of a sulfonic acid, a bis(alkylsulfonyl)imide and a tris(alkylsulfonyl)methide, upon irradiation with an actinic ray or radiation is preferred.

The compound is more preferably a compound represented by the following formula (ZI), (ZII) or (ZIII):

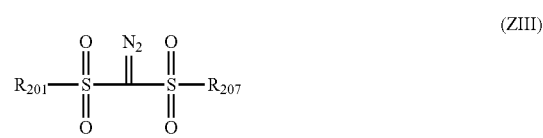

In formula (ZI), each of $R_{201}$, $R_{202}$ and $R_{203}$ independently represents an organic group.

The carbon number of the organic group as $R_{201}$, $R_{202}$ and $R_{203}$ is generally from 1 to 30, preferably from 1 to 20.

Two members out of $R_{201}$ to $R_{203}$ may combine to form a ring structure, and the ring may contain therein an oxygen atom, a sulfur atom, an ester bond, an amide bond or a carbonyl group. The group formed by combining two members out of $R_{201}$ to $R_{203}$ includes an alkylene group (e.g., butylenes group, pentylene group).

$Z^-$ represents a non-nucleophilic anion (an anion having an extremely low ability of causing a nucleophilic reaction).

Examples of the non-nucleophilic anion include a sulfonate anion (such as aliphatic sulfonate anion, aromatic sulfonate anion and camphorsulfonate anion), a carboxylate anion (such as aliphatic carboxylate anion, aromatic carboxylate anion and aralkylcarboxylate anion), a sulfonylimide anion, a bis(alkylsulfonyl)imide anion, and a tris(alkylsulfonyl)methide anion.

The aliphatic moiety in the aliphatic sulfonate anion and aliphatic carboxylate anion may be an alkyl group or a cycloalkyl group but is preferably a linear or branched alkyl group having a carbon number of 1 to 30 or a cycloalkyl group having a carbon number of 3 to 30.

The aromatic group in the aromatic sulfonate anion and aromatic carboxylate anion is preferably an aryl group having a carbon number of 6 to 14, and examples thereof include a phenyl group, a tolyl group and a naphthyl group.

The alkyl group, cycloalkyl group and aryl group above may have a substituent. Specific examples of the substituent include a nitro group, a halogen atom such as fluorine atom, a carboxyl group, a hydroxyl group, an amino group, a cyano group, an alkoxy group (preferably having a carbon number of 1 to 15), a cycloalkyl group (preferably having a carbon number of 3 to 15), an aryl group (preferably having a carbon number of 6 to 14), an alkoxycarbonyl group (preferably having a carbon number of 2 to 7), an acyl group (preferably having a carbon number of 2 to 12), an alkoxycarbonyloxy group (preferably having a carbon number of 2 to 7), an alkylthio group (preferably having a carbon number of 1 to 15), an alkylsulfonyl group (preferably having a carbon number of 1 to 15), an alkyliminosulfonyl group (preferably having a carbon number of 2 to 15), an aryloxysulfonyl group (preferably having a carbon number of 6 to 20), an alkylaryloxysulfonyl group (preferably having a carbon number of 7 to 20), a cycloalkylaryloxysulfonyl group (preferably having a carbon number of 10 to 20), an alkyloxyalkyloxy group (preferably having a carbon number of 5 to 20), and a cycloalkylalkyloxyalkyloxy group (preferably having a carbon number of 8 to 20). The aryl group or ring structure in each group may further have an alkyl group (preferably having a carbon number of 1 to 15) as a substituent.

The aralkyl group in the aralkylcarboxylate anion is preferably an aralkyl group having a carbon number of 6 to 12, and examples thereof include a benzyl group, a phenethyl group, a naphthylmethyl group, a naphthylethyl group and a naphthylbutyl group.

Examples of the sulfonylimide anion include saccharin anion.

The alkyl group in the bis(alkylsulfonyl)imide anion and tris(alkylsulfonyl)methide anion is preferably an alkyl group having a carbon number of 1 to 5, and examples of the substituent on this alkyl group include a halogen atom, a halogen atom-substituted alkyl group, an alkoxy group, an alkylthio group, an alkyloxysulfonyl group, an aryloxysulfonyl group, and a cycloalkylaryloxysulfonyl group, with a fluorine atom and a fluorine atom-substituted alkyl group being preferred.

Also, the alkyl groups in the bis(alkylsulfonyl)imide anion may combine with each other to form a ring structure. In this case, the acid strength increases.

Other examples of the non-nucleophilic anion include fluorinated phosphorus (e.g., $PF_6^-$), fluorinated boron (e.g., $BF_4^-$), and fluorinated antimony (e.g., $SbF_6^-$).

The non-nucleophilic anion is preferably an aliphatic sulfonate anion substituted with a fluorine atom at least at the α-position of the sulfonic acid, an aromatic sulfonate anion substituted with a fluorine atom or a fluorine atom-containing group, a bis(alkylsulfonyl)imide anion in which the alkyl group is substituted with a fluorine atom, or a tris(alkylsulfonyl)methide anion in which the alkyl group is substituted with a fluorine atom. The non-nucleophilic anion is more preferably a perfluoroaliphatic sulfonate anion (preferably having a carbon number of 4 to 8) or a fluorine atom-containing benzenesulfonate anion, still more preferably nonafluorobutanesulfonate anion, perfluorooctanesulfonate anion, pentafluorobenzenesulfonate anion or 3,5-bis(trifluoromethyl)benzenesulfonate anion.

As regards the acid strength, the pKa of the acid generated is preferably −1 or less for enhancing the sensitivity.

An anion represented by the following formula (AN1) is also a preferred embodiment of the non-nucleophilic anion:

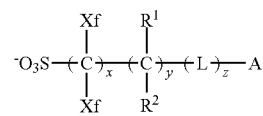

(AN1)

In the formula, each Xf independently represents a fluorine atom or an alkyl group substituted with at least one fluorine atom.

Each of $R^1$ and $R^2$ independently represents a hydrogen atom, a fluorine atom or an alkyl group, and when a plurality of $R^1$s or $R^2$s are present, each $R^1$ or $R^2$ may be the same as or different from every other $R^1$ or $R^2$.

L represents a divalent linking group, and when a plurality of L's are present, each L may be the same as or different from every other L.

A represents a cyclic organic group.

x represents an integer of 1 to 20, y represents an integer of 0 to 10, and z represents an integer of 0 to 10.

Formula (AN1) is described in more detail.

The alkyl group in the fluorine atom-substituted alkyl group of Xf is preferably an alkyl group having a carbon number of 1 to 10, more preferably from 1 to 4. Also, the fluorine atom-substituted alkyl group of Xf is preferably a perfluoroalkyl group.

Xf is preferably a fluorine atom or a perfluoroalkyl group having a carbon number of 1 to 4. Specific examples of Xf include a fluorine atom, $CF_3$, $C_2F_5$, $C_3F_7$, $C_4F_9$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$ and $CH_2CH_2C_4F_9$, with a fluorine atom and $CF_3$ being preferred. In particular, it is preferred that both Xf's are a fluorine atom.

The alkyl group of $R^1$ and $R^2$ may have a substituent (preferably a fluorine atom) and is preferably an alkyl group having a carbon number of 1 to 4, more preferably a perfluoroalkyl group having a carbon number of 1 to 4. Specific examples of the alkyl group having a substituent of $R^1$ and $R^2$ include $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$ and $CH_2CH_2C_4F_9$, with $CF_3$ being preferred.

Each of $R^1$ and $R^2$ is preferably a fluorine atom or $CF_3$.

x is preferably an integer of 1 to 10, more preferably from 1 to 5.

y is preferably an integer of 0 to 4, more preferably 0.

z is preferably an integer of 0 to 5, more preferably from 0 to 3.

The divalent linking group of L is not particularly limited and includes, for example, —COO—, —OCO—, —CO—, —O—, —S—, —SO—, —SO$_2$—, an alkylene group, a cycloalkylene group, an alkenylene group, and a linking group formed by combining a plurality thereof. A linking group having a total carbon number of 12 or less is preferred. Among these, —COO—, —OCO—, —CO— and —O— are preferred, and —COO—, —OCO— are more preferred.

The cyclic organic group of A is not particularly limited as long as it has a cyclic structure, and examples thereof include an alicyclic group, an aryl group and a heterocyclic group (including not only those having aromaticity but also those having no aromaticity).

The alicyclic group may be monocyclic or polycyclic and is preferably a monocyclic cycloalkyl group such as cyclopentyl group, cyclohexyl group and cyclooctyl group, or a polycyclic cycloalkyl group such as norbornyl group, tricyclodecanyl group, tetracyclodecanyl group, tetracyclododecanyl group and adamantyl group. Above all, an alicyclic group having a bulky structure with a carbon number of 7 or more, such as norbornyl group, tricyclodecanyl group, tetracyclodecanyl group, tetracyclododecanyl group and adamantyl group, is preferred from the standpoint that the diffusion in the film during heating after exposure can be suppressed and MEEF can be improved.

Examples of the aryl group include a benzene ring, a naphthalene ring, a phenanthrene ring, and an anthracene ring.

Examples of the heterocyclic group include those derived from a furan ring, a thiophene ring, a benzofuran ring, a benzothiophene ring, a dibenzofuran ring, a dibenzothiophene ring and a pyridine ring. Among these, heterocyclic groups derived from a furan ring, a thiophene ring and a pyridine ring are preferred.

The cyclic organic group also includes a lactone structure. Specific examples thereof include lactone structures represented by formulae (LC1-1) to (LC1-17) which may be contained in the resin (A).

The cyclic organic group may have a substituent, and examples of the substituent include an alkyl group (may be any of linear, branched or cyclic; preferably having a carbon number of 1 to 12), a cycloalkyl group (may be any of monocyclic, polycyclic or spirocyclic; preferably having a carbon number of 3 to 20), an aryl group (preferably having a carbon number of 6 to 14), a hydroxy group, an alkoxy group, an ester group, an amide group, a urethane group, a ureido group, a thioether group, a sulfonamido group, and a sulfonic acid ester group. Incidentally, the carbon constituting the cyclic organic group (the carbon contributing to ring formation) may be carbonyl carbon.

Examples of the organic group of $R_{201}$, $R_{202}$ and $R_{203}$ include an aryl group, an alkyl group, and a cycloalkyl group.

At least one of three members $R_{201}$, $R_{202}$ and $R_{203}$ is preferably an aryl group, and it is more preferred that all of these three members are an aryl group. The aryl group may be a heteroaryl group such as indole residue and pyrrole residue, other than a phenyl group, a naphthyl group and the like. The alkyl group and cycloalkyl group of $R_{201}$ to $R^{203}$ may be preferably a linear or branched alkyl group having a carbon number of 1 to 10 and a cycloalkyl group having a carbon number of 3 to 10. More preferred examples of the alkyl group include a methyl group, an ethyl group, an n-propyl group, an i-propyl group, and an n-butyl group. More preferred examples of the cycloalkyl group include a cyclopropyl group, a cyclobutyl group, a cyclopentyl group, a cyclohexyl group, and a cycloheptyl group. These groups may further have a substituent, and examples of the substituent include, but are not limited to, a nitro group, a halogen atom such as fluorine atom, a carboxyl group, a hydroxyl group, an amino group, a cyano group, an alkoxy group (preferably having a carbon number of 1 to 15), a cycloalkyl group (preferably having a carbon number of 3 to 15), an aryl group (preferably having a carbon number of 6 to 14), an alkoxycarbonyl group (preferably having a carbon number of 2 to 7), an acyl group (preferably having a carbon number of 2 to 12), and an alkoxycarbonyloxy group (preferably having a carbon number of 2 to 7).

In the case where two members out of $R_{201}$ to $R_{203}$ are combined to form a ring structure, the ring structure is preferably a structure represented by the following formula (A1):

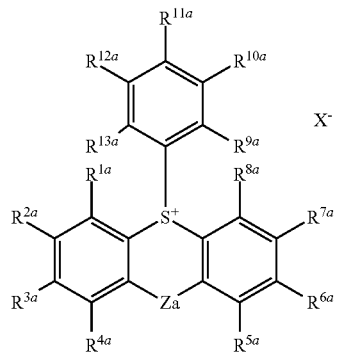

(A1)

In formula (A1), each of $R^{1a}$ to $R^{13a}$ independently represents a hydrogen atom or a substituent.

It is preferred that from one to three members out of $R^{1a}$ to $R^{13a}$ are not a hydrogen atom; and it is more preferred that any one of $R^{9a}$ to $R^{13a}$ is not a hydrogen atom.

Za represents a single bond or a divalent linking group.

X⁻ has the same meaning as Z⁻ in formula (ZI).

Specific examples of $R^{1a}$ to $R^{13a}$ when these are not a hydrogen atom include a halogen atom, a linear, branched or cyclic alkyl group, an alkenyl group, an alkynyl group, an aryl group, a heterocyclic group, a cyano group, a nitro group, a carboxyl group, an alkoxy group, an aryloxy group, a silyloxy group, a heterocyclic oxy group, an acyloxy group, a carbamoyloxy group, an alkoxycarbonyloxy group, an aryloxycarbonyloxy group, an amino group (including an anilino group), an ammonio group, an acylamino group, an aminocarbonylamino group, an alkoxycarbonylamino group, an aryloxycarbonylamino group, a sulfamoylamino group, an alkylsulfonylamino group, an arylsulfonylamino group, a mercapto group, an alkylthio group, an arylthio group, a heterocyclic thio group, a sulfamoyl group, a sulfo group, an alkylsulfinyl group, an arylsulfinyl group, an alkylsulfonyl group, an arylsulfonyl group, an acyl group, an aryloxycarbonyl group, an alkoxycarbonyl group, a carbamoyl group, an arylazo group, a heterocyclic azo group, an imido group, a phosphino group, a phosphinyl group, a phosphinyloxy group, a phosphinylamino group, a phosphono group, a silyl group, a hydrazino group, a ureido group, a boronic acid group (—B(OH)₂), a phosphato group (—OPO(OH)₂), a sulfato group (—OSO₃H), and other known substituents.

In the case where $R^{1a}$ to $R^{13a}$ are not a hydrogen atom, each of $R^{1a}$ to $R^{13a}$ is preferably a linear, branched or cyclic alkyl group substituted with a hydroxyl group.

Examples of the divalent linking group of Za include an alkylene group, an arylene group, a carbonyl group, a sulfonyl group, a carbonyloxy group, a carbonylamino group, a sulfonylamide group, an ether bond, a thioether bond, an amino group, a disulfide group, —(CH₂)ₙ—CO—, —(CH₂)ₙ—SO₂—, —CH=CH—, an aminocarbonylamino group, and an aminosulfonylamino group (n is an integer of 1 to 3).

Incidentally, preferred examples of the structure where at least one of $R_{201}$, $R_{202}$ and $R_{203}$ is not an aryl group include cation structures such as compounds described in paragraphs 0047 and 0048 of JP-A-2004-233661 and paragraphs 0040 to 0046 of JP-A-2003-35948, compounds illustrated as formulae (I-1) to (I-70) in U.S. Patent Application Publication No. 2003/0224288A1, and compounds illustrated as formulae (IA-1) to (IA-54) and formulae (IB-1) to (IB-24) in U.S. Patent Application Publication No. 2003/0077540A1.

In formulae (ZII) and (ZIII), each of $R_{204}$ to $R_{207}$ independently represents an aryl group, an alkyl group or a cycloalkyl group.

The aryl group, alkyl group and cycloalkyl group of $R_{204}$ to $R_{207}$ are the same as the aryl group, alkyl group and cycloalkyl group of $R_{201}$ to $R_{203}$ in the compound (ZI).

The aryl group, alkyl group and cycloalkyl group of $R_{204}$ to $R_{207}$ may have a substituent. Examples of the substituent include those of the substituent which the aryl group, alkyl group and cycloalkyl group of $R_{201}$ to $R_{203}$ in the compound (ZI) may have.

$Z^-$ represents a non-nucleophilic anion, and examples thereof are the same as those of the non-nucleophilic anion of $Z^-$ in formula (ZI).

The acid generator further includes compounds represented by the following formulae (ZIV), (ZV) and (ZVI):

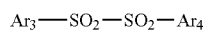
(ZIV)

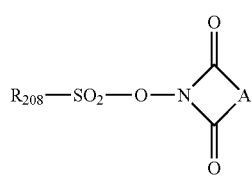
(ZV)

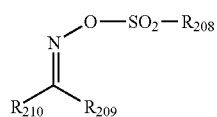
(ZVI)

In formulae (ZIV) to (ZVI), each of $Ar_3$ and $Ar_4$ independently represents an aryl group.

Each of $R_{208}$, $R_{209}$ and $R_{210}$ independently represents an alkyl group, a cycloalkyl group or an aryl group.

A represents an alkylene group, an alkenylene group or an arylene group.

Specific examples of the aryl group of $Ar_3$, $Ar_4$, $R_{208}$, $R_{209}$ and $R_{210}$ are the same as specific examples of the aryl group of $R_{201}$, $R_{202}$ and $R_{203}$ in formula (ZI).

Specific examples of the alkyl group and cycloalkyl group of $R_{208}$, $R_{209}$ and $R_{210}$ are the same as specific examples of the alkyl group and cycloalkyl group of $R_{201}$, $R_{202}$ and $R_{203}$ in formula (ZI).

The alkylene group of A includes an alkylene group having a carbon number of 1 to 12 (e.g., methylene group, ethylene group, propylene group, isopropylene group, butylenes group, isobutylene group); the alkenylene group of A includes an alkenylene group having a carbon number of 2 to 12 (e.g., ethenylene group, propenylene group, butenylene group); and the arylene group of A includes an arylene group having a carbon number of 6 to 10 (e.g., phenylene group, tolylene group, naphthylene group).

As the acid generator for use in the present invention, a compound having, as a substituent, a group capable of decomposing by the action of an acid to decrease the solubility for an organic solvent-containing developer may be also preferably used.

Specific examples and preferred examples of the group capable of decomposing by the action of an acid to decrease the solubility for an organic solvent-containing developer are the same as specific examples and preferred examples described above for the acid-decomposable group in the resin (A).

Examples of such an acid generator include the compounds described in JP-A-2005-97254 and JP-A-2007-199692.

Out of the acid generators, particularly preferred examples are illustrated below.

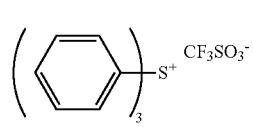
(z1)

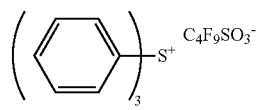
(z2)

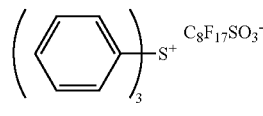
(z3)

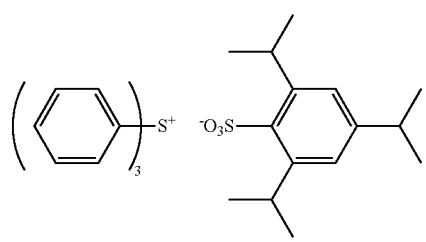
(z4)

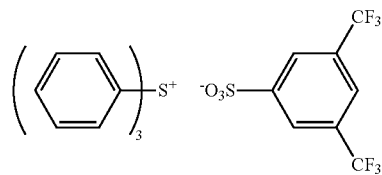
(z5)

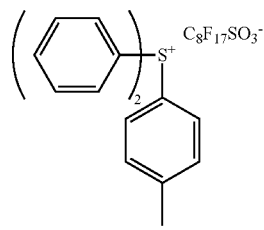
(z6)

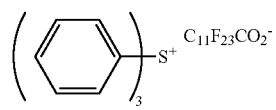
(z7)

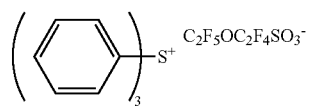
(z8)

-continued
(z9) 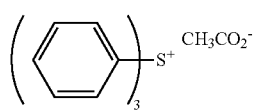
(z10) 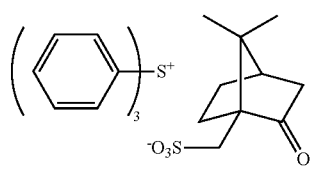
(z11) 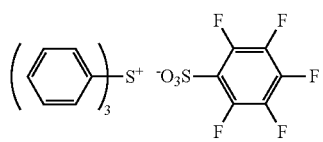
(z12) 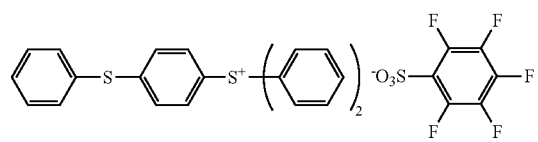
(z13) 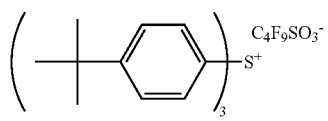
(z14) 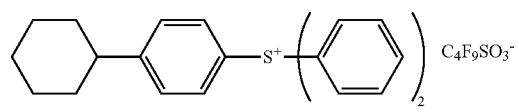
(z15) 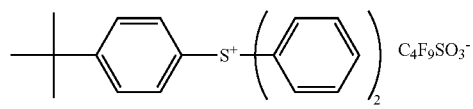
(z16) 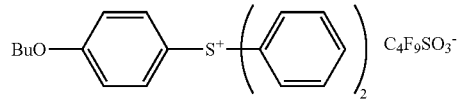
(z17) 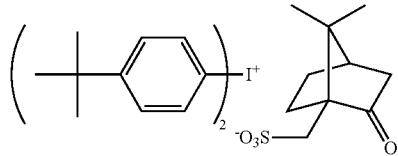
(z18) 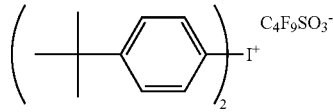
(z19) 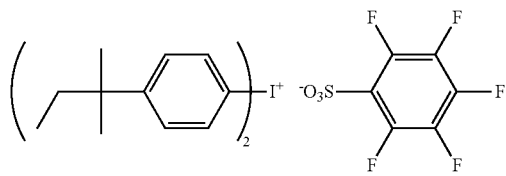
(z20) 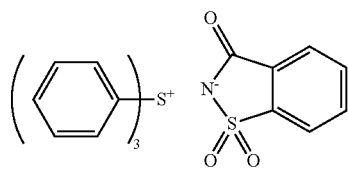
(z21) 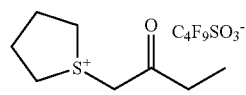
(z22) 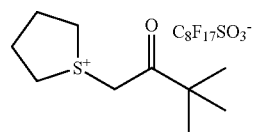
(z23) 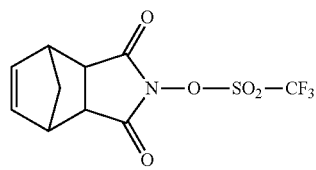
(z24) 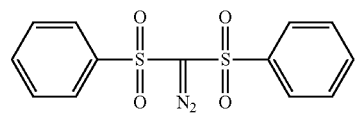
(z25) 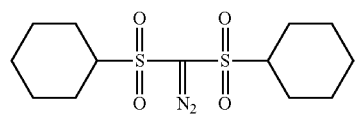
(z26) 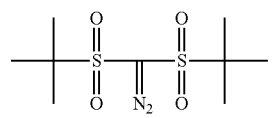
(z27) 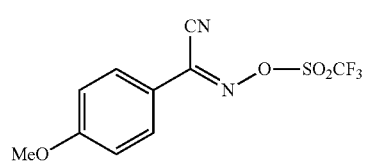

-continued
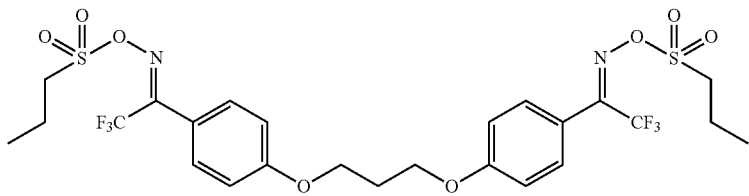 (z28)
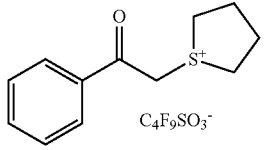 (z29)
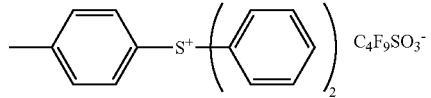 (z30)
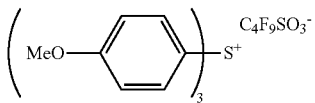 (z31)
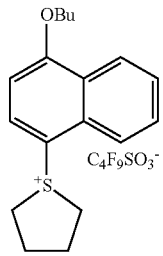 (z32)
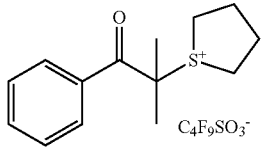 (z33)
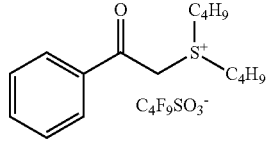 (z34)
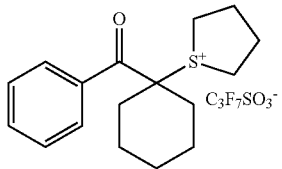 (z35)
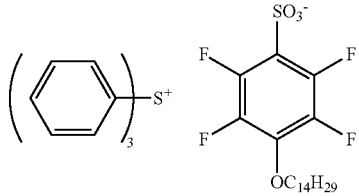 (z36)
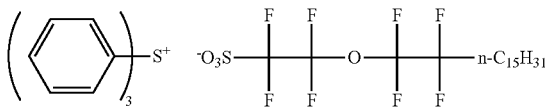 (z37)
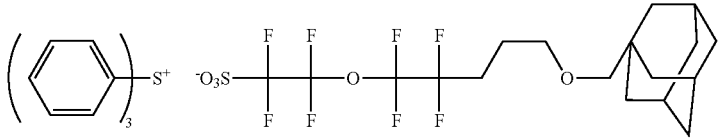 (z38)
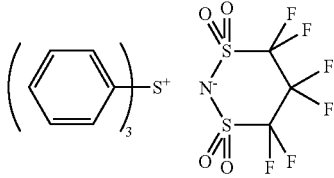 (z39)
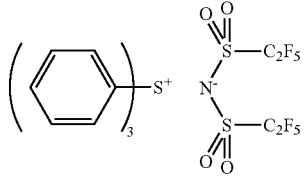 (z40)

-continued
(z41) 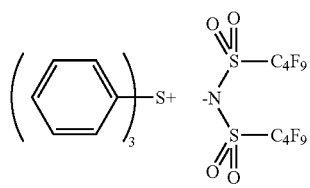
(z42) 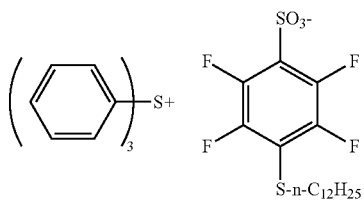
(z43) 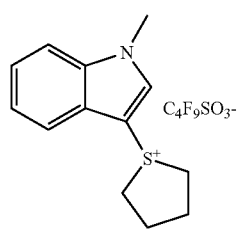
(z44) 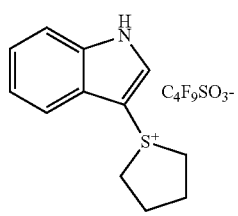
(z45) 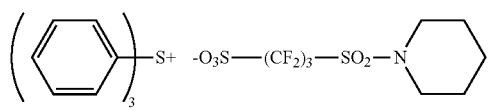
(z46) 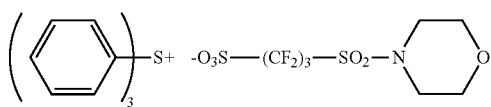
(z47) 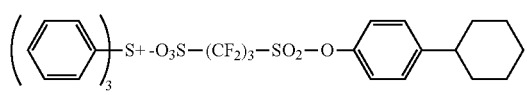
(z48) 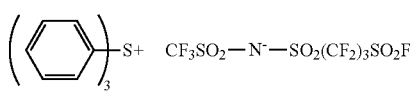
(z49) 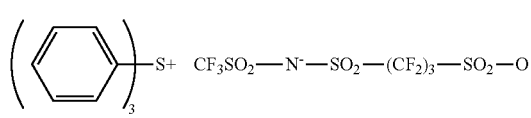
(z50) 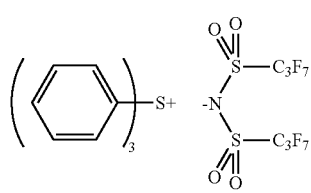
(z51) 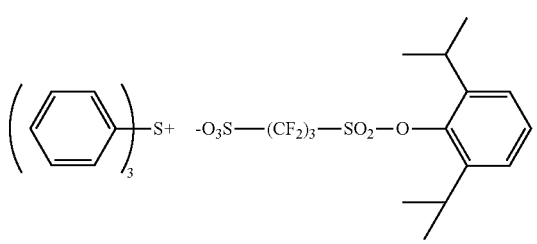
(z52) 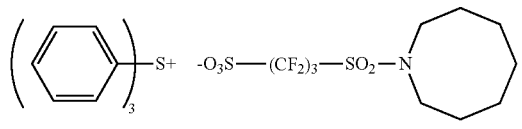
(z53) 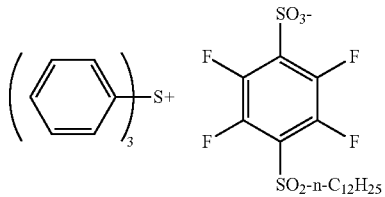
(z54) 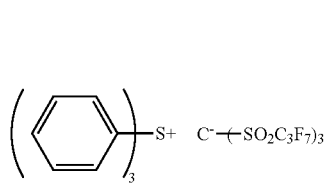
(z55) 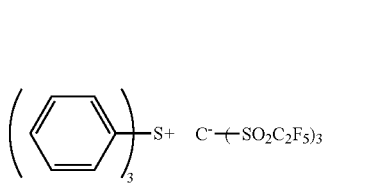
(z56) 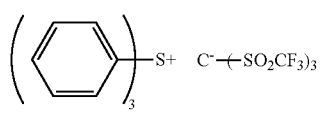

-continued
(z57)
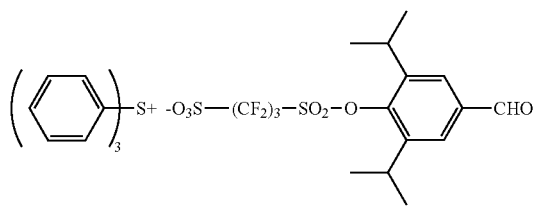
(z58)
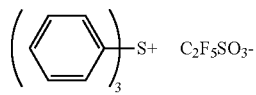
(z59)
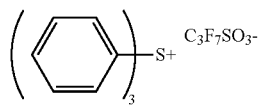
(z60)
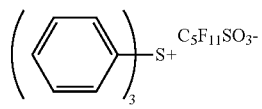
(z61)
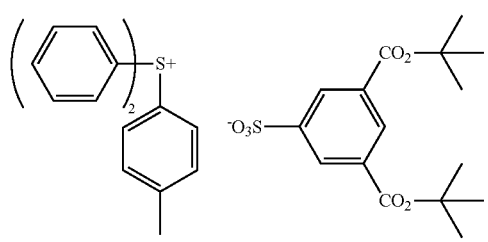
(z62)
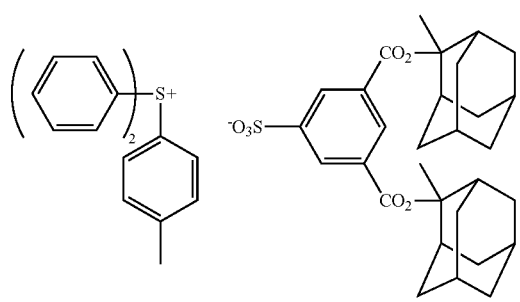
(z63)
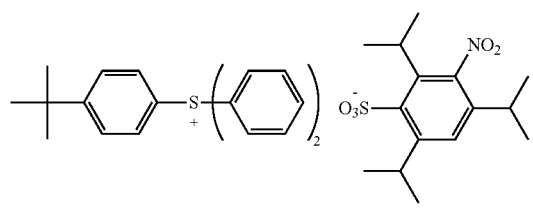
(z64)
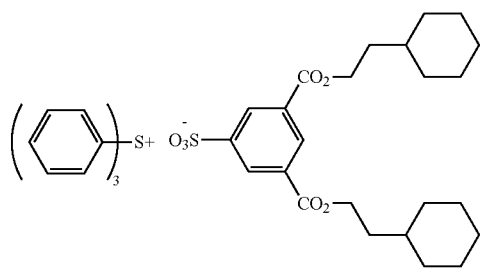
(z65)
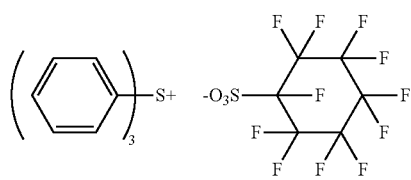
(z66)
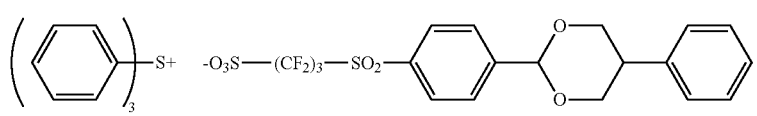
(z67)
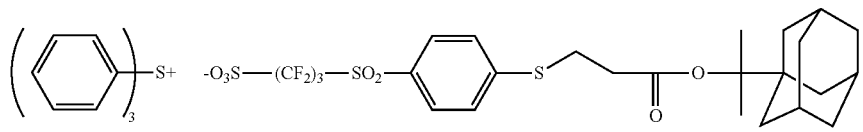
(z68)
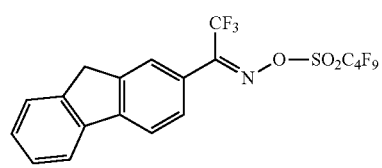
(z69)
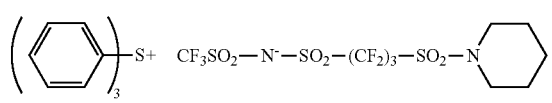

-continued
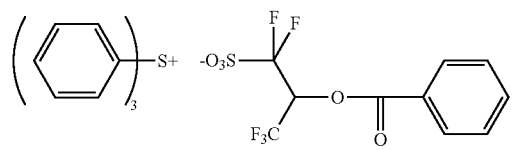 (z70)
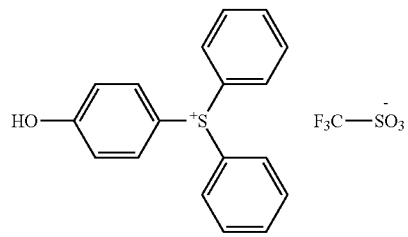 (z71)
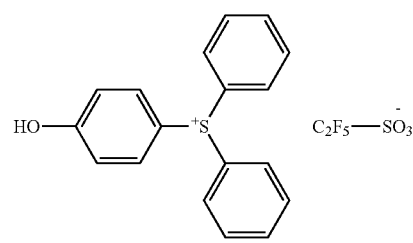 (z72)
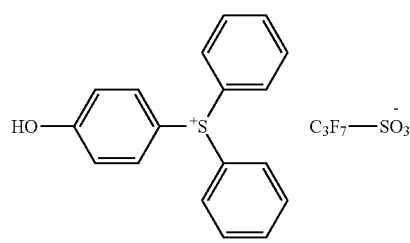 (z73)
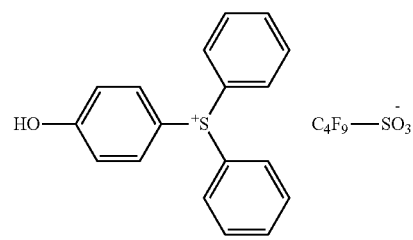 (z74)
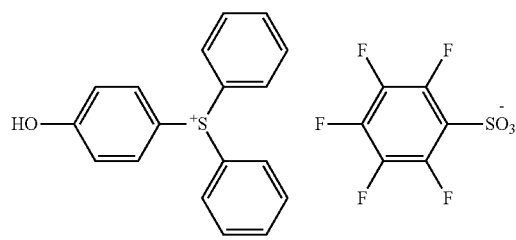 (z75)
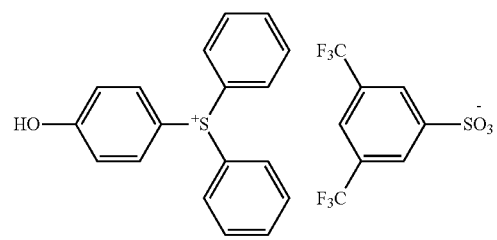 (z76)
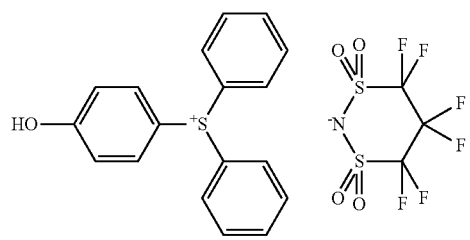 (z77)
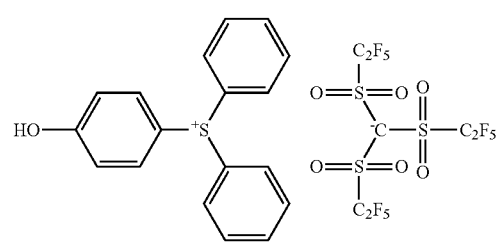 (z78)
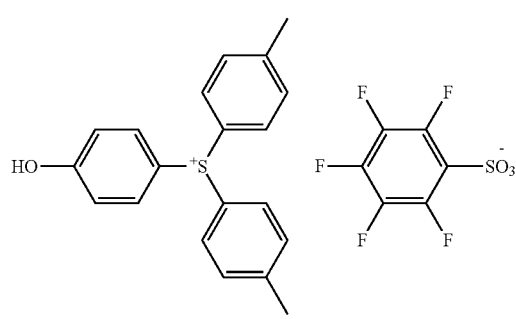 (z79)

-continued
(z80) 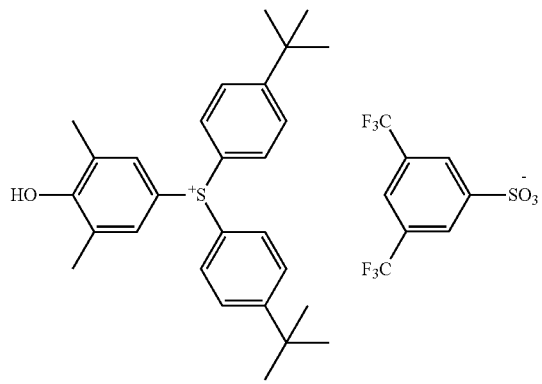
(z81) 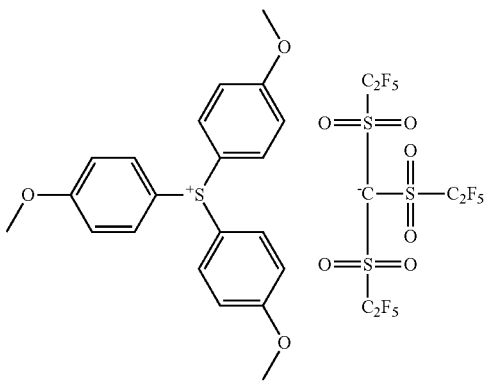
(z82) 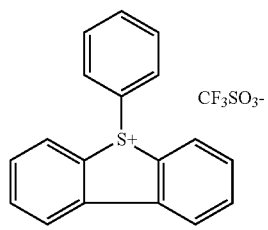
(z83) 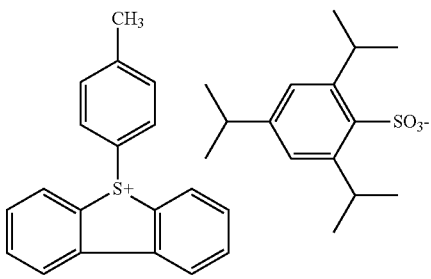
(z84) 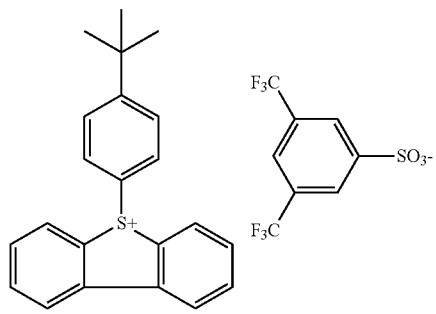
(z85) 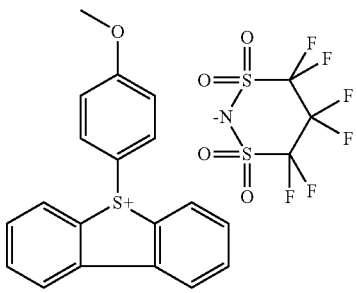
(z86) 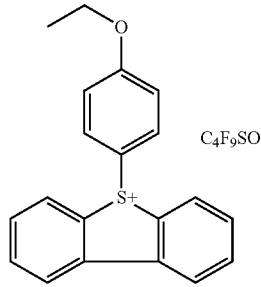
(z87) 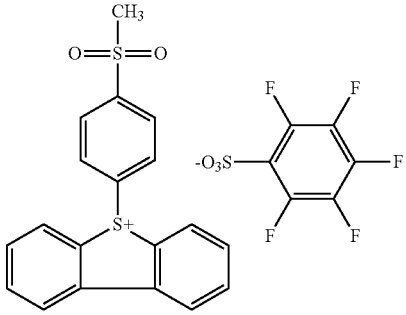
(z88) 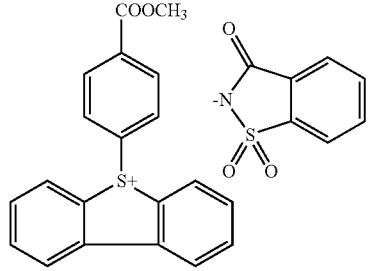
(z89) 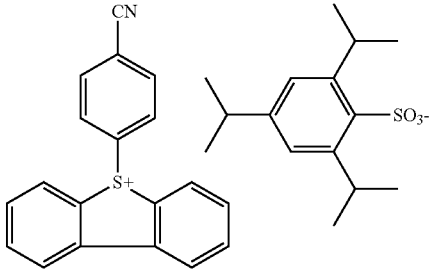

-continued
(z90) 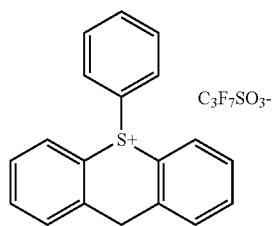
(z91) 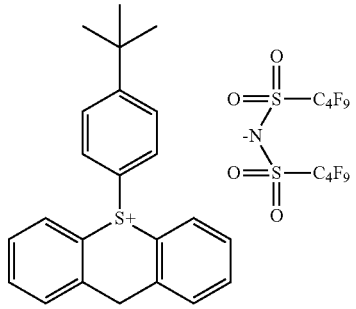
(z92) 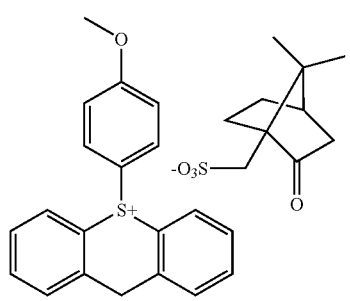
(z93) 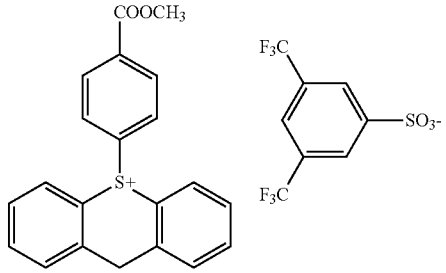
(z94) 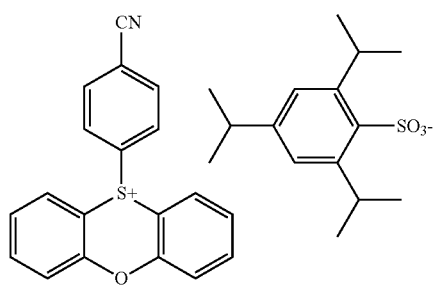
(z95) 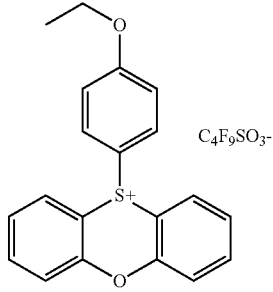
(z96) 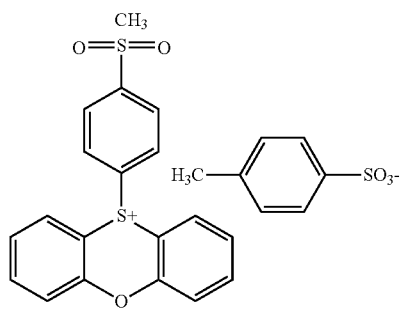
(z97) 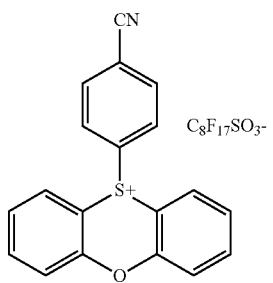
(z98) 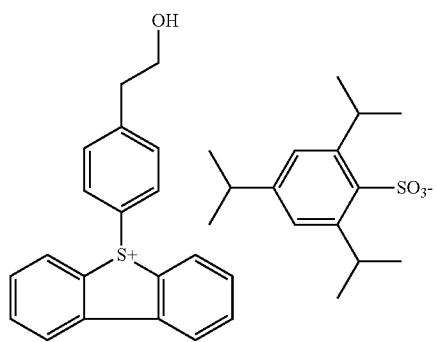
(z99) 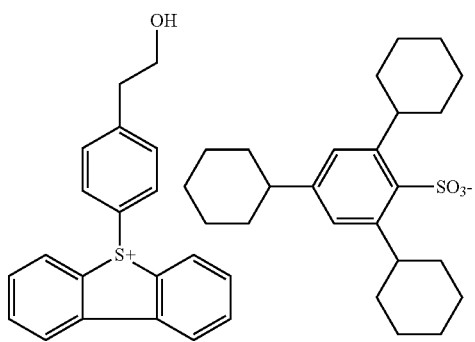

-continued
(z100)
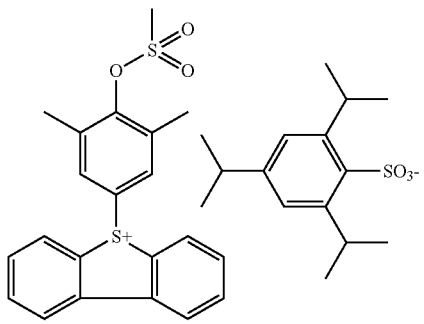
(z101)
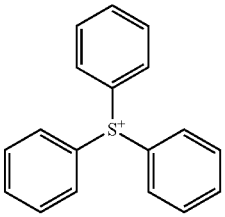
(z102)
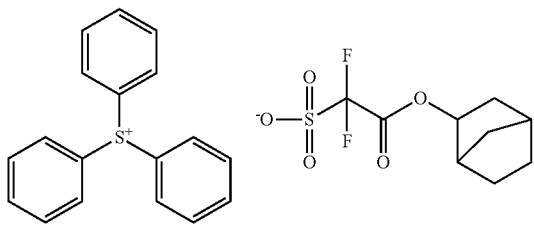
(z103)
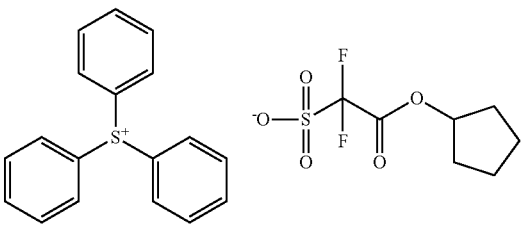
(z104)
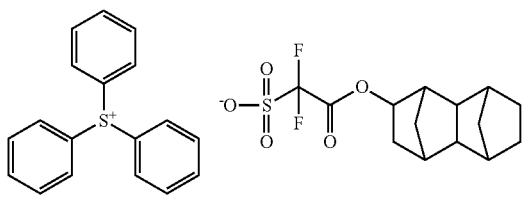
(z105)
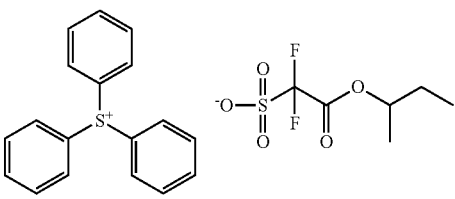
(z106)
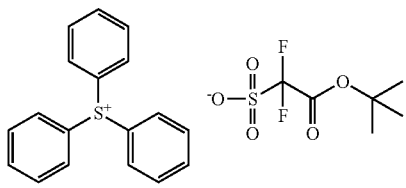
(z107)
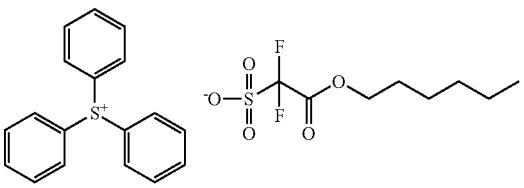
(z108)
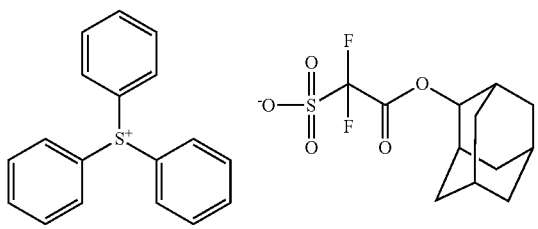
(z109)
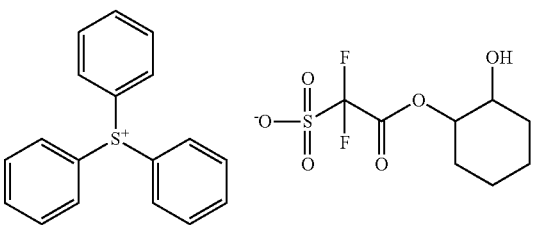
(z110)
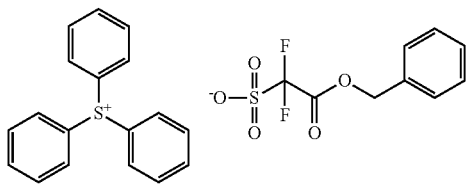
(z111)
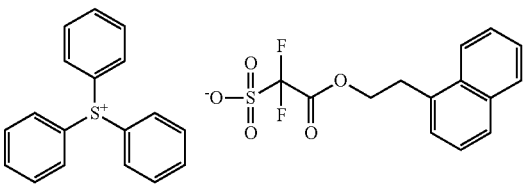

-continued
(z112)
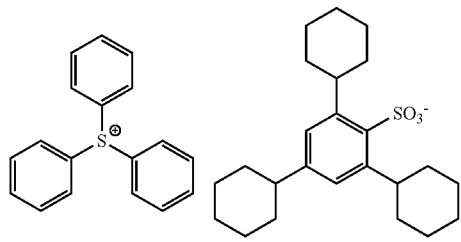
(z113)
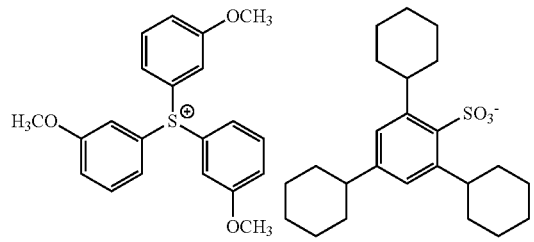
(z114)
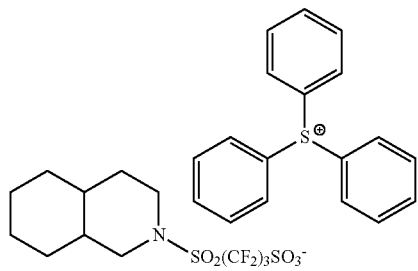
(z115)
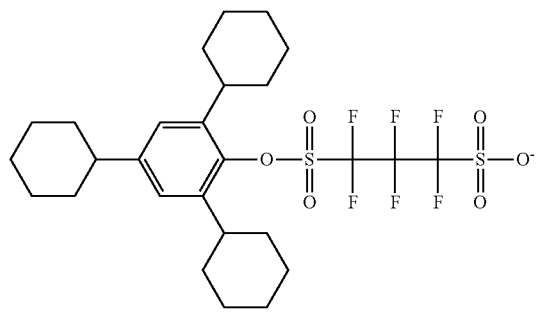
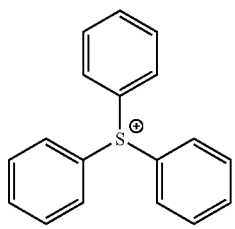
(z116)
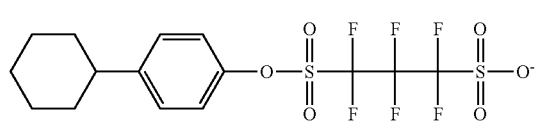
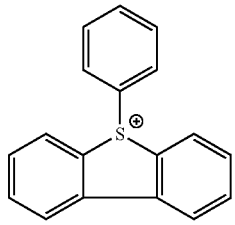
(z117) (z118)
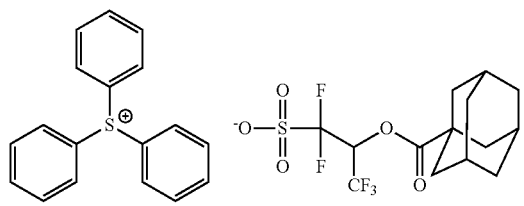
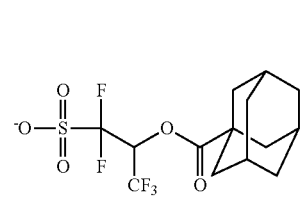
(z119) (z120)
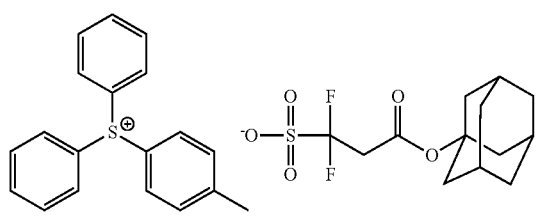
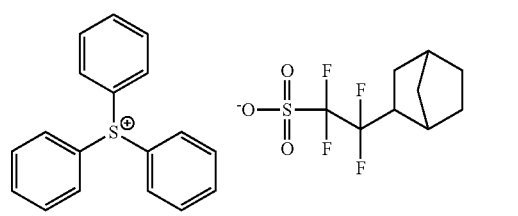

As for the acid generator, one kind of an acid generator may be used alone, or two or more kinds of acid generators may be used in combination.

The content of the acid generator in the composition is preferably from 0.1 to 70 mass %, more preferably from 0.5 to 60 mass %, still more preferably from 1.0 to 60 mass %, based on the entire solid content of the composition. If the content is too small, high sensitivity and high LWR performance can be hardly brought out, whereas if the content is too large, high resolution and high LWR performance can be hardly brought out.

[3] Hydrophobic Resin

The composition of the present invention may further contain a hydrophobic resin. When a hydrophobic resin is contained, the hydrophobic resin is unevenly distributed to the surface layer of the composition film and in the case of using water as the immersion medium, the receding contact angle of the film for the immersion liquid can be increased. In turn, the followability of the immersion liquid to the film can be enhanced.

The receding contact angle of the film after baking and before exposure is preferably from 60 to 90°, more preferably 65° or more, still more preferably 70° or more, yet still more preferably 75° or more, at a temperature of 23±3° C. and a humidity of 45±5%.

The hydrophobic resin is, as described above, unevenly distributed to the interface but unlike a surfactant, need not have necessarily a hydrophilic group in the molecule and may not contribute to uniform mixing of polar/nonpolar substances.

In the immersion exposure step, the immersion liquid must move on a wafer following the movement of an exposure head that is scanning the wafer at a high speed and forming an exposure pattern. Therefore, the contact angle of the immersion liquid with the resist film in a dynamic state is important, and the electron beam-sensitive or extreme ultraviolet-sensitive resin composition is required to have a performance of allowing a liquid droplet to follow the high-speed scanning of an exposure head with no remaining.

The hydrophobic resin (HR) is preferably a resin having at least either a fluorine atom or a silicon atom. The fluorine atom or silicon atom in the hydrophobic resin (HR) may be present in the main chain of the resin or may be substituted on the side chain. By virtue of the hydrophobic resin containing at least either a fluorine atom or a silicon atom, hydrophobicity (water followability) on the film surface is increased and the development residue (scum) is decreased.

The hydrophobic resin (HR) is preferably a resin having, as the fluorine atom-containing partial structure, a fluorine atom-containing alkyl group, a fluorine atom-containing cycloalkyl group or a fluorine atom-containing aryl group.

The fluorine atom-containing alkyl group (preferably having a carbon number of 1 to 10, more preferably from 1 to 4) is a linear or branched alkyl group with at least one hydrogen atom being substituted for by a fluorine atom and may further have other substituents.

The fluorine atom-containing cycloalkyl group is a monocyclic or polycyclic cycloalkyl group with at least one hydrogen atom being substituted for by a fluorine atom and may further have other substituents.

The fluorine atom-containing aryl group includes an aryl group (e.g., phenyl group, naphthyl group) with at least one hydrogen atom being substituted for by a fluorine atom and may further have other substituents.

Preferred examples of the fluorine atom-containing alkyl group, fluorine atom-containing cycloalkyl group and fluorine atom-containing aryl group include the groups represented by the following formulae (F2) to (F4), but the present invention is not limited thereto:

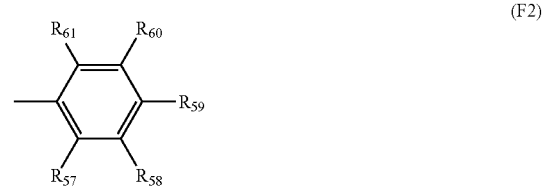

(F2)

(F3)

(F4)

In formulae (F2) to (F4), each of $R_{57}$ to $R_{68}$ independently represents a hydrogen atom, a fluorine atom or an alkyl group, provided that at least one of $R_{57}$ to $R_{61}$, at least one of $R_{62}$ to $R_{64}$ and at least one of $R_{65}$ to $R_{68}$ are a fluorine atom or an alkyl group (preferably having a carbon number of 1 to 4) with at least one hydrogen atom being substituted for by a fluorine atom. It is preferred that all of $R_{57}$ to $R_{61}$ and all of $R_{65}$ to $R_{67}$ are a fluorine atom. Each of $R_{62}$, $R_{63}$ and $R_{68}$ is preferably an alkyl group (preferably having a carbon number of 1 to 4) with at least one hydrogen atom being substituted for by a fluorine atom, more preferably a perfluoroalkyl group having a carbon number of 1 to 4. $R_{62}$ and $R_{63}$ may combine with each other to form a ring.

Specific examples of the group represented by formula (F2) include p-fluorophenyl group, pentafluorophenyl group and 3,5-di(trifluoromethyl)phenyl group.

Specific examples of the group represented by formula (F3) include trifluoromethyl group, pentafluoropropyl group, pentafluoroethyl group, heptafluorobutyl group, hexafluoroisopropyl group, heptafluoroisopropyl group, hexafluoro(2-methyl)isopropyl group, nonafluorobutyl group, octafluoroisobutyl group, nonafluorohexyl group, nonafluoro-tert-butyl group, perfluoroisopentyl group, perfluorooctyl group, perfluoro(trimethyl)hexyl group, 2,2,3,3-tetrafluorocyclobutyl group and perfluorocyclohexyl group. Among these, hexafluoroisopropyl group, heptafluoroisopropyl group, hexafluoro(2-methyl)isopropyl group, octafluoroisobutyl group, nonafluoro-tert-butyl group and perfluoroisopentyl group are preferred, and hexafluoroisopropyl group and heptafluoroisopropyl group are more preferred.

Specific examples of the group represented by formula (F4) include —C(CF$_3$)$_2$OH, —C(C$_2$F$_5$)$_2$OH, —C(CF$_3$)(CH$_3$)OH and —CH(CF$_3$)OH, with —C(CF$_3$)$_2$OH being preferred.

Suitable repeating units having a fluorine atom include the followings.

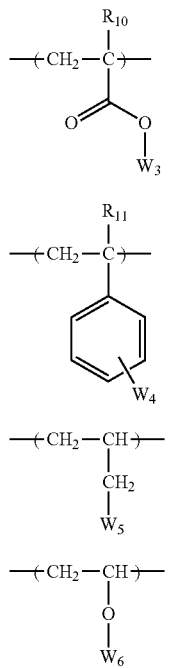

(C-Ia)

(C-Ib)

(C-Ic)

(C-Id)

In the formulae, each of $R_{10}$ and $R_{11}$ independently represents a hydrogen atom, a fluorine atom, or an alkyl group (preferably a linear or branched alkyl group having a carbon number of 1 to 4; the alkyl group having a substituent includes, in particular, a fluorinated alkyl group).

Each of $W_3$ to $W_6$ independently represents an organic group having at least one or more fluorine atoms, and the organic group specifically includes the groups represented by formulae (F2) to (F4).

In addition, the hydrophobic resin may contain a unit shown below as the repeating unit having a fluorine atom:

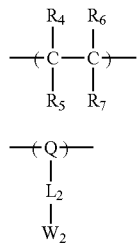

(C-II)

(C-III)

In the formulae, each of $R_4$ to $R_7$ independently represents a hydrogen atom, a fluorine atom, or an alkyl group (preferably a linear or branched alkyl group having a carbon number of 1 to 4; and the alkyl group having a substituent includes, in particular, a fluorinated alkyl group).

However, at least one of $R_4$ to $R_7$ represents a fluorine atom. $R_4$ and $R_5$, or $R_6$ and $R_7$ may form a ring.

$W_2$ represents an organic group having at least one fluorine atom, and the organic group specifically includes the atomic groups of (F2) to (F4) above.

Q represents an alicyclic structure. The alicyclic structure may have a substituent and may be monocyclic or polycyclic, and in the case of a polycyclic structure, the structure may be a crosslinked structure. The monocyclic structure is preferably a cycloalkyl group having a carbon number of 3 to 8, and examples thereof include a cyclopentyl group, a cyclohexyl group, a cyclobutyl group, and a cyclooctyl group. Examples of the polycyclic structure include a group having a bicyclo, tricyclo or tetracyclo structure with a carbon number of 5 or more. A cycloalkyl group having a carbon number of 6 to 20 is preferred, and examples thereof include an adamantyl group, a norbornyl group, a dicyclopentyl group, a tricyclodecanyl group, and a tetracyclododecyl group. A part of carbon atoms in the cycloalkyl group may be substituted with a heteroatom such as oxygen atom.

$L_2$ represents a single bond or a divalent linking group. The divalent linking group is a substituted or unsubstituted arylene group, a substituted or unsubstituted alkylene group, a substituted or unsubstituted cycloalkylene group, —O—, —SO$_2$—, —CO—, —N(R)— (wherein R represents a hydrogen atom or an alkyl group), —NHSO$_2$—, or a divalent linking group formed by combining a plurality thereof.

The hydrophobic resin (HR) may contain a silicon atom. The resin is preferably a resin having, as the silicon atom-containing partial structure, an alkylsilyl structure (preferably a trialkylsilyl group) or a cyclic siloxane structure.

Specific examples of the alkylsilyl structure and cyclic siloxane structure include groups represented by the following formulae (CS-1) to (CS-3):

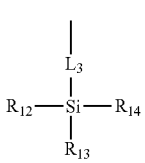

(CS-1)

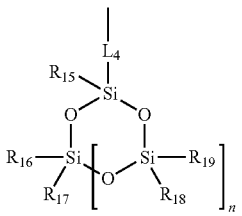

(CS-2)

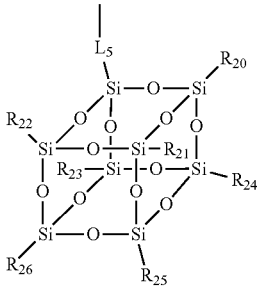

(CS-3)

In formulae (CS-1) to (CS-3), each of $R_{12}$ to $R_{26}$ independently represents a linear or branched alkyl group (preferably having a carbon number of 1 to 20) or a cycloalkyl group (preferably having a carbon number of 3 to 20).

Each of $L_3$ to $L_5$ represents a single bond or a divalent linking group. The divalent linking group is a single group or a combination of two or more groups selected from the group consisting of an alkylene group, a phenylene group, an ether group, a thioether group, a carbonyl group, an ester group, an amide group, a urethane group and a urea group.

n represents an integer of 1 to 5. n is preferably an integer of 2 to 4.
Specific examples of the repeating unit containing a fluorine atom or a silicon atom are illustrated below. In specific examples, $X_1$ represents a hydrogen atom, —$CH_3$, —F or —$CF_3$, and $X_2$ represents —F or —$CF_3$.
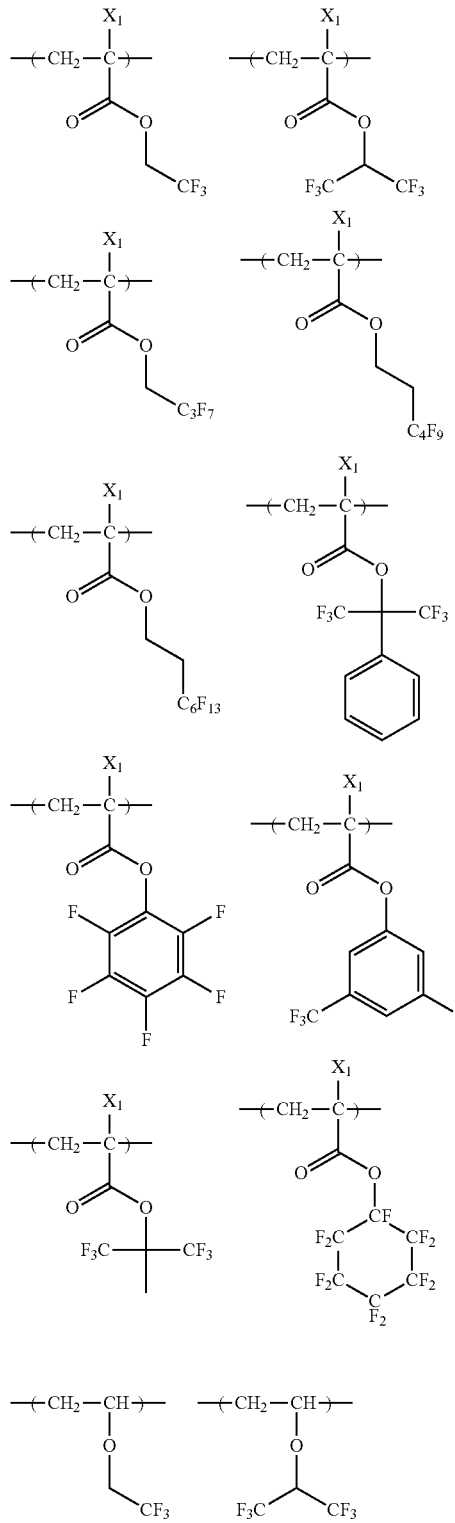
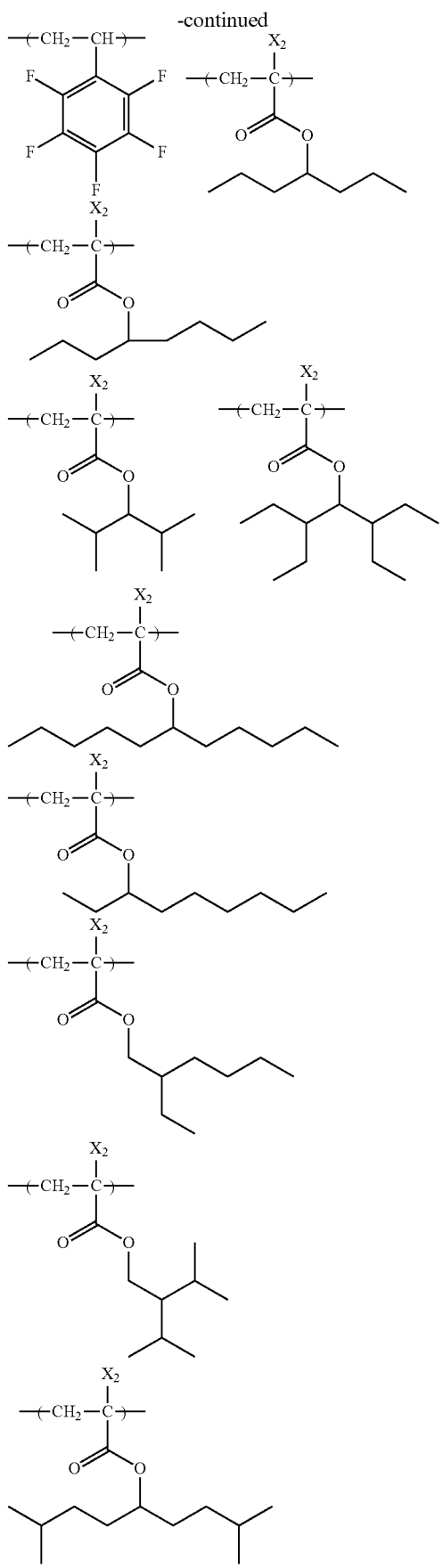

169
-continued
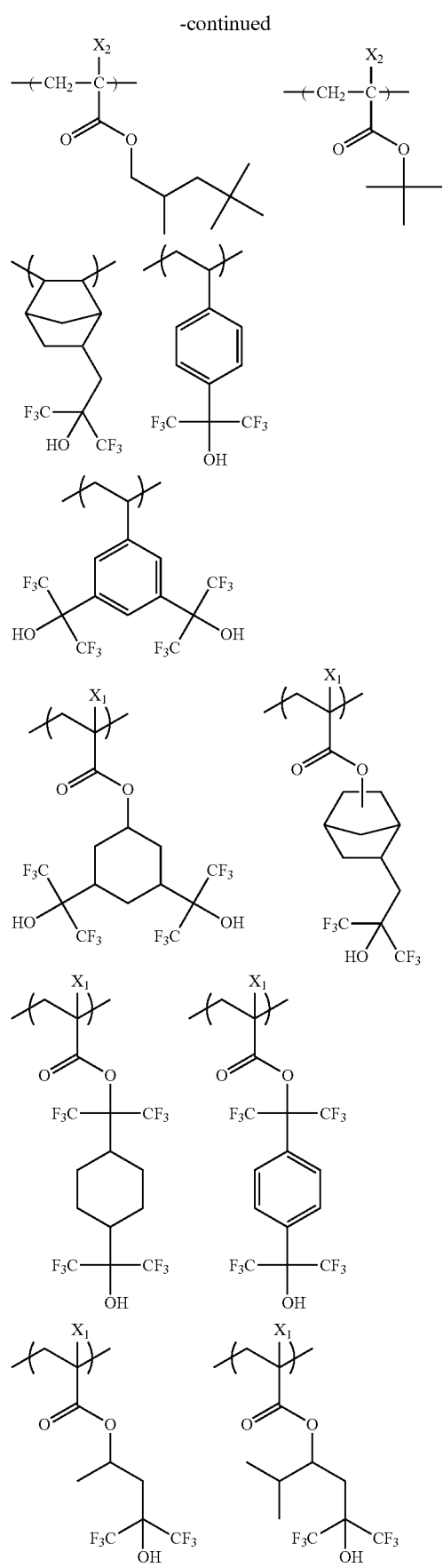
170
-continued
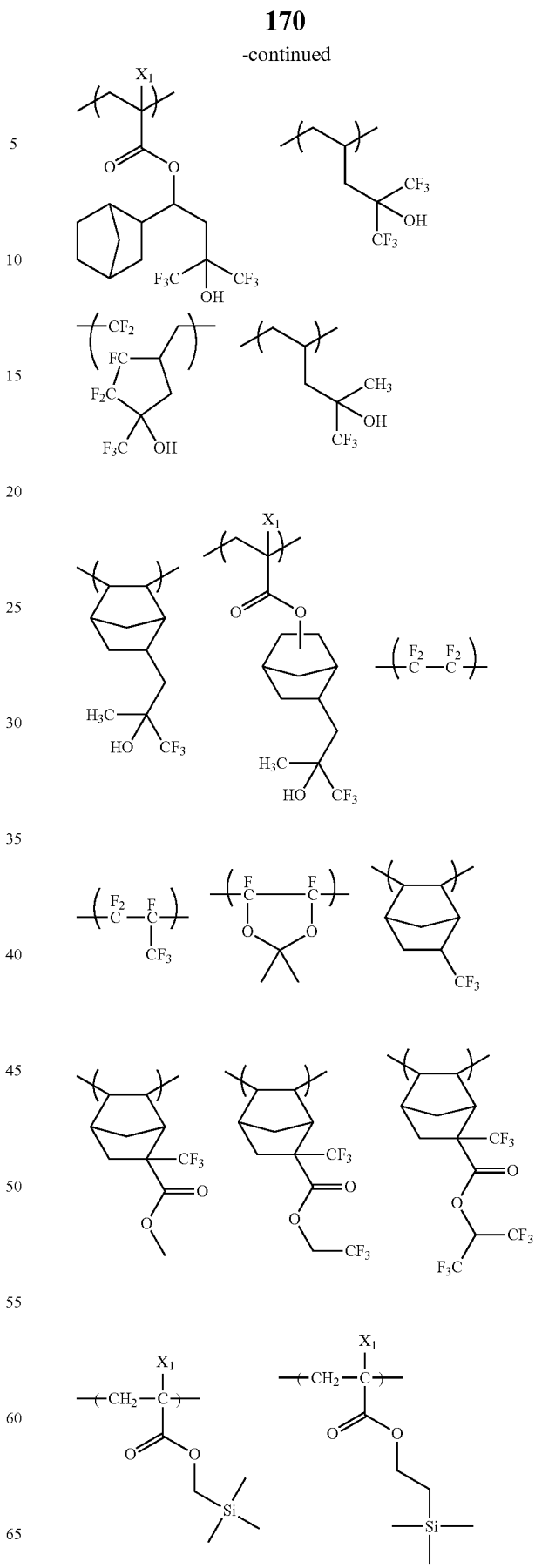

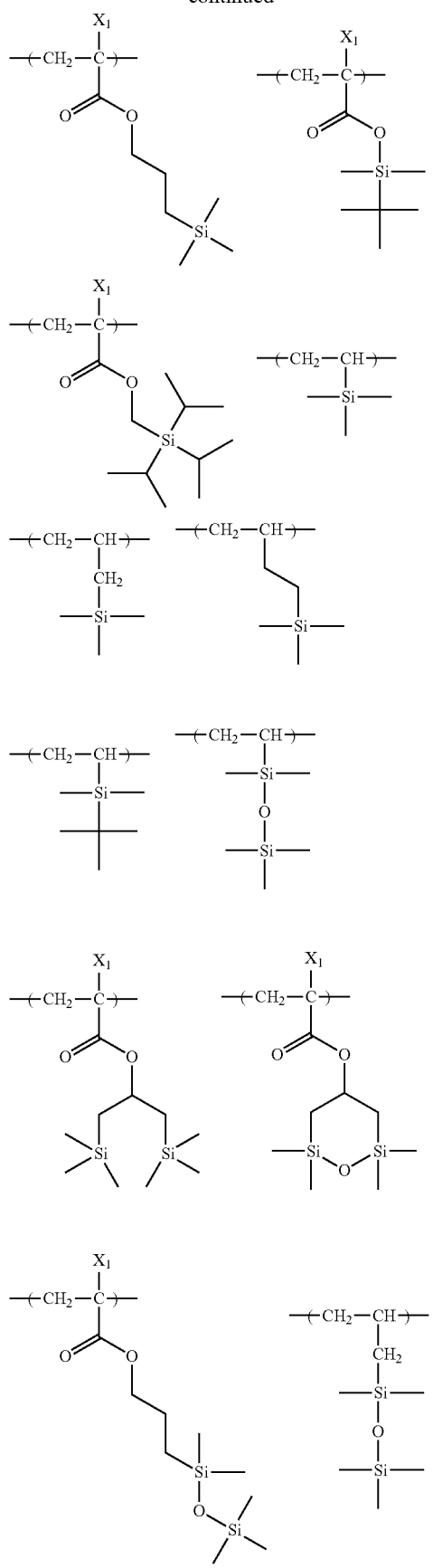
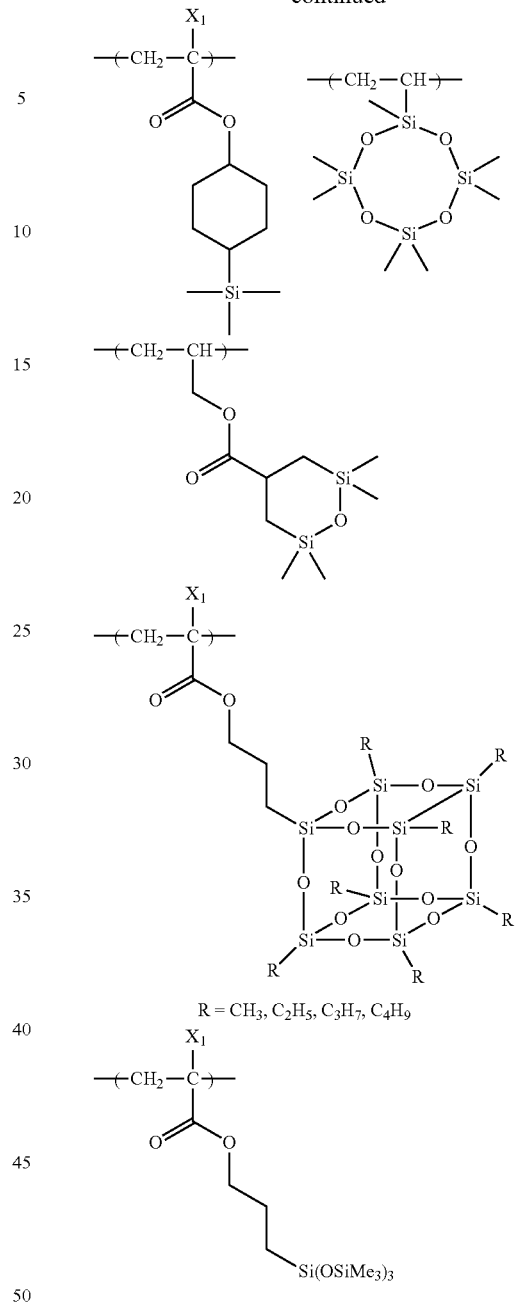

Furthermore, the hydrophobic resin (HR) may contain at least one group selected from the following (x) and (z):
(x) a polar group, and
(z) a group capable of decomposing by the action of an acid.

Examples of the polar group (x) include a phenolic hydroxyl group, a carboxylic acid group, a fluorinated alcohol group, a sulfonic acid group, a sulfonamide group, a sulfonylimide group, an (alkylsulfonyl)(alkylcarbonyl)methylene group, an (alkylsulfonyl)(alkylcarbonyl)imide group, a bis(alkylcarbonyl)methylene group, a bis(alkylcarbonyl)imide group, a bis(alkylsulfonyl)methylene group, a bis(alkylsulfonyl)imide group, a tris(alkylcarbonyl)methylene group, and a tris(alkylsulfonyl)methylene group.

Preferred polar groups include a fluorinated alcohol group (preferably hexafluoroisopropanol), a sulfonimide group and a bis(alkylcarbonyl)methylene group.

The repeating unit having (x) a polar group includes, for example, a repeating unit where the polar group is directly bonded to the main chain of the resin, such as repeating unit by an acrylic acid or a methacrylic acid, and a repeating unit where the polar group is bonded to the main chain of the resin through a linking group, and the polar group may be also introduced into the terminal of the polymer chain by using a polar group-containing polymerization initiator or chain transfer agent at the polymerization. All of these cases are preferred.

The content of the repeating unit having (x) a polar group is preferably from 1 to 50 mol %, more preferably from 3 to 35 mol %, still more preferably from 5 to 20 mol %, based on all repeating units in the hydrophobic resin.

Specific examples of the repeating unit having (x) a polar group are illustrated below. In specific examples, Rx represents H, $CH_3$, $CH_2OH$ or $CF_3$.

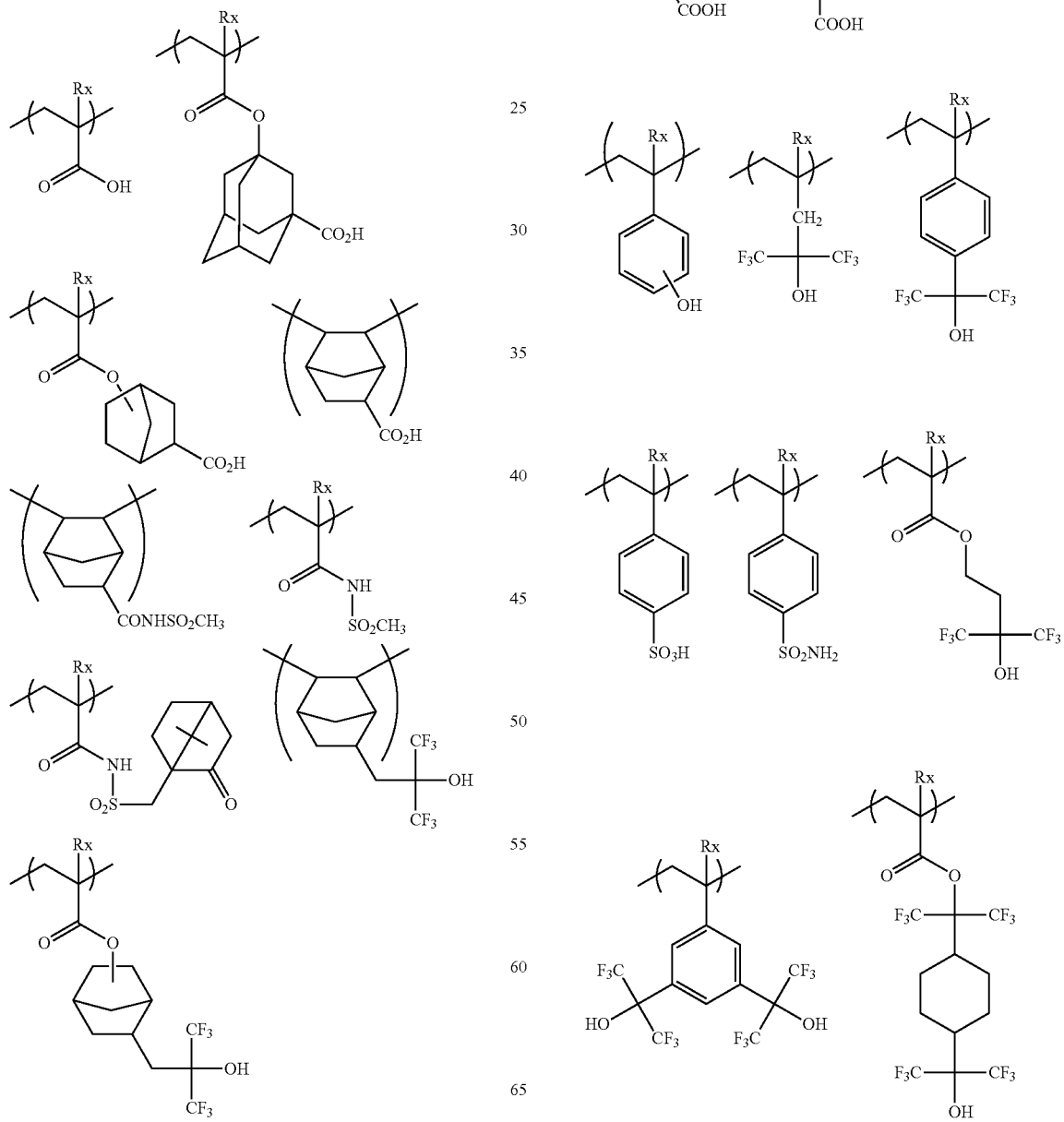

-continued

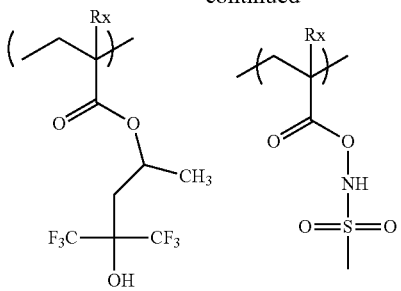

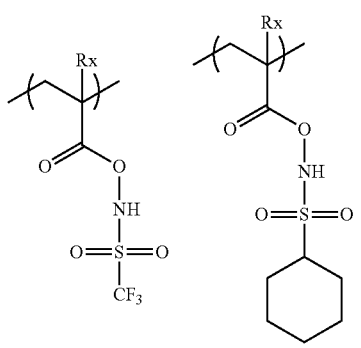

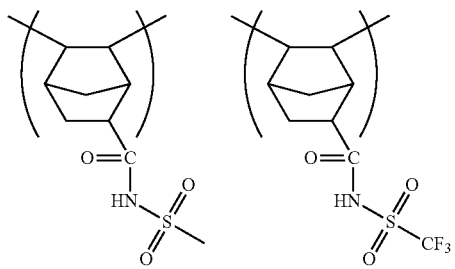

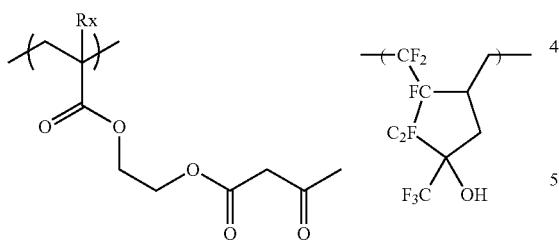

Examples of the repeating unit having (z) a group capable of decomposing by the action of an acid, contained in the hydrophobic resin (HR), are the same as those of the repeating unit having an acid-decomposable group described for the acid-decomposable resin.

In the hydrophobic resin (HR), the content of the repeating unit having (z) a group capable of decomposing by the action of an acid is preferably from 1 to 80 mol %, more preferably from 10 to 80 mol %, still more preferably from 20 to 60 mol %, based on all repeating units in the hydrophobic resin.

The hydrophobic resin (HR) may further contain a repeating unit represented by the following formula (VI):

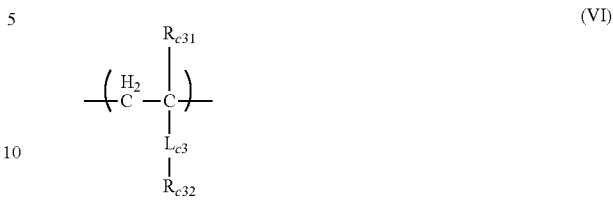

(VI)

In formula (VI), $R_{c31}$ represents a hydrogen atom, an alkyl group which may be substituted with fluorine, a cyano group or a —$CH_2$—O—$R_{ac2}$ group, wherein $R_{ac2}$ represents a hydrogen atom, an alkyl group or an acyl group. $R_{c31}$ is preferably a hydrogen atom, a methyl group, a hydroxymethyl group or a trifluoromethyl group, more preferably a hydrogen atom or a methyl group.

$R_{c32}$ represents a group having an alkyl group, a cycloalkyl group, an alkenyl group, a cycloalkenyl group or an aryl group. Each of these groups may be substituted with a fluorine atom or a silicon atom.

$L_{c3}$ represents a single bond or a divalent linking group.

The alkyl group of $R_{c32}$ in formula (VI) is preferably a linear or branched alkyl group having a carbon number of 3 to 20.

The cycloalkyl group is preferably a cycloalkyl group having a carbon number of 3 to 20.

The alkenyl group is preferably an alkenyl group having a carbon number of 3 to 20.

The cycloalkenyl group is preferably a cycloalkenyl group having a carbon number of 3 to 20.

The aryl group is preferably a phenyl group or a naphthyl group, which are an aryl group having a carbon number of 6 to 20, and these groups may have a substituent.

$R_{c32}$ is preferably an unsubstituted alkyl group or a fluorine atom-substituted alkyl group.

The divalent linking group of $L_{c3}$ is preferably an alkylene group (preferably having a carbon number of 1 to 5), an oxy group, a phenylene group or an ester bond (a group represented by —COO—).

The hydrophobic resin (HR) may contain, as the repeating unit represented by formula (VI), a repeating unit represented by the following formula (VII) or (VIII):

(VII)

(VIII)

In formula (VII), $R_{c5}$ represents a hydrocarbon group having at least one cyclic structure and having neither a hydroxy group nor a cyano group.

In formulae (VII) and (VIII), Rac represents a hydrogen atom, an alkyl group which may be substituted with a fluorine atom, a cyano group or a —CH$_2$—O-Rac$_2$ group, wherein Rac$_2$ represents a hydrogen atom, an alkyl group or an acyl group. Rac is preferably a hydrogen atom, a methyl group, a hydroxymethyl group or a trifluoromethyl group, more preferably a hydrogen atom or a methyl group.

The cyclic structure contained in R$_{c5}$ includes a monocyclic hydrocarbon group and a polycyclic hydrocarbon group. Examples of the monocyclic hydrocarbon group include a cycloalkyl group having a carbon number of 3 to 12, and a cycloalkenyl group having a carbon number of 3 to 12. The monocyclic hydrocarbon group is preferably a monocyclic hydrocarbon group having a carbon number of 3 to 7.

The polycyclic hydrocarbon group includes a ring assembly hydrocarbon group and a crosslinked cyclic hydrocarbon group. The crosslinked cyclic hydrocarbon ring includes, for example, a bicyclic hydrocarbon ring, a tricyclic hydrocarbon ring and a tetracyclic hydrocarbon ring. The crosslinked cyclic hydrocarbon ring also includes a condensed cyclic hydrocarbon ring (for example, a condensed ring formed by fusing a plurality of 5- to 8-membered cycloalkane rings). Preferred crosslinked cyclic hydrocarbon rings include a norbornyl group and an adamantyl group.

These alicyclic hydrocarbon groups may have a substituent, and preferred examples of the substituent include a halogen atom, an alkyl group, a hydroxyl group protected by a protective group, and an amino group protected by a protective group. The halogen atom is preferably bromine atom, chlorine atom or fluorine atom, and the alkyl group is preferably a methyl group, an ethyl group, a butyl group or a tert-butyl group. This alkyl group may further have a substituent, and the substituent which the alkyl group may further have includes a halogen atom, an alkyl group, a hydroxyl group protected by a protective group, and an amino group protected by a protective group.

Examples of the protective group include an alkyl group, a cycloalkyl group, an aralkyl group, a substituted methyl group, a substituted ethyl group, an alkoxycarbonyl group, and an aralkyloxycarbonyl group. The alkyl group is preferably an alkyl group having a carbon number of 1 to 4; the substituted methyl group is preferably a methoxymethyl group, a methoxythiomethyl group, a benzyloxymethyl group, a tert-butoxymethyl group or a 2-methoxyethoxymethyl group; the substituted ethyl group is preferably a 1-ethoxyethyl group or a 1-methyl-1-methoxyethyl group; the acyl group is preferably an aliphatic acyl group having a carbon number of 1 to 6, such as formyl group, acetyl group, propionyl group, butyryl group, isobutyryl group, valeryl group and pivaloyl group; and the alkoxycarbonyl group includes, for example, an alkoxycarbonyl group having a carbon number of 1 to 4.

In formula (VIII), R$_{c6}$ represents an alkyl group, a cycloalkyl group, an alkenyl group, a cycloalkenyl group, an alkoxycarbonyl group or an alkylcarbonyloxy group. Each of these groups may be substituted with a fluorine atom or a silicon atom.

The alkyl group of R$_{c6}$ is preferably a linear or branched alkyl group having a carbon number of 1 to 20.

The cycloalkyl group is preferably a cycloalkyl group having a carbon number of 3 to 20.

The alkenyl group is preferably an alkenyl group having a carbon number of 3 to 20.

The cycloalkenyl group is preferably a cycloalkenyl group having a carbon number of 3 to 20.

The alkoxycarbonyl group is preferably an alkoxycarbonyl group having a carbon number of 2 to 20.

The alkylcarbonyloxy group is preferably an alkylcarbonyloxy group having a carbon number of 2 to 20.

n represents an integer of 0 to 5. When n is 2 or more, each R$_{c6}$ may be the same as or different from every other R$_{c6}$.

R$_{c6}$ is preferably an unsubstituted alkyl group or an alkyl group substituted with a fluorine atom, more preferably a trifluoromethyl group or a tert-butyl group.

It is also preferred that the hydrophobic resin (HR) further contains a repeating unit represented by the following formula (CII-AB):

(CII-AB)

In formula (CII-AB), each of R$_{c11}$' and R$_{c12}$' independently represents a hydrogen atom, a cyano group, a halogen atom or an alkyl group.

Z$_c$' represents an atomic group for forming an alicyclic structure containing two carbon atoms (C—C) to which Z$_c$' is bonded.

Formula (CII-AB) is preferably the following formula (CII-AB1) or (CII-AB2):

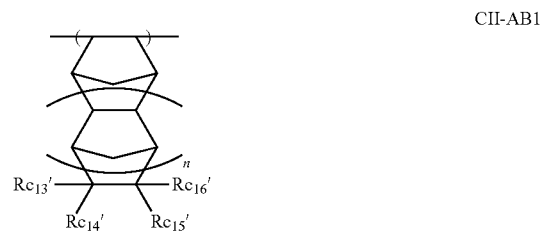

CII-AB1

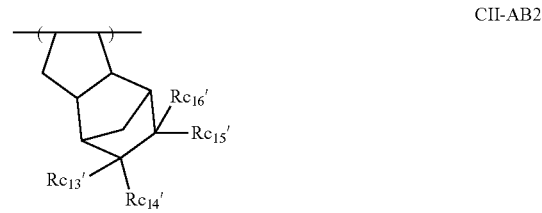

CII-AB2

In formulae (CII-AB1) and (CII-AB2), each of Rc$_{13}$' to Rc$_{16}$' independently represents a hydrogen atom, a halogen atom, an alkyl group or a cycloalkyl group.

Also, at least two members out of Rc$_{13}$' to Rc$_{16}$' may combine to form a ring.

n represents 0 or 1.

Specific examples of the repeating unit represented by formula (VI) or (CII-AB) are illustrated below, but the present invention is not limited thereto. In the formulae, Ra represents H, CH$_3$, CH$_2$OH, CF$_3$ or CN.

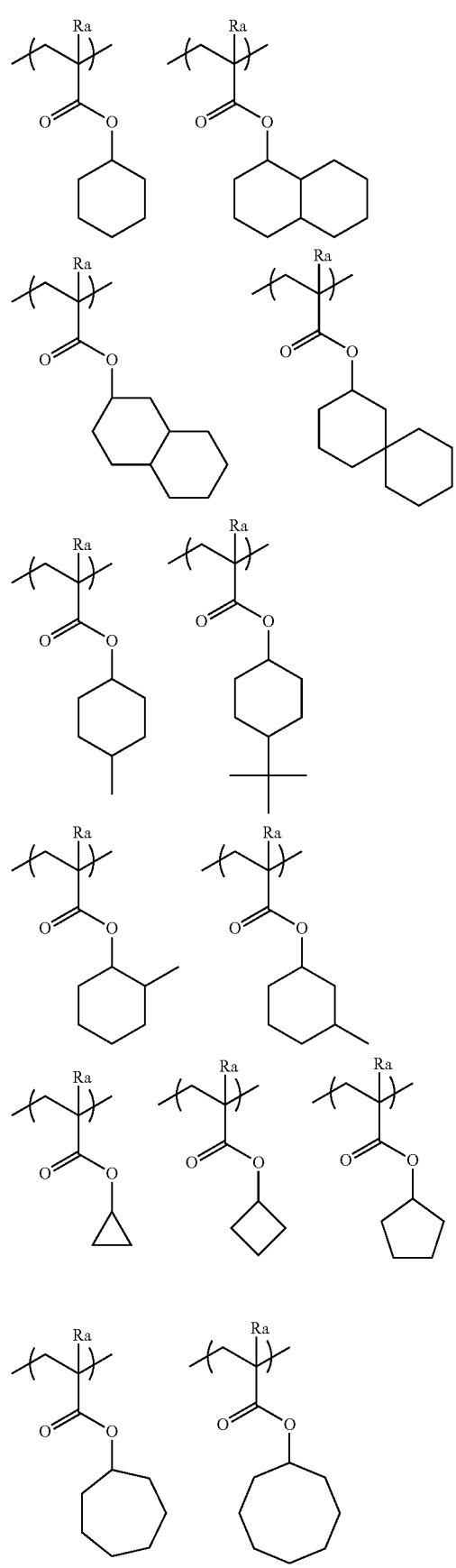
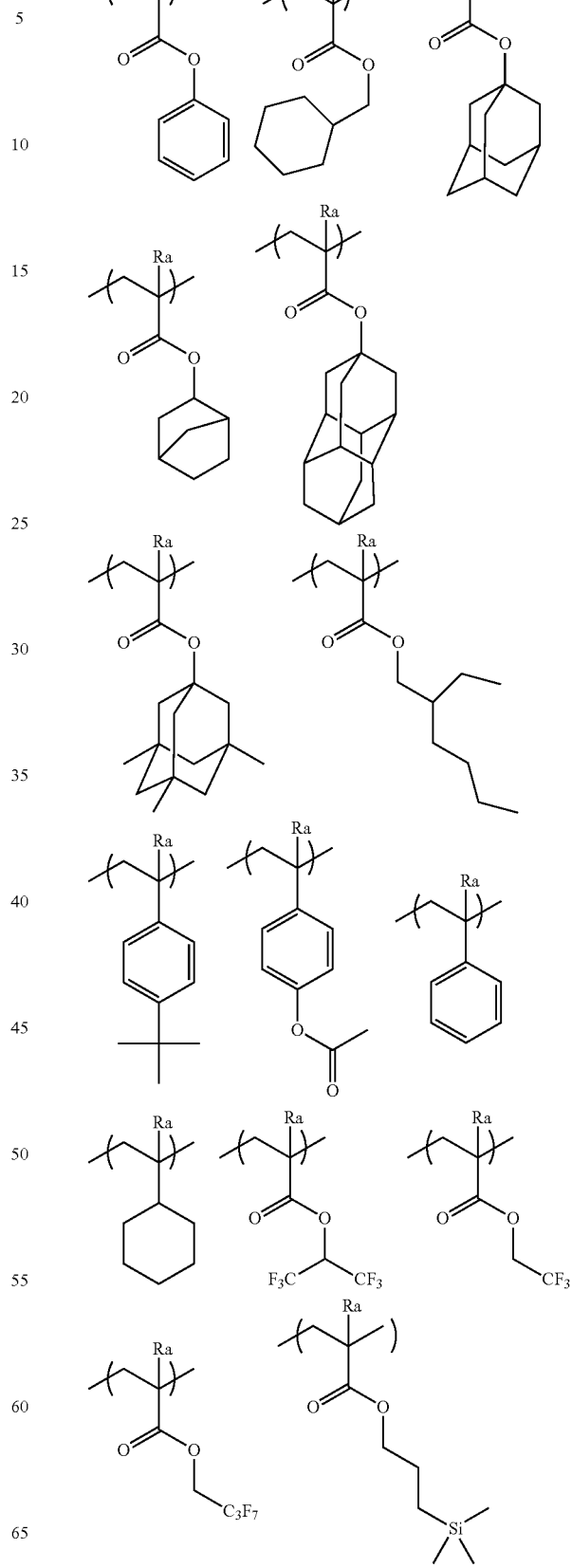

-continued
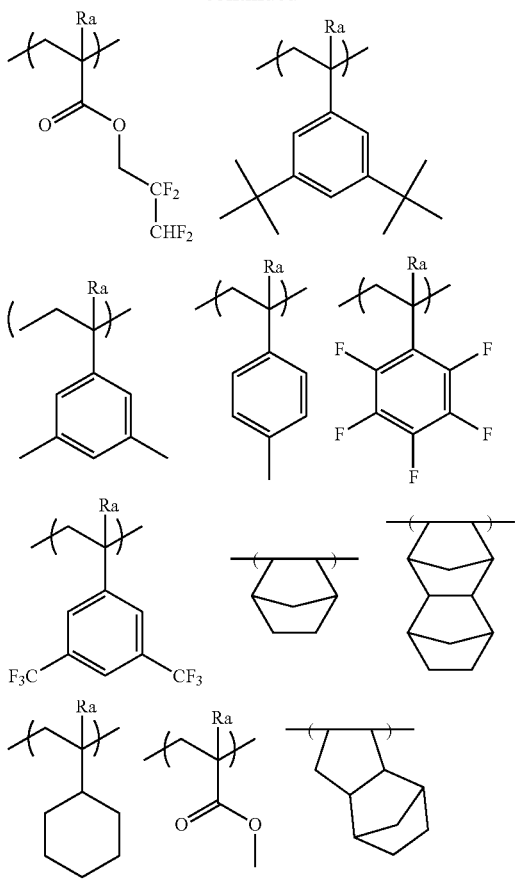
Specific examples of the hydrophobic resin (HR) are illustrated below. Also, the molar ratio of repeating units (corresponding to repeating units starting from the left), weight average molecular weight and polydispersity of each resin are shown in Tables 1 to 3 later.
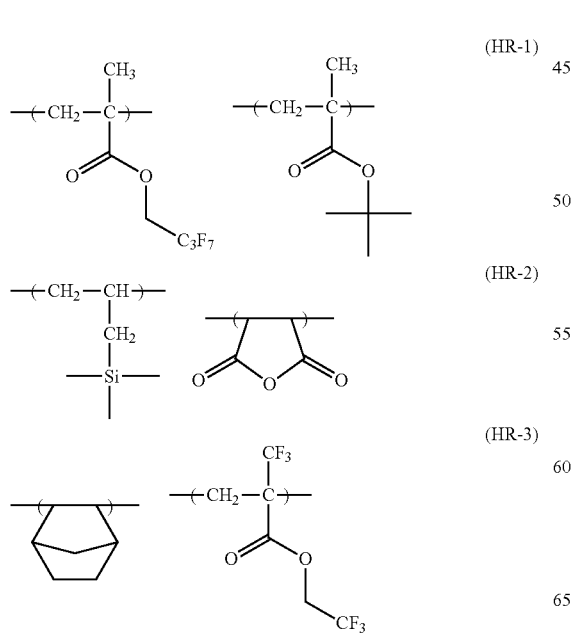
-continued
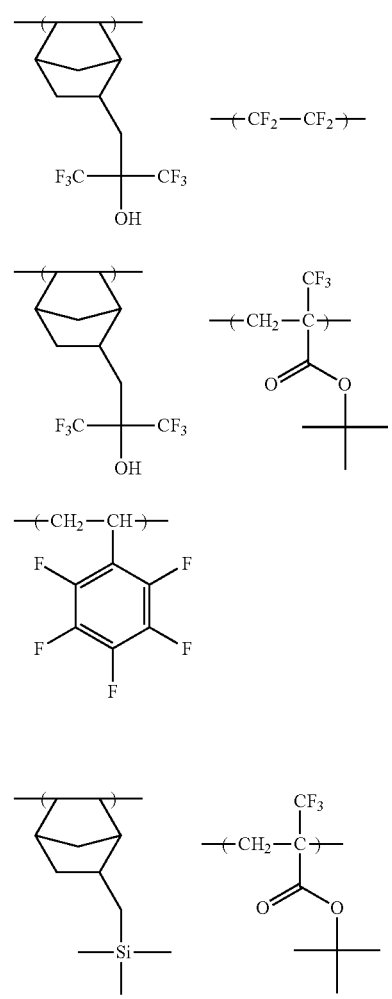

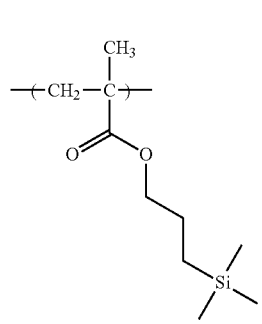 (HR-10)
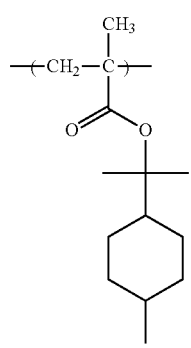 (HR-11)
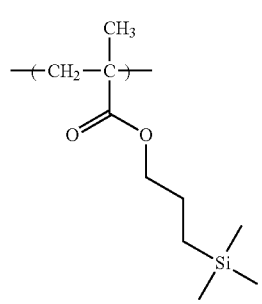 (HR-12)
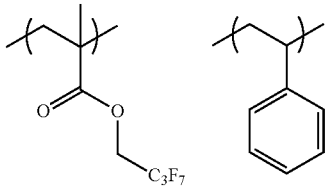 (HR-14)
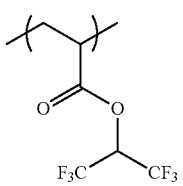 (HR-15)
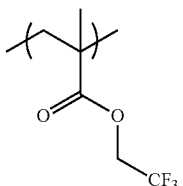 (HR-16)
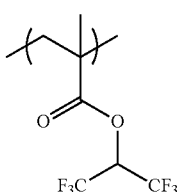 (HR-17)
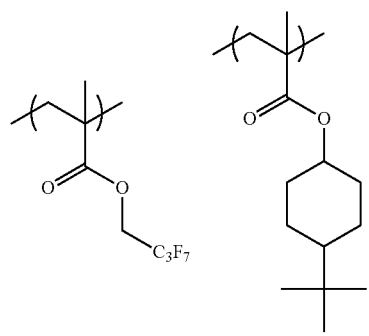 (HR-13)
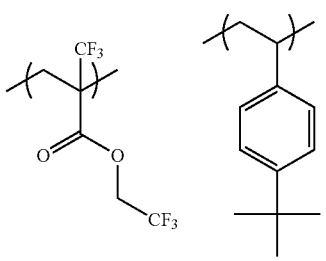 (HR-18)
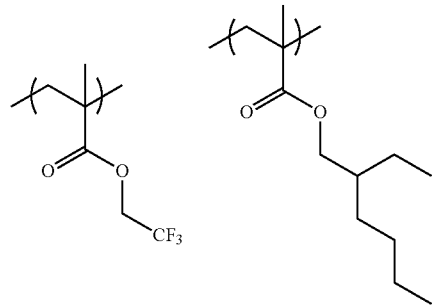 
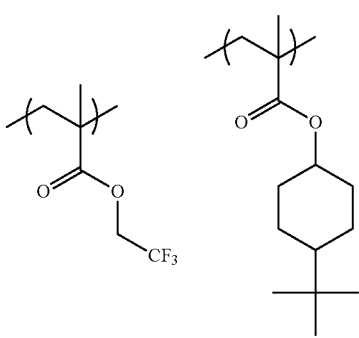 (HR-19)

(HR-20) 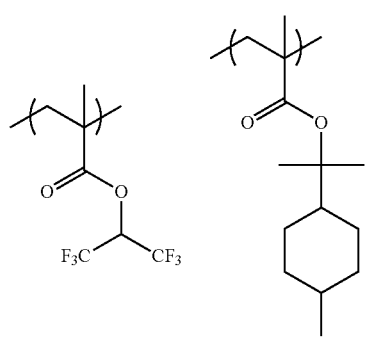
(HR-21) 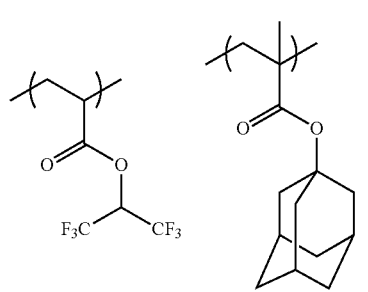
(HR-22) 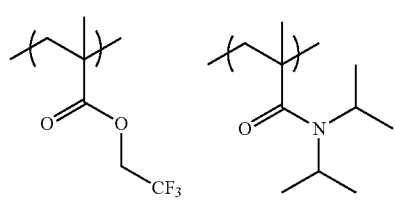
(HR-23) 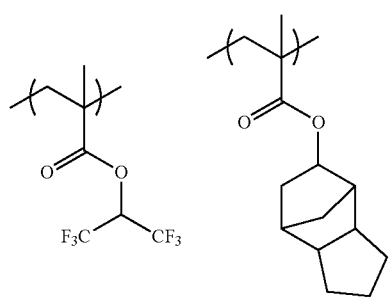
(HR-24) 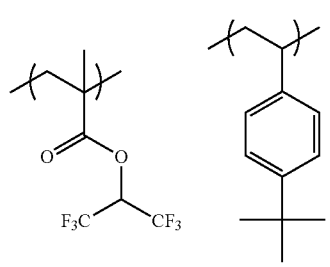
(HR-25) 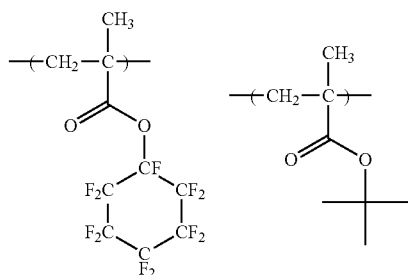
(HR-26) 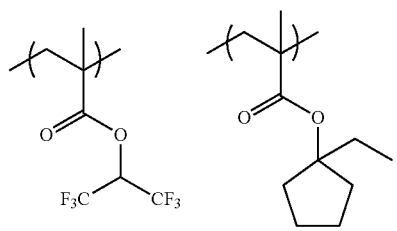
(HR-27) 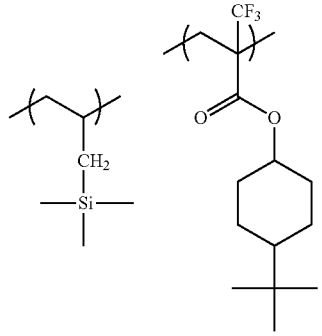
(HR-28) 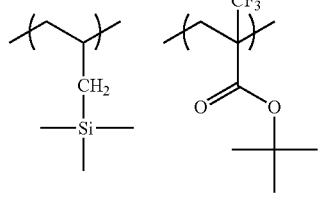
(HR-29) 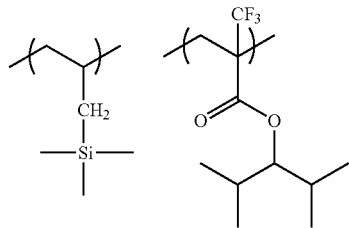
(HR-30) 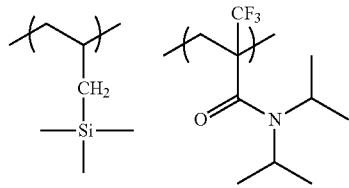

(HR-31) 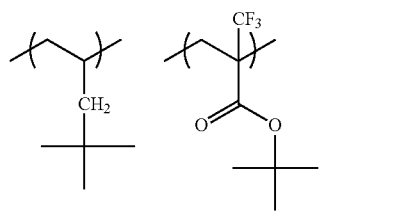
(HR-32) 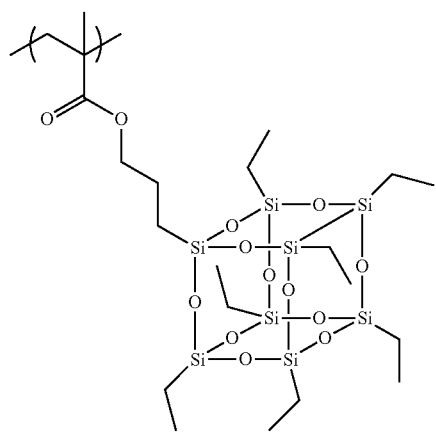
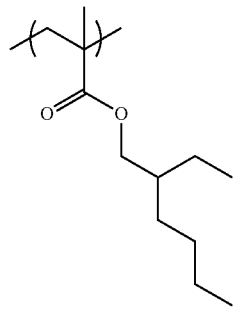
(HR-33) 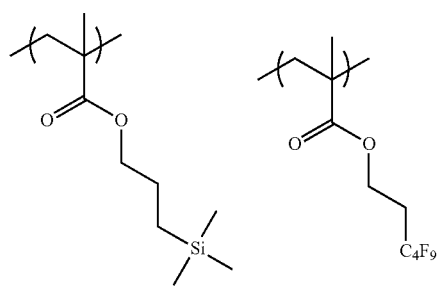
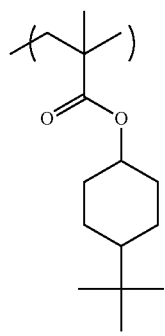
(HR-34) 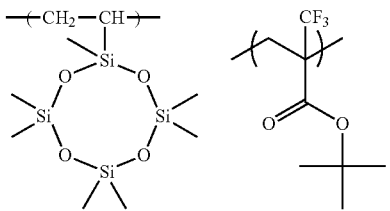
(HR-35) 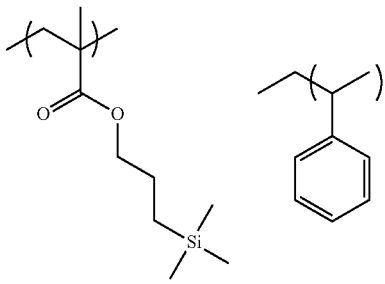
(HR-36) 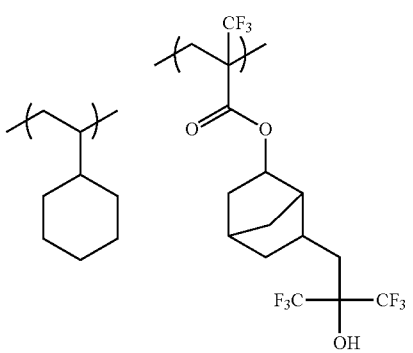
(HR-37) 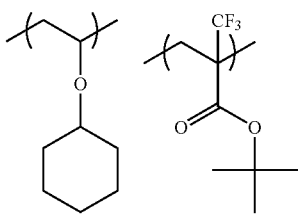
(HR-38) 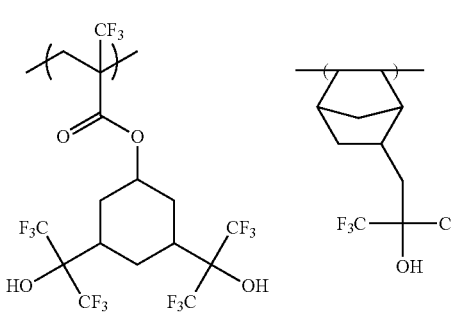

(HR-39) 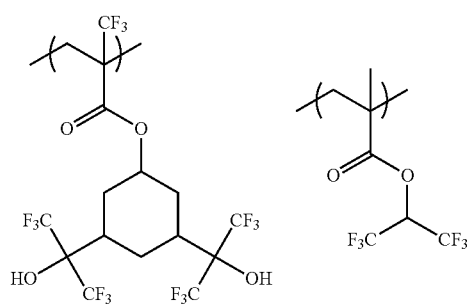
(HR-40) 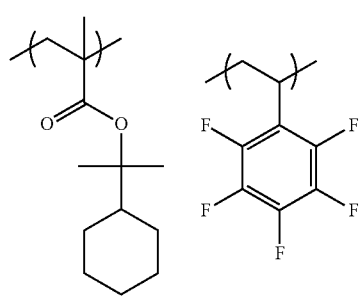
(HR-41) 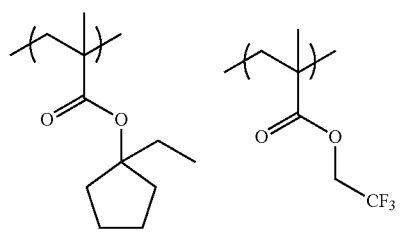
(HR-42) 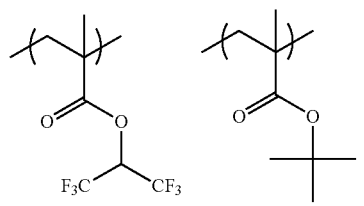
(HR-43) 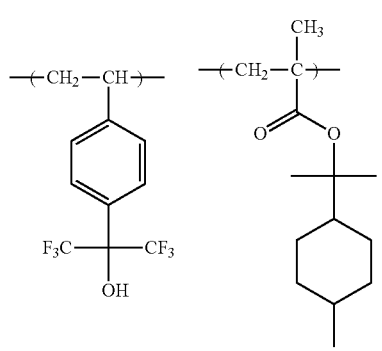
(HR-44) 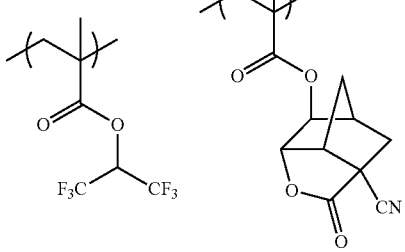
(HR-45) 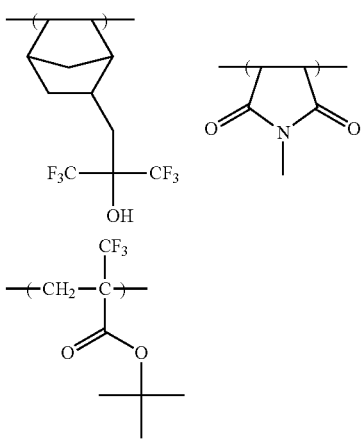
(HR-46) 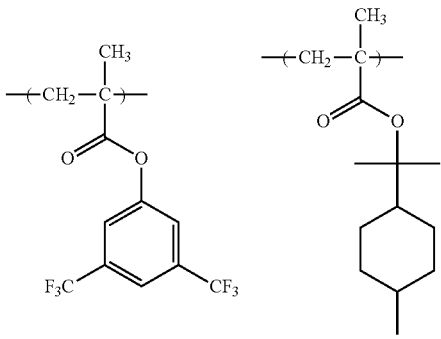
(HR-47) 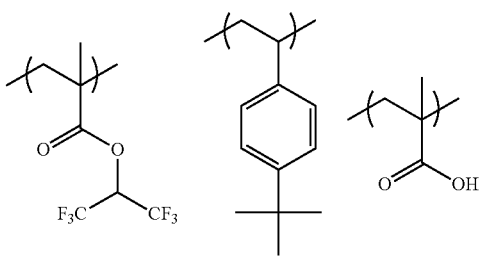
(HR-48) 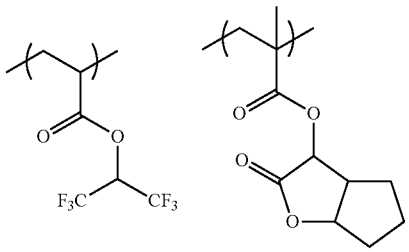

(HR-49)
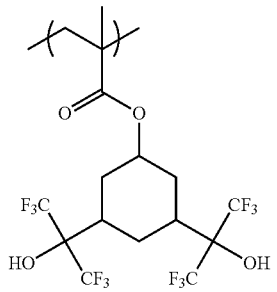
(HR-50)
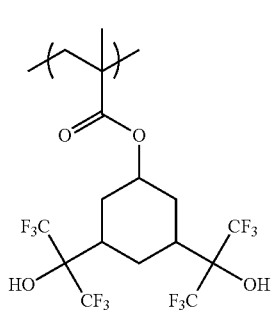
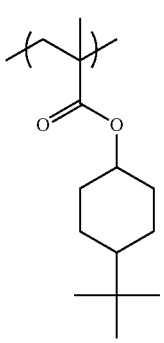
(HR-51)
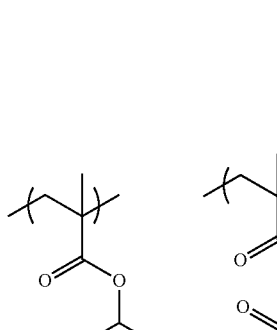
(HR-52)
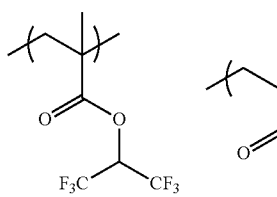
(HR-53)
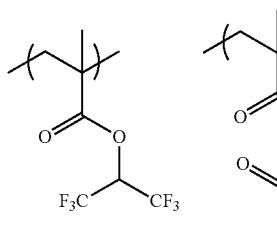
(HR-54)
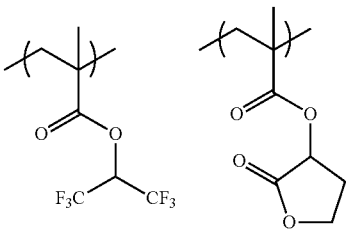
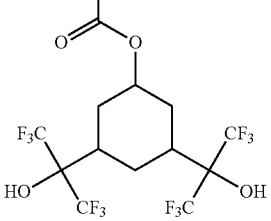
(HR-55)
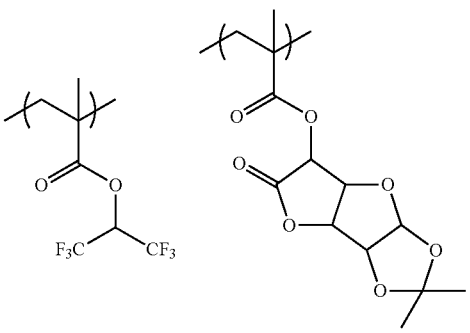
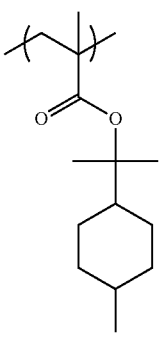
(HR-56)
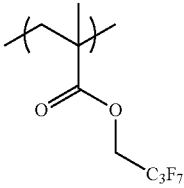
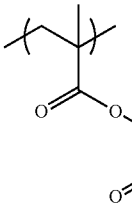

(HR-57)
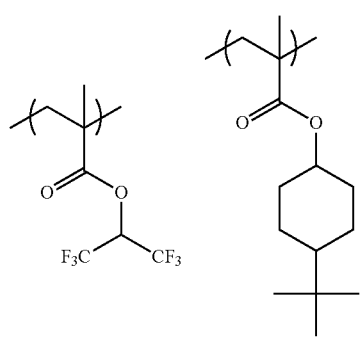
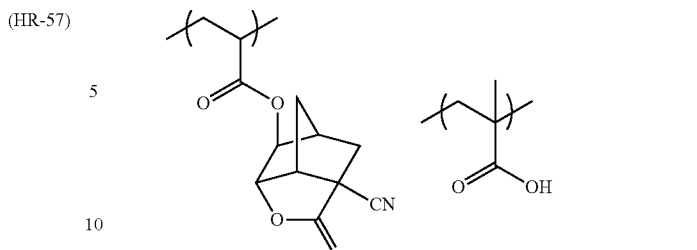
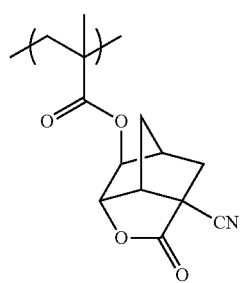
(HR-61)
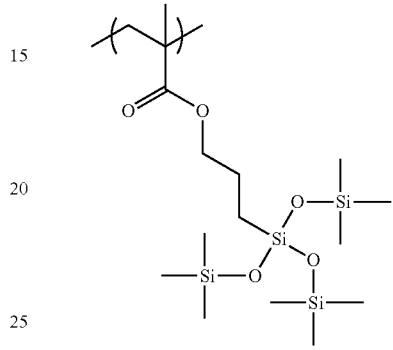
(HR-58)
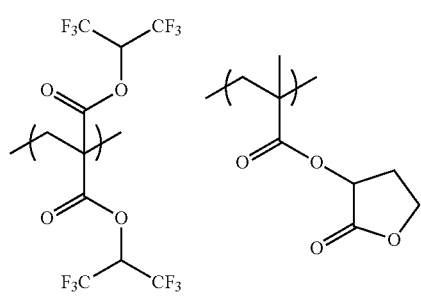
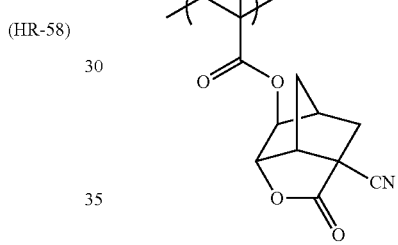
(HR-59)
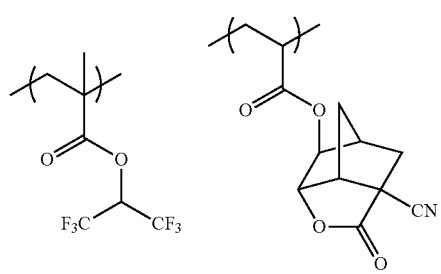
(HR-62)
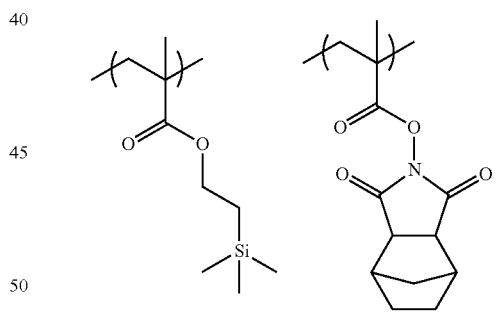
(HR-60)
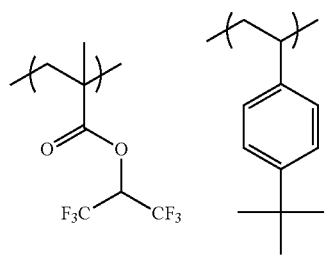
(HR-63)
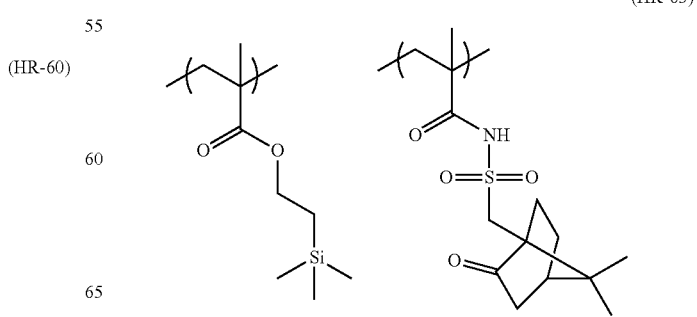

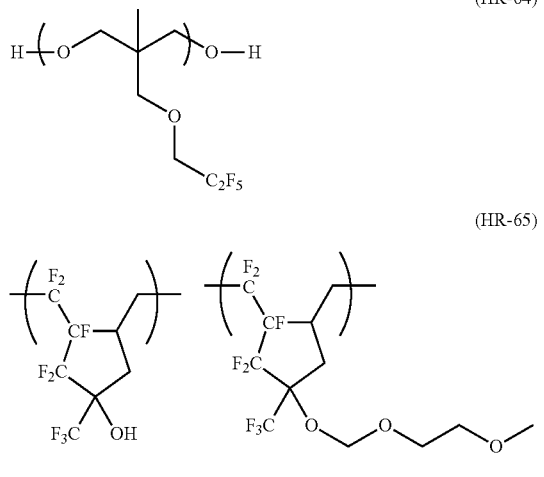
(HR-64)
(HR-65)
(HR-66)
(HR-67)
(HR-68)
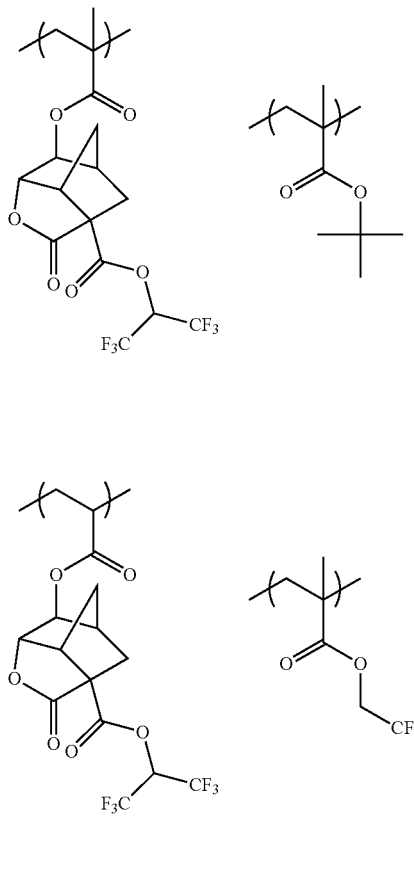
(HR-69)
(HR-70)
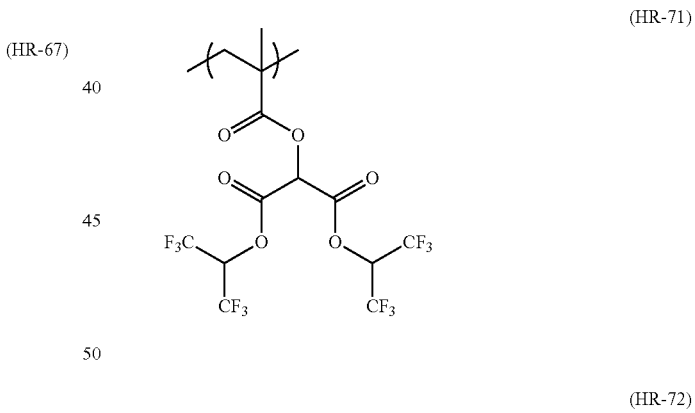
(HR-71)
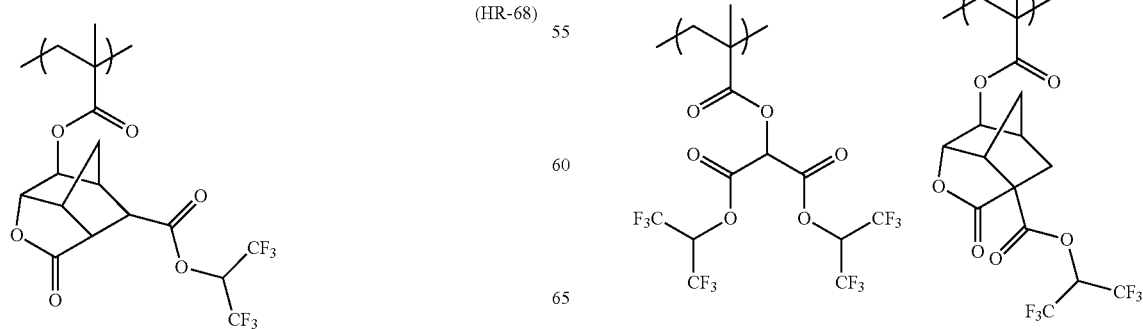
(HR-72)

(HR-73)
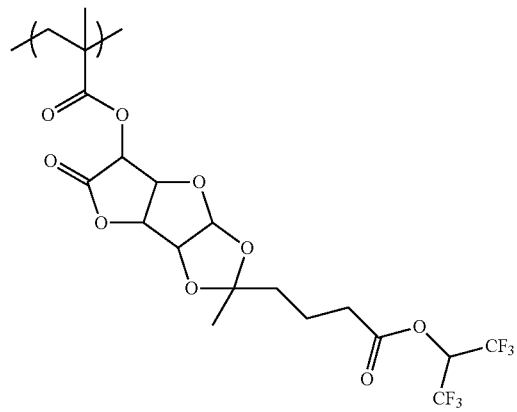
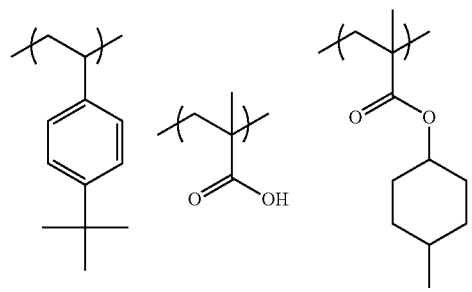
(HR-74)
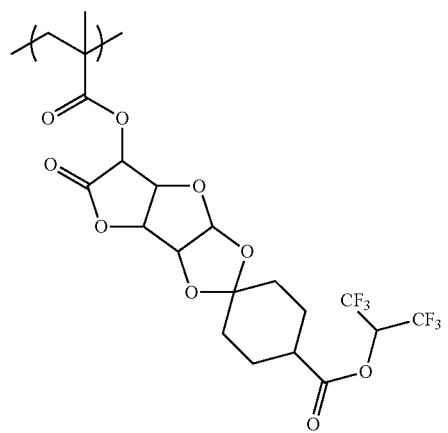
(HR-75)
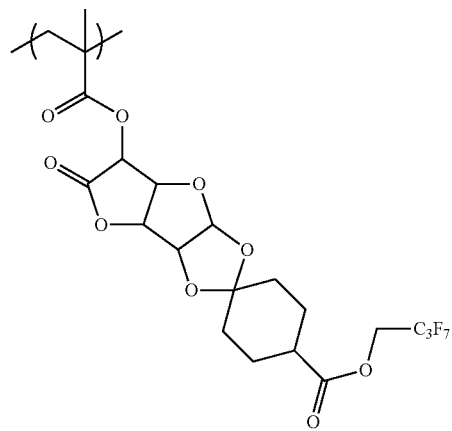
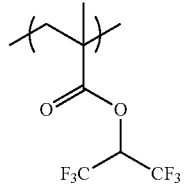
(HR-76)
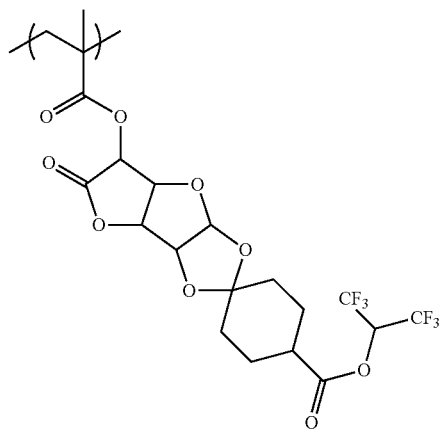
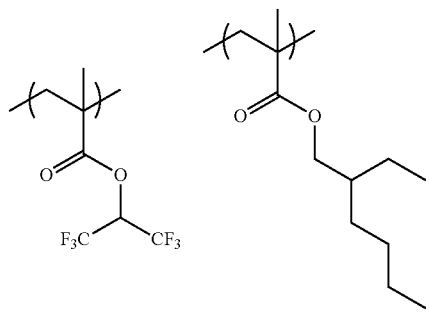
(HR-77)
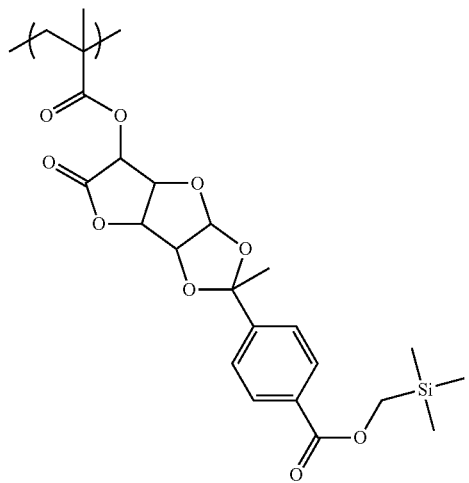

-continued
(HR-78)
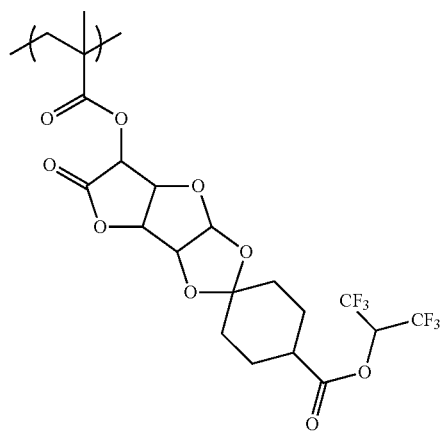
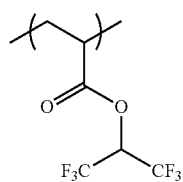
(HR-79)
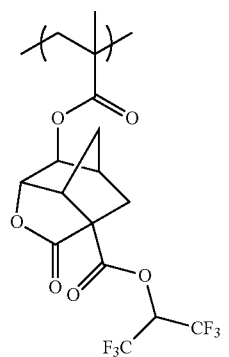
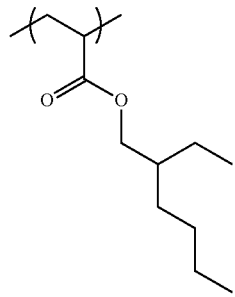
(HR-80)
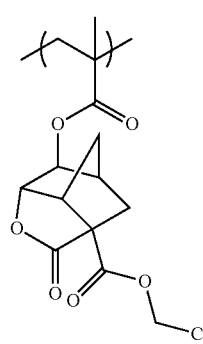
-continued
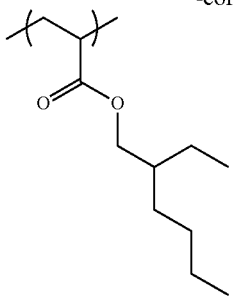
(HR-81)
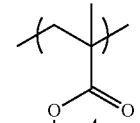
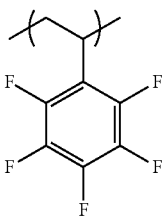
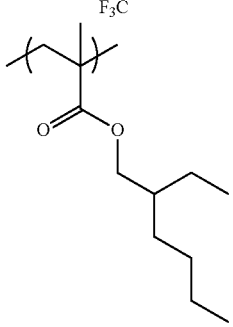
(HR-82)
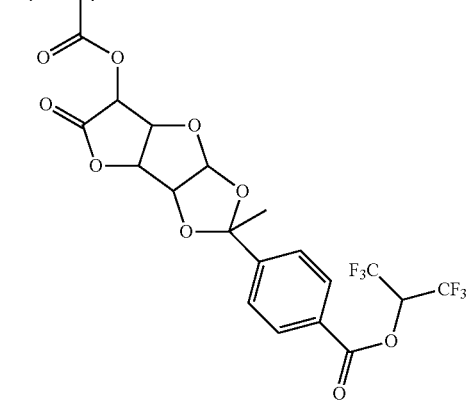
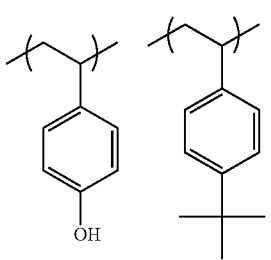

(HR-83)
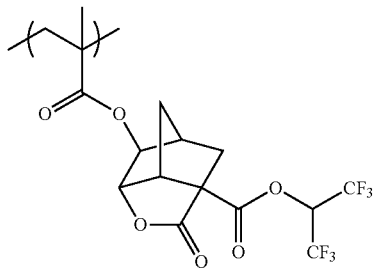
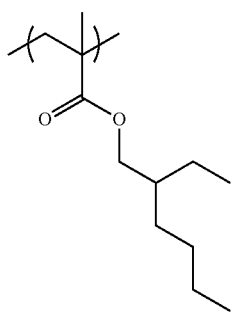
(HR-84)
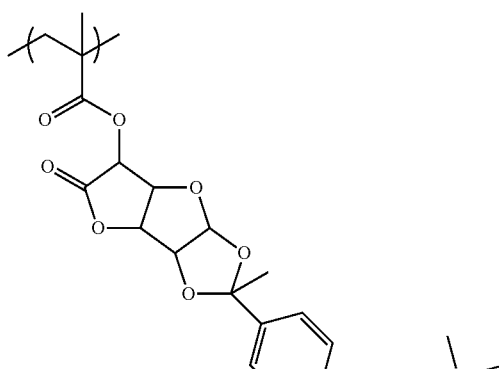
(HR-85)
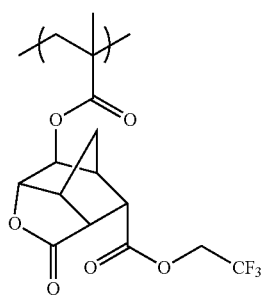
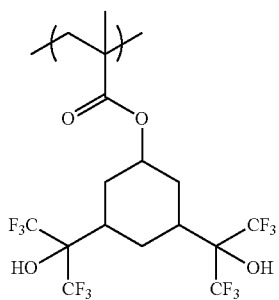
(HR-86)
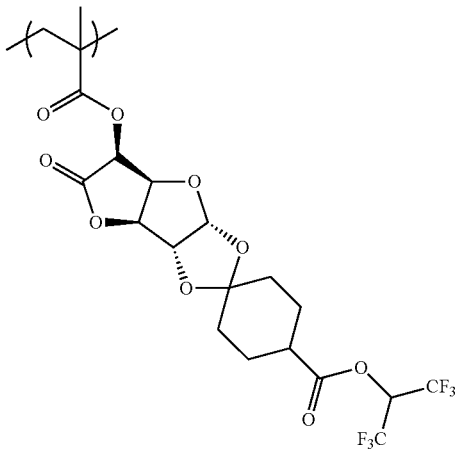
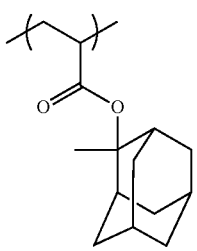
(HR-87)
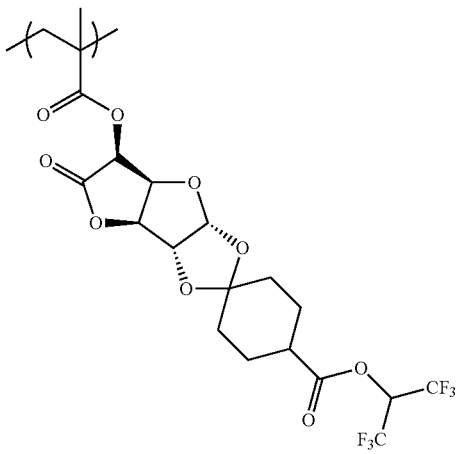
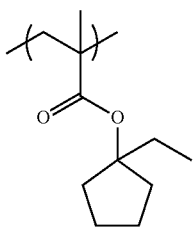

203
-continued
(HR-88)
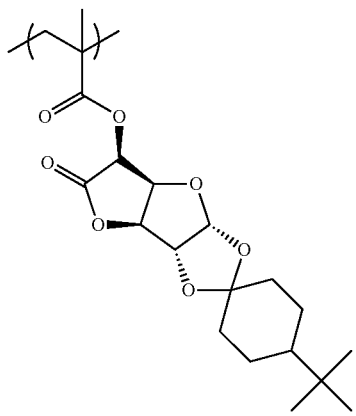
(HR-89)
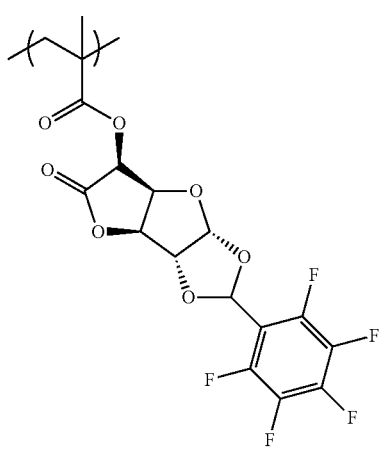
(HR-90)
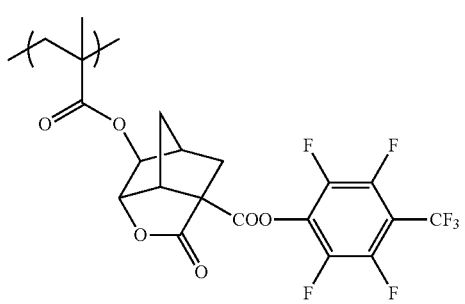
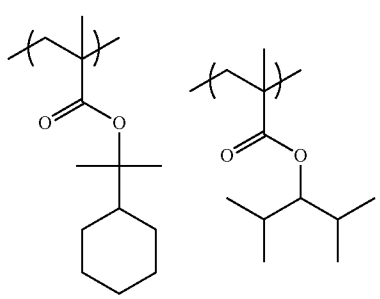
204
-continued
A-1
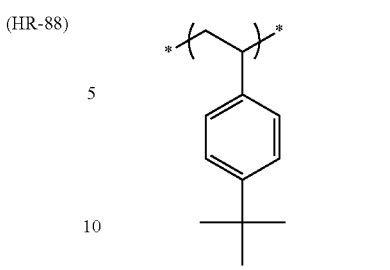
A-2
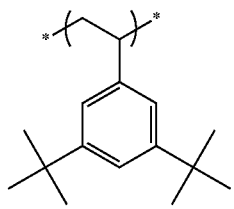
A-3
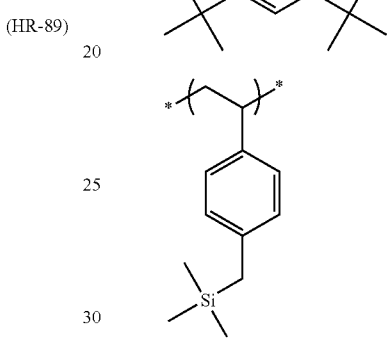
A-4
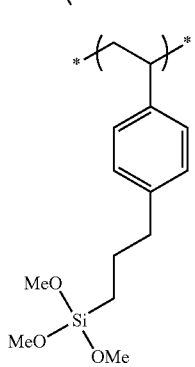
A-5
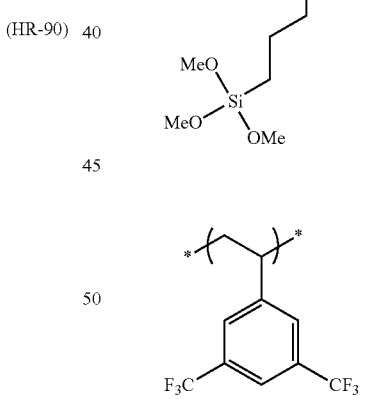
A-6
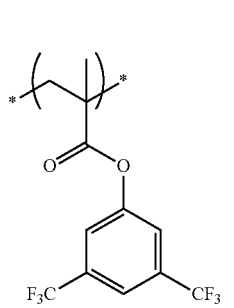

A-7
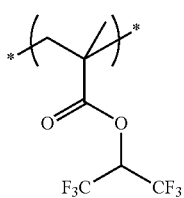
A-8
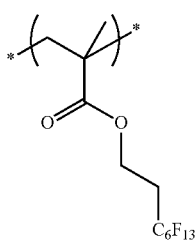
A-9
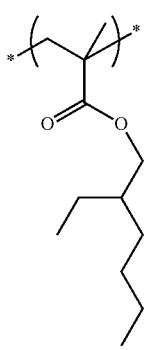
A-10
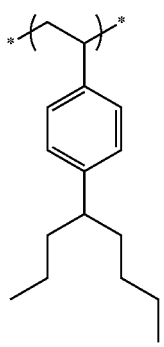 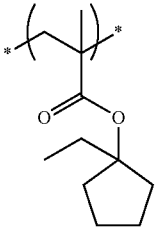
A-11
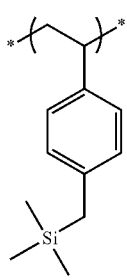 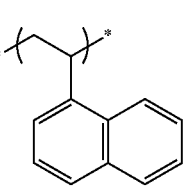
A-12
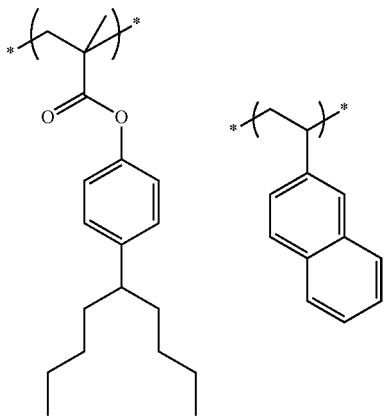
A-13
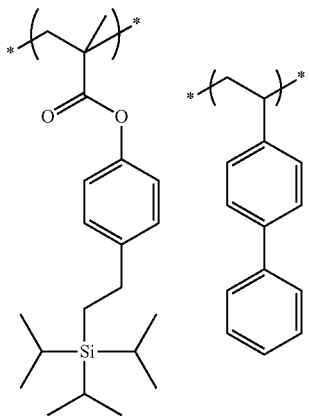
A-14
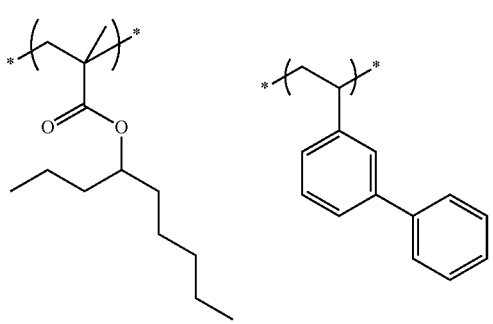
A-15
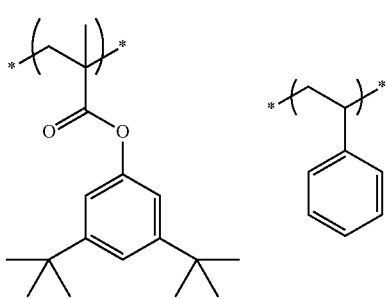

A-16
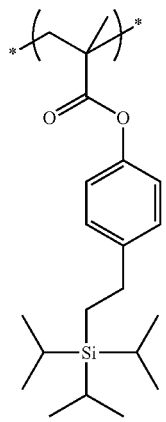
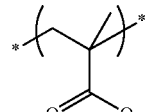
A-17
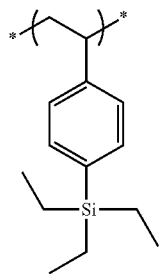
A-18
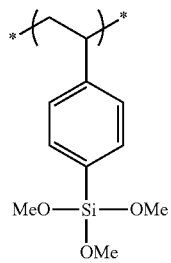
A-19
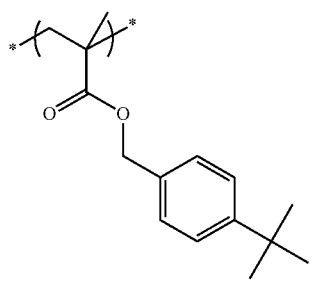
A-20
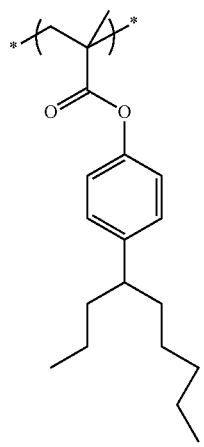
A-21
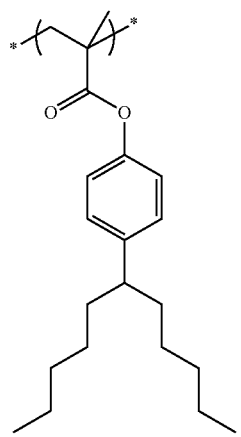
TABLE 1
| Resin | Composition | Mw | Mw/Mn |
|---|---|---|---|
| HR-1 | 50/50 | 4900 | 1.4 |
| HR-2 | 50/50 | 5100 | 1.6 |
| HR-3 | 50/50 | 4800 | 1.5 |
| HR-4 | 50/50 | 5300 | 1.6 |
| HR-5 | 50/50 | 4500 | 1.4 |
| HR-6 | 100 | 5500 | 1.6 |
| HR-7 | 50/50 | 5800 | 1.9 |
| HR-8 | 50/50 | 4200 | 1.3 |
| HR-9 | 50/50 | 5500 | 1.8 |
| HR-10 | 40/60 | 7500 | 1.6 |
| HR-11 | 70/30 | 6600 | 1.8 |
| HR-12 | 40/60 | 3900 | 1.3 |
| HR-13 | 50/50 | 9500 | 1.8 |
| HR-14 | 50/50 | 5300 | 1.6 |
| HR-15 | 100 | 6200 | 1.2 |
| HR-16 | 100 | 5600 | 1.6 |
| HR-17 | 100 | 4400 | 1.3 |
| HR-18 | 50/50 | 4300 | 1.3 |
| HR-19 | 50/50 | 6500 | 1.6 |
| HR-20 | 30/70 | 6500 | 1.5 |
| HR-21 | 50/50 | 6000 | 1.6 |
| HR-22 | 50/50 | 3000 | 1.2 |
| HR-23 | 50/50 | 5000 | 1.5 |
| HR-24 | 50/50 | 4500 | 1.4 |
| HR-25 | 30/70 | 5000 | 1.4 |
| HR-26 | 50/50 | 5500 | 1.6 |
| HR-27 | 50/50 | 3500 | 1.3 |
| HR-28 | 50/50 | 6200 | 1.4 |
| HR-29 | 50/50 | 6500 | 1.6 |
| HR-30 | 50/50 | 6500 | 1.6 |
| HR-31 | 50/50 | 4500 | 1.4 |

TABLE 1-continued

| Resin | Composition | Mw | Mw/Mn |
|---|---|---|---|
| HR-32 | 30/70 | 5000 | 1.6 |
| HR-33 | 30/30/40 | 6500 | 1.8 |
| HR-34 | 50/50 | 4000 | 1.3 |
| HR-35 | 50/50 | 6500 | 1.7 |
| HR-36 | 50/50 | 6000 | 1.5 |
| HR-37 | 50/50 | 5000 | 1.6 |
| HR-38 | 50/50 | 4000 | 1.4 |
| HR-39 | 20/80 | 6000 | 1.4 |
| HR-40 | 50/50 | 7000 | 1.4 |
| HR-41 | 50/50 | 6500 | 1.6 |
| HR-42 | 50/50 | 5200 | 1.6 |
| HR-43 | 50/50 | 6000 | 1.4 |
| HR-44 | 70/30 | 5500 | 1.6 |
| HR-45 | 50/20/30 | 4200 | 1.4 |
| HR-46 | 30/70 | 7500 | 1.6 |
| HR-47 | 40/58/2 | 4300 | 1.4 |
| HR-48 | 50/50 | 6800 | 1.6 |
| HR-49 | 100 | 6500 | 1.5 |
| HR-50 | 50/50 | 6600 | 1.6 |
| HR-51 | 30/20/50 | 6800 | 1.7 |
| HR-52 | 95/5 | 5900 | 1.6 |
| HR-53 | 40/30/30 | 4500 | 1.3 |
| HR-54 | 50/30/20 | 6500 | 1.8 |
| HR-55 | 30/40/30 | 7000 | 1.5 |
| HR-56 | 60/40 | 5500 | 1.7 |
| HR-57 | 40/40/20 | 4000 | 1.3 |
| HR-58 | 60/40 | 3800 | 1.4 |
| HR-59 | 80/20 | 7400 | 1.6 |
| HR-60 | 40/40/15/5 | 4800 | 1.5 |
| HR-61 | 60/40 | 5600 | 1.5 |
| HR-62 | 50/50 | 5900 | 2.1 |
| HR-63 | 80/20 | 7000 | 1.7 |
| HR-64 | 100 | 5500 | 1.8 |
| HR-65 | 50/50 | 9500 | 1.9 |

TABLE 2

| Resin | Composition | Mw | Mw/Mn |
|---|---|---|---|
| HR-66 | 100 | 6000 | 1.5 |
| HR-67 | 100 | 6000 | 1.4 |
| HR-68 | 100 | 9000 | 1.5 |
| HR-69 | 60/40 | 8000 | 1.3 |
| HR-70 | 80/20 | 5000 | 1.4 |
| HR-71 | 100 | 9500 | 1.5 |
| HR-72 | 40/60 | 8000 | 1.4 |
| HR-73 | 55/30/5/10 | 8000 | 1.3 |
| HR-74 | 100 | 13000 | 1.4 |
| HR-75 | 70/30 | 8000 | 1.3 |
| HR-76 | 50/40/10 | 9500 | 1.5 |
| HR-77 | 100 | 9000 | 1.6 |
| HR-78 | 80/20 | 3500 | 1.4 |
| HR-79 | 90/8/2 | 13000 | 1.5 |
| HR-80 | 85/10/5 | 5000 | 1.5 |
| HR-81 | 80/18/2 | 6000 | 1.5 |
| HR-82 | 50/20/30 | 5000 | 1.3 |
| HR-83 | 90/10 | 8000 | 1.4 |
| HR-84 | 100 | 9000 | 1.6 |
| HR-85 | 80/20 | 15000 | 1.6 |
| HR-86 | 70/30 | 4000 | 1.42 |
| HR-87 | 60/40 | 8000 | 1.32 |
| HR-88 | 100 | 3800 | 1.29 |
| HR-89 | 100 | 6300 | 1.35 |
| HR-90 | 50/40/10 | 8500 | 1.51 |

TABLE 3

| Resin | Compositional Ratio | Mass Weight Average Molecular Weight (Mw) | Polydispersity (Mw/Mn) |
|---|---|---|---|
| A-1 | 100 | 11000 | 1.40 |
| A-2 | 100 | 12000 | 1.45 |
| A-3 | 100 | 11500 | 1.43 |
| A-4 | 100 | 11800 | 1.42 |
| A-5 | 100 | 11700 | 1.46 |
| A-6 | 100 | 11600 | 1.51 |
| A-7 | 100 | 11800 | 1.48 |
| A-8 | 100 | 11000 | 1.52 |
| A-9 | 100 | 11200 | 1.41 |
| A-10(1) | 97/3 | 11500 | 1.50 |
| A-10(2) | 95.5/4.5 | 11600 | 1.48 |
| A-10(3) | 94.5/5.5 | 11400 | 1.51 |
| A-10(4) | 93/7 | 11500 | 1.48 |
| A-11 | 70/30 | 11000 | 1.48 |
| A-12 | 70/30 | 11300 | 1.43 |
| A-13 | 80/20 | 11300 | 1.45 |
| A-14 | 80/20 | 11500 | 1.44 |
| A-15 | 80/20 | 11400 | 1.50 |
| A-16 | 80/20 | 11600 | 1.51 |
| A-17 | 100 | 11800 | 1.52 |
| A-18 | 100 | 11000 | 1.48 |
| A-19 | 100 | 11200 | 1.51 |
| A-20 | 100 | 11500 | 1.43 |
| A-21 | 100 | 11600 | 1.42 |

In the case where the hydrophobic resin contains a fluorine atom, the fluorine atom content is preferably from 5 to 80 mass %, more preferably from 10 to 80 mass %, based on the weight average molecular weight of the resin (HR). Also, the content of the fluorine atom-containing repeating unit is preferably from 10 to 100 mol %, more preferably from 30 to 100 mol %, based on all repeating units in the resin (HR).

In the case where the hydrophobic resin (HR) contains a silicon atom, the silicon atom content is preferably from 2 to 50 mass %, more preferably from 2 to 30 mass %, based on the molecular weight of the resin (HR). Also, the content of the silicon atom-containing repeating unit is preferably from 10 to 90 mol %, more preferably from 20 to 80 mol %, based on all repeating units in the resin (HR).

The weight average molecular weight of the resin (HR) is, in terms of standard polystyrene, preferably from 1,000 to 100,000, more preferably from 1,000 to 50,000, still more preferably from 2,000 to 15,000.

One kind of a hydrophobic resin may be used alone, or two or more kinds of hydrophobic resins may be used in combination. The content of the resin (HR) in the composition may be appropriately adjusted so that the receding contact angle of the composition film can fall in the range above, but the content is preferably from 0.01 to 10 mass %, more preferably from 0.1 to 9 mass %, still more preferably from 0.5 to 8 mass %, based on the entire solid content of the composition.

In the resin (HR), similarly to the acid-decomposable resin, it is of course preferred that the amount of impurities such as metal is small, but the content of residual monomers or oligomer components is also preferably from 0 to 10 mass %, more preferably from 0 to 5 mass %, still more preferably from 0 to 1 mass %. By satisfying these conditions, a resist free from extraneous substances in liquid or change with aging in the sensitivity and the like can be obtained. Furthermore, in view of resolution, resist profile, side wall of pattern, roughness and the like, the molecular weight distribution (Mw/Mn, sometimes referred to as "polydispersity") is preferably from 1 to 3, more preferably from 1 to 2, still more preferably from 1 to 1.8, and most preferably from 1 to 1.5.

As the resin (HR), various commercially available products may be used, or the resin may be synthesized by a conventional method (for example, radical polymerization).

Examples of the general synthesis method include a batch polymerization method of dissolving monomer species and an initiator in a solvent and heating the solution, thereby effecting the polymerization, and a dropping polymerization method of adding dropwise a solution containing monomer species and an initiator to a heated solvent over 1 to 10 hours. A dropping polymerization method is preferred. Examples of the reaction solvent include tetrahydrofuran, 1,4-dioxane, ethers such as diisopropyl ether, ketones such as methyl ethyl ketone and methyl isobutyl ketone, an ester solvent such as ethyl acetate, an amide solvent such as dimethylformamide and dimethylacetamide, and the above-described solvent capable of dissolving the composition of the present invention, such as propylene glycol monomethyl ether acetate (PGMEA), propylene glycol monomethyl ether (PGME) and cyclohexanone. The polymerization is more preferably performed using the same solvent as the solvent used in the resist composition of the present invention. By the use of this solvent, generation of particles during storage can be suppressed.

The polymerization reaction is preferably performed in an inert gas atmosphere such as nitrogen and argon. As for the polymerization initiator, the polymerization is started using a commercially available radical initiator (e.g., azo-based initiator, peroxide). The radical initiator is preferably an azo-based initiator, and an azo-based initiator having an ester group, a cyano group or a carboxyl group is preferred. Preferred examples of the initiator include azobisisobutyronitrile, azobisdimethylvaleronitrile and dimethyl 2,2'-azobis(2-methylpropionate). The concentration during the reaction is usually from 5 to 50 mass %, preferably from 30 to 50 mass %. The reaction temperature is usually from 10 to 150° C., preferably from 30 to 120° C., more preferably from 60 to 100° C.

After the completion of reaction, the reaction product is allowed to cool to room temperature and purified. In the purification, a conventional method, for example, a liquid-liquid extraction method of applying water washing or combining an appropriate solvent to remove residual monomers or oligomer components, a purification method in a solution state, such as ultrafiltration of removing by extraction only polymers having a molecular weight lower than a specific molecular weight, a reprecipitation method of adding dropwise the resin solution to a poor solvent to solidify the resin in the poor solvent and thereby remove residual monomers or the like, or a purification method in a solid state, such as washing of the resin slurry with a poor solvent after separation by filtration, may be applied. For example, the resin is precipitated as a solid by contacting the reaction solution with a solvent in which the resin is sparingly soluble or insoluble (poor solvent) and which is in a volumetric amount of 10 times or less, preferably from 10 to 5 times, the reaction solution.

The solvent used at the operation of precipitation or reprecipitation from the polymer solution (precipitation or reprecipitation solvent) may be sufficient if it is a poor solvent to the polymer, and the solvent used may be appropriately selected according to the kind of the polymer from, for example, a hydrocarbon, a halogenated hydrocarbon, a nitro compound, an ether, a ketone, an ester, a carbonate, an alcohol, a carboxylic acid, water, and a mixed solvent containing such a solvent. Among these, the precipitation or reprecipitation solvent is preferably a solvent containing at least an alcohol (particularly methanol or the like) or water.

The amount of the precipitation or reprecipitation solvent used may be appropriately selected by taking into account the efficiency, yield and the like, but in general, the amount used is from 100 to 10,000 parts by mass, preferably from 200 to 2,000 parts by mass, more preferably from 300 to 1,000 parts by mass, per 100 parts by mass of the polymer solution.

The temperature at the precipitation or reprecipitation may be appropriately selected by taking into account the efficiency or operability, but the temperature is usually on the order of 0 to 50° C., preferably in the vicinity of room temperature (for example, approximately from 20 to 35° C.). The precipitation or reprecipitation operation may be performed using a commonly employed mixing vessel such as stirring tank, according to a known method such as batch system and continuous system.

The precipitated or reprecipitated polymer is usually subjected to commonly employed solid-liquid separation such as filtration and centrifugation, then dried and used. The filtration is performed using a solvent-resistant filter element preferably under pressure. The drying is performed under atmospheric pressure or reduced pressure (preferably under reduced pressure) at a temperature of approximately from 30 to 100° C., preferably on the order of 30 to 50° C.

Incidentally, after the resin is once precipitated and separated, the resin may be again dissolved in a solvent and then put into contact with a solvent in which the resin is sparingly soluble or insoluble. More specifically, there may be used a method comprising, after the completion of radical polymerization reaction, precipitating a resin by bringing the polymer into contact with a solvent in which the polymer is sparingly soluble or insoluble (step a), separating the resin from the solution (step b), anew dissolving the resin in a solvent to prepare a resin solution A (step c), precipitating a resin solid by bringing the resin solution A into contact with a solvent in which the resin is sparingly soluble or insoluble and which is in a volumetric amount of less than 10 times (preferably a volumetric amount of 5 times or less) the resin solution A (step d), and separating the precipitated resin (step e).

With respect to the film formed from the resist composition according to the present invention, the exposure may be performed by filling a liquid (immersion medium) having a refractive index higher than that of air between the film and the lens at the irradiation with an actinic ray or radiation (immersion exposure). By this exposure, the resolution can be enhanced. The immersion medium used may be any liquid as long as it has a refractive index higher than that of air, but pure water is preferred.

The immersion liquid used in the immersion exposure is described below.

The immersion liquid is preferably a liquid being transparent to light at the exposure wavelength and having as small a temperature coefficient of refractive index as possible so as to minimize the distortion of an optical image projected on the resist film, and water is preferably used in view of easy availability and easy handleability, in addition to the above-described aspects.

Furthermore, a medium having a refractive index of 1.5 or more can be also used from the standpoint that the refractive index can be more enhanced. This medium may be either an aqueous solution or an organic solvent.

In the case of using water as the immersion liquid, for the purpose of decreasing the surface tension of water and increasing the surface activity, an additive (liquid) which does not dissolve the resist film on a wafer and at the same time, gives only a negligible effect on the optical coat at the undersurface of the lens element, may be added in a small ratio. The additive is preferably an aliphatic alcohol having a refractive index nearly equal to that of water, and specific examples thereof include methyl alcohol, ethyl alcohol and isopropyl alcohol. By virtue of adding an alcohol having a refractive index nearly equal to that of water, even when the alcohol component in water is evaporated and its content concentration is changed, the change in the refractive index of the entire liquid can be advantageously made very small. On the other hand, if an impurity greatly differing in the refractive index from water is mixed, this incurs distortion of the optical image projected on the resist film. Therefore, the water used is preferably distilled water. Pure water obtained by further filtering the distilled water through an ion exchange filter or the like may be also used.

The electrical resistance of water is preferably 18.3 MΩcm or more, and TOC (total organic carbon) is preferably 20 ppb or less. Also, the water is preferably subjected to a deaeration treatment.

The lithography performance can be enhanced by elevating the refractive index of the immersion liquid. From such a standpoint, an additive for elevating the refractive index may be added to water, or heavy water ($D_2O$) may be used in place of water.

In order to prevent the film from directly contacting with the immersion liquid, a film (hereinafter, sometimes referred to as a "topcoat") sparingly soluble in the immersion liquid may be provided between the film formed of the composition of the present invention and the immersion liquid. The functions required of the topcoat are suitability for coating as an overlayer of the composition film and sparing solubility in the immersion liquid. The topcoat is preferably unmixable with the composition film and capable of being uniformly coated as an overlayer of the composition film.

Specific examples of the topcoat include a hydrocarbon polymer, an acrylic acid ester polymer, a polymethacrylic acid, a polyacrylic acid, a polyvinyl ether, a silicon-containing polymer and a fluorine-containing polymer. The above-described hydrophobic resin (HR) is suitable also as the topcoat. Furthermore, a commercially available topcoat material may be also appropriately used. If impurities are dissolved out into the immersion liquid from the topcoat, the optical lens is contaminated. In this viewpoint, residual monomer components of the polymer are preferably little contained in the topcoat.

On peeling off the topcoat, a developer may be used or a releasing agent may be separately used. The releasing agent is preferably a solvent hardly permeating the film. From the standpoint that the peeling step can be performed simultaneously with the development step of the film, the topcoat is preferably peelable with an organic solvent-containing developer.

With no difference in the refractive index between the topcoat and the immersion liquid, the resolution is enhanced. In the case of using water as the immersion liquid, the topcoat preferably has a refractive index close to the refractive index of the immersion liquid. From the standpoint of having a refractive index close to that of the immersion liquid, the topcoat preferably contains a fluorine atom. Also, in view of transparency and refractive index, the topcoat is preferably a thin film.

The topcoat is preferably unmixable with the film and further unmixable with the immersion liquid. From this standpoint, when the immersion liquid is water, the solvent used for the topcoat is preferably a medium that is sparingly soluble in the solvent used for the composition of the present invention and insoluble in water. In the case where the immersion liquid is an organic solvent, the topcoat may be either water-soluble or water-insoluble.

The hydrophobic resin may be used also in the case of not performing the immersion exposure. As for the effects brought about here, the hydrophobic resin can be unevenly distributed to the resist film surface and irrespective of exposed area or unexposed area of the resist film, accelerates the dissolution of the resist film in the organic developer, as a result, even in the case of forming a very fine pattern, the hydrophobic resin is expected to fulfill a function of suppressing roughening of pattern surface (particularly in the case of EUV exposure) and generation of a T-top profile, a reverse tapered profile and a bridge part.

[4] (C) Resist Solvent (Coating Solvent)

The solvent which can be used when preparing the composition is not particularly limited as long as it dissolves respective components, but examples thereof include an alkylene glycol monoalkyl ether carboxylate (e.g., propylene glycol monomethyl ether acetate (PGMEA; another name: 1-methoxy-2-acetoxypropane)), an alkylene glycol monoalkyl ether (e.g., propylene glycol monomethyl ether (PGME; 1-methoxy-2-propanol)), an alkyl lactate (e.g., ethyl lactate, methyl lactate), a cyclic lactone (e.g., γ-butyrolactone; preferably having a carbon number of 4 to 10), a chain or cyclic ketone (e.g., 2-heptanone, cyclohexanone; preferably having a carbon number of 4 to 10), an alkylene carbonate (e.g., ethylene carbonate, propylene carbonate), an alkyl carboxylate (preferably an alkyl acetate such as butyl acetate), and an alkyl alkoxyacetate (e.g., ethyl ethoxypropionate). Other examples of the solvent which can be used include solvents described in paragraph [0244] et seq. of U.S. Patent Application Publication No. 2008/0248425A1.

Among the solvents above, an alkylene glycol monoalkyl ether carboxylate and an alkylene glycol monoalkyl ether are preferred.

One of these solvents may be used alone, or two or more thereof may be mixed and used. In the case of mixing two or more solvents, it is preferred to mix a solvent having a hydroxyl group and a solvent having no hydroxyl group. The mass ratio between the solvent having a hydroxyl group and the solvent having no hydroxyl group is from 1/99 to 99/1, preferably from 10/90 to 90/10, more preferably from 20/80 to 60/40.

The solvent having a hydroxy group is preferably an alkylene glycol monoalkyl ether, and the solvent having no hydroxyl group is preferably an alkylene glycol monoalkyl ether carboxylate.

[5] Basic Compound

The electron beam-sensitive or extreme ultraviolet-sensitive resin composition of the present invention preferably contains a basic compound.

The basic compound is preferably a nitrogen-containing organic basic compound.

The compound which can be used is not particularly limited but, for example, compounds classified into the following (1) to (4) are preferably used.

(1) Compound Represented by the Following Formula (BS-1):

(BS-1)

In formula (BS-1), each $R_{bs1}$ independently represents any one of a hydrogen atom, an alkyl group (linear or branched), a cycloalkyl group (monocyclic or polycyclic), an aryl group and an aralkyl group. However, it does not occur that three $R_{bs1}$s all are a hydrogen atom.

The carbon number of the alkyl group as $R_{bs1}$ is not particularly limited but is usually from 1 to 20, preferably from 1 to 12.

The carbon number of the cycloalkyl group as $R_{bs1}$ is not particularly limited but is usually from 3 to 20, preferably from 5 to 15.

The carbon number of the aryl group as $R_{bs1}$ is not particularly limited but is usually from 6 to 20, preferably from 6 to 10. Specific examples thereof include a phenyl group and a naphthyl group.

The carbon number of the aralkyl group as $R_{bs1}$ is not particularly limited but is usually from 7 to 20, preferably from 7 to 11. Specific examples thereof include a benzyl group.

In the alkyl group, cycloalkyl group, aryl group or aralkyl group as $R_{bs1}$, a hydrogen atom may be substituted for by a substituent. Examples of the substituent include an alkyl group, a cycloalkyl group, an aryl group, an aralkyl group, a hydroxyl group, a carboxyl group, an alkoxy group, an aryloxy group, an alkylcarbonyloxy group, and an alkyloxycarbonyl group.

The compound represented by formula (BS-1) is preferably a compound where only one of three $R_{bs1}$s is a hydrogen atom or all $R_{bs1}$s are not a hydrogen atom.

Specific examples of the compound represented by formula (BS-1) include tri-n-butylamine, tri-n-pentylamine, tri-n-octylamine, tri-n-decylamine, triisodecylamine, dicyclohexylmethylamine, tetradecylamine, pentadecylamine, hexadecyl amine, octadecylamine, didecylamine, methyloctadecylamine, dimethylundecylamine, N,N-dimethyldodecylamine, methyldioctadecylamine, N,N-dibutylaniline, and N,N-dihexylaniline.

Also, one preferred embodiment is a compound where in formula (BS-1), at least one $R_{bs1}$ is an alkyl group substituted with a hydroxyl group. Specific examples of the compound include triethanolamine and N,N-dihydroxyethylaniline.

The alkyl group as $R_{bs1}$ may have an oxygen atom in the alkyl chain to form an alkyleneoxy chain. The alkyleneoxy chain is preferably —CH$_2$CH$_2$O—. Specific examples thereof include tris(methoxyethoxyethyl)amine and compounds exemplified in column 3, line 60 et seq. of U.S. Pat. No. 6,040,112.

(2) Compound Having a Nitrogen-Containing Heterocyclic Structure

The heterocyclic structure may or may not have aromaticity. Also, the heterocyclic structure may contain a plurality of nitrogen atoms and may further contain a heteroatom other than nitrogen. Specific examples of the compound include a compound having an imidazole structure (e.g., 2-phenylbenzimidazole, 2,4,5-triphenylimidazole), a compound having a piperidine structure (e.g., N-hydroxyethylpiperidine, bis(1,2,2,6,6-pentamethyl-4-piperidyl)sebacate), a compound having a pyridine structure (e.g., 4-dimethylaminopyridine), and a compound having an antipyrine structure (e.g., antipyrine, hydroxyantipyrine).

A compound having two or more ring structures is also suitably used. Specific examples thereof include 1,5-diazabicyclo[4.3.0]non-5-ene and 1,8-diazabicyclo[5.4.0]-undec-7-ene.

(3) Amine Compound Having a Phenoxy Group:

The amine compound having a phenoxy group has a phenoxy group at the terminal opposite the nitrogen atom of the alkyl group in an amine compound. The phenoxy group may have a substituent such as alkyl group, alkoxy group, halogen atom, cyano group, nitro group, carboxyl group, carboxylic acid ester group, sulfonic acid ester group, aryl group, aralkyl group, acyloxy group and aryloxy group.

A compound having at least one alkyleneoxy chain between the phenoxy group and the nitrogen atom is preferred. The number of alkyleneoxy chains per molecule is preferably from 3 to 9, more preferably from 4 to 6. Among alkyleneoxy chains, —CH$_2$CH$_2$O— is preferred.

Specific examples of the compound include 2-[2-{2-(2,2-dimethoxy-phenoxyethoxy)ethyl}-bis-(2-methoxyethyl)]-amine and Compounds (C1-1) to (C3-3) illustrated in paragraph [0066] of U.S. Patent Application Publication No. 2007/0224539A1.

(4) Ammonium Salt:

An ammonium salt is also appropriately used. The salt is preferably a hydroxide or a carboxylate. More specifically, a tetraalkylammonium hydroxide typified by tetrabutylammonium hydroxide is preferred. In addition, an ammonium salt derived from amines of (1) to (3) above can be used.

Other examples of the basic compound which can be used include compounds described in JP-A-2011-85926, compounds synthesized in Examples of JP-A-2002-363146, and compounds described in paragraph 0108 of JP-A-2007-298569.

The composition of the present invention may contain, as the basic compound, a low molecular compound having a nitrogen atom and having a group capable of leaving by the action of an acid (hereinafter, sometimes referred to as "low molecular compound (D)" or "component (D)").

The group capable of leaving by the action of an acid is not particularly limited but is preferably an acetal group, a carbonate group, a carbamate group, a tertiary ester group, a tertiary hydroxyl group or a hemiaminal ether group, more preferably a carbamate group or a hemiaminal ether group.

The molecular weight of the compound (D) is preferably from 100 to 1,000, more preferably from 100 to 700, still more preferably from 100 to 500.

The compound (D) is preferably an amine derivative having on the nitrogen atom a group capable of leaving by the action of an acid.

The compound (D) may have a protective group-containing carbamate group on the nitrogen atom. The protective group constituting the carbamate group can be represented, for example, by the following formula (d-1):

In formula (d-1), each R' independently represents a hydrogen atom, a linear or branched alkyl group, a cycloalkyl group, an aryl group, an aralkyl group or an alkoxyalkyl group. Each R' may combine with another R' to form a ring.

R' is preferably a linear or branched alkyl group, a cycloalkyl group or an aryl group, more preferably a linear or branched alkyl group or a cycloalkyl group.

Specific structures of this group are illustrated below.

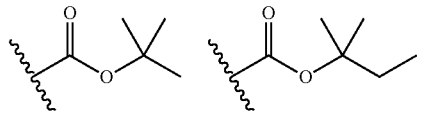

217
-continued
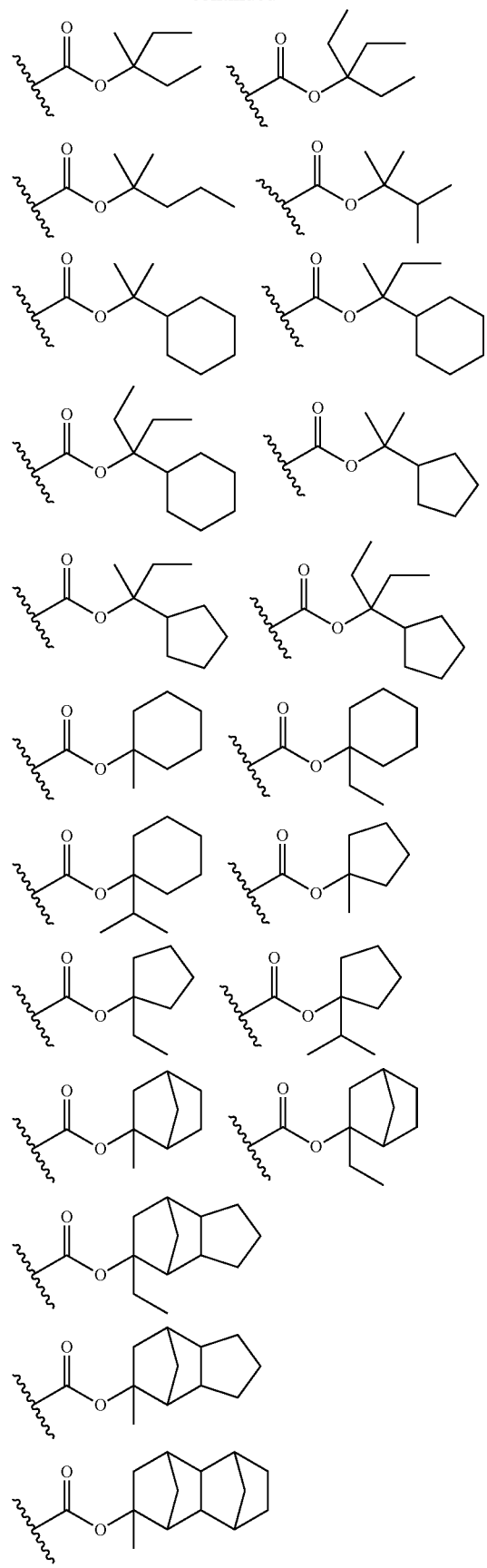
218
-continued
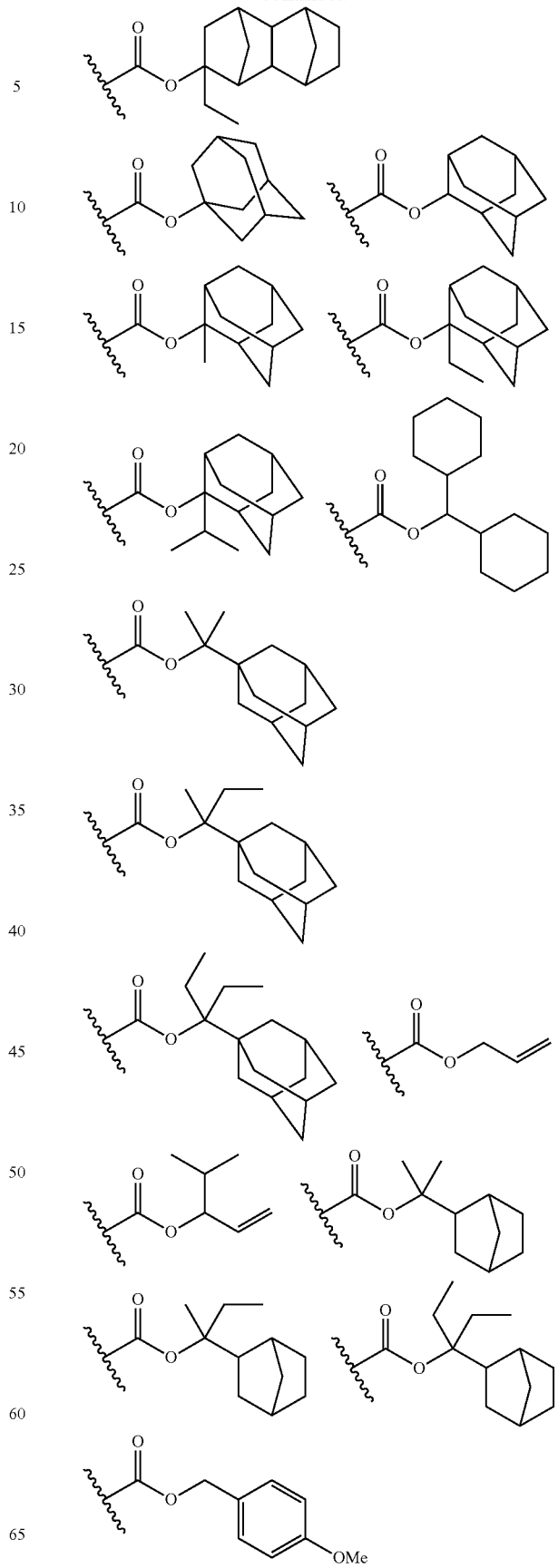

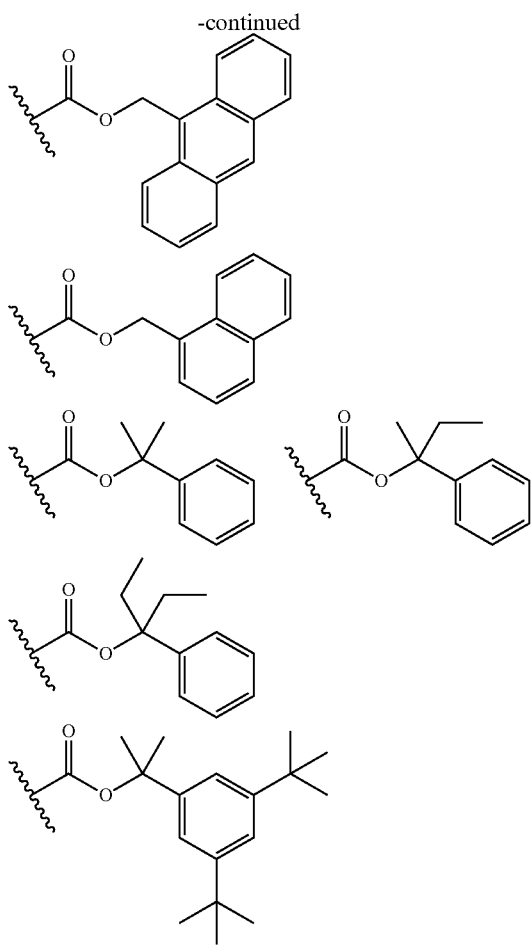

The compound (D) may be also composed by arbitrarily combining various basic compounds described above with the structure represented by formula (d-1).

The compound (D) is more preferably a compound having a structure represented by the following formula (F).

Incidentally, the compound (D) may be a compound corresponding to various basic compounds described above as long as it is a low molecular compound having a group capable of leaving by the action of an acid.

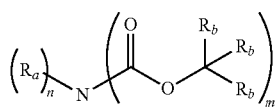

(F)

In formula (F), Ra represents a hydrogen atom, an alkyl group, a cycloalkyl group, an aryl group or an aralkyl group. Also, when n=2, two Ra's may be the same or different, and two Ra's may combine with each other to form a divalent heterocyclic hydrocarbon group (preferably having a carbon number of 20 or less) or a derivative thereof.

Each Rb independently represents a hydrogen atom, an alkyl group, a cycloalkyl group, an aryl group, an aralkyl group or an alkoxyalkyl group, provided that when one or more Rb in —C(Rb)(Rb)(Rb) are a hydrogen atom, at least one of remaining Rb is a cyclopropyl group, a 1-alkoxyalkyl group or an aryl group.

At least two Rb's may combine to form an alicyclic hydrocarbon group, an aromatic hydrocarbon group, a heterocyclic hydrocarbon group or a derivative thereof.

n represents an integer of 0 to 2, m represents an integer of 1 to 3, and n+m=3.

In formula (F), the alkyl group, cycloalkyl group, aryl group and aralkyl group represented by Ra and Rb may be substituted with a functional group such as hydroxyl group, cyano group, amino group, pyrrolidino group, piperidino group, morpholino group and oxo group, an alkoxy group or a halogen atom. The same applies to the alkoxyalkyl group represented by Rb.

Examples of the alkyl group, cycloalkyl group, aryl group and aralkyl group (each of these alkyl group, cycloalkyl group, aryl group and aralkyl group may be substituted with the above-described functional group, an alkoxy group or a halogen atom) of Ra and/or Rb include:

a group derived from a linear or branched alkane such as methane, ethane, propane, butane, pentane, hexane, heptane, octane, nonane, decane, undecane and dodecane, or a group where the group derived from an alkane is substituted with one or more kinds of or one or more groups of cycloalkyl group such as cyclobutyl group, cyclopentyl group and cyclohexyl group;

a group derived from a cycloalkane such as cyclobutane, cyclopentane, cyclohexane, cycloheptane, cyclooctane, norbornane, adamantane and noradamantane, or a group where the group derived from a cycloalkane is substituted with one or more kinds of or one or more groups of linear or branched alkyl group such as methyl group, ethyl group, n-propyl group, i-propyl group, n-butyl group, 2-methylpropyl group, 1-methylpropyl group and tert-butyl group;

a group derived from an aromatic compound such as benzene, naphthalene and anthracene, or a group where the group derived from an aromatic compound is substituted with one or more kinds of or one or more groups of linear or branched alkyl group such as methyl group, ethyl group, n-propyl group, i-propyl group, n-butyl group, 2-methylpropyl group, 1-methylpropyl group and tert-butyl group;

a group derived from a heterocyclic compound such as pyrrolidine, piperidine, morpholine, tetrahydrofuran, tetrahydropyran, indole, indoline, quinoline, perhydroquinoline, indazole and benzimidazole, or a group where the group derived from a heterocyclic compound is substituted with one or more kinds of or one or more groups of linear or branched alkyl group or aromatic compound-derived group; a group where the group derived from a linear or branched alkane or the group derived from a cycloalkane is substituted with one or more kinds of or one or more groups of aromatic compound-derived group such as phenyl group, naphthyl group and anthracenyl group; and a group where the substituent above is substituted with a functional group such as hydroxyl group, cyano group, amino group, pyrrolidino group, piperidino group, morpholino group and oxo group.

Examples of the divalent heterocyclic hydrocarbon group (preferably having a carbon number of 1 to 20) formed by combining Ra's with each other or a derivative thereof include a group derived from a heterocyclic compound such as pyrrolidine, piperidine, morpholine, 1,4,5,6-tetrahydropyrimidine, 1,2,3,4-tetrahydroquinoline, 1,2,3,6-tetrahydropyridine, homopiperazine, 4-azabenzimidazole, benzotriazole, 5-azabenzotriazole, 1H-1,2,3-triazole, 1,4,7-triazacyclononane, tetrazole, 7-azaindole, indazole, benzimidazole, imidazo[1,2-a]pyridine, (1S,4S)-(+)-2,5-diazabicyclo[2.2.1]heptane, 1,5,7-triazabicyclo[4.4.0]dec-5-ene, indole, indoline, 1,2,3,4-tetrahydroquinoxaline, perhydroquinoline and 1,5,9-triazacyclododecane, and a group where the group derived from a heterocyclic compound is substituted with one or more kinds of or one or more groups of linear or branched alkane-derived group, cycloalkane-derived group, aromatic compound-derived group, heterocyclic compound-derived group, and functional group such as hydroxyl group, cyano group, amino group, pyrrolidino group, piperidino group, morpholino group and oxo group.

Specific examples of the compound (D) particularly preferred in the present invention are illustrated below, but the present invention is not limited thereto.

(D-1)
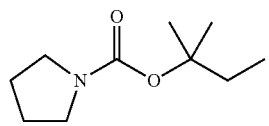

(D-2)
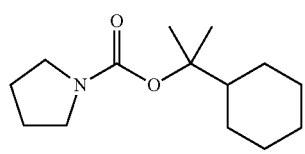

(D-3)
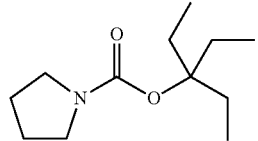

(D-4)
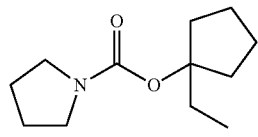

(D-5)
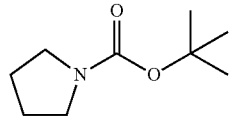

(D-6)
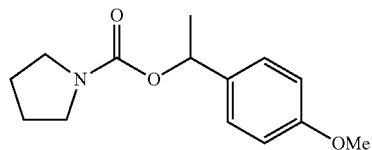

(D-7)
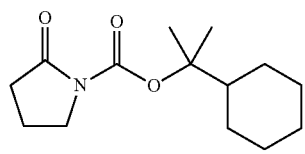

(D-8)
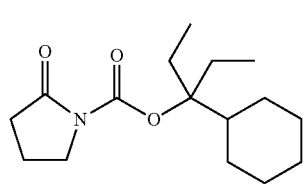

(D-9)
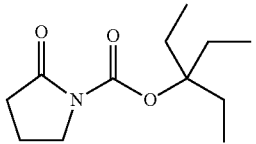

(D-10)
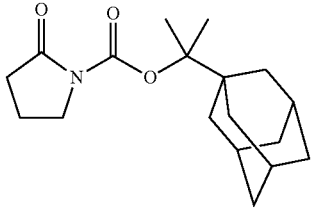

(D-11)
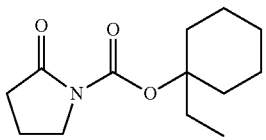

(D-12)
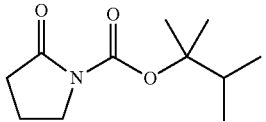

(D-13)
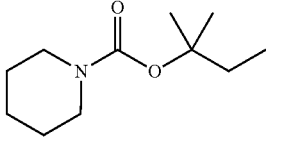

(D-14)
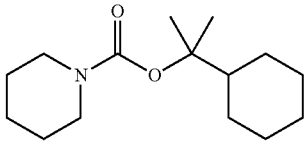

(D-15)
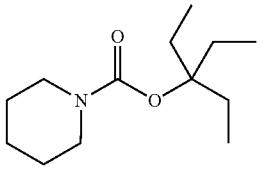

(D-16)
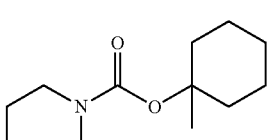

(D-17)
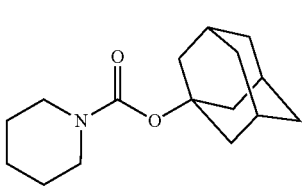

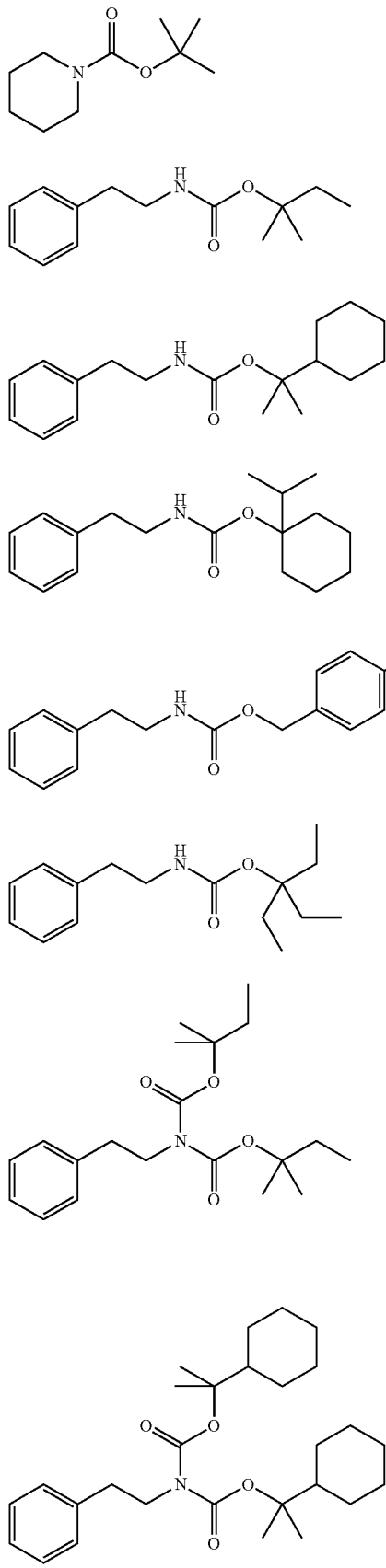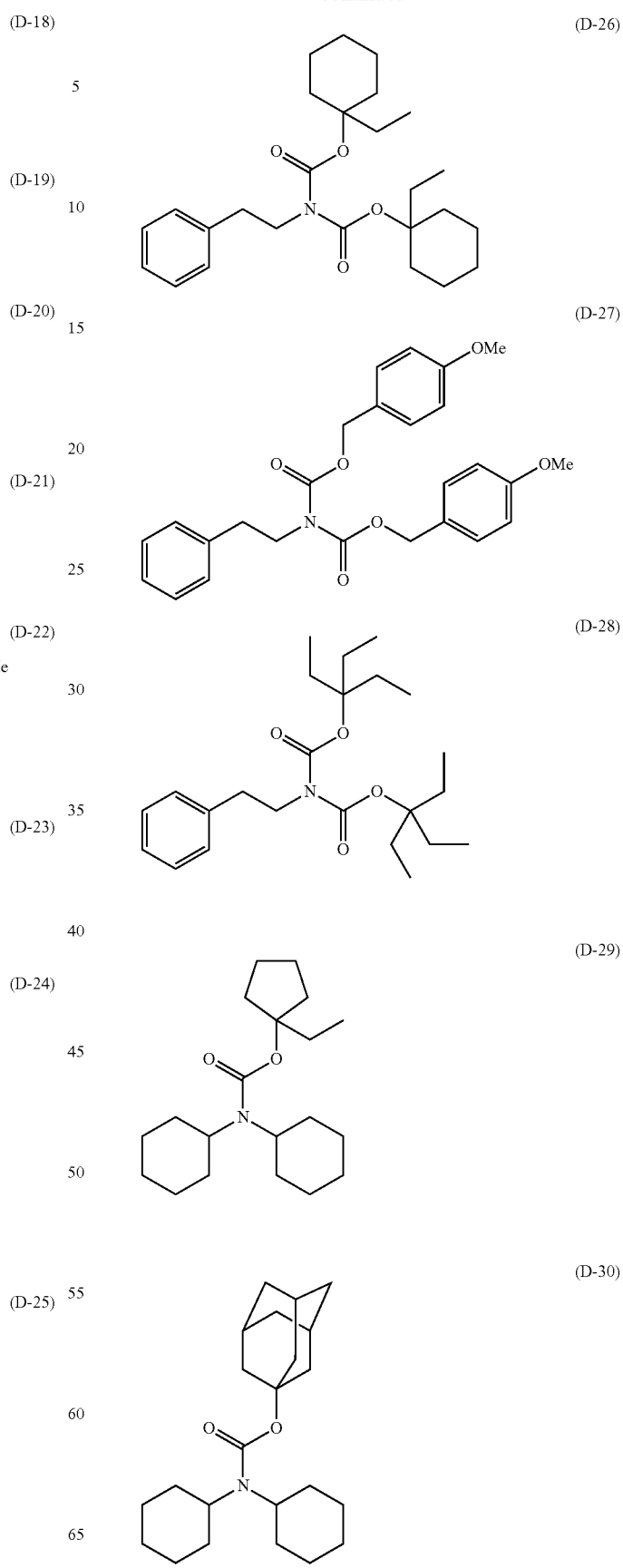

(D-31) 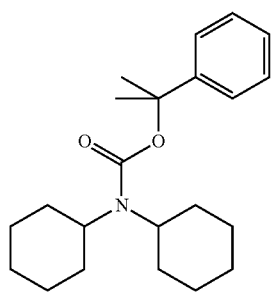
(D-32) 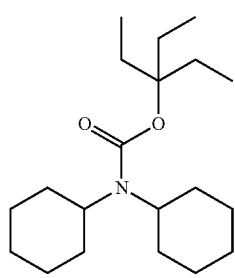
(D-33) 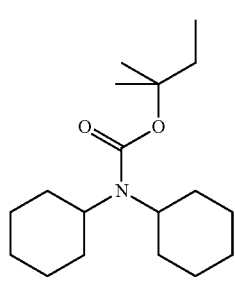
(D-34) 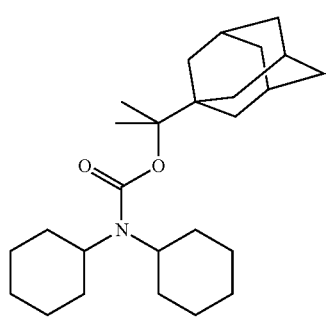
(D-35) 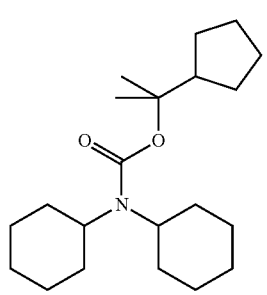
(D-36) 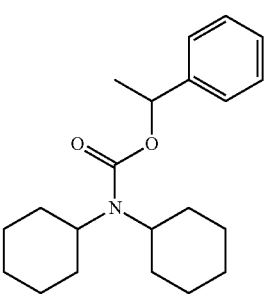
(D-37) 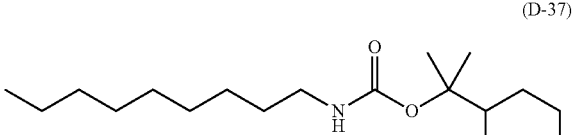
(D-38) 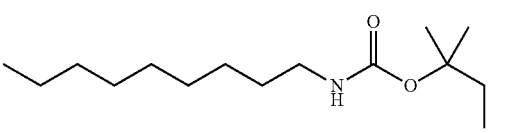
(D-39) 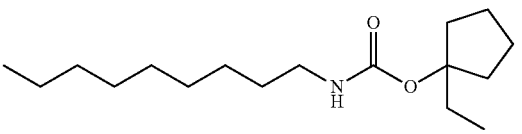
(D-40) 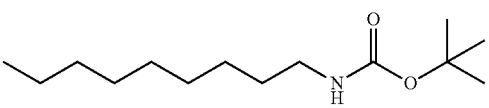
(D-41) 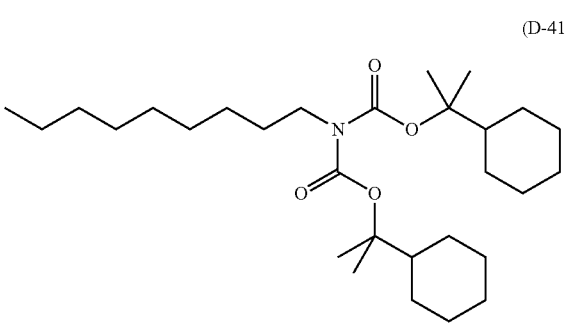
(D-42) 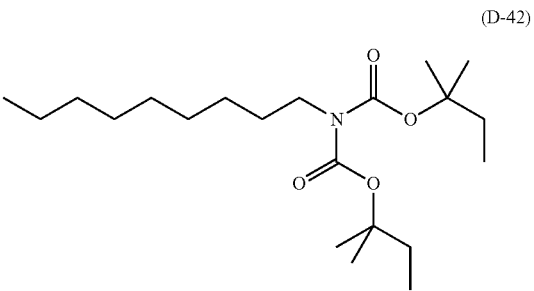

(D-43)
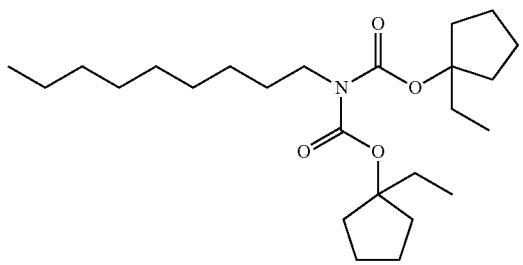

(D-44)
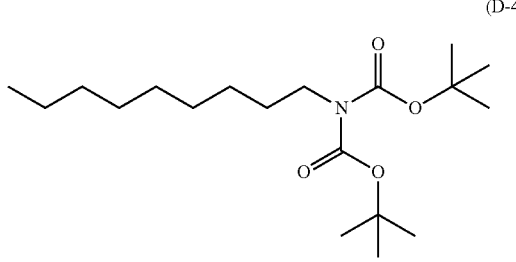

(D-45)
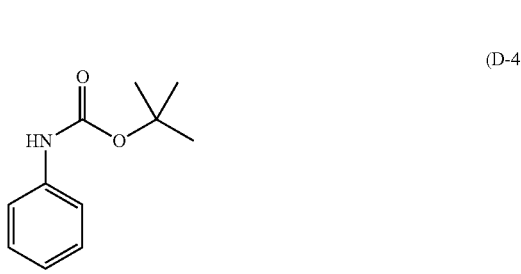

(D-46)
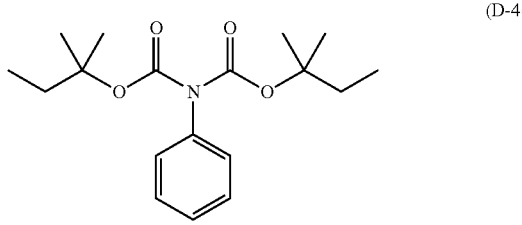

(D-47)
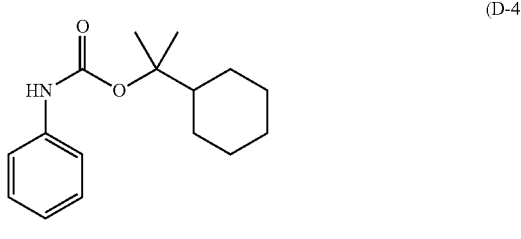

(D-48)
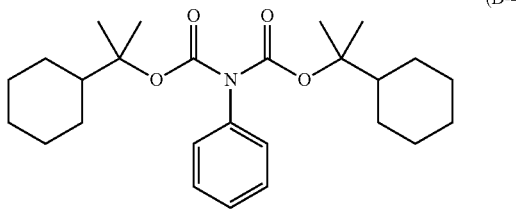

(D-49)
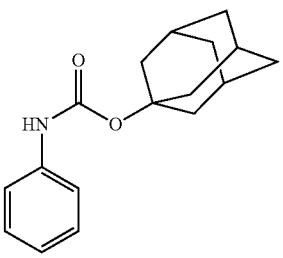

(D-50)
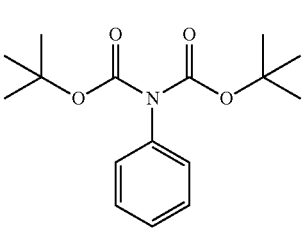

(D-51)
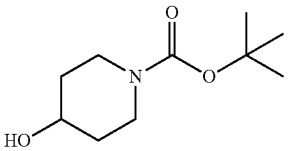

(D-52)
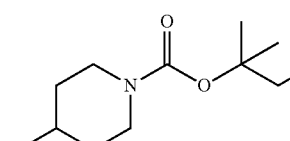

(D-53)
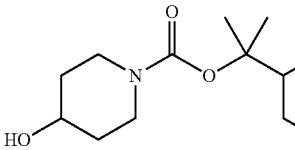

(D-54)
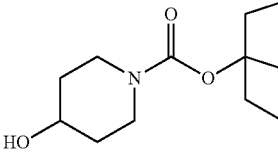

(D-55)
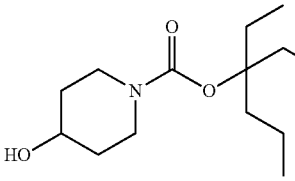

The compound represented by formula (F) can be easily synthesized from a commercially available amine by the method described, for example, in *Protective Groups in Organic Synthesis*, 4th edition. A most general method is a method of causing a dicarbonic acid ester or a haloformic acid ester to act on a commercially available amine to obtain the compound. In the formulae, X represents a halogen atom, and definitions and specific examples of Ra and Rb are the same as those in formula (F).

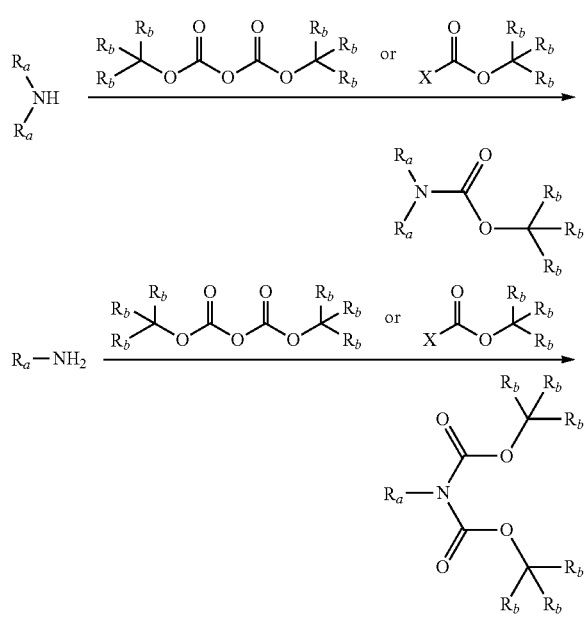

In addition, a photodecomposable basic compound (a compound which initially exhibits basicity because of the action of a basic nitrogen atom as a base but decomposes upon irradiation with an actinic ray or radiation to generate a zwitterionic compound having a basic nitrogen atom and an organic acid moiety and resulting from their neutralization in the molecule, is reduced in or deprived of the basicity; for example, onium salts described in Japanese Patent No. 3,577, 743, JP-A-2001-215689, JP-A-2001-166476 and JP-A-2008-102383), and a photobase generator (for example, compounds described in JP-A-2010-243773) may be also appropriately used.

As for the basic compound (including the compound (D), one compound may be used alone, or two or more kinds of compounds may be used in combination.

The amount of the basic compound used is usually from 0.001 to 10 mass %, preferably from 0.01 to 5 mass %, based on the solid content of the composition.

The molar ratio of acid generator/basic compound is preferably from 2.5 to 300. That is, the molar ratio is preferably 2.5 or more in view of sensitivity and resolution and is preferably 300 or less from the standpoint of suppressing the reduction in resolution due to thickening of the pattern with aging after exposure until heat treatment. The molar ratio is more preferably from 5.0 to 200, still more preferably from 7.0 to 150.

[6] Surfactant

The composition of the present invention may further contain a surfactant. By virtue of containing a surfactant, when an exposure light source having a wavelength of 250 nm or less, particularly 220 nm or less, is used, a pattern with good sensitivity, resolution and adherence as well as fewer development defects can be formed.

As for the surfactant, it is particularly preferred to use a fluorine-containing and/or silicon-containing surfactant.

Examples of the fluorine-containing and/or silicon-containing surfactants include surfactants described in paragraph [0276] of U.S. Patent Application Publication 2008/0248425. There may be also used EFtop EF301 and EF303 (produced by Shin-Akita Kasei K.K.); Florad FC430, 431 and 4430 (produced by Sumitomo 3M Inc.); Megaface F171, F173, F176, F189, F113, F110, F177, F120 and R08 (produced by Dainippon Ink & Chemicals, Inc.); Surflon S-382, SC101, 102, 103, 104, 105 and 106 (produced by Asahi Glass Co., Ltd.); Troysol S-366 (produced by Troy Chemical); GF-300 and GF-150 (produced by Toagosei Chemical Industry Co., Ltd.); Surflon S-393 (produced by Seimi Chemical Co., Ltd.); EFtop EF121, EF122A, EF122B, RF122C, EF125M, EF135M, EF351, EF352, EF801, EF802 and EF601 (produced by JEMCO Inc.); PF636, PF656, PF6320 and PF6520 (produced by OMNOVA); and FTX-204G, 208G, 218G, 230G, 204D, 208D, 212D, 218D and 222D (produced by NEOS Co., Ltd.). Also, polysiloxane polymer KP-341 (produced by Shin-Etsu Chemical Co., Ltd.) may be used as the silicon-containing surfactant.

As the surfactant, other than these known surfactants, a surfactant may be synthesized by using a fluoro-aliphatic compound produced by a telomerization process (also called a telomer process) or an oligomerization process (also called an oligomer process). Specifically, a fluoro-aliphatic group-containing polymer derived from the fluoro-aliphatic compound may be used as the surfactant. The fluoro-aliphatic compound can be synthesized by the method described in JP-A-2002-90991.

The polymer having a fluoro-aliphatic group is preferably a copolymer of a fluoro-aliphatic group-containing monomer with a (poly(oxyalkylene)) acrylate or methacrylate and/or a (poly(oxyalkylene)) methacrylate, and the polymer may have an irregular distribution or may be a block copolymer.

Examples of the poly(oxyalkylene) group include a poly(oxyethylene) group, a poly(oxypropylene) group and a poly(oxybutylene) group. This group may also be a unit having alkylenes differing in the chain length within the same chain, such as block-linked poly(oxyethylene, oxypropylene and oxyethylene) and block-linked poly(oxyethylene and oxypropylene).

Furthermore, the copolymer of a fluoro-aliphatic group-containing monomer and a (poly(oxyalkylene)) acrylate or methacrylate may be also a ternary or higher copolymer obtained by simultaneously copolymerizing two or more different fluoro-aliphatic group-containing monomers or two or more different (poly(oxyalkylene)) acrylates or methacrylates.

Examples thereof include, as the commercially available surfactant, Megaface F178, F-470, F-473, F-475, F-476 and F-472 (produced by Dainippon Ink & Chemicals, Inc.) and further include a copolymer of a $C_6F_{13}$ group-containing acrylate or methacrylate with a (poly(oxyalkylene)) acrylate or methacrylate, a copolymer of a $C_6F_{13}$ group-containing acrylate or methacrylate with a (poly(oxyalkylene)) acrylate or methacrylate and a (poly(oxypropylene))acrylate or methacrylate, a copolymer of a $C_8F_{17}$ group-containing acrylate or methacrylate with a (poly(oxyethylene)) acrylate or methacrylate, and a copolymer of a $C_8F_{17}$ group-containing acrylate or methacrylate with a (poly(oxyethylene)) acrylate or methacrylate and a (poly(oxypropylene)) acrylate or methacrylate.

Surfactants other than the fluorine-containing and/or silicon-containing surfactant, described in paragraph [0280] of U.S. Patent Application Publication No. 2008/0248425, may be also used.

As for these surfactants, one kind may be used alone, or two or more kinds may be used in combination.

In the case where the composition of the present invention contains a surfactant, the content of the surfactant is preferably from 0 to 2 mass %, more preferably from 0.0001 to 2 mass %, still more preferably from 0.0005 to 1 mass %, based on the entire solid content of the composition.

[7] Other Additives

The composition of the present invention may appropriately contain, in addition to the components described above, a carboxylic acid, an onium carboxylate, a dissolution inhibiting compound having a molecular weight of 3,000 or less described, for example, in *Proceeding of SPIE*, 2724, 355 (1996), a dye, a plasticizer, a photosensitizer, a light absorber, an antioxidant and the like.

In particular, a carboxylic acid is suitably used for enhancing the performance. The carboxylic acid is preferably an aromatic carboxylic acid such as benzoic acid and naphthoic acid.

The content of the carboxylic acid is preferably from 0.01 to 10 mass %, more preferably from 0.01 to 5 mass %, still more preferably from 0.01 to 3 mass %, based on the entire solid content concentration of the composition.

From the standpoint of enhancing the resolution, the electron beam-sensitive or extreme ultraviolet-sensitive resin composition of the present invention is preferably used in a film thickness of 10 to 250 nm, more preferably from 20 to 200 nm, still more preferably from 30 to 100 nm. Such a film thickness can be achieved by setting the solid content concentration in the composition to an appropriate range, thereby imparting an appropriate viscosity and enhancing the coatability and film-forming property.

The solid content concentration in the electron beam-sensitive or extreme ultraviolet-sensitive resin composition of the present invention is usually from 1.0 to 10 mass %, preferably from 2.0 to 5.7 mass %, more preferably from 2.0 to 5.3 mass %. By setting the solid content concentration to the range above, the resist solution can be uniformly coated on a substrate and furthermore, a resist pattern improved in the line width roughness can be formed. The reason therefor is not clearly known, but it is considered that probably thanks to a solid content concentration of 10 mass % or less, preferably 5.7 mass % or less, aggregation of materials, particularly, a photoacid generator, in the resist solution is suppressed, as a result, a uniform resist film can be formed.

The solid content concentration is a weight percentage of the weight of resist components excluding the solvent, based on the total weight of the electron beam-sensitive or extreme ultraviolet-sensitive resin composition.

The electron beam-sensitive or extreme ultraviolet-sensitive resin composition of the present invention is used by dissolving the components above in a predetermined organic solvent, preferably in the above-described mixed solvent, filtering the solution, and coating it on a predetermined support (substrate). The filter used for filtration is preferably a polytetrafluoroethylene-, polyethylene- or nylon-made filter having a pore size of 0.1 μm or less, more preferably 0.05 μm or less, still more preferably 0.03 μm or less. In the filtration through a filter, as described, for example, in JP-A-2002-62667, circulating filtration may be performed, or the filtration may be performed by connecting a plurality of kinds of filters in series or in parallel. Also, the composition may be filtered a plurality of times. Furthermore, a deaeration treatment or the like may be applied to the composition before and after filtration through a filter.

[Usage]

The pattern forming method of the present invention is suitably used for the fabrication of a semiconductor microcircuit, for example, in the production of VLSI or a high-capacity microchip. Incidentally, at the fabrication of a semiconductor microcircuit, the resist film having formed therein a pattern is subjected to circuit formation or etching and the remaining resist film part is finally removed with a solvent or the like. Therefore, unlike a so-called permanent resist used for a printed board and the like, the resist film derived from the electron beam-sensitive or extreme ultraviolet-sensitive resin composition of the present invention does not remain in the final product such as microchip.

The present invention also relates to a method for manufacturing an electronic device, comprising the pattern forming method of the present invention, and an electronic device manufactured by this manufacturing method.

The electronic device of the present invention is suitably mounted on electric electronic equipment (such as home electronic device, OA•media-related device, optical device and communication device).

EXAMPLES

The present invention is described in greater detail below by referring to Examples, but the present invention should not be construed as being limited to these Examples.

Synthesis Example

Synthesis of Resin (A-1)

First, 11.85 g of Compound (1), 17.06 g of Compound (2) and 0.92 g of polymerization initiator V-601 (produced by Wako Pure Chemical Industries, Ltd.) were dissolved in 69.40 g of cyclohexanone. Thereafter, 17.35 g of cyclohexanone was charged into a reaction vessel and after dropwise addition to the system at 80° C. over 4 hours in a nitrogen gas atmosphere, the reaction solution was heated with stirring over 2 hours and then allowed to cool to room temperature.

The reaction solution was diluted by adding 77 g of cyclohexanone thereto, and the diluted solution was added dropwise to 1,500 g of heptane/ethyl acetate=9/1 (mass ratio) to precipitate a polymer, followed by filtering. The solid matter collected by filtration was washed by spraying 200 g of heptane/ethyl acetate=9/1 (mass ratio) thereon. The solid matter after washing was then dried under reduced pressure to obtain 24.58 g of Resin (A-1).

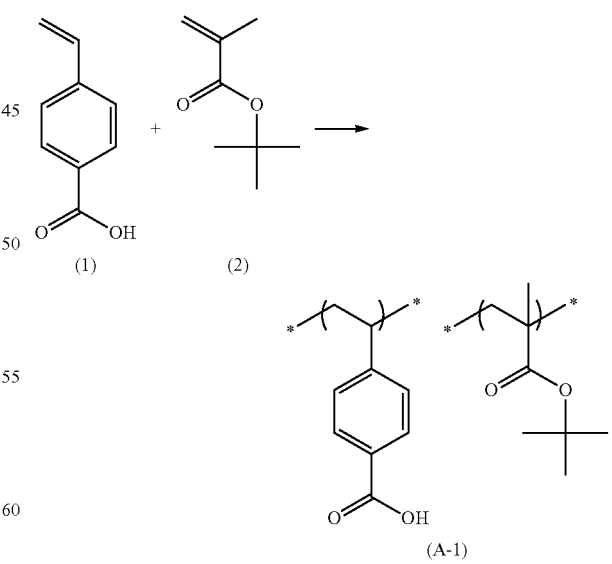

The weight average molecular weight (Mw, in terms of polystyrene) of the resin obtained as determined by GPC (carrier: tetrahydrofuran (THF)) was Mw=21,000, the number average molecular weight Mn was 11,500, the polydispersity Mw/Mn was 1.83, and the compositional ratio as measured by $^{13}$C-NMR was 40/60.
<Acid-Decomposable Resin>
Resins A-2 to A-12 and CA-1 were synthesized in the same manner. The structures of the synthesized polymers are illustrated below.
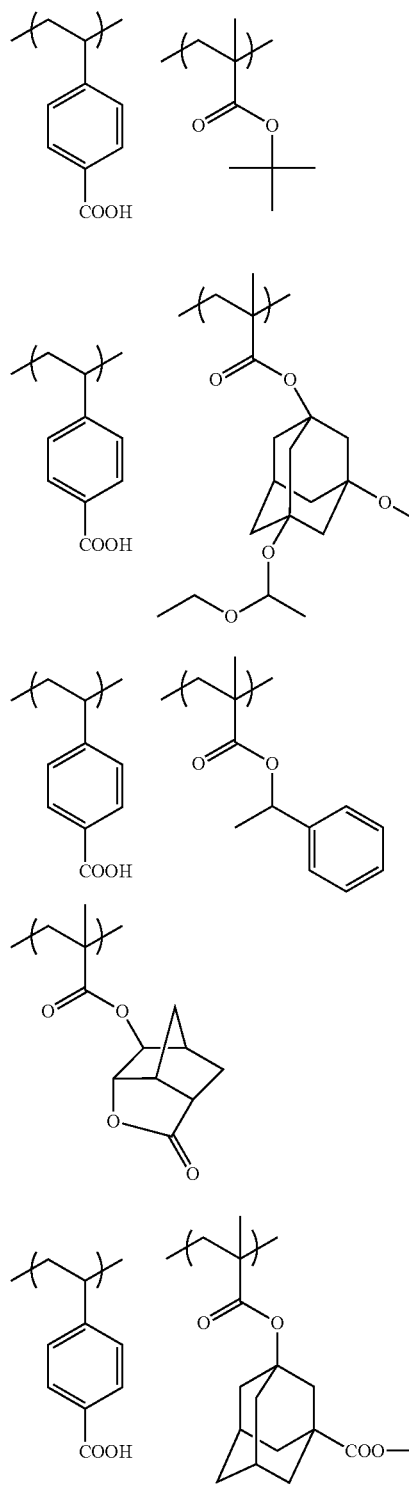
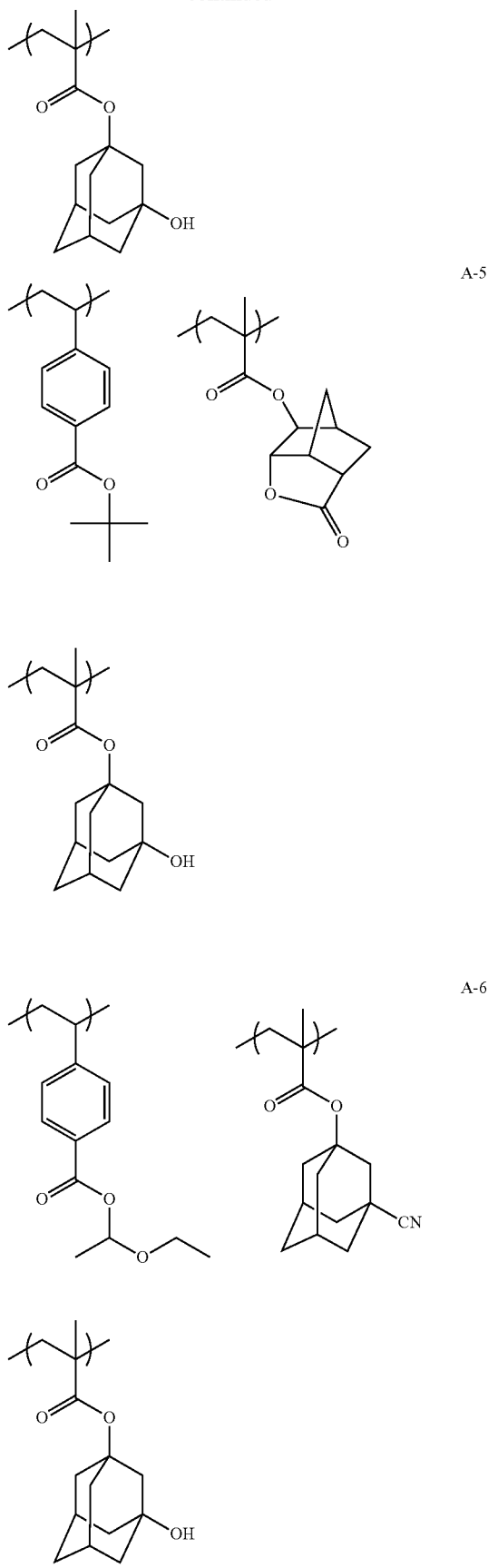

A-7
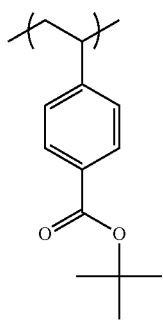
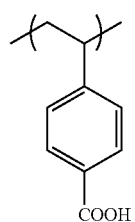
A-8
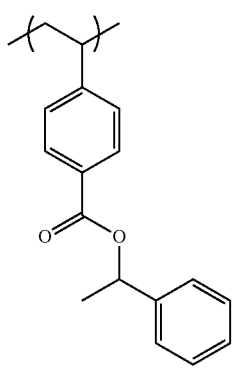
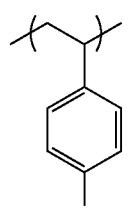
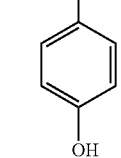
A-9
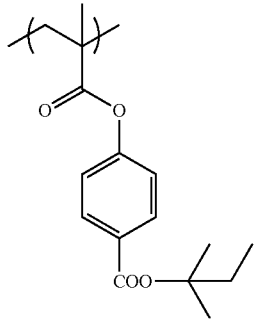
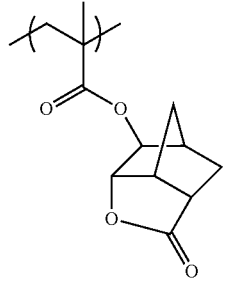
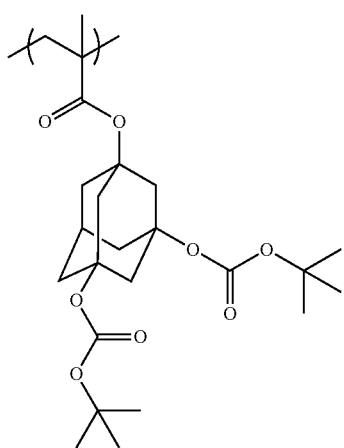
A-10
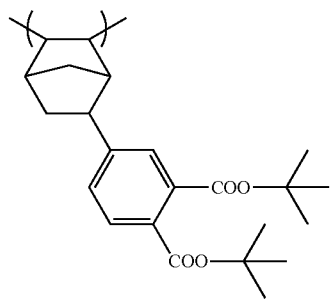
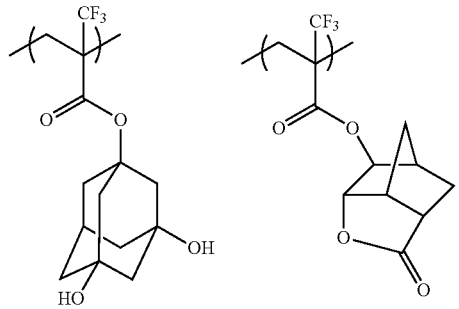
A-11
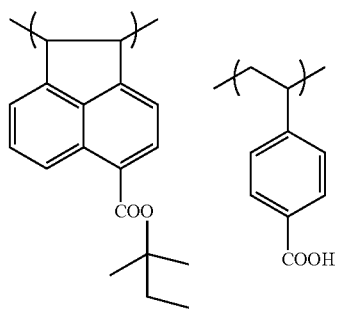
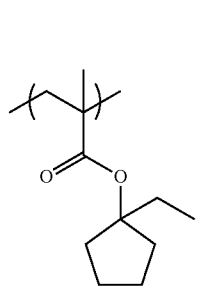
A-12
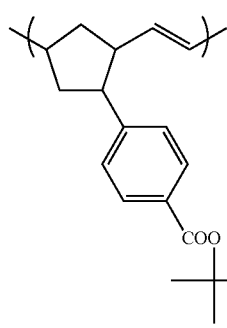

-continued

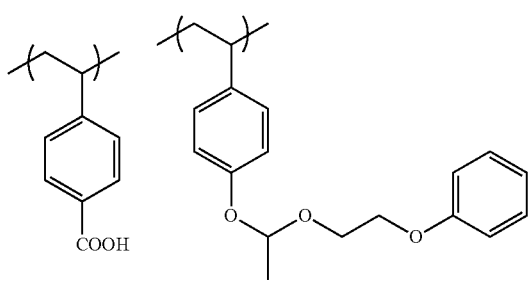

CA-1

The compositional ratio of respective repeating units (molar ratio; corresponding to repeating units starting from the left), weight average molecular weight (Mw) and polydispersity (Mw/Mn) are shown in the Table below.

TABLE 4

| Resin | Mw | Mw/Mn | Compositional Ratio | | |
|---|---|---|---|---|---|
| A-1 | 21000 | 1.83 | 40 | 60 | |
| A-2 | 6700 | 1.78 | 40 | 60 | |
| A-3 | 14500 | 1.81 | 30 | 50 | 20 |
| A-4 | 8600 | 1.79 | 40 | 50 | 10 |
| A-5 | 9000 | 1.84 | 60 | 30 | 10 |
| A-6 | 9800 | 1.77 | 60 | 20 | 20 |
| A-7 | 10500 | 1.78 | 50 | 50 | |
| A-8 | 12400 | 1.81 | 70 | 15 | 15 |
| A-9 | 7800 | 1.79 | 40 | 40 | 20 |
| A-10 | 6500 | 1.84 | 50 | 20 | 30 |
| A-11 | 7100 | 1.77 | 40 | 40 | 20 |
| A-12 | 6000 | 1.77 | 60 | 40 | |
| CA-1 | 8000 | 1.22 | 50 | 50 | |

<Acid Generator>

As the acid generator, the following compounds were used.

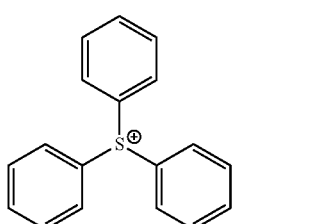

PAG-1

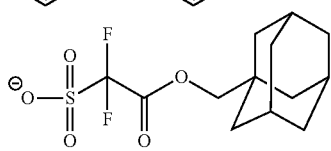

PAG-2

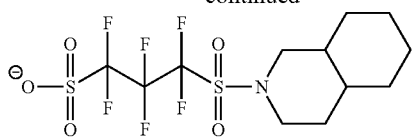

PAG-3

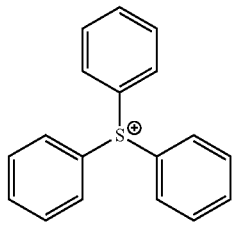

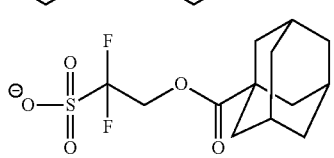

PAG-4

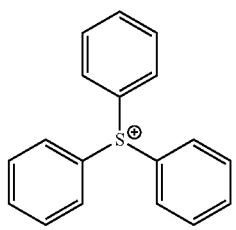

PAG-5

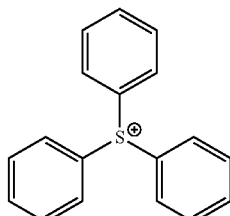

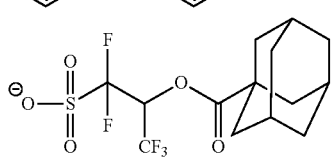

PAG-6

PAG-7
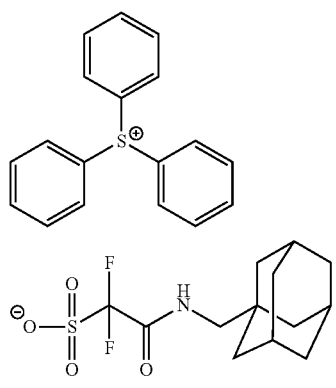
PAG-8
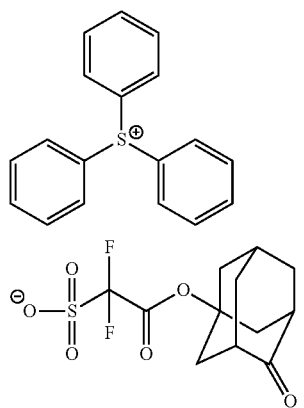
PAG-9
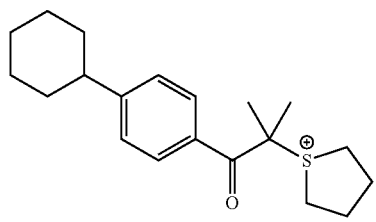
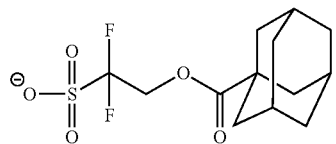
PAG-10
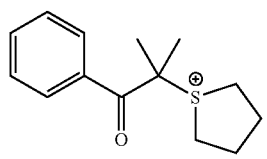
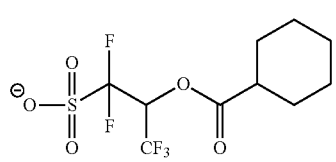
PAG-11
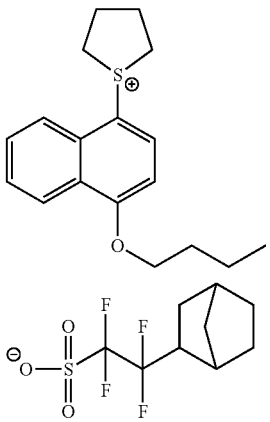
PAG-12
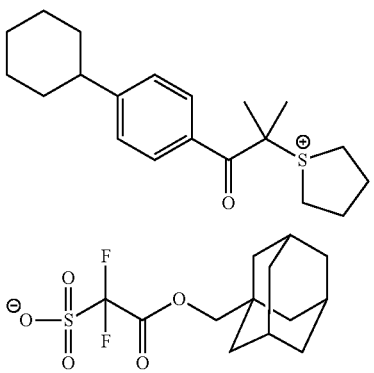
<Basic Compound>
As the basic compound, the following compounds were used.
N-1
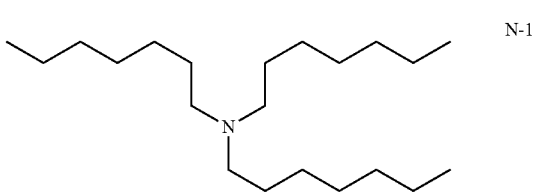
N-2
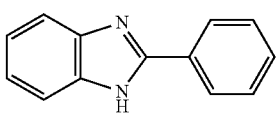
N-3
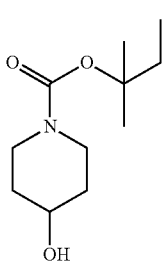

-continued

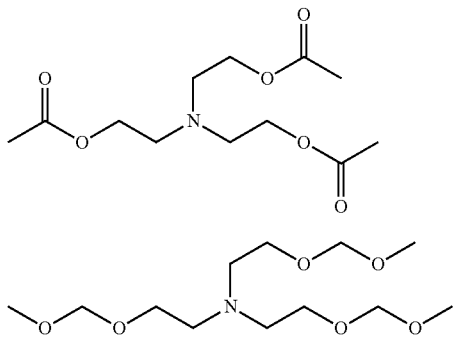

N-4

N-5

<Additive>

As the additive in the Table, the following compounds were used.

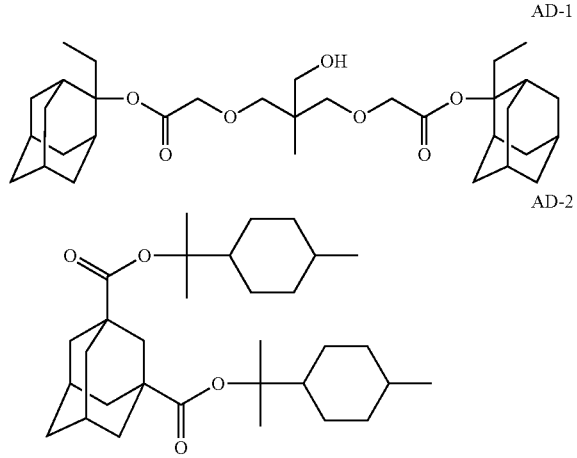

AD-1

AD-2

<Surfactant>

As the surfactant, the following compounds were prepared.
W-1: Megaface F176 (produced by DIC Corp.; fluorine-containing)
W-2: Megaface R08 (produced by DIC Corp.; fluorine- and silicon-containing)
W-3: Polysiloxane polymer KP-341 (produced by Shin-Etsu Chemical Co., Ltd.; silicon-containing)
W-4: Troysol S-366 (produced by Troy Chemical)
W-5: KH-20 (produced by Asahi Glass Co., Ltd.)
W-6: PolyFox PF-6320 (produced by OMNOVA Solutions Inc., fluorine-containing)

<Solvent>

As the solvent, the following compounds were prepared.
(Group a)
SL-1: Propylene glycol monomethyl ether acetate (PGMEA)
SL-2: Propylene glycol monomethyl ether propionate
SL-3: 2-Heptanone
(Group b)
SL-4: Ethyl lactate
SL-5: Propylene glycol monomethyl ether (PGME)
SL-6: Cyclohexanone
(Group c)
SL-7: γ-Butyrolactone
SL-8: Propylene carbonate Examples 1 to 12 and Comparative Example 1

Electron Beam (EB) Exposure

<Preparation of Coating Solution of Electron Beam-Sensitive or Extreme Ultraviolet-Sensitive Resin Composition, Coating, EB Exposure and Development>

The components shown in Table 5 below were dissolved in the mixed solvent shown in Table 5 to prepare a resist solution, and this solution was filtered through a polytetrafluoroethylene filter having a pore size of 0.1 μm to obtain an electron beam-sensitive or extreme ultraviolet-sensitive resin composition (resist composition) solution. The prepared electron beam-sensitive or extreme ultraviolet-sensitive resin composition solution was uniformly coated by a spin coater on a 6-inch silicon wafer subjected to a hexamethyldisilazane treatment, and dried by heating on a hot plate at 110° C. for 90 seconds to form a resist film having a thickness of 100 nm.

The formed resist film was irradiated with electron beam by using an electron beam irradiation apparatus (HL750, manufactured by Hitachi, Ltd., accelerating voltage: 50 keV). Immediately after the irradiation, the film was baked on a hot plate at 120° C. for 90 seconds, then developed using butyl acetate at 23° C. for 60 seconds, rinsed with MIBC (4-methyl-2-pentanol) for 30 seconds, and dried to form a 1:1 line-and-space pattern having a line width of 50 nm, and the obtained pattern was evaluated by the following methods.

Comparative Example 2

Electron Beam (EB) Exposure

An electron beam-sensitive or extreme ultraviolet-sensitive resin composition was prepared and a pattern was formed, in the same manner as in Example 1 except for changing the composition as shown in the Table below, performing the development with an aqueous alkali solution (TMAH, an aqueous 2.38 mass % tetramethylammonium hydroxide solution) instead of the organic developer, and using water as the rinsing solution.

<Evaluation of Resist>

[Sensitivity]

The cross-sectional profile of the pattern obtained was observed using a scanning electron microscope (S-9220, manufactured by Hitachi, Ltd.). The minimum irradiation energy below which a 50-nm line (line:space=1:1) is not resolved, was taken as the sensitivity. A smaller value indicates higher performance.

[Pattern Collapse]

The limiting pre-collapse dimension (the minimum line width below which a line and a space are not separated and resolved and the pattern collapses) at the irradiation dose giving the sensitivity above is taken as the resolution.

A smaller value indicates that a finer pattern is resolved without collapsing, pattern collapse is less likely to occur, and the resolution is higher.

[Residual Film Ratio]

The cross-sectional profile at the above-described limiting pre-collapse dimension was observed using a scanning electron microscope (S-4300, manufactured by Hitachi, Ltd.), and film thickness of pattern/initial film thickness×100 was evaluated as the residual film ratio (%).

These evaluation results are shown in Table 5 below.

TABLE 5

| | Resin | | Resin Used in Combination | | Acid Generator 1 | | Acid Generator 2 | | Basic Compound 1 | | Basic Compound 2 | | Additive | |
|---|---|---|---|---|---|---|---|---|---|---|---|---|---|---|
| | Compound No. | parts by mass | Compound No. | parts by mass | Compound No. | parts by mass | Compound No. | parts by mass | Compound No. | parts by mass | Compound No. | parts by mass | Compound No. | parts by mass |
| Example 1 | A-1 | 80.5 | | | PAG-1 | 10.0 | PAG-9 | 8.0 | N-1 | 0.80 | N-2 | 0.20 | | |
| Example 2 | A-2 | 79.9 | | | PAG-3 | 14.0 | PAG-11 | 4.0 | N-2 | 0.50 | N-3 | 0.10 | AD-1 | 1.0 |
| Example 3 | A-3 | 71.3 | CA-1 | 15.0 | PAG-2 | 8.0 | PAG-4 | 4.0 | N-1 | 0.70 | | | | |
| Example 4 | A-4 | 81.5 | | | PAG-8 | 10.0 | PAG-12 | 6.0 | N-4 | 0.50 | | | AD-2 | 1.5 |
| Example 5 | A-5 | 74.5 | CA-1 | 10.0 | PAG-6 | 15.0 | | | N-3 | 0.30 | N-5 | 0.20 | | |
| Example 6 | A-6 | 82.6 | | | PAG-7 | 8.0 | PAG-10 | 8.0 | N-1 | 0.40 | | | | |
| Example 7 | A-7 | 79.9 | | | PAG-3 | 14.0 | PAG-11 | 4.0 | N-2 | 0.50 | N-3 | 0.10 | AD-1 | 1.0 |
| Example 8 | A-8 | 70.3 | CA-1 | 15.0 | PAG-2 | 8.0 | PAG-4 | 5.0 | N-1 | 0.70 | | | | |
| Example 9 | A-9 | 78.5 | | | PAG-8 | 11.0 | PAG-12 | 8.0 | N-4 | 0.50 | | | AD-2 | 1.5 |
| Example 10 | A-10 | 75.5 | CA-1 | 10.0 | PAG-6 | 14.0 | | | N-3 | 0.30 | N-5 | 0.20 | | |
| Example 11 | A-11 | 84.6 | | | PAG-7 | 6.0 | PAG-5 | 8.0 | N-1 | 0.40 | | | | |
| Example 12 | A-12 | 84.4 | | | PAG-7 | 6.0 | PAG-10 | 8.0 | N-1 | 0.40 | N-4 | 0.20 | | |
| Comparative Example 1 | CA-1 | 83.8 | | | PAG-1 | 15.0 | | | N-1 | 0.70 | | | | |
| Comparative Example 2*[1] | A-1 | 80.5 | | | PAG-1 | 10.0 | PAG-9 | 8.0 | N-1 | 0.80 | N-2 | 0.20 | | |

| | Surfactant | | Solvent | | | | | | Performance Evaluation Results | | |
|---|---|---|---|---|---|---|---|---|---|---|---|
| | Compound No. | parts by mass | Solvent 1 | parts by mass | Solvent 2 | parts by mass | Solvent 3 | parts by mass | Sensitivity ($\mu C/cm^2$) | Pattern Collapse (nm) | Residual Film Ratio (%) |
| Example 1 | W-2 | 0.50 | SL-1 | 1292 | SL-4 | 800 | SL-7 | 30 | 25.0 | 35.0 | 75 |
| Example 2 | W-3 | 0.50 | SL-1 | 1952 | SL-5 | 100 | SL-7 | 70 | 22.0 | 34.0 | 85 |
| Example 3 | W-6 | 1.00 | SL-1 | 822 | SL-5 | 1000 | SL-6 | 300 | 20.0 | 34.0 | 80 |
| Example 4 | W-4 | 0.50 | SL-1 | 1522 | SL-4 | 500 | SL-7 | 100 | 26.0 | 35.0 | 75 |
| Example 5 | | | SL-1 | 1122 | SL-5 | 800 | SL-3 | 200 | 21.0 | 31.0 | 80 |
| Example 6 | W-5 | 1.00. | SL-6 | 1472 | SL-5 | 650 | | | 28.0 | 32.0 | 75 |
| Example 7 | W-3 | 0.50. | SL-1 | 1252 | SL-5 | 800 | SL-7 | 70 | 26.0 | 30.0 | 75 |
| Example 8 | W-6 | 1.00 | SL-1 | 572 | SL-6 | 1500 | SL-7 | 50 | 29.0 | 32.0 | 75 |
| Example 9 | W-4 | 0.50 | SL-1 | 1422 | SL-4 | 600 | SL-7 | 100 | 18.0 | 30.0 | 85 |
| Example 10 | | | SL-1 | 1502 | SL-4 | 600 | SL-8 | 20 | 19.5 | 32.0 | 85 |
| Example 11 | W-5 | 1.00 | SL-6 | 1452 | SL-1 | 650 | SL-7 | 20 | 25.0 | 31.0 | 80 |
| Example 12 | W-5 | 1.00 | SL-6 | 1452 | SL-1 | 650 | SL-7 | 20 | 20.0 | 32.0 | 85 |
| Comparative Example 1 | W-1 | 0.50 | SL-1 | 1522 | SL-6 | 600 | | | 31.0 | 40.0 | 35 |
| Comparative Example 2*[1] | W-2 | 0.50 | SL-1 | 1292 | SL-4 | 800 | SL-7 | 30 | | not resolved*[2] | |

*[1]Positive development with TMAH
*[2]Due to generation of pattern collapse

As apparent from the Table above, in Comparative Example 1 where the acid-decomposable resin does not have the partial structure represented by formula (A0), all of sensitivity, pattern collapse resistance and residual film ratio are poor.

In Comparative Example 2 where the same resist composition as in Example 1 is used and positive development is performed using an alkali developer, the capillary force imposed on the side wall of the pattern is probably larger in the case of using an alkali developer than in the case of using an organic developer, and this is considered to bring the results that pattern collapse was generated and a finer pattern with a line width of 50 nm or less could not be resolved.

On the other hand, in Examples 1 to 12 where the acid-decomposable resin has the partial structure represented by formula (A0), it is seen that all of sensitivity, pattern collapse resistance and residual film ratio are excellent.

Incidentally, with respect to Examples 1 to 12, also when the developer was changed to methyl amyl ketone or ethyl 2-ethoxypropionate from butyl acetate, the same results were obtained, that is, all of sensitivity, pattern collapse resistance and residual film ratio were excellent.

Furthermore, also in the characteristic evaluation by irradiation with EUV light according to the pattern forming method of the present invention of forming a negative pattern by using an electron beam-sensitive or extreme ultraviolet-sensitive resin composition containing (A) a resin containing a repeating unit having a partial structure represented by formula (A0), the results obtained show that the sensitivity is high, generation of pattern collapse after development is reduced, and the residual film ratio is large.

This application is based on Japanese patent application No. JP 2011-218548 filed on Sep. 30, 2011, the entire contents of which are hereby incorporated by reference, the same as if set forth at length.

What is claimed is:
1. A pattern forming method comprising:
(1) forming a film by using an electron beam-sensitive or extreme ultraviolet-sensitive resin composition containing (A) a resin that contains a repeating unit having a partial structure represented by the following formula (A1) and can decrease the solubility for a developer containing an organic solvent by the action of an acid, and (B) a compound capable of generating an acid upon irradiation with an electron beam or an extreme ultraviolet ray, (2) exposing the film by using an electron beam or an extreme ultraviolet ray, and (4) developing the exposed film by using an organic solvent-containing developer to form a negative pattern:

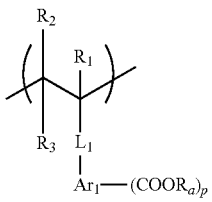

(A1)

wherein each of $R_1$, $R_2$ and $R_3$ independently represents a hydrogen atom, an alkyl group, a cycloalkyl group, a halogen atom, a cyano group or an alkoxycarbonyl group, $R_3$ may combine with $L_1$ or $Ar_1$ to form a ring, and in this case, $R_3$ represents an alkylene group;

$L_1$ represents a single bond;

$Ar_1$ represents a (p+1)-valent aromatic ring group and in the case of combining with $R_3$ to form a ring, $Ar_1$ represents a (p+2)-valent aromatic ring group;

Ra represents a hydrogen atom or a group capable of leaving by the action of an acid; and p represents an integer of 1 to 4, and when a plurality of Ra's are present, each Ra may be the same as or different from every other Ra;

and further wherein the content of the repeating unit having a partial structure represented by formula (A1) is from 30 to 70 mol % based on all repeating units of the resin (A).

2. The pattern forming method according to claim 1, wherein Ra is a group capable of leaving by the action of an acid.

3. The pattern forming method according to claim 1, wherein the resin (A) further contains a repeating unit having a lactone structure.

4. A method for manufacturing an electronic device, comprising the pattern forming method claimed in claim 1.

5. An electronic device manufactured by the method for manufacturing an electronic device as claimed in claim 4.

6. The pattern forming method according to claim 1, wherein the developer is a developer containing at least one kind of an organic solvent selected from the group consisting of a ketone-based solvent, an ester-based solvent, an alcohol-based solvent, an amide-based solvent and an ether-based solvent.

7. The pattern forming method according to claim 1, further comprising:

(5) rinsing the film by using a rinsing solution containing an organic solvent.

8. A pattern forming method comprising:

(1) forming a film by using an electron beam-sensitive or extreme ultraviolet-sensitive resin composition containing (A) a resin that contains a repeating unit having a partial structure represented by the following formula (A1) and can decrease the solubility for a developer containing an organic solvent by the action of an acid, and (B) a compound capable of generating an acid upon irradiation with an electron beam or an extreme ultraviolet ray, (2) exposing the film by using an electron beam or an extreme ultraviolet ray, and (4) developing the exposed film by using an organic solvent-containing developer to form a negative pattern:

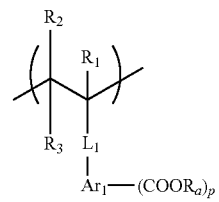

(A1)

wherein each of $R_1$, $R_2$ and $R_3$ independently represents a hydrogen atom, an alkyl group, a cycloalkyl group, a halogen atom, a cyano group or an alkoxycarbonyl group, $R_3$ may combine with $L_1$ or $Ar_1$ to form a ring, and in this case, $R_3$ represents an alkylene group;

$L_1$ represents a single bond or a divalent linking group;

$Ar_1$ represents a phenylene group;

Ra represents a hydrogen atom or a group capable of leaving by the action of an acid; and p represents an integer of 1 to 4, and when a plurality of Ra's are present, each Ra may be the same as or different from every other Ra;

and further wherein the content of the repeating unit having a partial structure represented by formula (A1) is from 30 to 70 mol % based on all repeating units of the resin (A).

9. The pattern forming method according to claim 8, wherein the divalent linking group of $L_1$ is —COO—, —OCO—, —COO—La— or —OCO—La—, wherein La represents an alkylene group, a cycloalkylene group, or a divalent aromatic ring group.

10. The pattern forming method according to claim 8, wherein Ra is a group capable of leaving by the action of an acid.

11. The pattern forming method according to claim 8, wherein the resin (A) further contains a repeating unit having a lactone structure.

12. A method for manufacturing an electronic device, comprising the pattern forming method claimed in claim 8.

13. An electronic device manufactured by the method for manufacturing an electronic device as claimed in claim 12.

14. The pattern forming method according to claim 8, wherein the developer is a developer containing at least one kind of an organic solvent selected from the group consisting of a ketone-based solvent, an ester-based solvent, an alcohol-based solvent, an amide-based solvent and an ether-based solvent.

15. The pattern forming method according to claim 8, further comprising:

(5) rinsing the film by using a rinsing solution containing an organic solvent.

16. The pattern forming method according to claim 1, wherein $Ar_1$ represents a phenylene group.

17. The pattern forming method according to claim 6, wherein the developer contains butyl acetate.

18. The pattern forming method according to claim 14, wherein the developer contains butyl acetate.

* * * * *